(12) United States Patent
    Muramatsu et al.

(10) Patent No.: US 8,908,151 B2
(45) Date of Patent: Dec. 9, 2014

(54) ILLUMINATION OPTICAL SYSTEM, EXPOSURE APPARATUS, DEVICE MANUFACTURING METHOD, COMPENSATION FILTER, AND EXPOSURE OPTICAL SYSTEM

(75) Inventors: Kouji Muramatsu, Belmont, CA (US); Osamu Tanitsu, Kumagaya (JP); Hirohisa Tanaka, Kumagaya (JP); Masaya Yamamoto, Honji (JP); Norio Miyake, Tokyo (JP); Yasushi Mizuno, Saitama (JP); Ryuji Takaya, Kumagaya (JP); Risa Yoshimoto, Fukaya (JP); Hiroyuki Hirota, Fukaya (JP)

(73) Assignee: Nikon Corporation, Tokyo (JP)

( * ) Notice: Subject to any disclaimer, the term of this patent is extended or adjusted under 35 U.S.C. 154(b) by 952 days.

(21) Appl. No.: 12/366,429

(22) Filed: Feb. 5, 2009

(65) Prior Publication Data
    US 2009/0284727 A1    Nov. 19, 2009

Related U.S. Application Data

(60) Provisional application No. 61/071,130, filed on Apr. 14, 2008, provisional application No. 61/071,444,
    (Continued)

(30) Foreign Application Priority Data

| Feb. 14, 2008 | (JP) | ............................... P2008-033390 |
| Jul. 19, 2008 | (JP) | ............................... P2008-187977 |
| Oct. 14, 2008 | (JP) | ............................... P2008-264961 |

(51) Int. Cl.
    *G03B 27/72*   (2006.01)
    *G03F 7/20*    (2006.01)
    *G02B 27/09*   (2006.01)
    *G02B 3/08*    (2006.01)
    *G02B 3/06*    (2006.01)
    *G02B 19/00*   (2006.01)

(52) U.S. Cl.
    CPC .............. *G02B 3/06* (2013.01); *G03F 7/70191* (2013.01); *G02B 27/0927* (2013.01); *G02B 3/08* (2013.01); *G02B 27/0988* (2013.01); *G03F 7/70308* (2013.01); *G02B 19/0047* (2013.01); *G03F 7/70825* (2013.01); *G02B 19/0014* (2013.01); *G03F 7/70141* (2013.01)
    USPC .................................. 355/71; 355/53; 355/67

(58) Field of Classification Search
    CPC ......................... G03F 7/70091; G03F 7/70191
    USPC ........................................ 355/53, 67, 69, 71
    See application file for complete search history.

(56) References Cited

U.S. PATENT DOCUMENTS

| 4,621,898 A | 11/1986 | Cohen |
| 6,049,374 A | 4/2000  | Komatsuda et al. |

(Continued)

FOREIGN PATENT DOCUMENTS

| EP | 1 349 009 A2 | 10/2003 |
| JP | 06-124873    | 5/1994  |

(Continued)

OTHER PUBLICATIONS

International Search Report mailed May 19, 2009 in corresponding International Patent Application PCT/JP2009/052274.

(Continued)

*Primary Examiner* — Steven H Whitesell Gordon
(74) *Attorney, Agent, or Firm* — Staas & Halsey LLP

(57) ABSTRACT

An illumination optical system is one for illuminating a surface to be illuminated with light from a light source, which has a distribution forming optical system including an optical integrator and forming a pupil intensity distribution on an illumination pupil located behind the optical integrator, and an optical attenuator arranged on a predetermined surface in an optical path behind the optical integrator and having an attenuation characteristic of varying an attenuation rate depending upon an angle of incidence to the predetermined surface.

39 Claims, 129 Drawing Sheets

Related U.S. Application Data filed on Apr. 29, 2008, provisional application No. 61/071,446, filed on Apr. 29, 2008, provisional application No. 61/129,745, filed on Jul. 16, 2008, provisional application No. 61/129,786, filed on Jul. 18, 2008, provisional application No. 61/129,901, filed on Jul. 28, 2008, provisional application No. 61/136,044, filed on Aug. 8, 2008, provisional application No. 61/136,473, filed on Sep. 8, 2008.

(56) References Cited

U.S. PATENT DOCUMENTS

| | | |
|---|---|---|
| 6,456,436 B2 | 9/2002 | Miura et al. |
| 6,741,329 B2 | 5/2004 | Leenders et al. |
| 6,771,350 B2 | 8/2004 | Nishinaga |
| 6,913,373 B2 | 7/2005 | Tanaka et al. |
| 6,927,836 B2 | 8/2005 | Nishinaga |
| 7,030,958 B2 | 4/2006 | Luijkx et al. |
| 7,145,634 B2 | 12/2006 | Muijderman et al. |
| 7,292,316 B2 | 11/2007 | Kohno |
| 7,489,387 B2 | 2/2009 | Suda |
| 2003/0025890 A1* | 2/2003 | Nishinaga ............... 355/53 |
| 2003/0038225 A1 | 2/2003 | Mulder et al. |
| 2005/0237623 A1* | 10/2005 | Fiolka et al. ............. 359/619 |
| 2006/0050261 A1* | 3/2006 | Brotsack ............... 355/71 |
| 2006/0055834 A1 | 3/2006 | Tanitsu et al. |
| 2006/0170901 A1 | 8/2006 | Tanitsu et al. |
| 2006/0192935 A1* | 8/2006 | Hansen et al. ........... 355/69 |
| 2007/0014112 A1 | 1/2007 | Ohya et al. |
| 2007/0058150 A1 | 3/2007 | Bouman |
| 2007/0058274 A1 | 3/2007 | Singer et al. |
| 2007/0146676 A1 | 6/2007 | Tanitsu et al. |
| 2007/0170376 A1* | 7/2007 | Neerhof et al. ........... 250/504 R |
| 2008/0030707 A1 | 2/2008 | Tanaka et al. |
| 2008/0074631 A1 | 3/2008 | Kita |
| 2008/0074632 A1 | 3/2008 | Tanitsu et al. |
| 2008/0094602 A1 | 4/2008 | Tanitsu et al. |
| 2008/0239274 A1 | 10/2008 | Tanitsu et al. |
| 2008/0291422 A1 | 11/2008 | Kremer |

FOREIGN PATENT DOCUMENTS

| | | |
|---|---|---|
| JP | 10-303114 | 11/1998 |
| JP | 2005-292316 | 10/2005 |
| JP | 2005-321766 | 11/2005 |
| JP | 2005-322855 | 11/2005 |
| JP | 2006-332197 | 12/2006 |
| JP | 2006-332197 A | 12/2006 |
| JP | 2007-027240 | 2/2007 |
| WO | 99/49504 | 9/1999 |
| WO | 2004/051717 A1 | 6/2004 |
| WO | 2004/051717 A1 | 6/2004 |
| WO | 2006/066638 A1 | 6/2006 |
| WO | 2006/136353 A1 | 12/2006 |
| WO | 2006/136353 A1 | 12/2006 |
| WO | 2008/092653 A2 | 8/2008 |

OTHER PUBLICATIONS

English Translation of the International Preliminary Report on Patentability mailed Oct. 14, 2010 in corresponding International Patent Application PCT/JP2009/052274.

European Search Report dated Jul. 22, 2011 in corresponding European Patent Application 09710500.1.

Taiwanese Patent Office Action issued Apr. 22, 2014, in corresponding Taiwanese Patent Application No. 098104487.

* cited by examiner

Fig.3
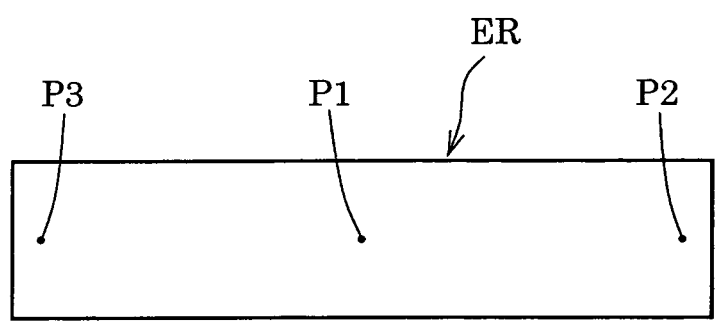
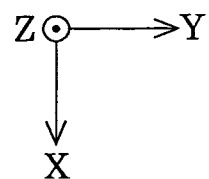

*Fig.45*
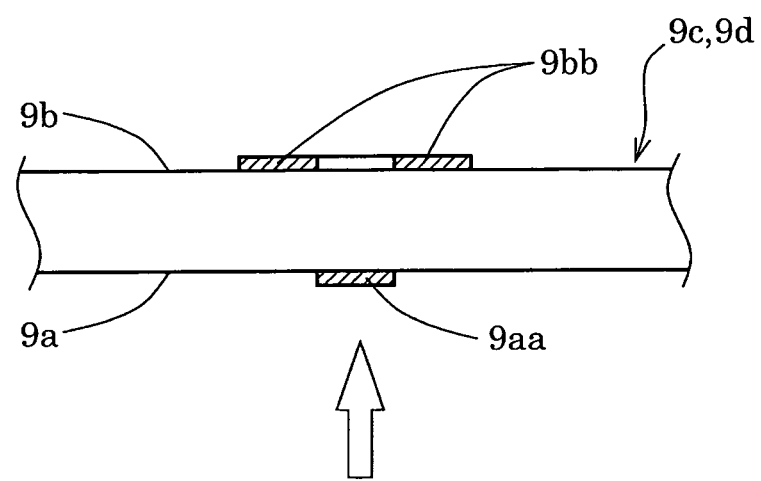
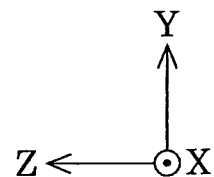

Fig.54
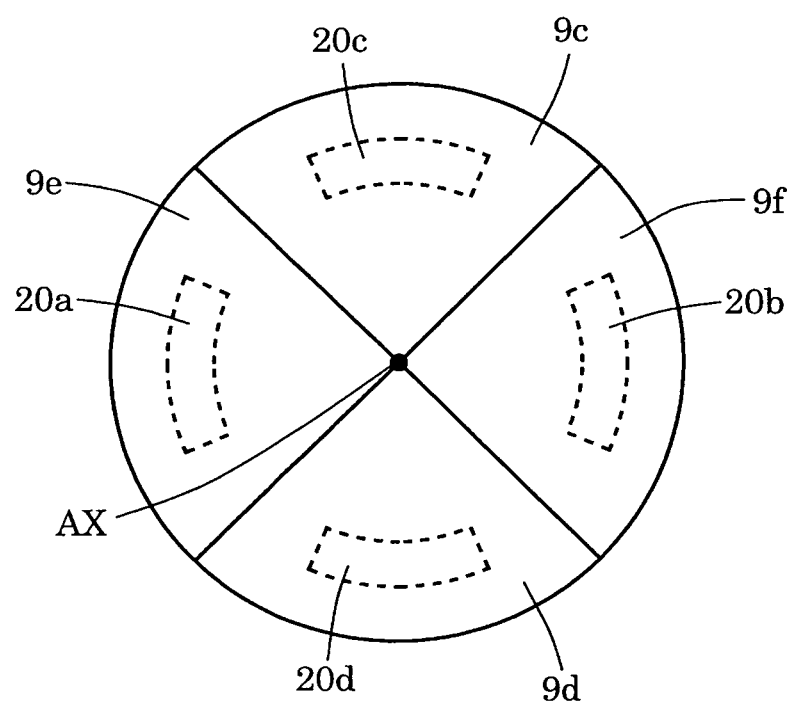
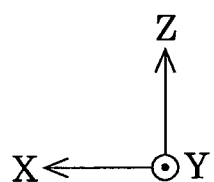

*Fig.55*
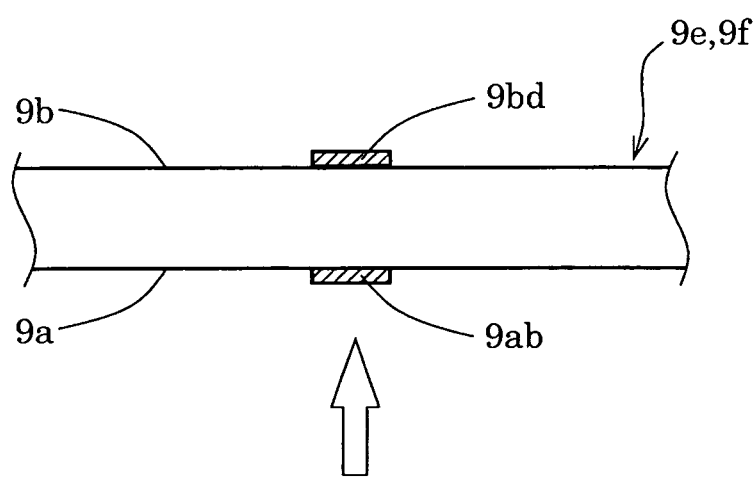
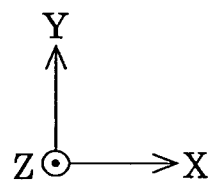

Fig.61
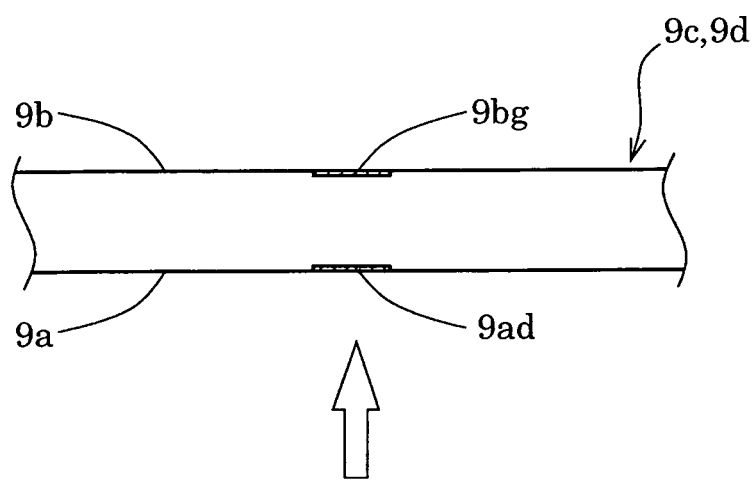
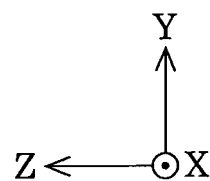

Fig.63
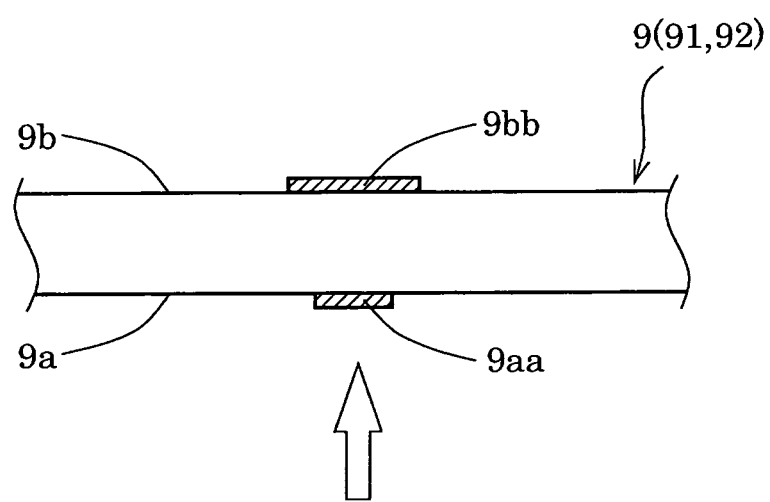
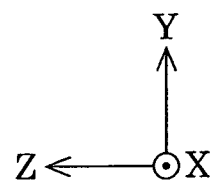

*Fig.72*
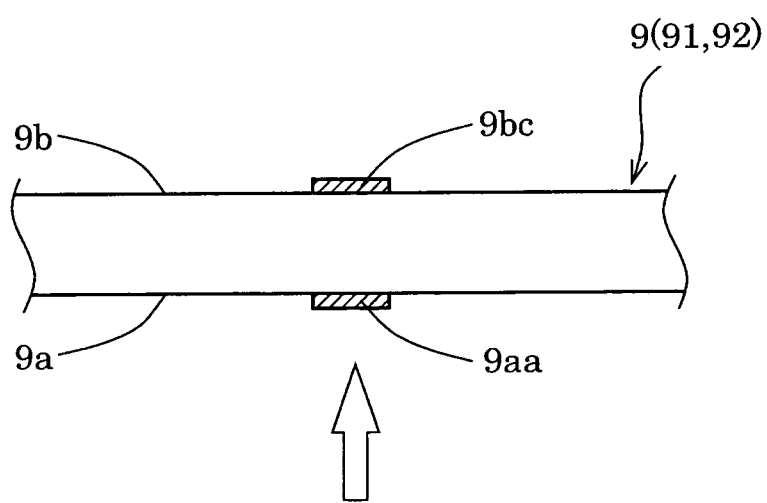
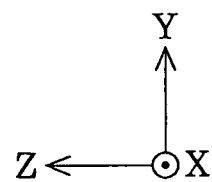

*Fig.80*
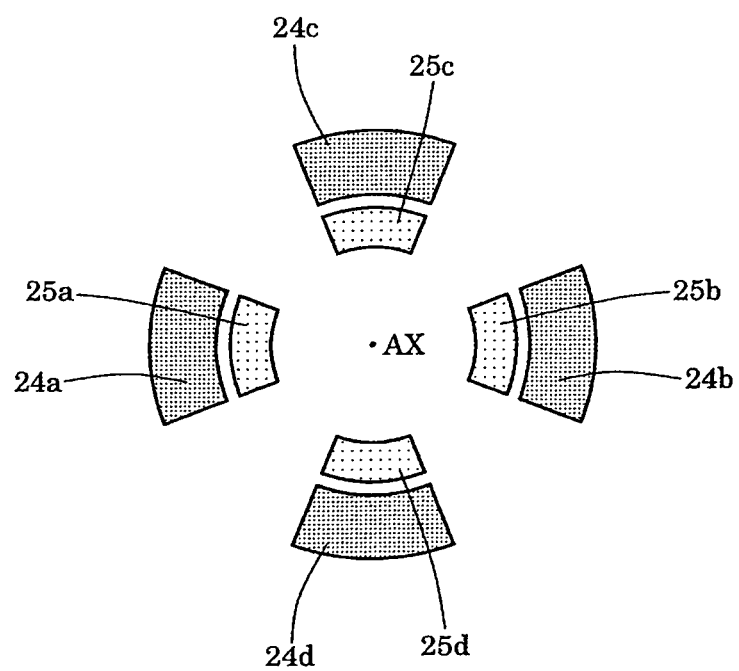
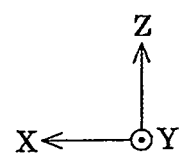

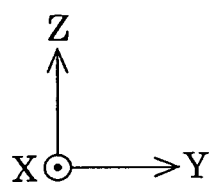
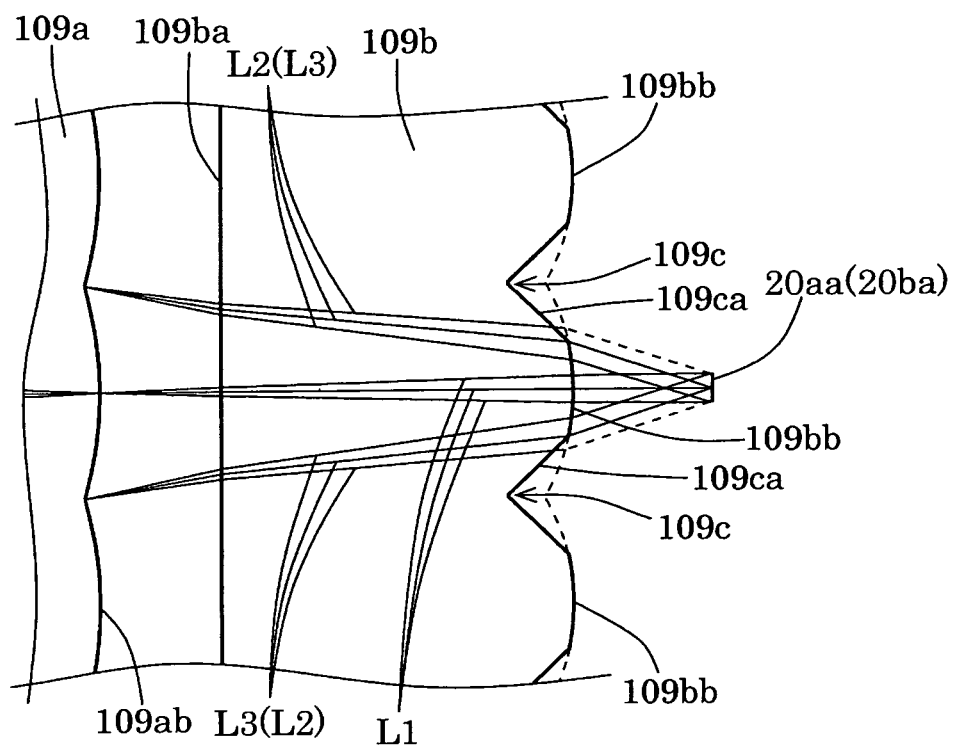

Fig.93
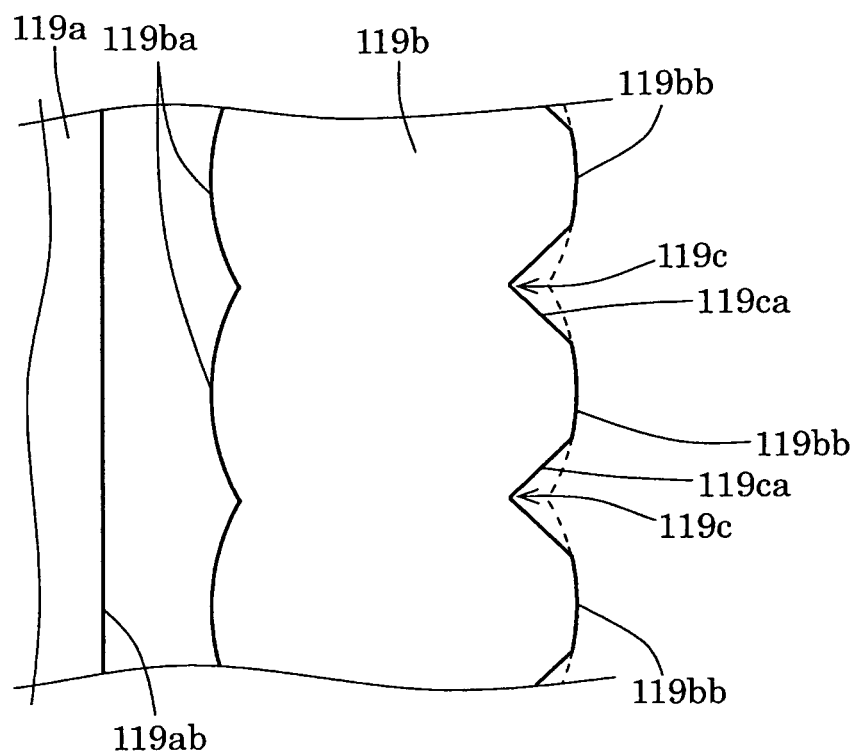
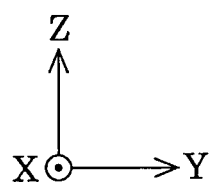

Fig.102
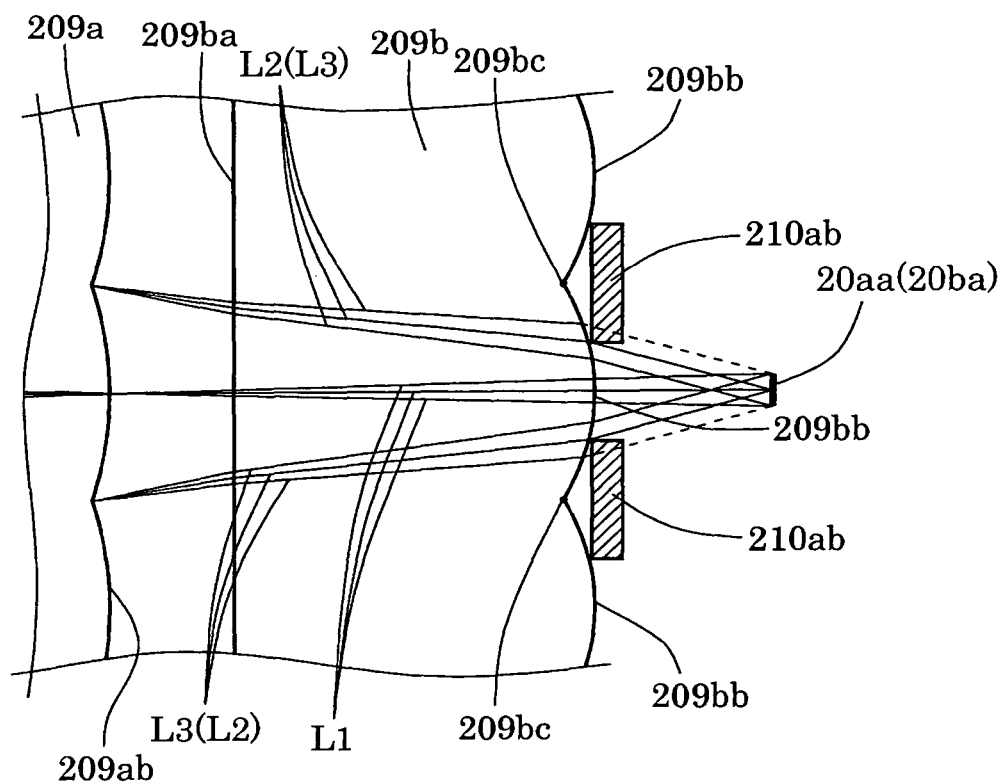
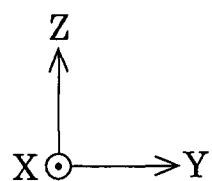

*Fig.103*
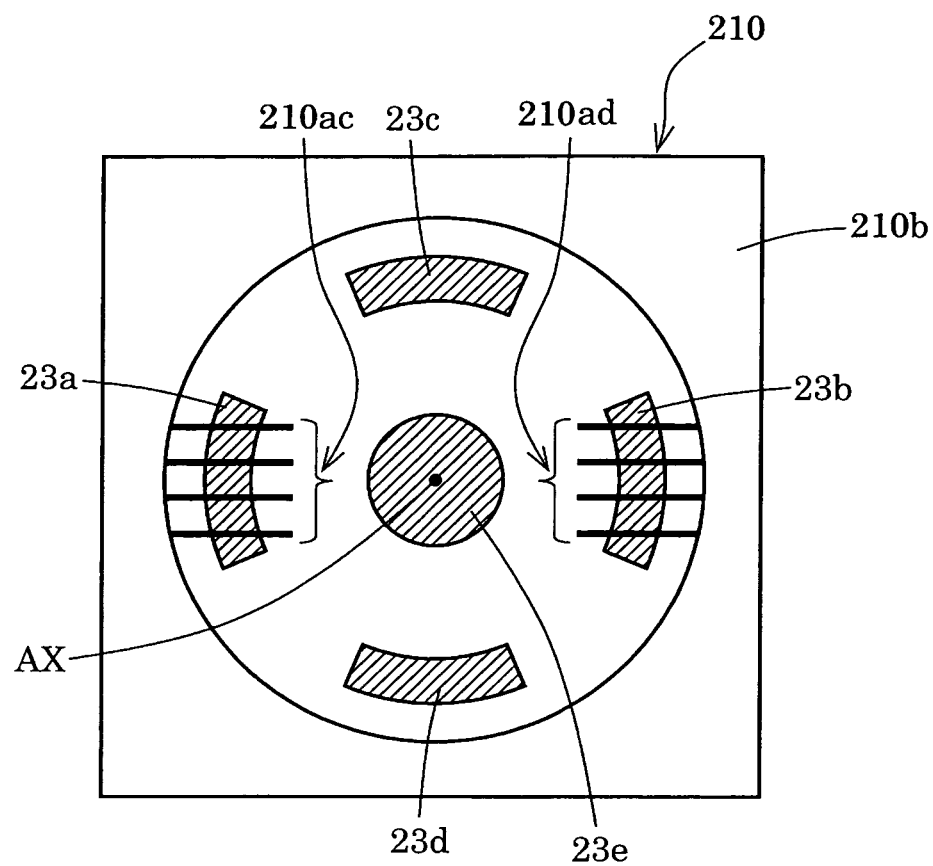
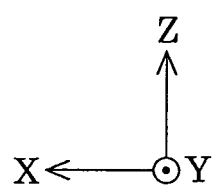

U.S. 8,908,151 B2

ILLUMINATION OPTICAL SYSTEM, EXPOSURE APPARATUS, DEVICE MANUFACTURING METHOD, COMPENSATION FILTER, AND EXPOSURE OPTICAL SYSTEM

CROSS-REFERENCE TO RELATED APPLICATIONS

This application is based upon and claims the benefit of priorities from Japanese Application No. JP2008-033390, filed on Feb. 14, 2008, U.S. PROVISIONAL Application No. U.S. 61/071,130, filed on Apr. 14, 2008, U.S. Provisional Application No. U.S. 61/071,444, filed on Apr. 29, 2008, U.S. Provisional Application No. U.S. 61/071,446, filed on Apr. 29, 2008, U.S. Provisional Application No. U.S. 61/129,745, filed on Jul. 16, 2008, U.S. Provisional Application No. U.S. 61/129,786, filed on Jul. 18, 2008, Japanese Application No. JP2008-187977, filed on Jul. 19, 2008, U.S. Provisional Application No. U.S. 61/129,901, filed on Jul. 28, 2008, U.S. Provisional Application No. U.S. 61/136,044, filed on Aug. 8, 2008, U.S. Provisional Application No. U.S. 61/136,473, filed on Sep. 8, 2008, and Japanese Application No. JP2008-264961, filed on Oct. 14, 2008, the entire contents of which are incorporated herein by reference.

BACKGROUND OF THE INVENTION

1. Field

The present invention relates to an illumination optical system, exposure apparatus, device manufacturing method, compensation filter, and exposure optical system.

2. Description of the Related Art

In a typical exposure apparatus of this kind, light emitted from a light source travels through a fly's eye lens as an optical integrator to form a secondary light source (in general, a certain light intensity distribution on an illumination pupil) as a substantial surface illuminant consisting of a large number of light sources. The light intensity distribution on the illumination pupil will be referred to hereinafter as "pupil intensity distribution." The illumination pupil is defined as follows: by action of an optical system between the illumination pupil and a surface to be illuminated (a mask or wafer in the case of exposure apparatus), the surface to be illuminated becomes a Fourier transform surface of the illumination pupil.

Light from the secondary light source is condensed by a condenser lens and then superposedly illuminates the mask on which a predetermined pattern is formed. Light transmitted by the mask travels through a projection optical system to be focused on the wafer, whereby the mask pattern is projected (or transferred) onto the wafer. Since the pattern formed on the mask is a highly integrated one, a uniform illuminance distribution must be formed on the wafer in order to accurately transfer this micro pattern onto the wafer.

For accurately transferring the micro pattern of the mask onto the wafer, there is the proposed technology of forming the pupil intensity distribution, for example, of an annular shape or a multi-polar shape (dipolar, quadrupolar, or other shape) to improve the depth of focus and the resolving power of the projection optical system (cf. U.S. Pat. Published Application No. 2006/0055834).

SUMMARY

An embodiment of the present invention provides an illumination optical system capable of independently adjusting each of pupil intensity distributions for respective points on a surface to be illuminated. Another embodiment of the present invention provides an exposure apparatus capable of performing excellent exposure under an appropriate illumination condition, using the illumination optical system configured to independently adjust each of pupil intensity distributions for respective points on a surface to be illuminated.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A first embodiment of the present invention provides an illumination optical system which illuminates a surface to be illuminated with light from a light source, the illumination optical system comprising: a distribution forming optical system having an optical integrator and forming a pupil intensity distribution on an illumination pupil located behind the optical integrator; and an optical attenuator arranged on a predetermined surface in an optical path behind the optical integrator and having an attenuation characteristic of varying an attenuation rate depending upon an angle of incidence to the predetermined surface.

In the first embodiment of the present invention, the illumination optical system may be configured as follows: the optical attenuator has a light shield member arranged at a position immediately in front of or behind the illumination pupil; the light shield member is so configured that the attenuation rate of light toward a point on the surface to be illuminated, by the light shield member increases from a center to a peripheral region of the surface to be illuminated.

In the first embodiment of the present invention, the illumination optical system may be configured as follows: the optical attenuator has at least two light shield members arranged at a position immediately in front of or behind the illumination pupil and extending so as to intersect with each other along a plane substantially parallel to a plane of the illumination pupil; the at least two light shield members are so configured that the attenuation rate of light toward a point on the surface to be illuminated, by the at least two light shield members increases from a center to a peripheral region of the surface to be illuminated.

In the first embodiment of the present invention, the illumination optical system may be configured as follows: the optical attenuator has an optically transparent substrate arranged at a position immediately in front of or behind the illumination pupil located behind the optical integrator and having a linear attenuation portion formed on at least one surface thereof; the linear attenuation portion has a size along a traveling direction of light and is so configured that the attenuation rate of light toward a point on the surface to be illuminated, by the attenuation portion increases from a center to a peripheral region of the surface to be illuminated.

In the first embodiment of the present invention, the illumination optical system may be configured as follows: the optical integrator is of a wavefront division type and has a plurality of first refracting faces with a predetermined refracting power in a first direction in a plane perpendicular to the optical axis, and a plurality of second refracting faces with a predetermined refracting power in the first direction provided behind the plurality of first refracting faces so as to correspond to the plurality of first refracting faces; the optical attenuator has an attenuation portion provided between at least two adjacent second refracting faces out of the plurality of second refracting faces of the optical integrator and having an attenuation characteristic of increasing the attenuation rate with increasing distance of a position of light reaching the surface to be illuminated, along the first direction from a center of the surface to be illuminated.

In the first embodiment of the present invention, the illumination optical system may be configured as follows: the optical integrator is of a wavefront division type; the optical attenuator has an attenuation portion arranged immediately behind a boundary line between at least two adjacent second refracting faces out of a plurality of second refracting faces of the optical integrator provided so as to correspond to a plurality of first refracting faces of the optical integrator having a predetermined refracting power in a first direction in a plane perpendicular to the optical axis, behind the plurality of first refracting faces, and having a predetermined refracting power in the first direction, the attenuation portion having an attenuation characteristic of increasing the attenuation rate with increasing distance of a position of light reaching the surface to be illuminated, along the first direction from a center of the surface to be illuminated.

In the first embodiment of the present invention, the illumination optical system may be configured as follows: the optical integrator has a plurality of transmissive lens faces arrayed in a surface crossing a traveling direction of incident light; the optical attenuator has a light shield member arranged as an independent article of a light shield material at a position corresponding to a non-lens region between the lens faces adjacent to each other in the optical integrator.

In the first embodiment of the present invention, the illumination optical system may be configured as follows: the optical attenuator has an optically transparent substrate with a predetermined thickness along the optical axis, which is arranged in an illumination pupil space between an optical element with a power adjacent in front of the illumination pupil and an optical element with a power adjacent behind the illumination pupil; the substrate has a first attenuation pattern formed on a surface on an entrance side of light, and a second attenuation pattern formed on a surface on an exit side of light.

In the first embodiment of the present invention, the illumination optical system may be configured as follows: the optical attenuator has a first attenuation region formed on a first surface located in an illumination pupil space between an optical element with a power adjacent in front of the illumination pupil and an optical element with a power adjacent behind the illumination pupil, and a second attenuation region formed corresponding to the first attenuation region on a second surface located behind the first surface in the illumination pupil space; the first attenuation region and the second attenuation region impart an attenuation characteristic of monotonically decreasing the attenuation rate with change in an angle of incidence of light to the first surface, then keeping the attenuation rate substantially constant, and thereafter monotonically increasing the attenuation rate, to light passing through the first surface and the second surface.

In the first embodiment of the present invention, the illumination optical system may be configured as follows: the optical attenuator has an optically transparent first substrate with a predetermined thickness along the optical axis arranged in an illumination pupil space between an optical element with a power adjacent in front of the illumination pupil and an optical element with a power adjacent behind the illumination pupil, and an optically transparent second substrate with a predetermined thickness along the optical axis arranged behind the first substrate in the illumination pupil space; the first substrate has a first attenuation pattern formed on at least one surface out of a surface on an entrance side of light and a surface on an exit side of light; the second substrate has a second attenuation pattern formed on at least one surface out of a surface on an entrance side of light and a surface on an exit side of light; the first attenuation pattern has at least one first unit attenuation region; the second attenuation pattern has at least one second unit attenuation region formed corresponding to the at least one first unit attenuation region; the first unit attenuation region and the second unit attenuation region have an attenuation characteristic of varying the attenuation rate depending upon an angle of incidence of light to the optical attenuator.

A second embodiment of the present invention provides an exposure apparatus comprising the illumination optical system of the first embodiment for illuminating a predetermined pattern, which performs exposure of the predetermined pattern on a photosensitive substrate.

A third embodiment of the present invention provides a device manufacturing method comprising an exposure step of effecting the exposure of the predetermined pattern on the photosensitive substrate, using the exposure apparatus of the second embodiment; a development step of developing the photosensitive substrate on which the predetermined pattern has been transferred, to form a mask layer in a shape corresponding to the predetermined pattern on a surface of the photosensitive substrate; and a processing step of processing the surface of the photosensitive substrate through the mask layer.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 3 is a drawing showing a still exposure region of a rectangular shape formed on a wafer.

FIG. 45 is a drawing showing a state in which a light shield dot of a circular shape is formed on an entrance surface and a light shield dot of a ring shape is formed on an exit surface, as a unit attenuation region of a compensation filter according to the embodiment.

FIG. 54 is a drawing showing four filter regions forming a compensation filter according to a modification example of substantially uniformly adjusting pupil intensity distributions related to respective points without use of a density filter.

FIG. 55 is a drawing showing a state in which a light shield dot of a circular shape is formed on an entrance surface and on an exit surface, in a new pair of filter regions in the modification example of FIG. 54.

FIG. 61 is a drawing showing an example using a scattering region or diffractive region as a unit attenuation region in a configuration corresponding to the modification example of FIG. 55.

FIG. 63 is a drawing showing a state in which a light shield dot of a circular shape is formed on each of an entrance surface and an exit surface, as a unit attenuation region of a compensation filter according to the embodiment.

FIG. 72 is a drawing showing a configuration example of a unit attenuation region formed separately from the unit attenuation region of the embodiment.

FIG. 80 is a drawing showing a state in which a pupil intensity distribution of a quadrupolar shape with a relatively large illumination NA is formed and in which a pupil intensity distribution of a quadrupolar shape with a relatively small illumination NA is formed.

FIG. 87 is a drawing to illustrate a configuration and action of an attenuation portion provided in the cylindrical micro fly's eye lens of FIG. 82.

FIG. 93 is a drawing schematically showing a configuration of an attenuation portion provided in the cylindrical micro fly's eye lens of FIG. 92.

FIG. 102 is a drawing showing a configuration example using light shield members of a rectangular cross section.

FIG. 103 is a drawing showing a configuration example using light shield members extending locally in a state in which the light shield members are supported at only one end thereof.

FIG. 104 is a drawing showing a configuration example using light shield members of a cross section varying along the longitudinal direction.

FIG. 105 is a drawing showing a first configuration example permitting change in position or posture of light shield members.

FIG. 106 is a drawing showing a second configuration example permitting change in position or posture of light shield members.

FIG. 107 is a drawing showing a third configuration example permitting change in position or posture of light shield members.

FIG. 108 is a drawing showing a fourth configuration example permitting change in position or posture of light shield members.

FIG. 109 is a drawing showing a fifth configuration example permitting change in position or posture of light shield members.

FIG. 110 is a drawing showing a sixth configuration example permitting change in position or posture of light shield members.

FIG. 111A is a drawing showing an example of a driving mechanism for changing the position or posture of light shield members.

FIG. 111B is a drawing showing an example of a driving mechanism for changing the position or posture of light shield members.

FIG. 112 is a drawing schematically showing a configuration of a projection optical system according to a modification example of the embodiment.

FIG. 113 is a drawing schematically showing a configuration of a projection optical system according to another modification example of the embodiment.

DESCRIPTION

First Embodiment

Figure 1:
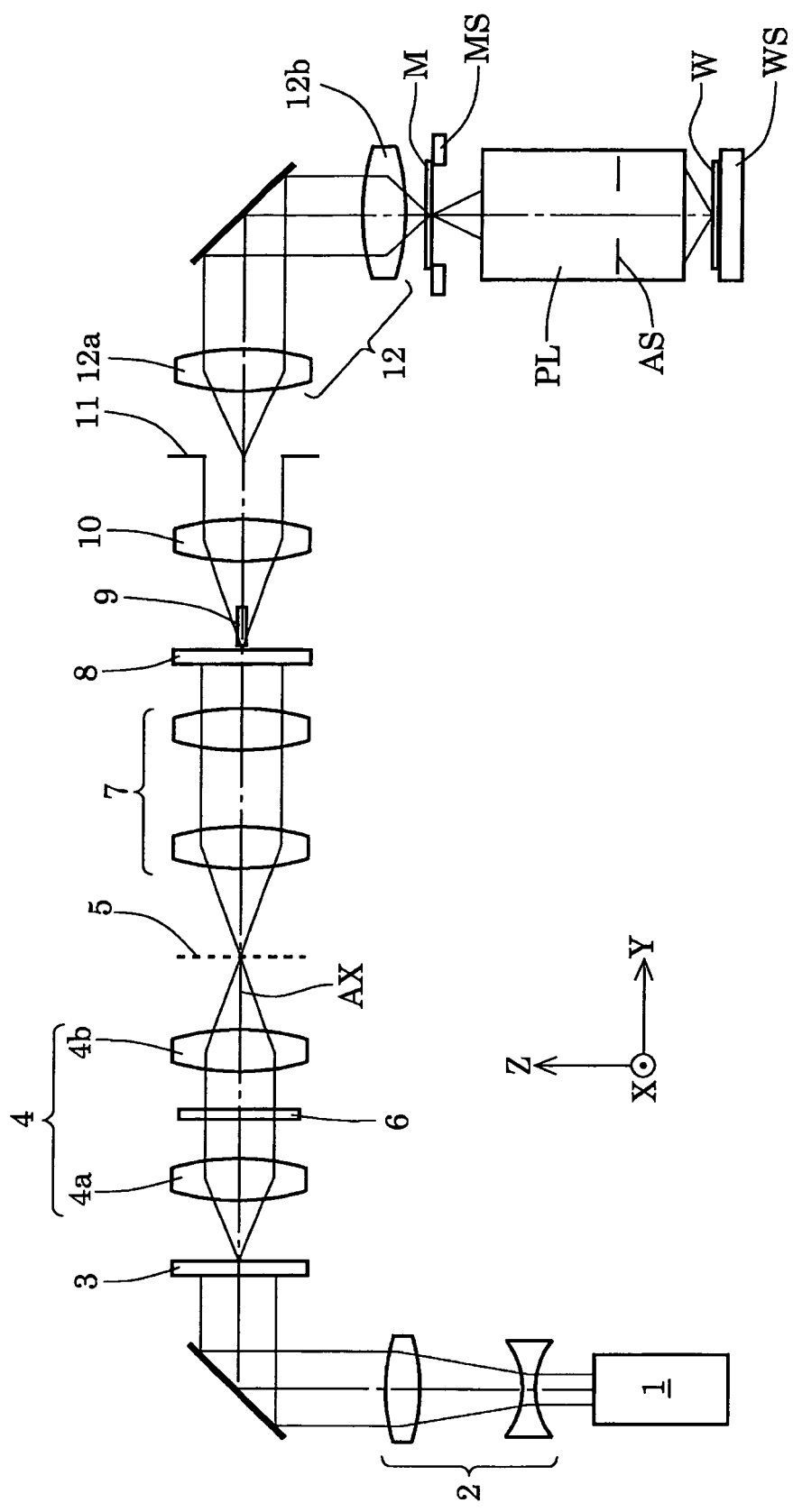
FIG. 1 is a drawing schematically showing a configuration of an exposure apparatus according to an embodiment of the present invention.

The first embodiment of the present invention will be described on the basis of the accompanying drawings. FIG. 1 is a drawing schematically showing a configuration of an exposure apparatus according to the first embodiment. In FIG. 1, the Z-axis is set along a direction of a normal to an exposure surface (transfer surface) of a wafer W being a photosensitive substrate, the Y-axis along a direction parallel to the plane of FIG. 1 in the exposure surface of the wafer W, and the X-axis along a direction perpendicular to the plane of FIG. 1 in the exposure surface of the wafer W.

With reference to FIG. 1, exposure light (illumination light) is supplied from a light source 1 in the exposure apparatus of the present embodiment. The light source 1 can be, for example, an ArF excimer laser light source to supply light at the wavelength of 193 nm or a KrF excimer laser light source to supply light at the wavelength of 248 nm. The light beam emitted from the light source 1 is converted into a beam of a required sectional shape by a shaping optical system 2 and thereafter the shaped beam travels, for example, through a diffractive optical element 3 for annular illumination to enter an afocal lens 4.

The afocal lens 4 is an afocal system (afocal optic) which is so set that a front focal point thereof agrees approximately with the position of the diffractive optical element 3 and that a rear focal point thereof agrees approximately with a position of a predetermined plane 5 indicated by a dashed line in the drawing. The diffractive optical element 3 is made by forming level differences at the pitch nearly equal to the wavelength of the exposure light (illumination light) on a substrate and has an action to diffract an incident beam at desired angles. Specifically, the diffractive optical element 3 for annular illumination has such a function that when a parallel beam with a rectangular cross section is incident thereto, it forms a light intensity distribution of an annular shape in its far field (or Fraunhofer diffractive region).

Therefore, the nearly parallel beam incident to the diffractive optical element 3 forms a light intensity distribution of an annular shape on a pupil plane of the afocal lens 4 and thereafter it is emitted in an annular angle distribution from the afocal lens 4. In the optical path between front lens unit 4a and rear lens unit 4b of the afocal lens 4, there is a compensation filter 6 arranged at or near the pupil position of the afocal lens 4. The compensation filter 6 has a form of a plane-parallel plate and a dense pattern of light shield dots of chromium, chromium oxide, or the like is formed on its optical surface. Namely, the compensation filter 6 has a transmittance distribution of different transmittances depending upon positions of incidence of light. A specific action of the compensation filter 6 will be described later.

The light having passed through the afocal lens 4 travels through a zoom lens 7 for varying the σ value (σ value=mask-side numerical aperture of the illumination optical system/mask-side numerical aperture of the projection optical system), to enter a micro fly's eye lens (or fly's eye lens) 8 as an optical integrator. The micro fly's eye lens 8 is, for example, an optical element consisting of a large number of micro lenses with a positive refracting power arrayed vertically and horizontally and densely, and is made by forming the micro lens group by etching of a plane-parallel plate.

Each micro lens forming the micro fly's eye lens is smaller than each lens element forming the fly's eye lens. In the micro fly's eye lens, different from the fly's eye lens consisting of lens elements isolated from each other, the large number of micro lenses (micro refracting faces) are integrally formed without being isolated from each other. However, the micro fly's eye lens is an optical integrator of the same wavefront division type as the fly's eye lens in that the lens elements with the positive refracting power are vertically and horizontally arranged. It is also possible to use, for example, a cylindrical micro fly's eye lens as the micro fly's eye lens 8. The configuration and action of the cylindrical micro fly's eye lens are disclosed, for example, in U.S. Pat. No. 6,913,373. The teachings of U.S. Pat. No. 6,913,373 are incorporated herein by reference.

The position of the predetermined plane 5 is arranged at or near the front focal point of the zoom lens 7 and an entrance surface of the micro fly's eye lens 8 is arranged at or near the rear focal point of the zoom lens 7. In other words, the zoom lens 7 arranges the predetermined plane 5 and the entrance surface of the micro fly's eye lens 8 substantially in a relation of Fourier transform and, in turn, arranges the pupil plane of the afocal lens 4 and the entrance surface of the micro fly's eye lens 8 so as to be substantially optically conjugate with each other.

Therefore, for example, an annular illumination field centered on the optical axis AX is formed on the entrance surface of the micro fly's eye lens 8 as on the pupil plane of the afocal lens 4. The overall shape of this annular illumination field similarly varies depending upon the focal length of the zoom lens 7. An entrance face of each micro lens (i.e., a unit wavefront division face) in the micro fly's eye lens 8 is, for example, a rectangular shape having the long sides along the Z-direction and the short sides along the X-direction and rectangular shape similar to a shape of an illumination region to be formed on the mask M (and, therefore, similar to a shape of an exposure region to be formed on the wafer W).

The beam incident to the micro fly's eye lens 8 is two-dimensionally divided to form a secondary light source with a light intensity distribution substantially identical to the illumination field formed on the entrance surface of the micro fly's eye lens 8, i.e., a secondary light source (pupil intensity distribution) consisting of a substantial surface illuminant of an annular shape centered on the optical axis AX, at the rear focal plane thereof or at a position near it (therefore, at the position of the illumination pupil). A fin member 9 is arranged as a light shield member at or near the rear focal plane of the micro fly's eye lens 8. The configuration and action of the fin member 9 will be described later.

An illumination aperture stop (not shown) having an annular aperture region (light transmitting portion) corresponding to the annular secondary light source is arranged, if necessary, at or near the rear focal plane of the micro fly's eye lens 8. The illumination aperture stop is configured so as to be freely inserted into or retracted from the illumination optical path and so as to be switchable with a plurality of aperture stops having respective aperture regions of different sizes and shapes. A switching method of the aperture stops can be, for example, a well-known turret method, slide method, or the like. The illumination aperture stop is arranged at a position substantially optically conjugate with an entrance pupil plane of projection optical system PL described below, to define a range for the secondary light source to contribute to illumination.

The light having passed via the micro fly's eye lens 8 and the fin member 9 travels through a condenser optical system 10 to superposedly illuminate a mask blind 11. In this manner, a rectangular illumination field according to the shape and focal length of the micro lenses of the micro fly's eye lens 8 is formed on the mask blind 11 as an illumination field stop. The light having passed through a rectangular aperture region (light transmitting portion) of the mask blind 11 travels through an imaging optical system 12 consisting of a front lens unit 12a and a rear lens unit 12b, to superposedly illuminate the mask M on which a predetermined pattern is formed. Namely, the imaging optical system 12 forms an image of the rectangular aperture region of the mask blind 11 on the mask M.

The pattern to be transferred is formed on the mask M held on a mask stage MS and is illuminated in a pattern region of a rectangular shape (slit shape) having the long sides along the Y-direction and the short sides along the X-direction in the entire pattern region. Light transmitted by the pattern region of the mask M travels through the projection optical system PL to form an image of the mask pattern on the wafer (photosensitive substrate) W held on a wafer stage WS. Namely, the pattern image is also formed in a still exposure region (effective exposure region) of a rectangular shape having the long sides along the Y-direction and the short sides along the X-direction on the wafer W, so as to optically correspond to the rectangular illumination region on the mask M.

In this configuration, the mask stage MS and the wafer stage WS and, therefore, the mask M and wafer W are synchronously moved (scanned) along the X-direction (scanning direction) in the plane (XY plane) perpendicular to the optical axis AX of the projection optical system PL in accordance with the so-called step-and-scan method, whereby scanning exposure of the mask pattern is effected in a shot area (exposure region) having a width equal to a Y-directional size of the still exposure region and a length according to a scan distance (movement distance) of the wafer W, on the wafer W.

In the present embodiment, as described above, the mask M arranged on the surface to be illuminated, of the illumination optical system (2-12) is illuminated by Köhler illumination, using as a light source the secondary light source formed by the micro fly's eye lens 8. For this reason, the position where the secondary light source is formed is optically conjugate with a position of an aperture stop AS of the projection optical system PL and the forming position of the secondary light source can be called an illumination pupil plane of the illumination optical system (2-12). Typically, the surface to be illuminated (the surface where the mask M is arranged, or the surface where the wafer W is arranged in the case where the illumination optical system is considered to include the projection optical system PL) becomes an optical Fourier transform surface of the illumination pupil plane.

A pupil intensity distribution is a light intensity distribution (luminance distribution) on the illumination pupil plane of the illumination optical system (2-12) or on a plane optically conjugate with the illumination pupil plane. If the number of wavefront divisions by the micro fly's eye lens 8 is relatively large, there is a high correlation between a global light intensity distribution formed on the entrance surface of the micro fly's eye lens 8 and a global light intensity distribution (pupil intensity distribution) of the entire secondary light source. For this reason, light intensity distributions on the entrance surface of the micro fly's eye lens 8 and on a plane optically conjugate with the entrance surface can also be called pupil intensity distributions. In the configuration of FIG. 1, the diffractive optical element 3, afocal lens 4, zoom lens 7, and micro fly's eye lens 8 constitute a distribution forming optical system to form the pupil intensity distribution on the illumination pupil located behind the micro fly's eye lens 8.

The diffractive optical element 3 for annular illumination may be replaced with another diffractive optical element (not shown) for multi-polar illumination (dipolar illumination, quadrupolar illumination, octupolar illumination, or the like) set in the illumination optical path, so as to implement the multi-polar illumination. The diffractive optical element for multi-polar illumination has such a function that when a parallel beam with a rectangular cross section is incident thereto, it forms a light intensity distribution of a multi-polar shape (dipolar shape, quadrupolar shape, octupolar shape, or the like) in its far field. Therefore, the beam having passed through the diffractive optical element for multi-polar illumination forms, for example, an illumination field of a multi-polar shape consisting of a plurality of illumination zones of a predetermined shape (arcuate shape, circular shape, or the like) centered on the optical axis AX, on the entrance surface of the micro fly's eye lens 8. As a consequence, a secondary light source of a multi-polar shape identical to the illumination field formed on the entrance surface is also formed on or near the rear focal plane of the micro fly's eye lens 8.

When a diffractive optical element for circular illumination (not shown) is set, instead of the diffractive optical element 3 for annular illumination, in the illumination optical path, ordinary circular illumination can be implemented. The diffractive optical element for circular illumination has such a function that when a parallel beam with a rectangular cross section is incident thereto, it forms a light intensity distribution of a circular shape in its far field. Therefore, a beam having passed through the diffractive optical element for circular illumination forms, for example, an illumination field of a circular shape centered on the optical axis AX, on the entrance surface of the micro fly's eye lens 8. As a consequence, a secondary light source of a circular shape identical to the illumination field formed on the entrance surface is also formed on or near the rear focal plane of the micro fly's eye lens 8. Furthermore, modified illuminations of various forms can also be implemented by setting a diffractive optical element with an appropriate property (not shown) in the illumination optical path, instead of the diffractive optical element 3 for annular illumination. A switching method of diffractive optical element 3 can be, for example, a well-known turret method, slide method, or the like.

Figure 2:
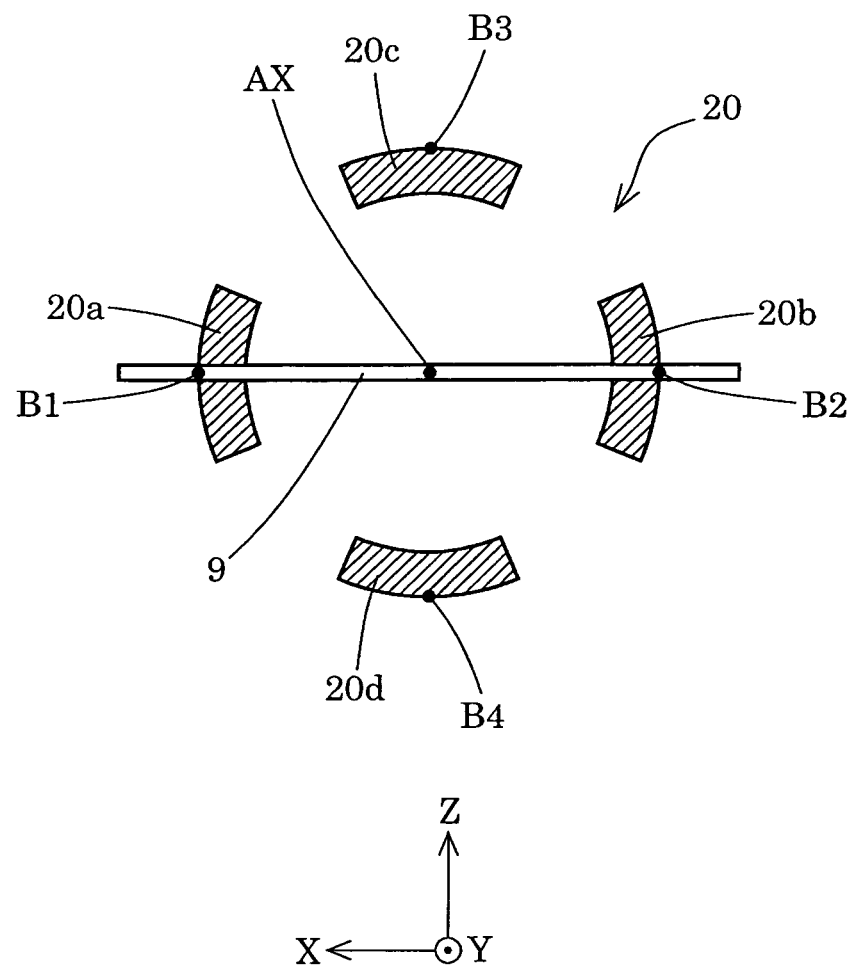
FIG. 2 is a drawing showing a secondary light source of a quadrupolar shape formed on an illumination pupil.

It is assumed in the description hereinafter, for easier understanding of the action and effect of the present embodiment, that a pupil intensity distribution (secondary light source) 20 of a quadrupolar shape as shown in FIG. 2 is formed on the rear focal plane of the micro fly's eye lens 8 or on the illumination pupil near it. It is also assumed that the single fin member 9 is arranged immediately behind the plane where the pupil intensity distribution 20 of the quadrupolar shape is formed. When the "illumination pupil" is simply used in the description hereinafter, it means the rear focal plane of the micro fly's eye lens 8 or the illumination pupil near it.

With reference to FIG. 2, the pupil intensity distribution 20 of the quadrupolar shape formed on the illumination pupil has a pair of substantial surface illuminants of an arcuate shape (which will be referred to simply as "surface illuminants") 20a, 20b spaced in the X-direction on both sides of the optical axis AX, and a pair of substantial surface illuminants 20c, 20d of an arcuate shape spaced in the Z-direction on both sides of the optical axis AX. The X-direction on the illumination pupil is the short-side direction of the rectangular micro lenses of the micro fly's eye lens 8 and corresponds to the scanning direction of the wafer W. The Z-direction on the illumination pupil is the long-side direction of the rectangular micro lenses of the micro fly's eye lens 8 and corresponds to an orthogonal-to-scan direction (the Y-direction on the wafer W) perpendicular to the scanning direction of the wafer W.

As shown in FIG. 3, a still exposure region ER of a rectangular shape having the long sides along the Y-direction and the short sides along the X-direction is formed on the wafer W and a rectangular illumination region (not shown) is formed on the mask M so as to correspond to this still exposure region ER. It is noted herein that the quadrupolar pupil intensity distribution formed on the illumination pupil by light incident to a point in the still exposure region ER has much the same shape, independent of positions of incident points. However, light intensities of respective surface illuminants forming the quadrupolar pupil intensity distribution tend to differ depending upon positions of incident points.

Figure 4:
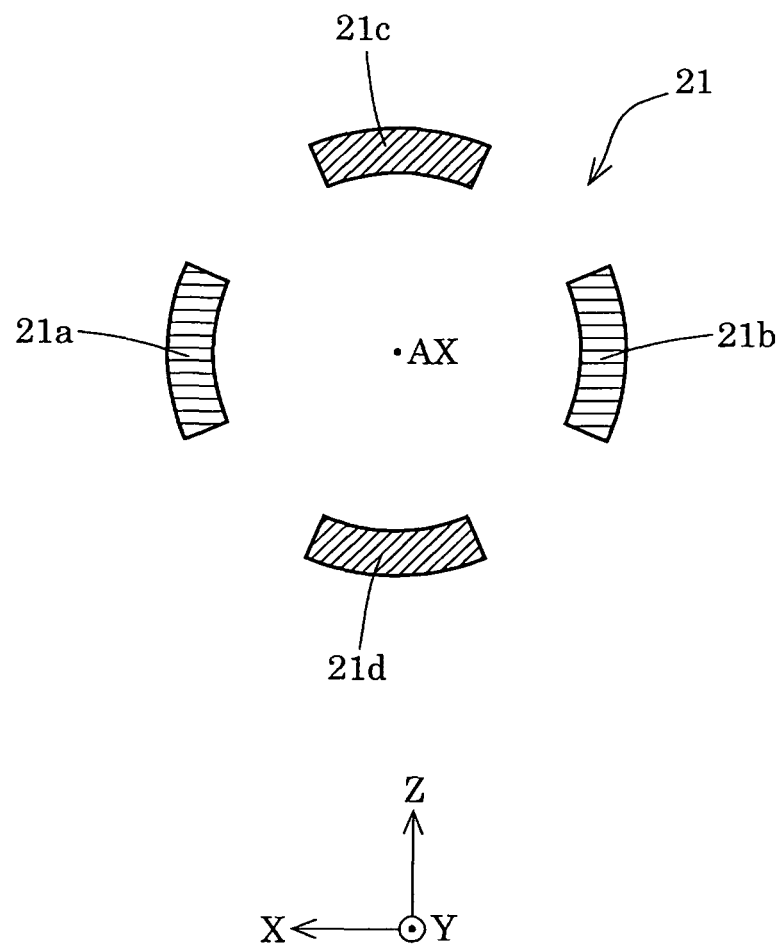
FIG. 4 is a drawing to illustrate a property of a pupil intensity distribution of a quadrupolar shape formed by light incident to a center point P1 in the still exposure region.
Figure 5:
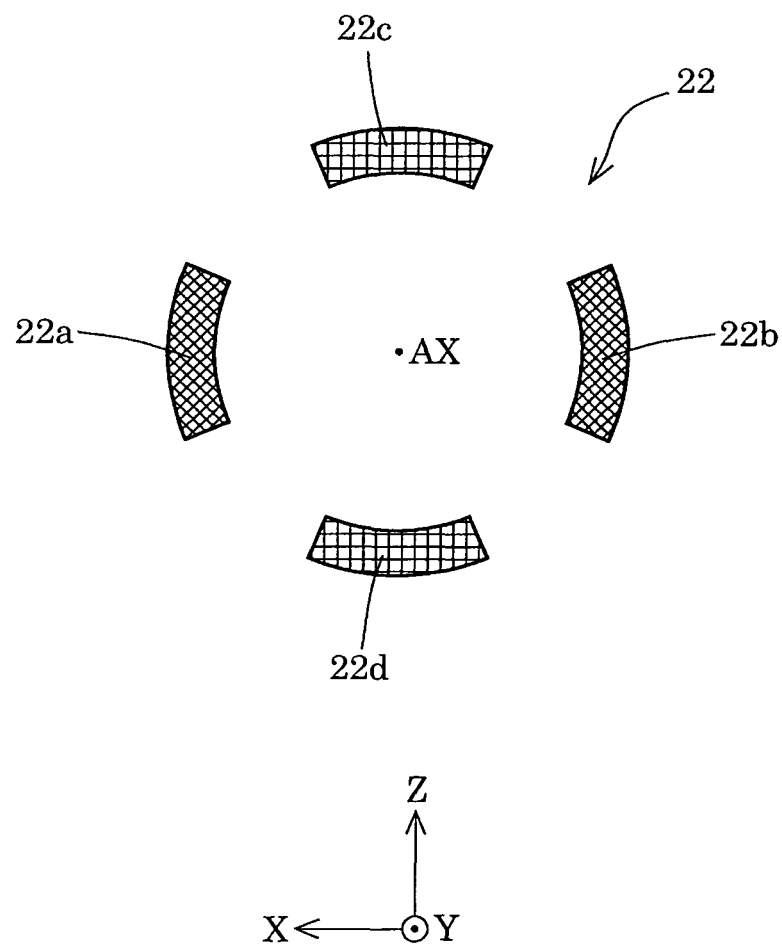
FIG. 5 is a drawing to illustrate a property of a pupil intensity distribution of a quadrupolar shape formed by light incident to peripheral points P2, P3 in the still exposure region.

Specifically, in the case of a quadrupolar pupil intensity distribution 21 formed by light incident to a center point P1 in the still exposure region ER, as shown in FIG. 4, the light intensity of surface illuminants 21c and 21d spaced in the Z-direction tends to become larger than the light intensity of surface illuminants 21a and 21b spaced in the X-direction. On the other hand, in the case of a quadrupolar pupil intensity distribution 22 formed by light incident to peripheral points P2, P3 spaced in the Y-direction apart from the center point P1 in the still exposure region ER, as shown in FIG. 5, the light intensity of surface illuminants 22c and 22d spaced in the Z-direction tends to become smaller than the light intensity of surface illuminants 22a and 22b spaced in the X-direction.

Figure 6A:
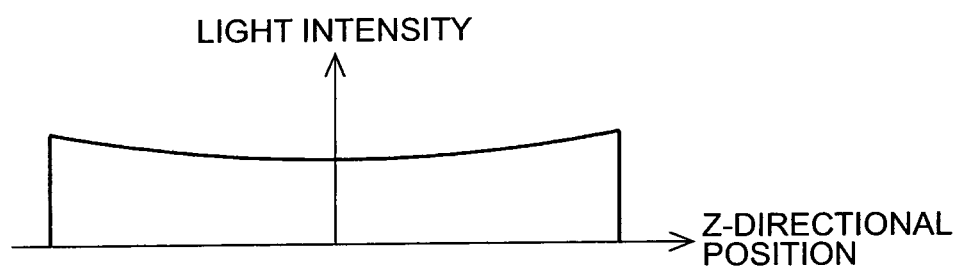
FIG. 6A is a drawing schematically showing a light intensity profile along the Z-direction of the pupil intensity distribution related to the center point P1.
Figure 6B:
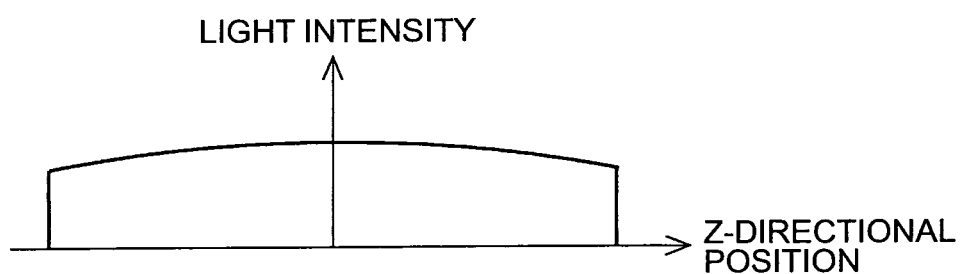
FIG. 6B is a drawing schematically showing a light intensity profile along the Z-direction of the pupil intensity distribution related to the peripheral points P2, P3.

In general, regardless of the contour of the pupil intensity distribution formed on the illumination pupil, a light intensity profile along the Z-direction of the pupil intensity distribution related to the center point P1 in the still exposure region ER on the wafer W (the pupil intensity distribution formed on the illumination pupil by the light incident to the center point P1) has a profile of a concave curve shape in which the intensity is minimum in the center and increases toward the periphery, as shown in FIG. 6A. On the other hand, a light intensity profile along the Z-direction of the pupil intensity distribution related to the peripheral points P2, P3 in the still exposure region ER on the wafer W has a profile of a convex curve shape in which the intensity is maximum in the center and decreases toward the periphery, as shown in FIG. 6B.

The light intensity profile along the Z-direction of the pupil intensity distribution is not very dependent on positions of incident points along the X-direction (scanning direction) in the still exposure region ER, but tends to vary depending upon positions of incident points along the Y-direction (orthogonal-to-scan direction) in the still exposure region ER. When each of the pupil intensity distributions related to respective points in the still exposure region ER on the wafer W (pupil intensity distributions formed on the illumination pupil by light incident to respective points) is not substantially uniform as in this case, the line width of the pattern varies depending upon positions on the wafer W, so as to fail in faithfully transferring the micro pattern of the mask M in a desired line width across the entire exposure region on the wafer W.

In the present embodiment, as described above, the compensation filter 6 with the transmittance distribution of different transmittances depending upon positions of incidence of light is arranged at or near the pupil position of the afocal lens 4. The pupil position of the afocal lens 4 is optically conjugate with the entrance surface of the micro fly's eye lens 8 by virtue of the rear lens unit 4b of the afocal lens 4 and the zoom lens 7. Therefore, the light intensity distribution formed on the entrance surface of the micro fly's eye lens 8 is adjusted (or corrected) by the action of the compensation filter 6 and, in turn, the pupil intensity distribution formed on the rear focal plane of the micro fly's eye lens 8 or on the illumination pupil near it is also adjusted.

However, the compensation filter 6 equally adjusts the pupil intensity distributions related to respective points in the still exposure region ER on the wafer W, independent of positions of the respective points. As a consequence, it is possible, for example, to adjust the quadrupolar pupil intensity distribution 21 related to the center point P1, to a substantially uniform distribution and, in turn, to make the light intensities of the respective surface illuminants 21a-21d approximately equal to each other by the action of the compensation filter 6, but in that case, the difference becomes larger on the contrary between the light intensities of the surface illuminants 22a, 22b and the surface illuminants 22c, 22d of the quadrupolar pupil intensity distribution 22 related to the peripheral points P2, P3.

Namely, in order to substantially uniformly adjust each of the pupil intensity distributions related to the respective points in the still exposure region ER on the wafer W by the action of the compensation filter 6, the pupil intensity distributions related to the respective points may be adjusted to distributions of mutually identical properties by another means different from the compensation filter 6. Specifically, for example, in the pupil intensity distribution 21 related to the center point P1 and the pupil intensity distribution 22 related to the peripheral points P2, P3, the magnitude relation of light intensities between the surface illuminants 21a, 21b and the surface illuminants 21c, 21d and the magnitude relation of light intensities between the surface illuminants 22a, 22b and the surface illuminants 22c, 22d may be made coincident at a nearly equal ratio.

Figure 7:
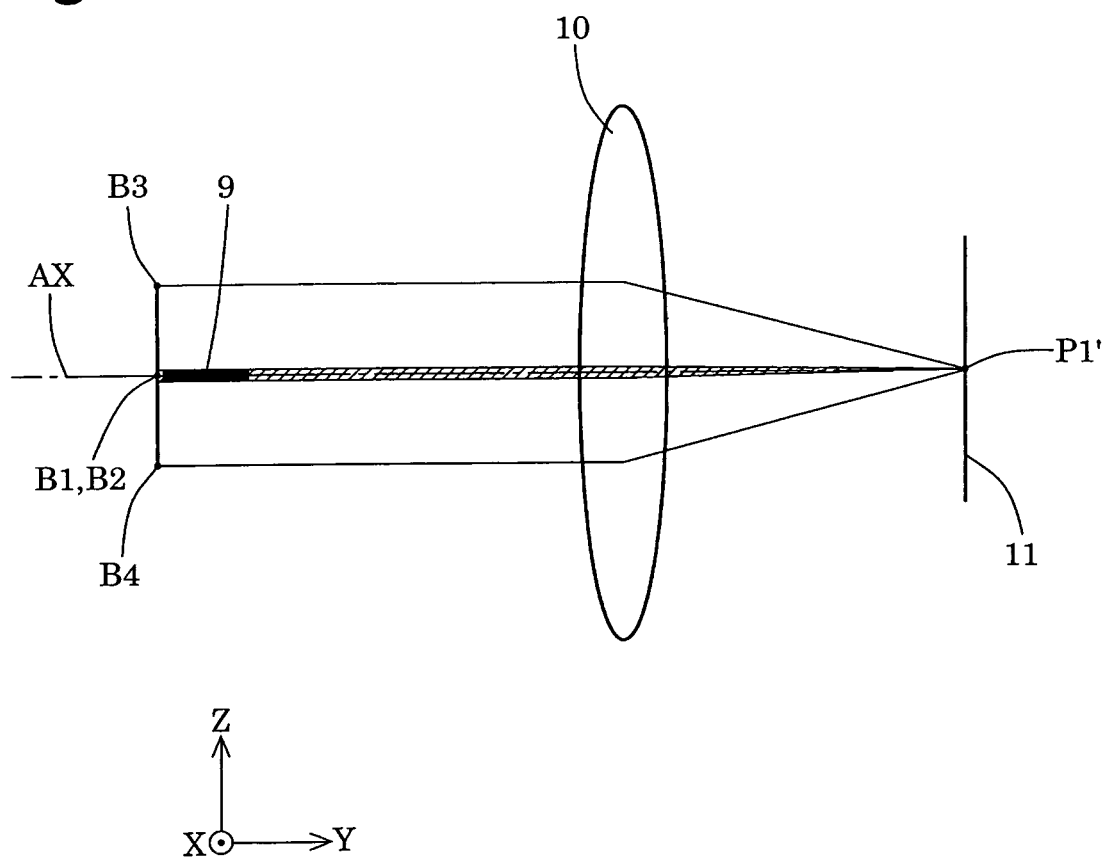
FIG. 7 is a first drawing to illustrate an action of a fin member in the embodiment.
Figure 8:
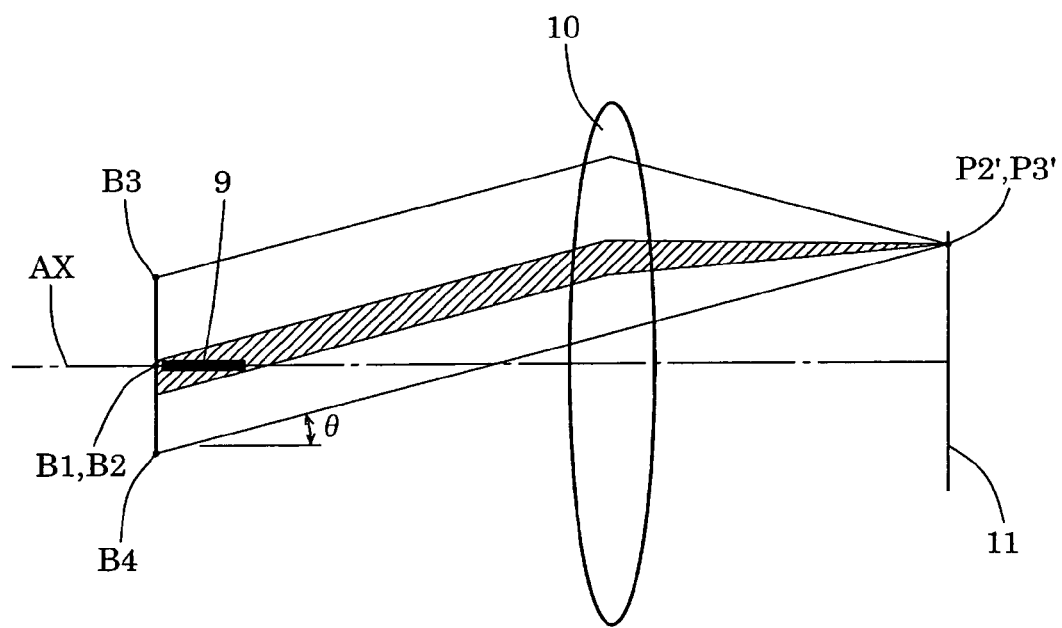
FIG. 8 is a second drawing to illustrate an action of the fin member in the embodiment.
Figure 9:
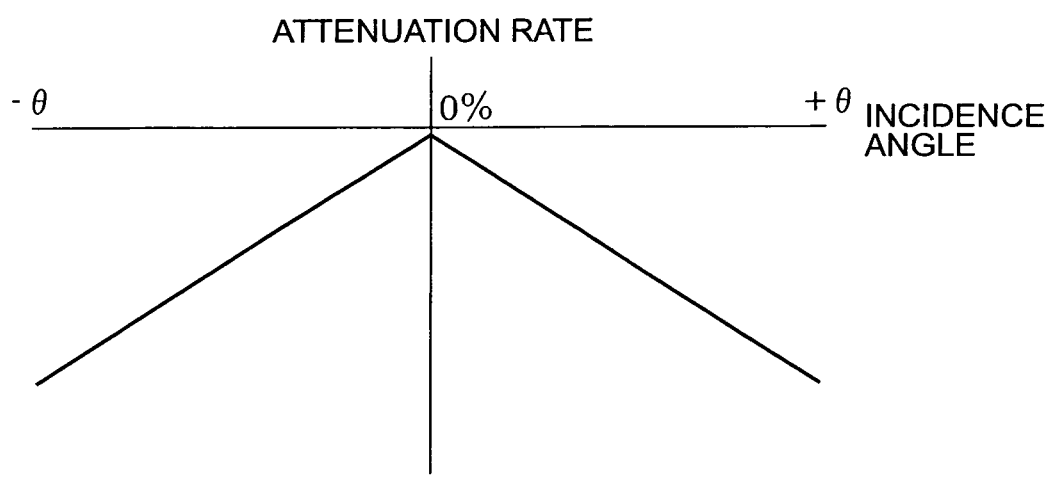
FIG. 9 is a drawing showing an attenuation characteristic of the fin member in the embodiment.

In the present embodiment, in order to make the property of the pupil intensity distribution related to the center point P1 approximately coincident with the property of the pupil intensity distribution related to the peripheral points P2, P3, the fin member 9 is provided as a light shield member for realizing such adjustment that the light intensity of the surface illuminants 22a, 22b becomes smaller than the light intensity of the surface illuminants 22c, 22d in the pupil intensity distribution 22 related to the peripheral points P2, P3. FIGS. 7 and 8 are drawings to illustrate the action of the fin member 9 in the present embodiment. FIG. 9 is a drawing showing the attenuation characteristic of the fin member 9 in the present embodiment.

The fin member 9, as shown in FIG. 2, has a plate-like form and is positioned along the X-direction so as to correspond to a pair of surface illuminants 20a, 20b spaced in the X-direction on both sides of the optical axis AX. Specifically, the fin member 9 has, for example, a contour in the form of a rectangular plane-parallel plate and is so arranged that its thickness direction (Z-direction) is substantially parallel to the plane of the illumination pupil (XZ plane) and that its width direction (Y-direction) is substantially parallel to the direction of the optical axis AX. Namely, the thickness direction of the fin member 9 agrees approximately with the long-side direction of the rectangular unit wavefront division faces of the micro fly's eye lens 8.

Therefore, of the quadrupolar pupil intensity distribution 20, light from the surface illuminants 20a and 20b is subjected to the action of the fin member 9, while light from the surface illuminants 20c and 20d is not subjected to the action of the fin member 9. In this case, as shown in FIG. 7, light reaching the center point P1 in the still exposure region ER on the wafer W, i.e., light reaching a center point P1' of the aperture of the mask blind 11 is incident at the incidence angle of 0 to the XZ plane on the end face on the illumination pupil side of the fin member 9, and thus only a small quantity of light is blocked by the fin member 9. In other words, the attenuation rate of the fin member 9 becomes a value close to 0% for the light from the surface illuminants 21a and 21b of the pupil intensity distribution 21 related to the center point P1.

On the other hand, as shown in FIG. 8, light reaching the peripheral points P2, P3 in the still exposure region ER on the wafer W. i.e., light reaching peripheral points P2', P3' of the aperture of the mask blind 11 is incident at incidence angles ±θ to the XZ plane on the end face on the illumination pupil side of the fin member 9, and thus a relatively large quantity of light is blocked by the fin member 9. In other words, the attenuation rate of the fin member 9 becomes a relatively large value according to the magnitude of the absolute value of the incidence angles ±θ for the light from the surface illuminants 22a and 22b of the pupil intensity distribution 22 related to the peripheral points P2, P3.

As described above, the attenuation rate of the fin member 9 for light toward a point on the still exposure region ER being a surface to be illuminated is defined so as to increase according to the magnitude of the absolute value of the incidence angle to the XZ plane on the end face on the illumination pupil side of the fin member 9, i.e., so as to increase from the center to the periphery of the still exposure region ER, as shown in FIG. 9. More specifically, the fin member 9 as a light shield member is configured so that the attenuation rate increases from the center to the periphery of the still exposure region ER along the long-side direction of the rectangular unit wavefront division faces of the micro fly's eye lens 8 (Z-direction: Y-direction on the still exposure region ER).

In FIGS. 7 and 8, reference symbol B1 denotes an outermost edge point along the X-direction of the surface illuminant 20a (21a, 22a) (cf. FIG. 2) and reference symbol B2 an outermost edge point along the X-direction of the surface illuminant 20b (21b, 22b) (cf. FIG. 2). Furthermore, for easier understanding of the description associated with FIGS. 7 and 8, an outermost edge point along the Z-direction of the surface illuminant 20c (21c, 22c) is denoted by reference symbol B3 and an outermost edge point along the Z-direction of the surface illuminant 20d (21d, 22d) by reference symbol B4. However, as described above, the light from the surface illuminant 20c (21c, 22c) and the surface illuminant 20d (21d, 22d) is not subjected to the attenuation action of the fin member 9.

Figure 10:
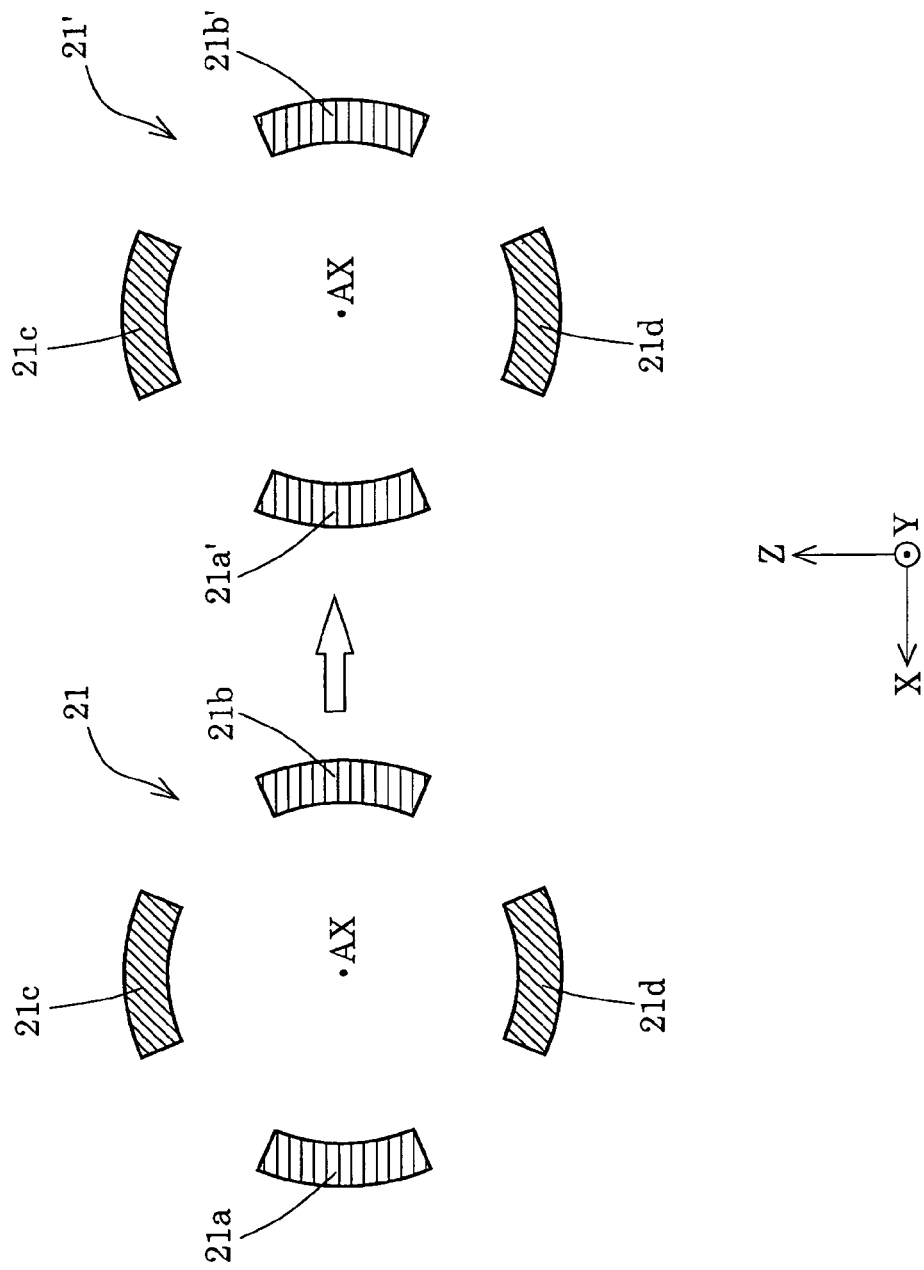
FIG. 10 is a drawing schematically showing how the pupil intensity distribution related to the center point P1 is adjusted by the fin member.

In this manner, the light from the surface illuminants 21a and 21b in the pupil intensity distribution 21 related to the center point P1 is subjected to the attenuation action of the fin member 9, but shows little change in the light intensity thereof. The light from the surface illuminants 21c and 21d is not subjected to the attenuation action of the fin member 9 and thus shows no change in its light intensity. As a result, even if the pupil intensity distribution 21 related to the center point P1 is subjected to the attenuation action of the fin member 9, as shown in FIG. 10, it is only slightly adjusted to a pupil intensity distribution 21' of a property nearly identical to that of the original distribution 21. Namely, the pupil intensity distribution 21' adjusted by the fin member 9 maintains the property that the light intensity of the surface illuminants 21*c*, 21*d* spaced in the Z-direction is larger than the light intensity of surface illuminants 21*a*', 21*b*' spaced in the X-direction.

Figure 11:
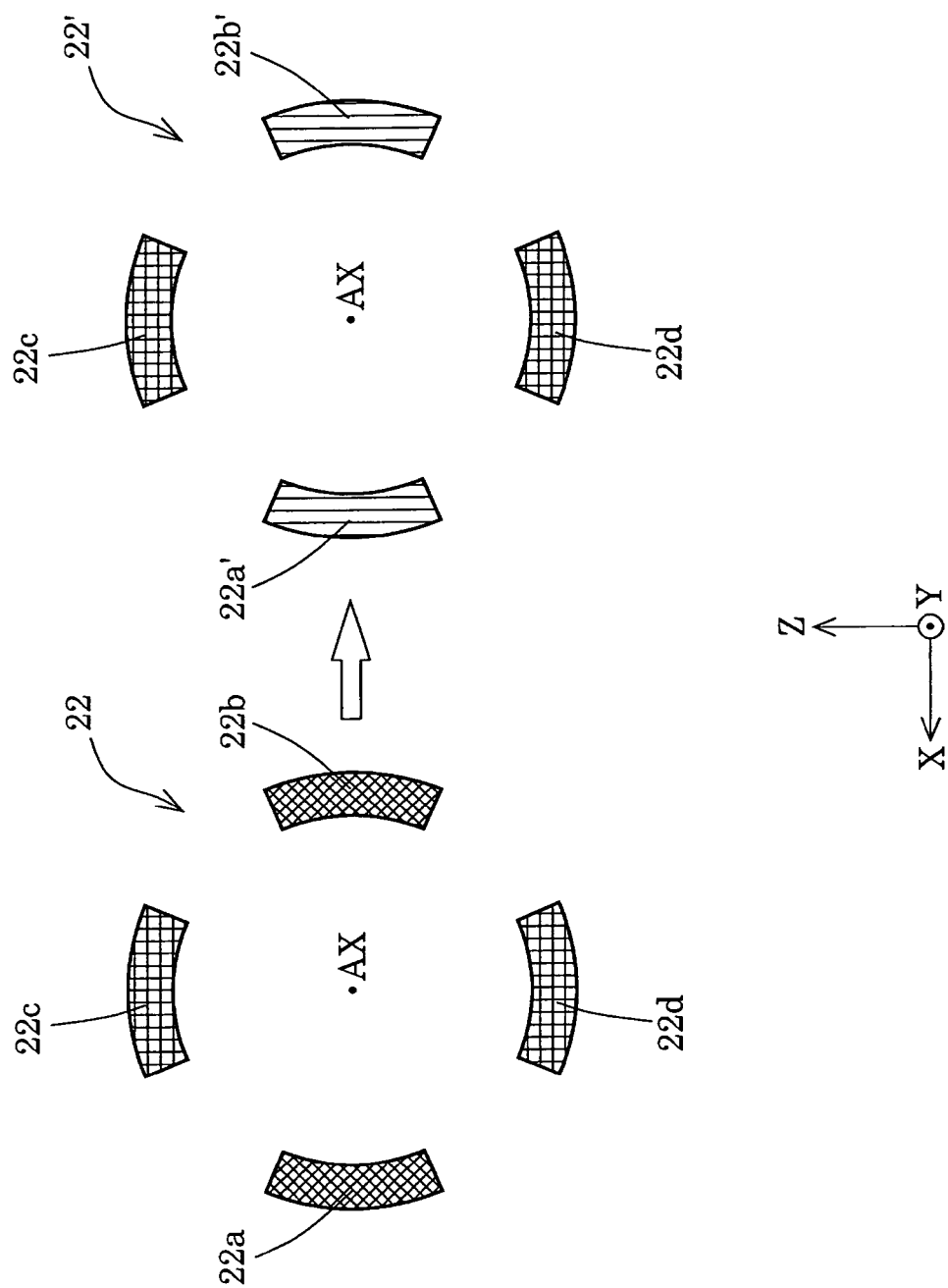
FIG. 11 is a drawing schematically showing how the pupil intensity distribution related to the peripheral points P2, P3 is adjusted by the fin member.

On the other hand, the light from the surface illuminants 22*a* and 22*b* in the pupil intensity distribution 22 related to the peripheral points P2, P3 is subjected to the attenuation action of the fin member 9 to decrease the light intensity thereof. Since the light from the surface illuminants 22*c* and 22*d* is not subjected to the attenuation action of the fin member 9, there is no change in the light intensity thereof. As a result, the pupil intensity distribution 22 related to the peripheral points P2, P3 is adjusted to a pupil intensity distribution 22' of a property different from that of the original distribution 22, as shown in FIG. 11, by the attenuation action of the fin member 9. Namely, the pupil intensity distribution 22' adjusted by the fin member 9 comes to have the property that the light intensity of the surface illuminants 22*c*, 22*d* spaced in the Z-direction is larger than the light intensity of surface illuminants 22*a*', 22*b*' spaced in the X-direction.

In this manner, the pupil intensity distribution 22 related to the peripheral points P2, P3 is adjusted to the distribution 22' of the property substantially identical to that of the pupil intensity distribution 21' related to the center point P1 by the attenuation action of the fin member 9. Similarly, the pupil intensity distributions related to respective points arranged along the Y-direction between the center point P1 and the peripheral points P2, P3 and, therefore, the pupil intensity distributions related to respective points in the still exposure region ER on the wafer W are also adjusted to distributions of nearly identical properties to that of the pupil intensity distribution 21' related to the center point P1. In other words, the pupil intensity distributions related to the respective points in the still exposure region ER on the wafer W are adjusted to distributions of substantially mutually identical properties by the attenuation action of the fin member 9. In still another expression, the fin member 9 has the required attenuation characteristic necessary for adjusting the pupil intensity distributions related to the respective points, to distributions of substantially mutually identical properties.

In the illumination optical system of the present embodiment, as described above, the pupil intensity distributions related to the respective points each are substantially uniformly adjusted through collaboration between the fin member 9 with the required attenuation characteristic varying depending upon the position of incidence of light to the still exposure region ER on the wafer W, to independently adjust each of the pupil intensity distributions related to the respective points in the still exposure region ER, and the compensation filter 6 to equally adjust the pupil intensity distributions related to the respective points in the still exposure region ER. Therefore, the exposure apparatus (2-WS) of the present embodiment is able to perform excellent exposure under an appropriate illumination condition according to the micro pattern of the mask M, using the illumination optical system (2-12) to substantially uniformly adjust each of the pupil intensity distributions for the respective points in the still exposure region ER on the wafer W, and therefore to faithfully transfer the micro pattern of the mask M in a desired line width across the entire exposure region on the wafer W.

It is considered in the present embodiment that the light quantity distribution on the wafer (surface to be illuminated) W is affected, for example, by the attenuation action (adjusting action) of the fin member 9. In this case, the illuminance distribution in the still exposure region ER or the shape of the still exposure region (illumination region) ER can be modified by action of a light quantity distribution adjuster having a known configuration if necessary. Specifically, the light quantity distribution adjuster to modify the illuminance distribution can be one using the configuration and technique described in Japanese Patent Applications Laid-open No. 2001-313250 and Laid-open No. 2002-100561 (and U.S. Pat. No. 6,771,350 and No. 6,927,836 corresponding thereto). The light quantity distribution adjuster to modify the shape of the illumination region can be one using the configuration and technique described in International Publication WO2005/048326 (and U.S. Pat. Published Application No. 2007/0014112 corresponding thereto). The teachings of U.S. Pat. No. 6,771,350, U.S. Pat. No. 6,927,836, and U.S. Pat. Published Application No. 2007/0014112 are incorporated herein by reference.

Figure 12A:
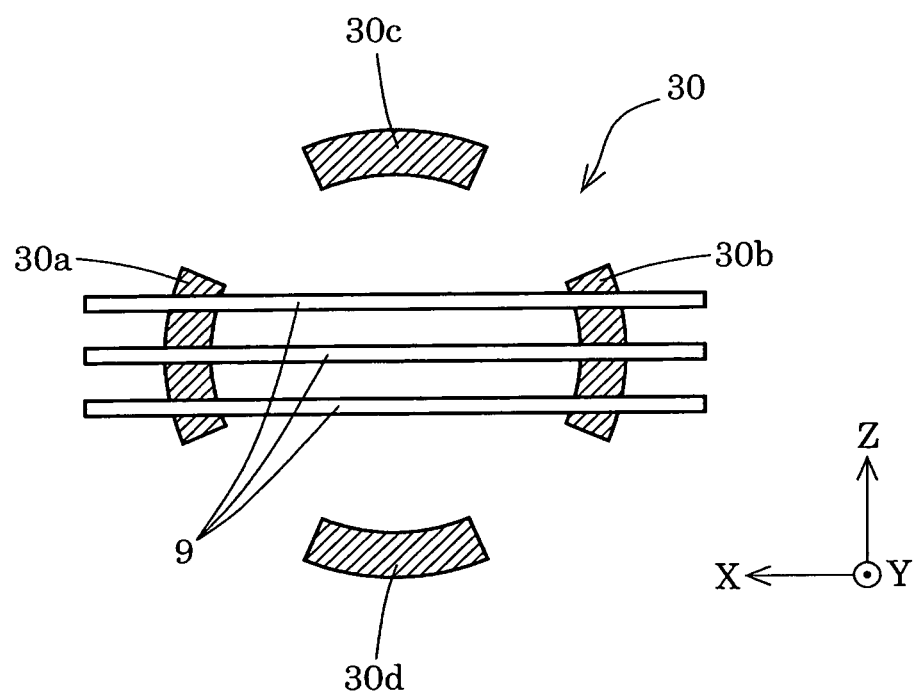
FIG. 12A is a drawing showing a state in which a plurality of fin members are arranged relative to a pupil intensity distribution of a quadrupolar shape with a large outside diameter.
Figure 12B:
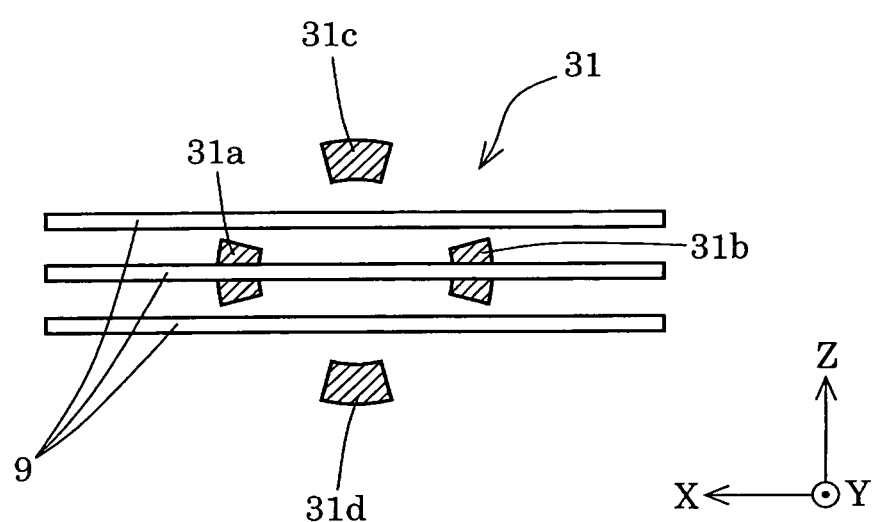
FIG. 12B is a drawing showing a state in which a plurality of fin members are arranged relative to a pupil intensity distribution of a quadrupolar shape with a small outside diameter.

In the above-described first embodiment, the single fin member 9 is arranged immediately behind the plane where the quadrupolar pupil intensity distribution 20 is formed. However, without having to be limited to this, a required number of fin members 9 may be arranged as occasion may demand, for example, as shown in FIGS. 12A and 12B (FIGS. 12A and 12B show examples of three fin members). In FIG. 12A, three fin members 9 act on light from a pair of surface illuminants 30*a*, 30*b* in a quadrupolar pupil intensity distribution 30 with a large outside diameter. In FIG. 12B, only a center fin member 9 acts on light from a pair of surface illuminants 31*a*, 31*b* in a quadrupolar pupil intensity distribution 31 with a small outside diameter.

In FIGS. 2 and 12A, 12B, one or more fin members 9 are arranged along the short-side direction (X-direction) of the rectangular unit wavefront division faces of the micro fly's eye lens 8. However, without having to be limited to this, the fin member(s) 9 may be arranged as slightly tilted relative to the short-side direction of the unit wavefront division faces. In other words, the fin member(s) 9 may be arranged as slightly tilted relative to the array direction (short-side direction or long-side direction) of the lens elements of the micro fly's eye lens 8. In general, the fin member(s) 9 can be modified in various forms as to the contour, number, arrangement, etc. thereof.

Figure 13A:
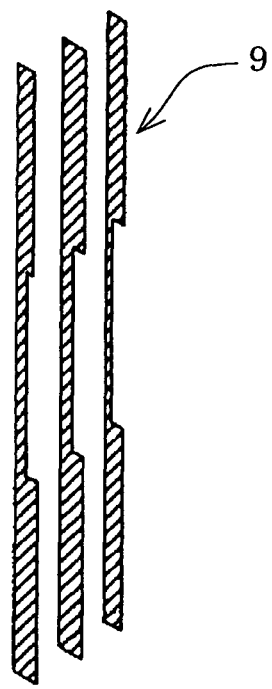
FIG. 13A is a drawing showing an example using fin members whose widthwise size discontinuously changes along a length direction.
Figure 13B:
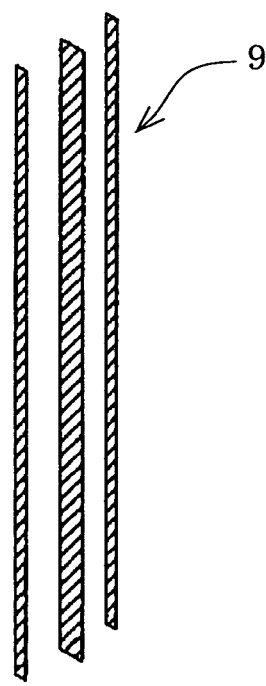
FIG. 13B is a drawing showing an example using a plurality of fin members having respective widthwise sizes different from each other.

Furthermore, the above first embodiment uses the fin member 9 with the contour of the rectangular shape and the form of the plane-parallel plate, i.e., the fin member 9 the size of which in the width direction (Y-direction in FIG. 2) is constant along the length direction (X-direction in FIG. 2). However, without having to be limited to this, it is also possible to use fin members 9 the size of which in the width direction discontinuously varies along the length direction, for example as shown in FIG. 13A, according to the shape of the pupil intensity distribution or the like. Furthermore, it is also possible to use a plurality of fin members 9 with mutually different sizes in the width direction, for example as shown in FIG. 13B (FIG. 13B shows an example of three fin members).

Figure 14A:
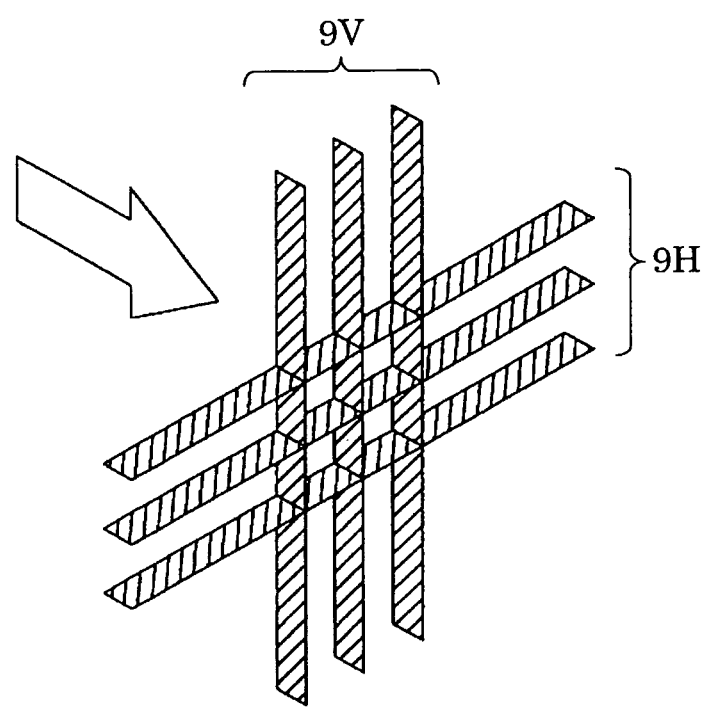
FIG. 14A is a drawing showing a state in which three fin members 9H and three fin members 9V are integrally formed.
Figure 14B:
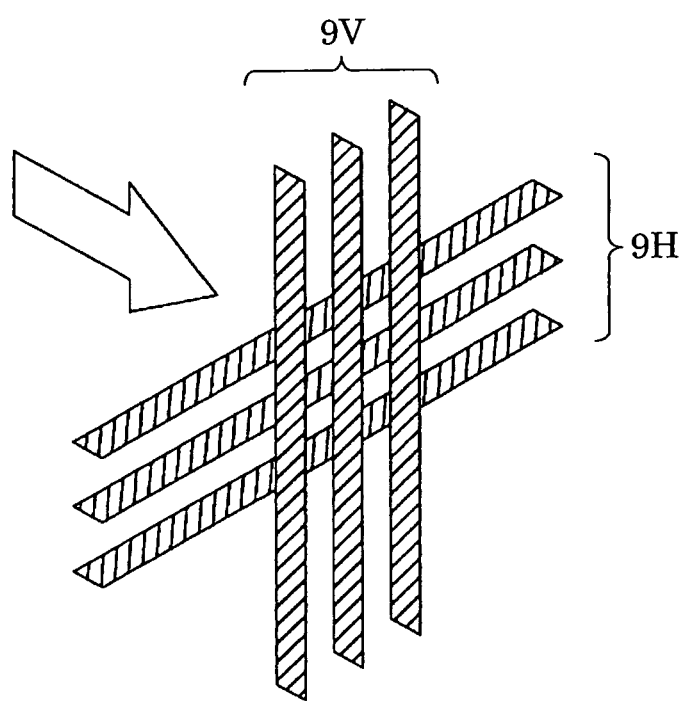
FIG. 14B is a drawing showing a state in which three fin members 9H and three fin members 9V are arranged in an anteroposterior relation.

In FIGS. 2 and 12A, 12B, one or more fin members 9 are one-dimensionally arranged along one direction. However, without having to be limited to this, a plurality of fin members 9 can also be two-dimensionally arranged as occasion may demand. Specifically, for example as shown in FIGS. 14A and 14B, it is possible to adopt a configuration wherein one or more fin members 9H are arranged along one direction (horizontal direction in the drawing) and one or more fin members 9V are arranged along another direction (vertical direction in the drawing). FIG. 14A shows a configuration wherein three fin members 9H and three fin members 9V are integrally formed, and FIG. 14B shows a configuration wherein three fin members 9H and three fin members 9V are arranged in an anteroposterior relation.

Figure 15:
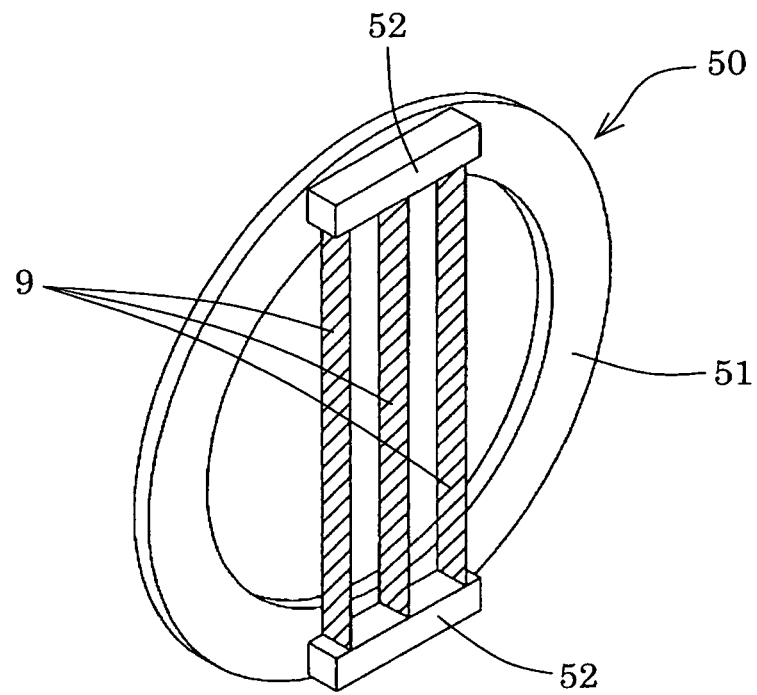
FIG. 15 is a drawing showing an example of a holding member for positioning and holding fin members at predetermined positions in an illumination optical path.

A holding member 50 can be used, for example as shown in FIG. 15, in order to position and hold one or more fin members 9 at a predetermined position in the illumination optical path. The holding member 50 has a main body 51 of a ring shape, and a pair of holders 52 provided at opposite positions in the radial direction of the main body 51. One or more fin members 9 are attached to the pair of holders 52.

Figure 16A:
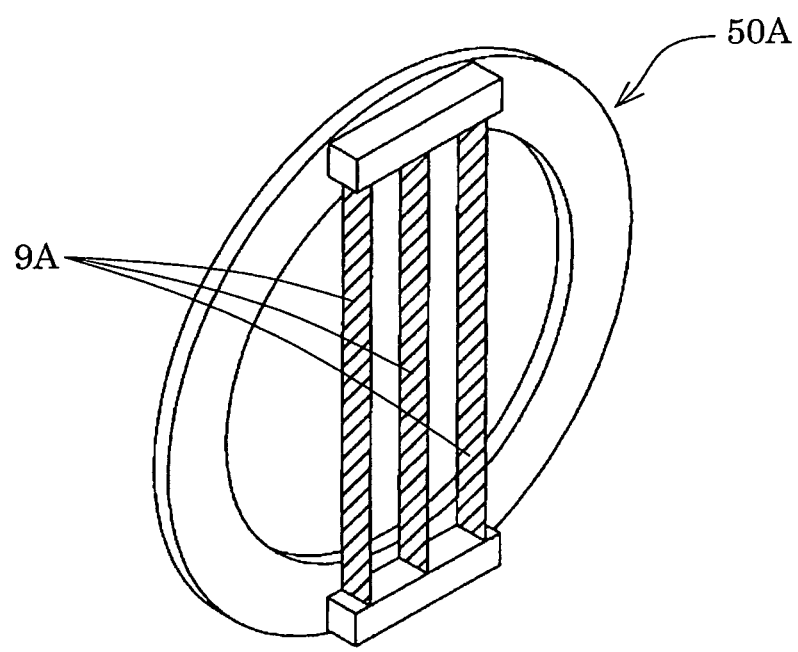
FIG. 16A is a drawing showing a light shield unit consisting of a holding member to which fin members with a constant widthwise size along a length direction are attached.
Figure 16B:
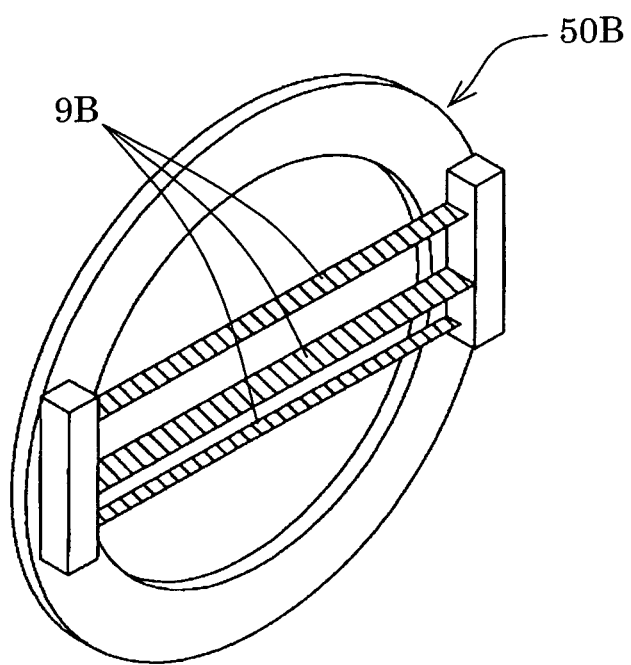
FIG. 16B is a drawing showing a light shield unit consisting of a holding member to which a plurality of fin members with mutually different widthwise sizes are attached.

It is also possible to adopt a configuration wherein a plurality of light shield units with mutually different characteristics are replaceably arranged, each light shield unit consisting of a holding member 50 with one or more fin members 9 attached thereto, for example, as shown in FIG. 15. As an example, a light shield unit consisting of a holding member 50A with fin members 9A the size of which in the width direction is constant along the length direction as shown in FIG. 16A can be replaced with a light shield unit consisting of a holding member 50B with a plurality of fin members 9B having mutually different sizes in the width direction as shown in FIG. 16B, or vice versa. In this case, the length direction of the fin members can be optionally selected in a mounted state of each light shield unit in the illumination optical path.

Figure 17:
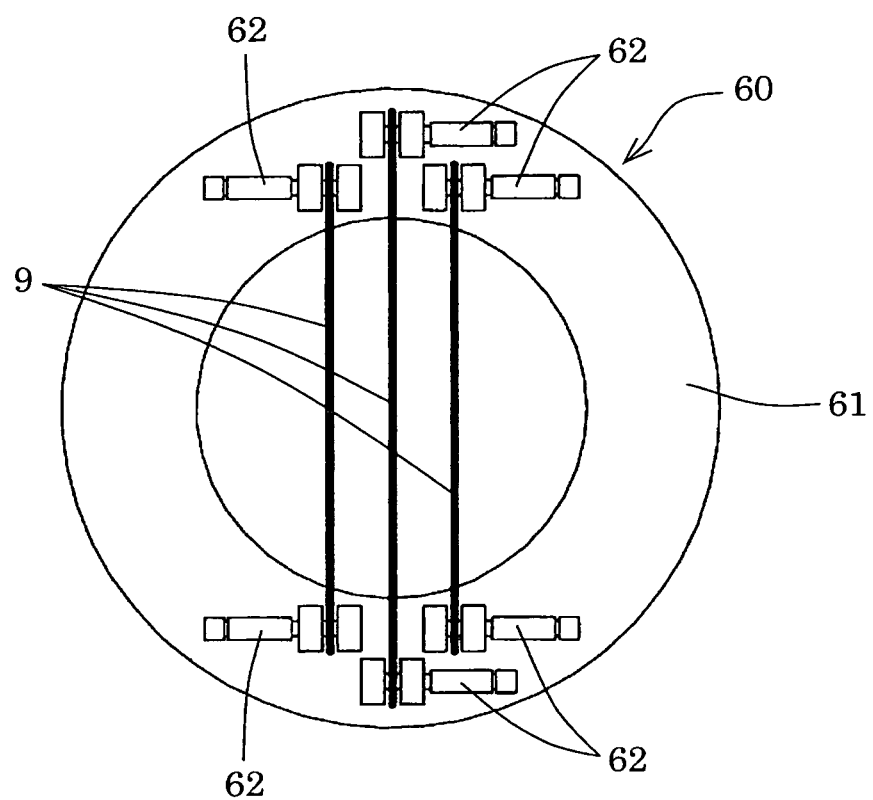
FIG. 17 is a drawing showing an example of a holding member capable of varying a relative positional relation among a plurality of fin members.

In the holding members shown in FIGS. 15 and 16A, 16B, the relative positional relationship among the plurality of fin members is fixed without any special means. If the relative positional relationship among the plurality of fin members needs to be variable, a holding member 60 as shown in FIG. 17 can be adopted. The holding member 60 has a main body 61 of a ring shape, and three pairs of holders 62 provided at opposite positions in the radial direction of the main body 61. One fin member 9 is attached to each pair of holders 62.

Figure 18:
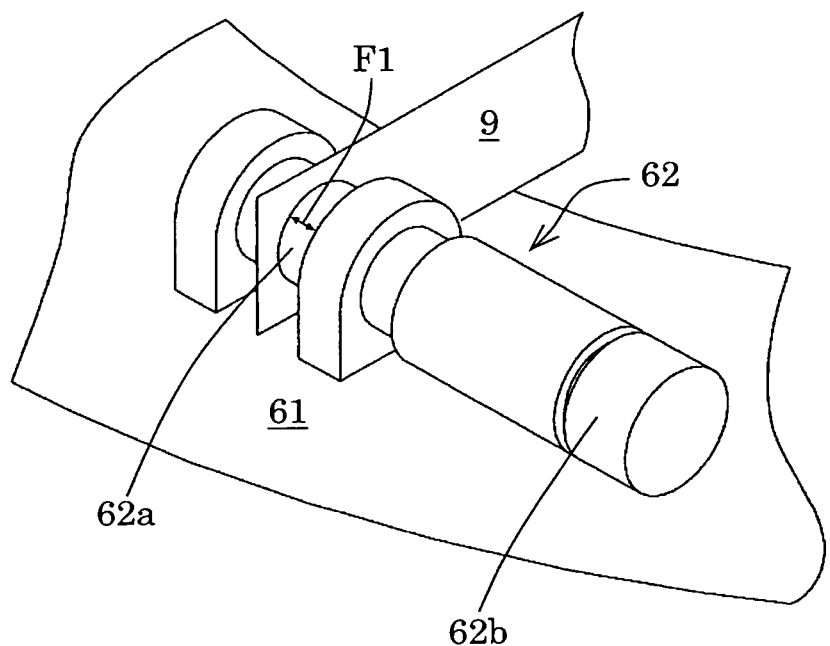
FIG. 18 is a drawing to illustrate a configuration and action of a holder shown in FIG. 17.

A holder 62, for example as shown in FIG. 18, has a shaft 62a to which one end of fin member 9 is attached, and an operation portion 62b for reciprocating the shaft 62a in directions of arrows F1, and, in turn, for reciprocating the position of one end of the fin member 9 in the directions of arrows F1. In the holding member 60, the relative positional relationship among the plurality of fin members 9 can be optionally varied by changing each of the positions of one ends of the fin members 9 in each of holders 62.

Figure 19:
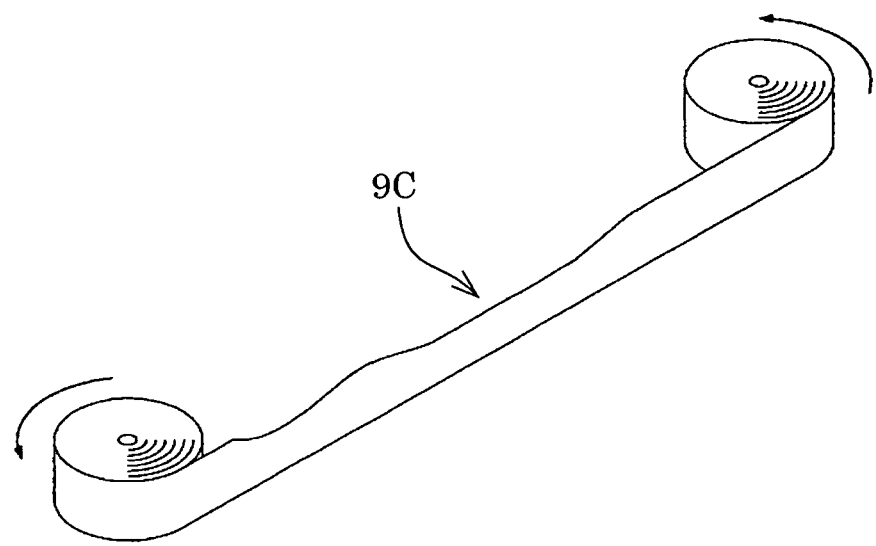
FIG. 19 is a drawing showing a configuration to wind or unwind a tape fin member whose width and thickness vary along its length direction.

The foregoing first embodiment uses the fin member 9 the contour of which is fixed and invariant. However, without having to be limited to this, it is also possible to adopt a configuration wherein a fin member 9C of a tape shape the width and thickness of which vary along the length direction, for example as shown in FIG. 19, is wound and unwound. This configuration makes it feasible to make variable the width and thickness of the fin member positioned in the illumination optical path, i.e., to make the contour of the fin member variable.

Figure 20:
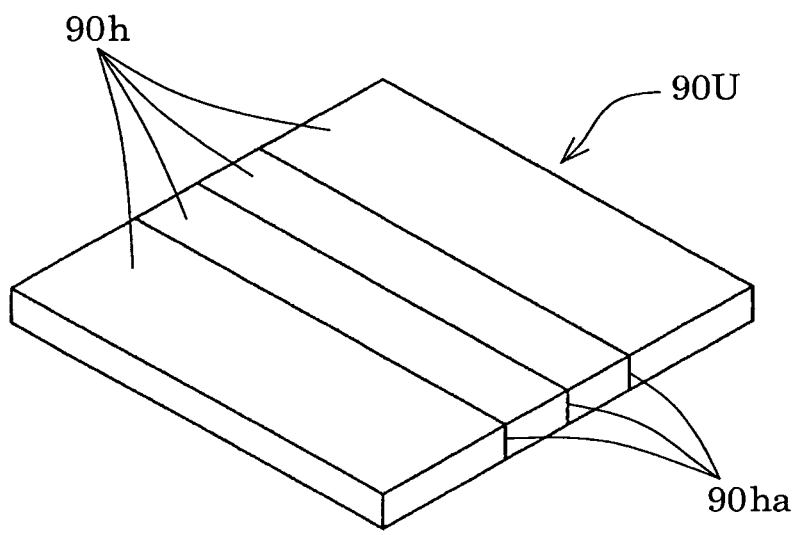
FIG. 20 is a drawing showing an example of a light shield member having a form of a side face of a plane-parallel plate.

The foregoing first embodiment uses the fin member 9 having the form of the plane-parallel plate, i.e., the plate-like form as the light shield member. However, without having to be limited to this, it is also possible to use a light shield member having a form of side faces 90ha of plane-parallel plates 90h, for example, as shown in FIG. 20. In a plane-parallel plate unit 90U shown in FIG. 20, side faces 90ha of four plane-parallel plates 90h are in contact with each other as an example. In the plane-parallel plate unit 90U, however, the contact between the side faces 90ha does not always have to be an optical contact.

Figure 21:
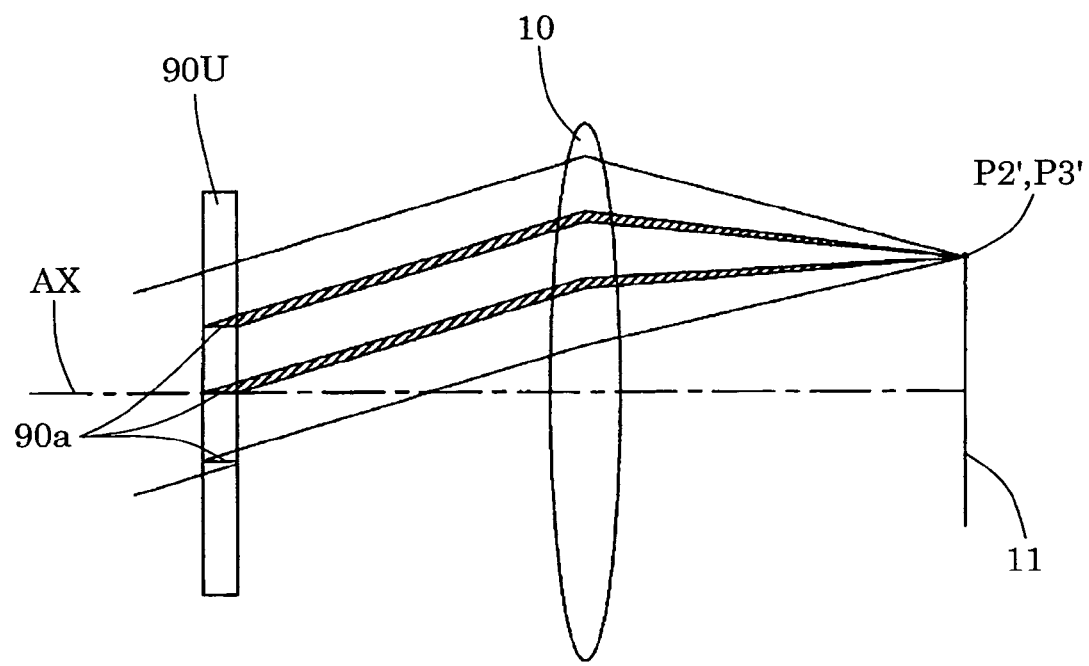
FIG. 21 is a drawing to illustrate an action of the light shield member of FIG. 20.

The plane-parallel plate unit 90U, as shown in FIG. 21, is arranged, for example, immediately behind the forming plane of the quadrupolar pupil intensity distribution. At this time, the plane-parallel plate unit 90U is so positioned that the side faces 90ha as the light shield member correspond to a state in which the thickness of the fin member 9 shown in FIGS. 7 and 8 is reduced to the extreme. Namely, the thickness direction (Z-direction) of the side faces 90ha as the light shield member is approximately parallel to the plane of the illumination pupil (XZ plane) and the width direction (Y-direction) of the side faces 90ha is approximately parallel to the direction of the optical axis AX.

Therefore, as shown in FIG. 21, the light reaching the peripheral points P2, P3 in the still exposure region ER on the wafer W, i.e., the light reaching the peripheral points P2', P3' of the aperture of the mask blind 11 is blocked by the side faces 90ha as the light shield member. On the other hand, though not shown, the light reaching the center P1 in the still exposure region ER on the wafer W, i.e., the light reaching the center P1' of the aperture of the mask blind 11 is rarely blocked by the side faces 90ha as the light shield member.

In the example using the side faces 90ha as the light shield member, as described above, the attenuation rate by the side faces 90ha for light toward a point on the still exposure region ER being the surface to be illuminated is so defined as to increase from the center to the periphery of the still exposure region ER, as in the first embodiment using the fin member 9. As a result, the example using the plane-parallel plate unit 90U can also achieve the same effect as the first embodiment using the fin member 9.

In the above description, the action and effect of the present invention were described using the example of the modified illumination to form the quadrupolar pupil intensity distribution on the illumination pupil, i.e., the quadrupolar illumination. However, it is obvious that, without having to be limited to the quadrupolar illumination, the present invention is also similarly applicable with the same action and effect, for example, to the annular illumination to form the pupil intensity distribution of the annular shape and to multi-polar illumination to form the pupil intensity distribution of a multipolar shape other than the quadrupolar shape.

In the above description, the light shield member (fin member 9 or side faces 90ha) is arranged immediately behind the rear focal plane of the micro fly's eye lens 8 or the illumination pupil near it. However, without having to be limited to this, the light shield member may also be arranged immediately in front of the rear focal plane of the micro fly's eye lens 8 or the illumination pupil near it. Furthermore, the light shield member can also be arranged immediately in front of or behind another illumination pupil located behind the micro fly's eye lens 8, e.g., immediately in front of or behind the illumination pupil between the front lens unit 12a and the rear lens unit 12b of the imaging optical system 12. When the light shield member is arranged at the position of the illumination pupil, the light shield member can be regarded as being arranged immediately in front of or behind the illumination pupil because the light shield member has some width along the optical-axis direction.

Figure 24:
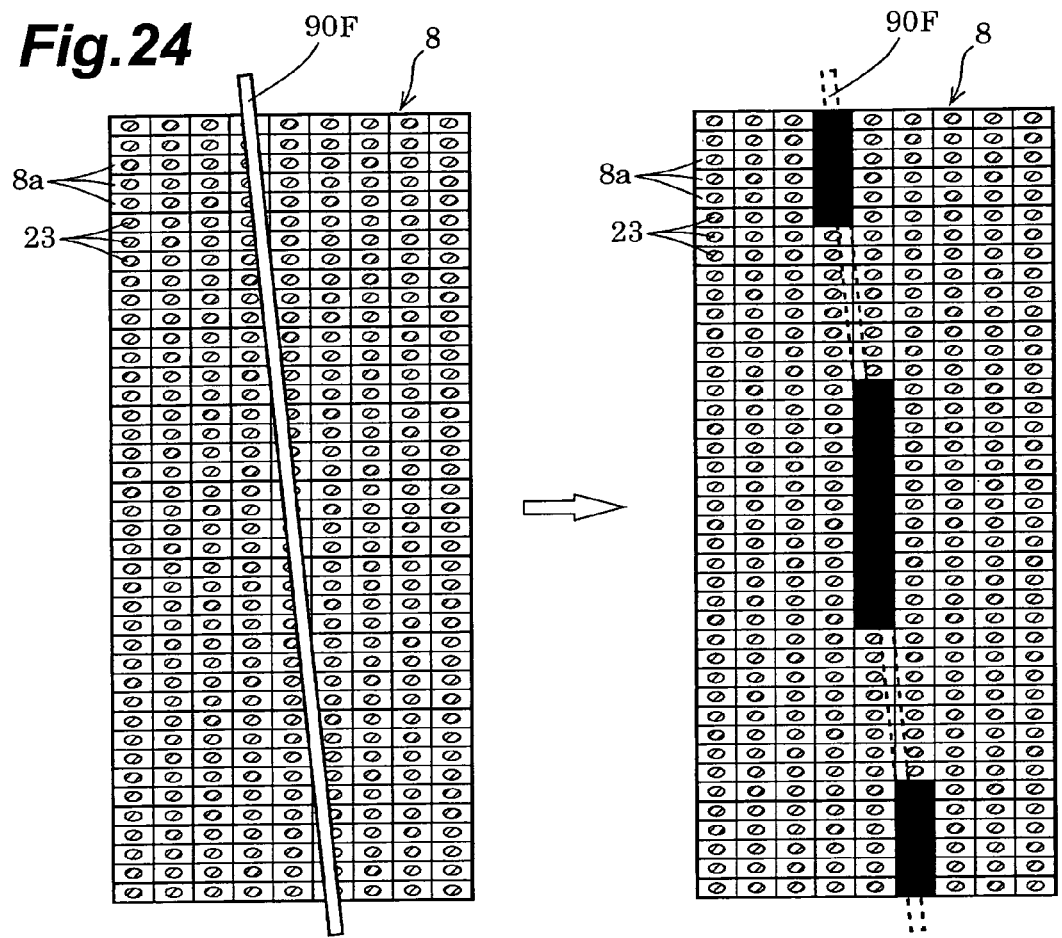
FIG. 24 is a first drawing to illustrate a disadvantage caused in use of a fin member extending approximately in parallel with the X-direction.

It is also possible to use a fin member 90F as shown in FIG. 24, instead of the fin member 9. The following disadvantage could be caused in the case using the fin member 90F extending nearly in parallel with the short-side direction or X-direction of the rectangular unit wavefront division faces 8a of the micro fly's eye lens 8 as shown in FIG. 24. FIG. 24 shows only some of the unit wavefront division faces 8a of the micro fly's eye lens 8 and shows a state in which small illuminants 23 (which are schematically shown as hatched ovals) are formed corresponding to all the unit wavefront division faces 8a shown. If the single fin member 90F is arranged as slightly tilted as shown in the left drawing of FIG. 24 (in FIG. 24 the tilt angle is illustrated in an exaggerated way for easier understanding of the description and, actually, the fin member 90F is tilted, for example, at only an angle of about 1°), the single fin member 90F exerts the attenuation action on light from small illuminants 23 formed corresponding to solid-black unit wavefront division faces 8a as shown in the right drawing of FIG. 24. In other words, among the series of unit wavefront division faces 8a facing the single fin member 90F as indicated by dashed lines in the right drawing of FIG. 24, a relatively large number of unit wavefront division faces 8a not subjected to the attenuation action continuously exist along the longitudinal direction of the single fin member 90F.

Figure 25:
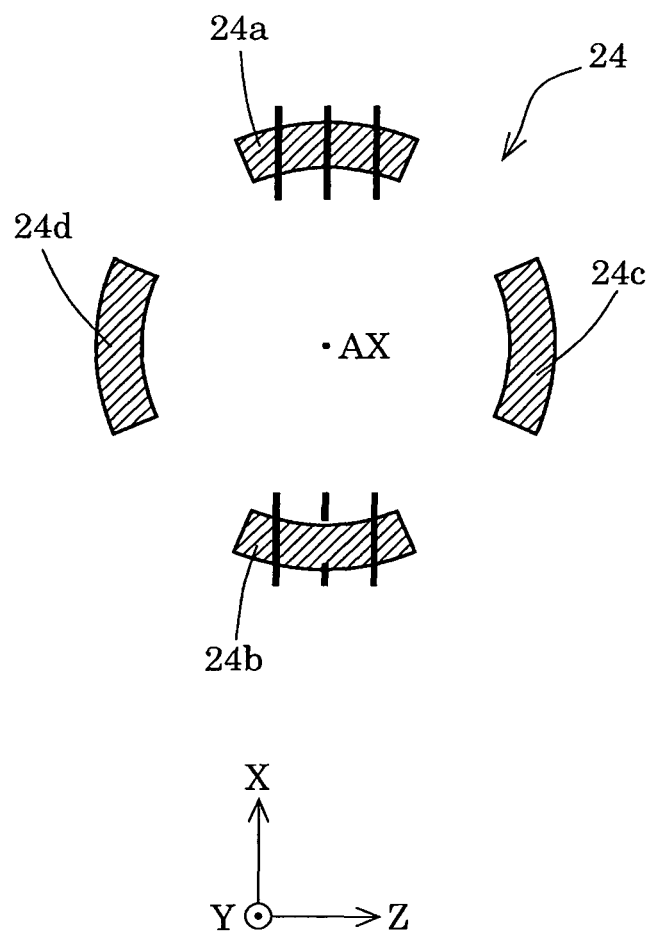
FIG. 25 is a second drawing to illustrate a disadvantage caused in use of the fin member extending approximately in parallel with the X-direction.

As a result, as shown in FIG. 25, there is a possibility that, of a pair of surface illuminants 24a, 24b spaced in the X-direction on both sides of the optical axis AX in a quadrupolar pupil intensity distribution 24 related to a certain point in the still exposure region ER on the wafer W, for example, one surface illuminant 24b cannot be subjected to the desired attenuation action of the fin member 90F. FIG. 25 schematically shows attenuation actions of three fin members 90F extending nearly in parallel with the X-direction on the surface illuminants 24a and 24b, by respective lines extending in the X-direction. FIG. 25 shows an example of a state in which the three fin members 90F all exert the desired attenuation action on the surface illuminant 24a, whereas the fin members 90F on both sides exert the desired attenuation action on the surface illuminant 24b but the center fin member 90F seldom exerts the attenuation action on the surface illuminant 24b. In this case, it becomes infeasible to adjust the surface illuminant 24b to a desired light intensity and this results in a lack of balance of light intensities between the surface illuminants 24a and 24b spaced in the X-direction on both sides of the optical axis AX.

If in FIG. 2 one or more fin members also extending nearly in parallel with the X-direction (e.g., fin members having the same configuration as the single fin member 90) are arranged in addition to the single fin member 90, these fin members parallel to each other also have an attenuation characteristic of a property to increase the attenuation rate from the center to the periphery of the still exposure region ER, similar to that of the single fin member 90. If in FIG. 2 the single fin member 90 is rotated by an appropriate angle (e.g., any angle of not more than 45°) around the optical axis AX so that the single fin member 90 extends in a direction intersecting with the X-direction, the single fin member 90 inclined relative to the X-direction has an attenuation characteristic of a property to increase the attenuation rate from the center to the periphery of the still exposure region ER, similar to that of the single fin member 90 extending nearly in parallel with the X-direction. In other words, by properly setting the number and orientations of the fin members arranged along a plane nearly parallel to the plane of the illumination pupil (XZ plane) at the position immediately behind the illumination pupil, it becomes feasible to secure the desired attenuation characteristic to increase the attenuation rate from the center to the periphery of the still exposure region ER and, therefore, to independently adjust each of the pupil intensity distributions related to the respective points in the still exposure region ER, as desired.

Figure 26:
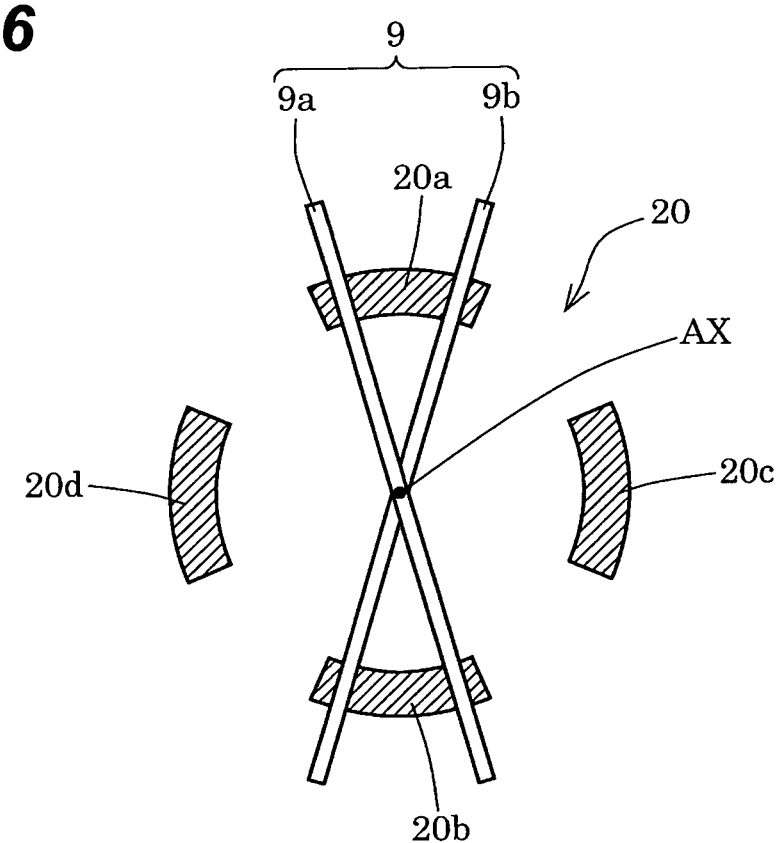
FIG. 26 is a drawing showing a positional relation between a secondary light source of a quadrupolar shape formed on an illumination pupil and a pair of light shield members forming a light shield portion according to the embodiment.

In the present embodiment, therefore, the optical system is provided, as shown in FIG. 26, with a light shield 9 consisting of a pair of light shield members 9a and 9b extending so as to intersect with each other along a plane nearly parallel to the plane of the illumination pupil while being arranged at the position immediately behind the illumination pupil. It is assumed below for easier description that the pair of light shield members 9a and 9b have the same configuration (e.g., the same form of a plate-like shape extending along a plane perpendicular to the plane of FIG. 26) and are inclined at the same angle to the X-direction. Namely, it is assumed that the pair of light shield members 9a and 9b are arranged in symmetry with respect to an axis extending in the X-direction while passing the optical axis AX, so that they are inclined at a required angle optionally selected in an angular range overlapping with the pair of surface illuminants 20a and 20b spaced in the X-direction on both sides of the optical axis AX, relative to the X-direction.

Figure 27:
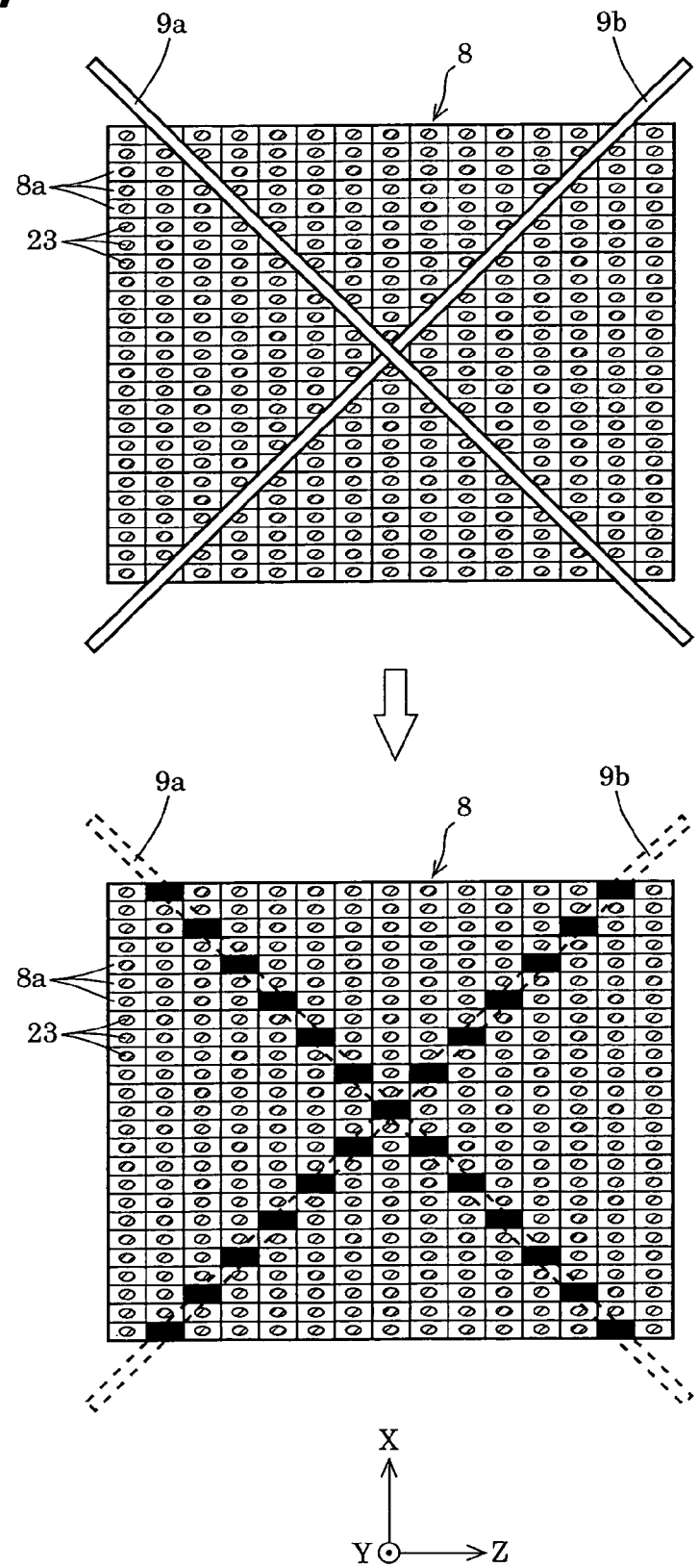
FIG. 27 is a drawing to illustrate a principle to avoid the disadvantage as shown in FIG. 24, by use of a pair of light shield members according to the embodiment.

In this case, since one light shield member 9a is arranged as relatively significantly inclined relative to the X-direction as shown in the upper drawing of FIG. 27 (the inclination angle is illustrated in an exaggerated way so as to be larger in FIG. 27 than the angle shown in FIG. 26, for easier understanding of the description), the attenuation action is exerted on light from small illuminants 23 formed corresponding to solid-black unit wavefront division faces 8a almost continuously scattered along the longitudinal direction of the light shield member 9a as shown in the lower drawing of FIG. 27. Similarly, since the other light shield member 9b is also arranged as relatively significantly inclined relative to the X-direction, the attenuation action is exerted on light from small illuminants 23 formed corresponding to solid-black unit wavefront division faces 8a almost continuously scattered along the longitudinal direction of the light shield member 9b as shown in the lower drawing of FIG. 27. In other words, in the series of unit wavefront division faces 8a facing the pair of light shield members 9a and 9b indicated by dashed lines in the lower drawing of FIG. 27, the following disadvantage is avoided: the disadvantage that a relatively large number of unit wavefront division faces 8a not subjected to the attenuation action continuously exist, i.e., the disadvantage that could be caused in use of the fin member extending nearly in parallel with the X-direction.

Figure 28:
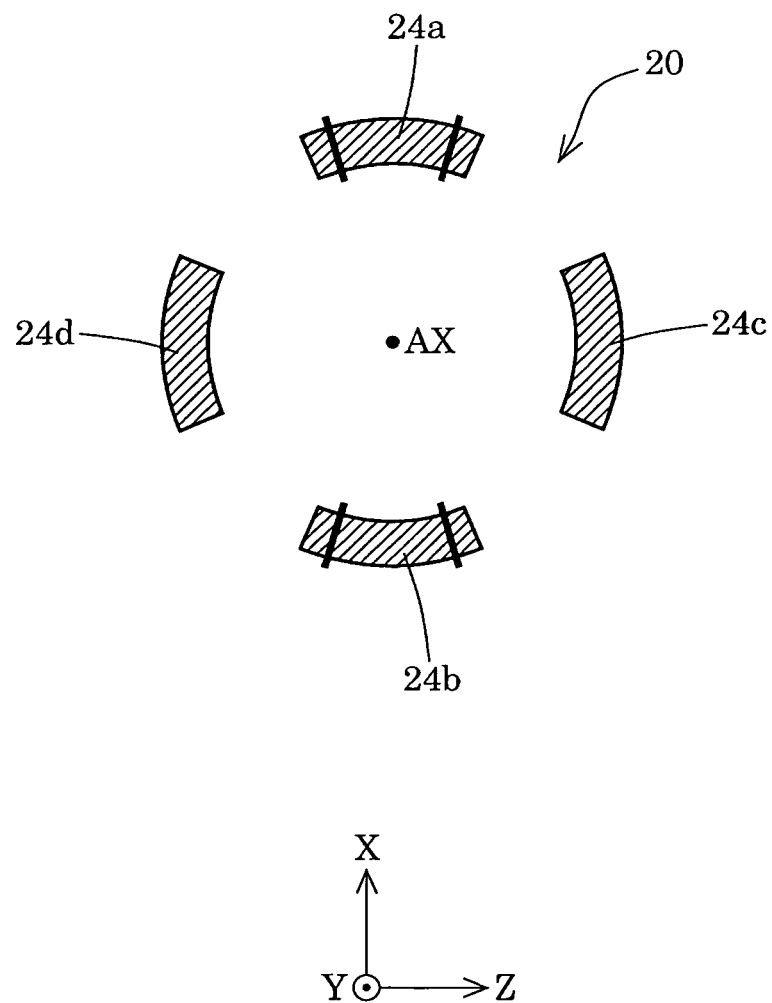
FIG. 28 is a drawing to illustrate a principle to avoid the disadvantage as shown in FIG. 25, by use of a pair of light shield members according to the embodiment.

In the present embodiment, therefore, different from the case using one or more fin members 90F extending nearly in parallel with the X-direction, the pair of light shield members 9a and 9b both exert the required attenuation action on a pair of surface illuminants 24a and 24b spaced in the X-direction on both sides of the optical axis AX, in a quadrupolar pupil intensity distribution 24 related to a certain point in the still exposure region ER on the wafer W, as shown in FIG. 28, so as to avoid the lack of balance of light intensities between the surface illuminants 24a and 24b. FIG. 28 schematically shows attenuation actions of the pair of light shield members 9a, 9b arranged as inclined relative to the X-direction, on the surface illuminants 24a and 24b, by respective lines inclined relative to the X-direction.

Figure 29:
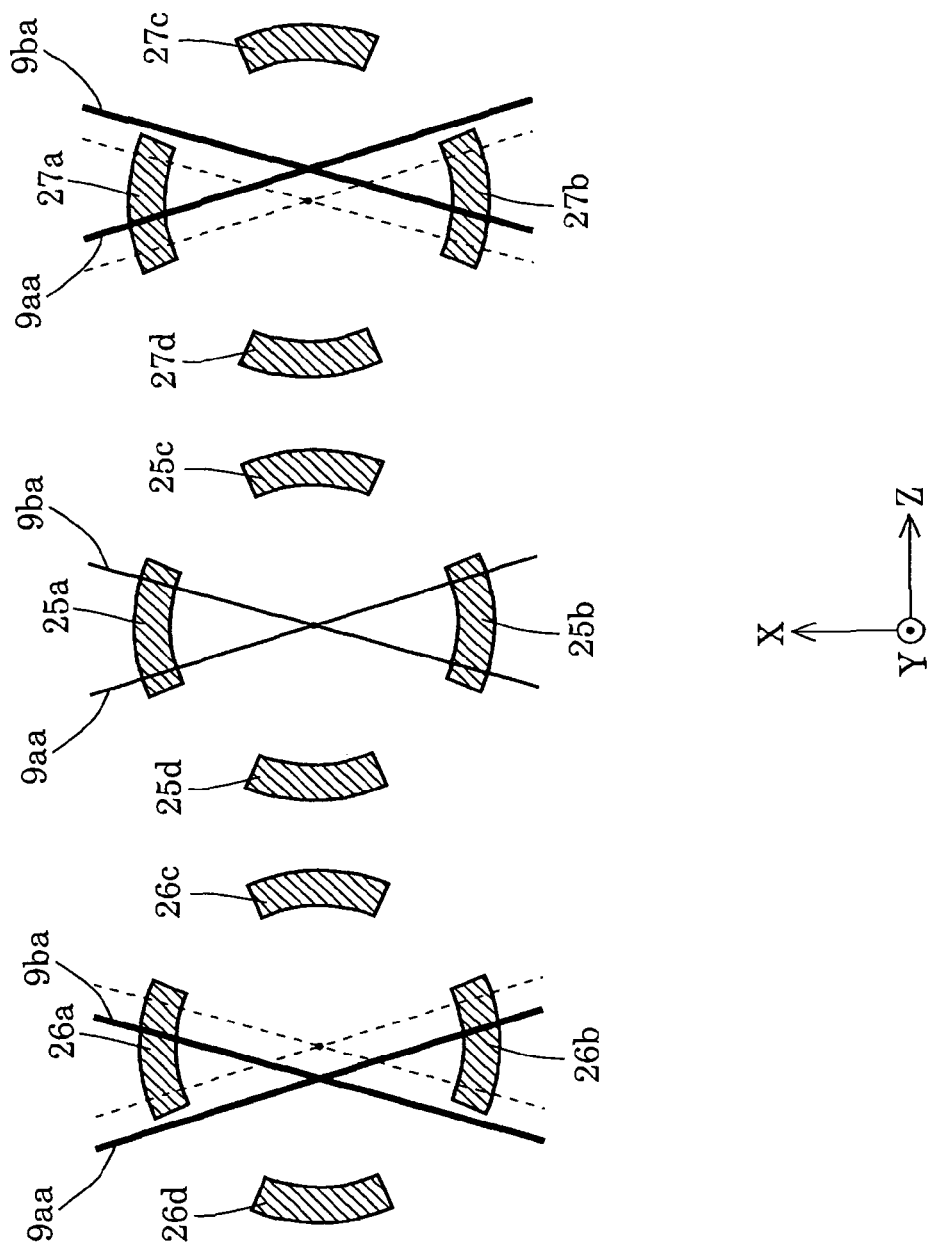
FIG. 29 is a drawing to illustrate influence of parallax in the embodiment.

In the present embodiment, the pair of light shield members 9a and 9b constituting the light shield 9 are arranged at the position immediately behind the illumination pupil being the forming plane of the pupil intensity distribution and formed in the plate shape having the predetermined size in the direction of the optical axis AX. Therefore, as shown in FIG. 29, the position of the attenuation action on the pupil intensity distribution by the pair of light shield members 9a, 9b deviates in the Z-direction according to a position of a point of interest in the still exposure region ER on the wafer W, because of influence of so-called parallax. It is easily presumed from FIGS. 7 and 8 and others about the single fin member 90 that the position of the attenuation action on the pupil intensity distribution by the pair of light shield members 9a, 9b deviates because of the influence of parallax.

In FIG. 29, the position of the attenuation action on the pupil intensity distribution by the pair of light shield members 9a, 9b is schematically indicated by lines 9aa, 9ba inclined relative to the X-direction. Specifically, as shown in the center drawing of FIG. 29, the position 9aa, 9ba of the attenuation action by the pair of light shield members 9a, 9b on the quadrupolar pupil intensity distribution 25 (25a-25d) formed by light incident to the center point P1 in the still exposure region ER is seldom affected by parallax. Therefore, the surface illuminants 25a and 25b spaced in the X-direction are subjected to the required attenuation action by the pair of light shield members 9a, 9b.

On the other hand, as shown in the left and right drawings of FIG. 29, the position 9aa, 9ba of the attenuation action by the pair of light shield members 9a, 9b on the quadrupolar pupil intensity distribution 26 (26a-26d) or pupil intensity distribution 27 (27a-27d) formed by light incident to the peripheral point P2 or P3 apart in the Y-direction from the center point P1 in the still exposure region ER is affected by parallax to deviate in the Z-direction. Namely, as shown in the left drawing of FIG. 29, there is a possibility that, of surface illuminants 26a and 26b spaced in the X-direction, the surface illuminant 26a is subjected to the attenuation action by the light shield member 9b while not subjected to the attenuation action by the light shield member 9a. On the other hand, there is a possibility that the surface illuminant 26b is subjected to the attenuation action by the light shield member 9a while not subjected to the attenuation action by the light shield member 9b.

Furthermore, as shown in the right drawing of FIG. 29, there is a possibility that, of surface illuminants 27a and 27b spaced in the X-direction, the surface illuminant 27a is subjected to the attenuation action by the light shield member 9a while not subjected to the attenuation action by the light shield member 9b. On the other hand, there is a possibility that the surface illuminant 27b is subjected to the attenuation action by the light shield member 9b while not subjected to the attenuation action by the light shield member 9a. In the present embodiment, however, as apparent from reference to FIG. 29, the pair of light shield members 9a and 9b are arranged so as to intersect with each other, and in the quadrupolar pupil intensity distribution formed by light incident to any point in the still exposure region ER, the attenuation actions on the pair of surface illuminants spaced in the X-direction are equal to each other even under the influence of parallax and, therefore, the lack of balance of light intensities is avoided between the pair of surface illuminants spaced in the X-direction.

Figure 30:
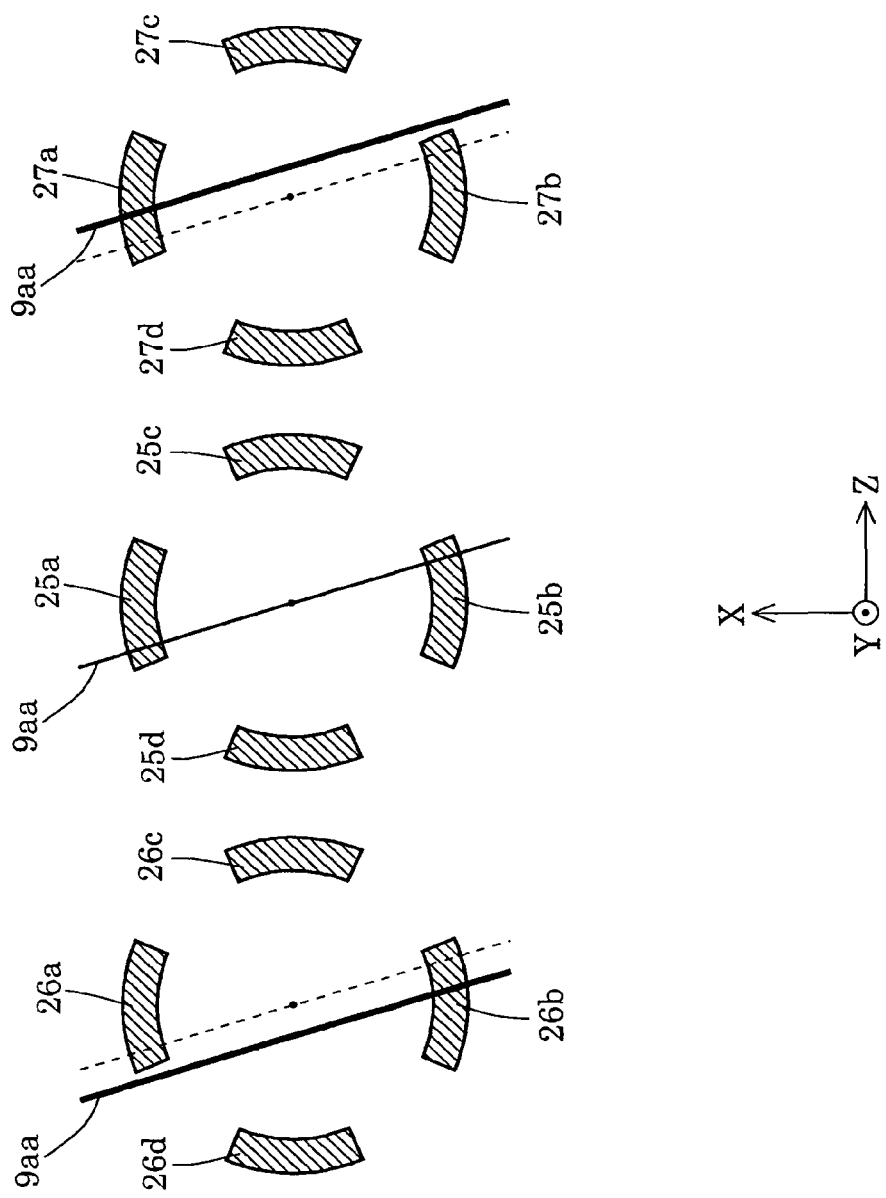
FIG. 30 is a drawing to illustrate influence of parallax in a comparative example of the embodiment.

In this connection, let us consider a comparative example using only one light shield member 9a; in this case, as shown in FIG. 30, there is a possibility that the attenuation actions on the pair of surface illuminants spaced in the X-direction can be completely different from each other because of the influence of parallax. Specifically, as shown in the center drawing of FIG. 30, the surface illuminants 25a and 25b are seldom affected by parallax and are thus subjected to the required attenuation action by the light shield member 9a. However, as shown in the left drawing of FIG. 30, there is a possibility that the surface illuminant 26b is subjected to the attenuation action by the light shield member 9a while the surface illuminant 26a is not subjected to the attenuation action by the light shield member 9a. Furthermore, as shown in the right drawing of FIG. 30, there is a possibility that the surface illuminant 27a is subjected to the attenuation action by the light shield member 9a while the surface illuminant 27b is not subjected to the attenuation action by the light shield member 9a. This lack of balance of light intensities between the pair of opposed surface illuminants due to the influence of parallax can also occur in the same manner in a configuration wherein one or more light shield members extending nearly in parallel with the light shield member 9a (e.g., fin members having the same configuration as the light shield member 9a) are arranged in addition to one light shield member 9a.

As described above, the illumination optical system (2-12) of the present embodiment is provided with the light shield 9 consisting of the pair of light shield members 9a and 9b extending so as to intersect with each other along the plane nearly parallel to the plane of the illumination pupil while arranged at the position immediately behind the illumination pupil. As a result, it is feasible to substantially uniformly adjust each of the pupil intensity distributions related to the respective points, through collaboration between the pair of light shield members 9a and 9b to independently adjust each of the pupil intensity distributions related to the respective points in the still exposure region ER, having the required attenuation characteristic varying depending upon the position of incidence of light to the still exposure region ER on the wafer W while avoiding the disadvantage possibly caused with use of the single fin member 90F extending nearly in parallel with the X-direction or with use of one or more fin members arranged as inclined in much the same orientation relative to the X-direction, and the compensation filter 6 to equally adjust the pupil intensity distributions related to the respective points in the still exposure region ER.

Therefore, the exposure apparatus (2-WS) of the present embodiment is able to perform excellent exposure under an appropriate illumination condition according to the micro pattern of the mask M, using the illumination optical system (2-12) to substantially uniformly adjust each of the pupil intensity distributions for the respective points in the still exposure region ER on the wafer W, and therefore to faithfully transfer the micro pattern of the mask M in a desired line width across the entire exposure region on the wafer W.

It is considered in the present embodiment that the light quantity distribution on the wafer (surface to be illuminated) W is affected, for example, by the attenuation action (adjusting action) of the light shield 9. In this case, as described above, the illuminance distribution in the still exposure region ER or the shape of the still exposure region (illumination region) ER can be modified by action of a light quantity distribution adjuster having a known configuration if necessary.

Figure 31:
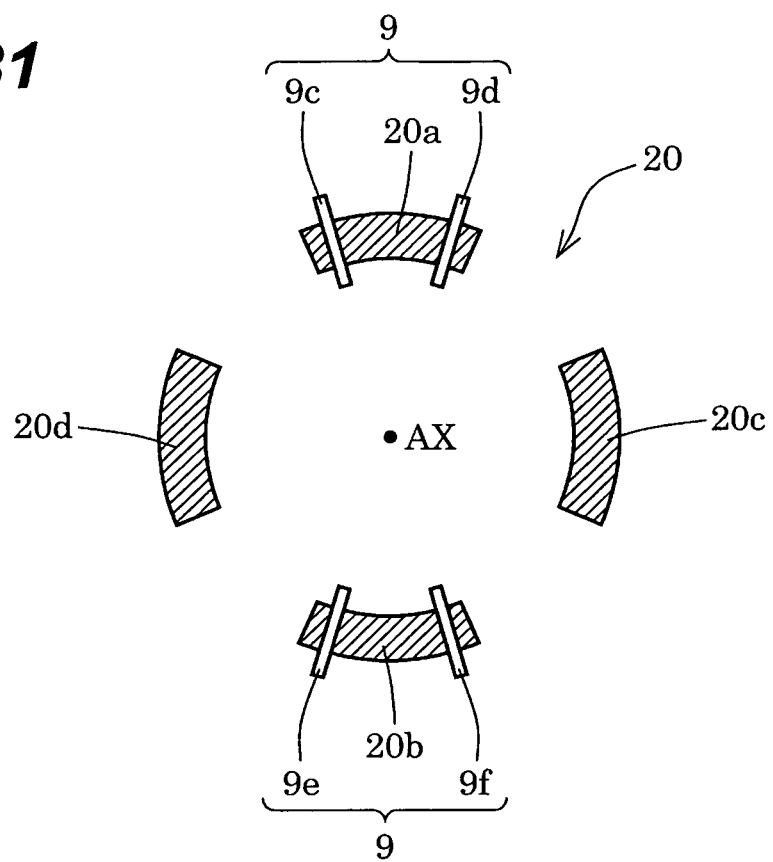
FIG. 31 is a drawing showing a configuration of a light shield portion according to a first modification example of the embodiment.

The above embodiment uses the pair of light shield members 9a and 9b arranged so as to actually intersect with each other at or near the position of the optical axis AX. However, without having to be limited to this, it is obvious that the same effect as in the above embodiment can also be achieved by use of a pair of light shield members 9c and 9d arranged opposite to the surface illuminant 20a and a pair of light shield members 9e and 9f arranged opposite to the surface illuminant 20b, for example, as shown in FIG. 31. In this configuration, the light shield members 9c and 9f correspond to partial regions of the light shield member 9a and the light shield members 9d, 9e correspond to partial regions of the light shield member 9b. It is then obvious that the same effect as in the above embodiment is also achieved by properly changing the angle of inclination of these light shield members 9c-9f relative to the X-direction.

Namely, the light shield according to the present invention may be configured as follows: it has at least two light shield members extending so as to intersect with each other along the plane nearly parallel to the plane of the illumination pupil; the attenuation rate by the light shield for light toward a point on the surface to be illuminated increases from the center to the periphery of the surface to be illuminated. It is noted herein that, for example, two light shield members arranged substantially in symmetry with respect to a predetermined axis passing the optical axis (the pair of light shield members 9c and 9d, or the pair of light shield members 9e and 9f in FIG. 31) do not have to actually intersect with each other, but it is sufficient that they are arranged so that their extension lines in the longitudinal direction intersect with each other. The configuration of the light shield 9 can be modified in various forms as described above.

Figure 32:
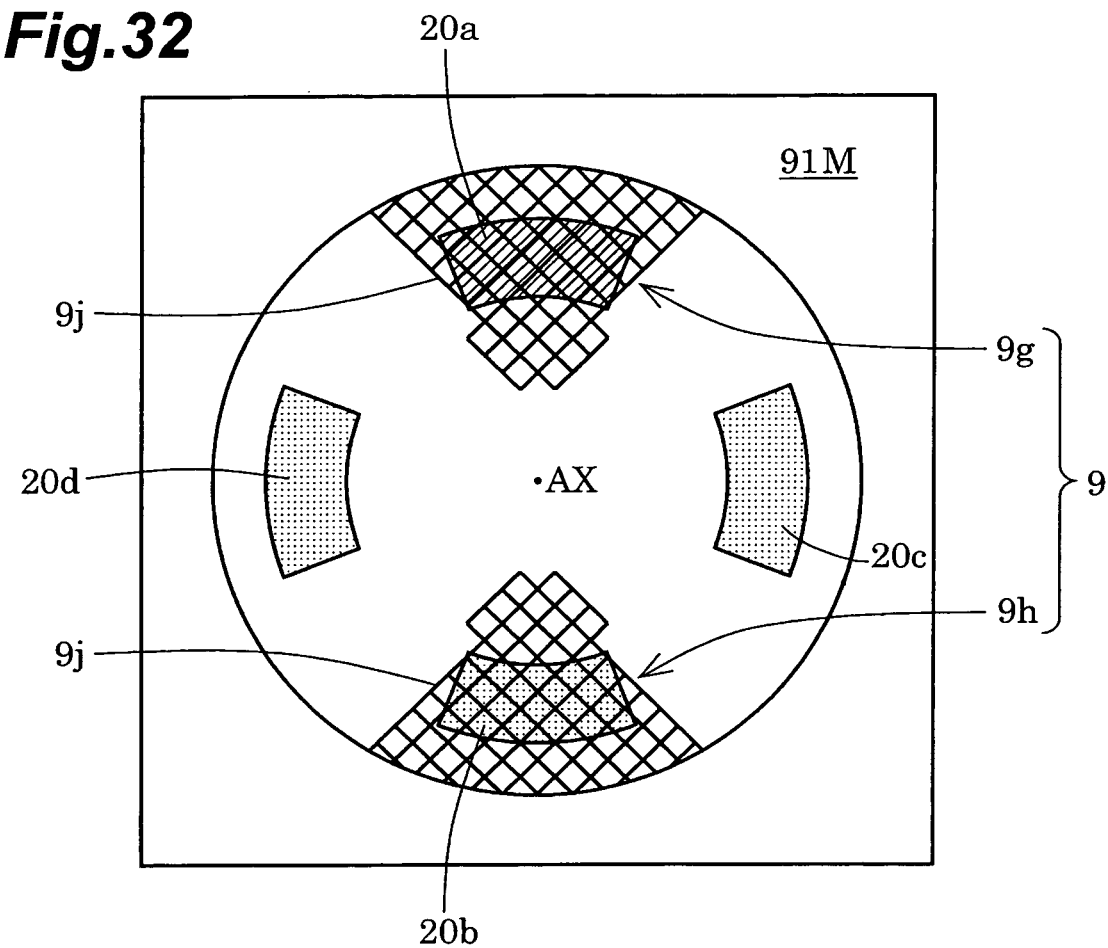
FIG. 32 is a drawing showing a configuration of a light shield portion according to a second modification example of the embodiment.

As an example, as shown in FIG. 32, it is possible to use the light shield 9 having a mesh-like form along the plane nearly parallel to the plane of the illumination pupil. The light shield 9 has a first light shield member group 9g of a mesh-like form arranged so as to act on light from the surface illuminant 20a, and a second light shield member group 9h of a mesh-like form arranged so as to act on light from the surface illuminant 20b. The first light shield member group 9g and the second light shield member group 9h are configured substantially in symmetry, for example, with respect to an axis extending in the Z-direction while passing the optical axis AX and with respect to an axis extending in the X-direction while passing the optical axis AX.

In this case, light shield members 9j as unit members constituting the mesh-like first light shield member group 9g and second light shield member group 9h can be considered as members corresponding to one side of one rectangular mesh or can be considered as linearly extending members connecting sides of adjacent meshes. In either case, the light shield members 9j have, for example, the plate-like form extending along the plane perpendicular to the plane of FIG. 32 (XZ plane) and are arranged so as to intersect with each other along the plane nearly parallel to the plane of the illumination pupil. The light shield 9 having the configuration shown in FIG. 32 can be made, for example, by subjecting a metal plate 91M of a rectangular contour to electrical discharging, etching, or the like.

Figure 33:
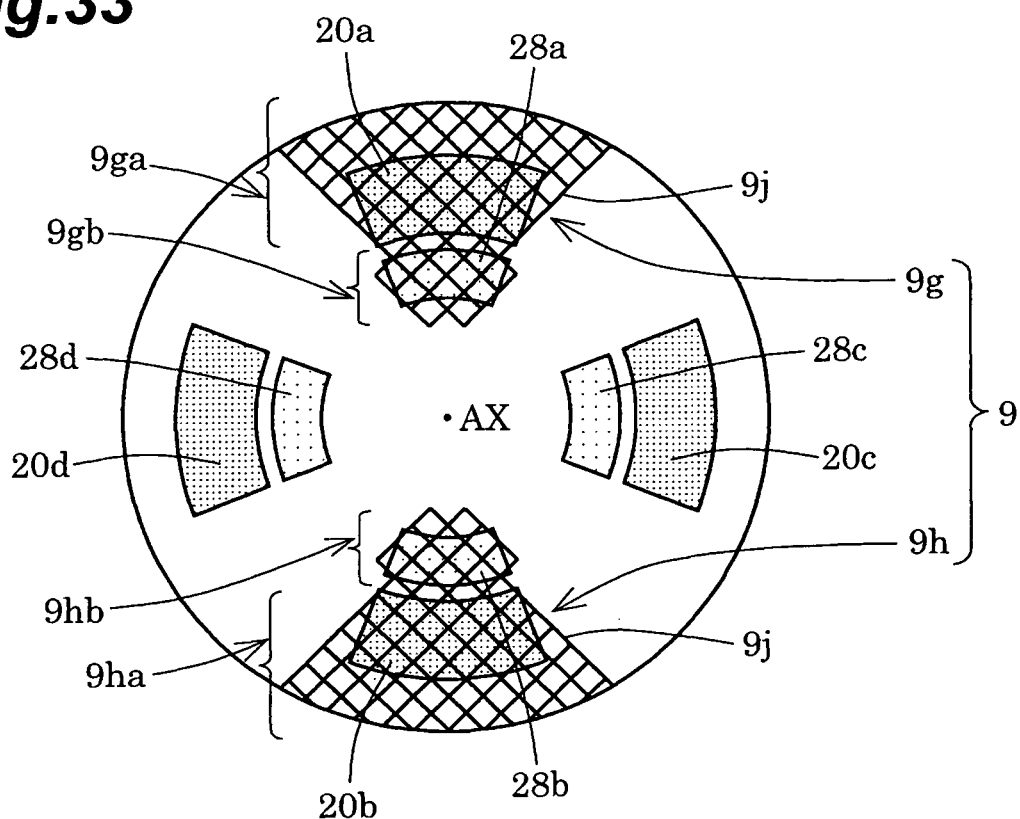
FIG. 33 is a drawing showing a configuration of a light shield portion according to a third modification example of the embodiment.

For example, as shown in FIG. 33, there is a case where a quadrupolar pupil intensity distribution 20 (20a-20d) with a relatively large outside diameter (or with a relatively large illumination NA) is formed in transfer of a pattern of a relatively small pitch and where a quadrupolar pupil intensity distribution 28 (28a-28d) with a relatively small outside diameter (or with a relatively small illumination NA) is formed in transfer of a pattern of a relatively large pitch. In this case, when a configuration wherein the sizes in the direction of the optical axis AX (Y-direction) of the light shield members 9j are different depending upon positions, is adopted for the first light shield member group 9g and the second light shield member group 9h of the light shield 9, the required attenuation action can be exerted on the pair of surface illuminants 20a and 20b and the required attenuation action can also be exerted on the pair of surface illuminants 28a and 28b.

Specifically, in the configuration of FIG. 33, the size in the direction of the optical axis AX of the light shield members in the light shield member groups 9gb and 9hb arranged opposite to the pair of surface illuminants 28a and 28b is set to be smaller than the size in the direction of the optical axis AX of the light shield members in the light shield member groups 9ga and 9ha arranged opposite to the pair of surface illuminants 20a and 20b. In other words, the size in the direction of the optical axis AX of the light shield members 9j arranged near the optical axis AX is set to be smaller than the size in the direction of the optical axis AX of the light shield members 9j arranged away from the optical axis AX.

Figure 34:
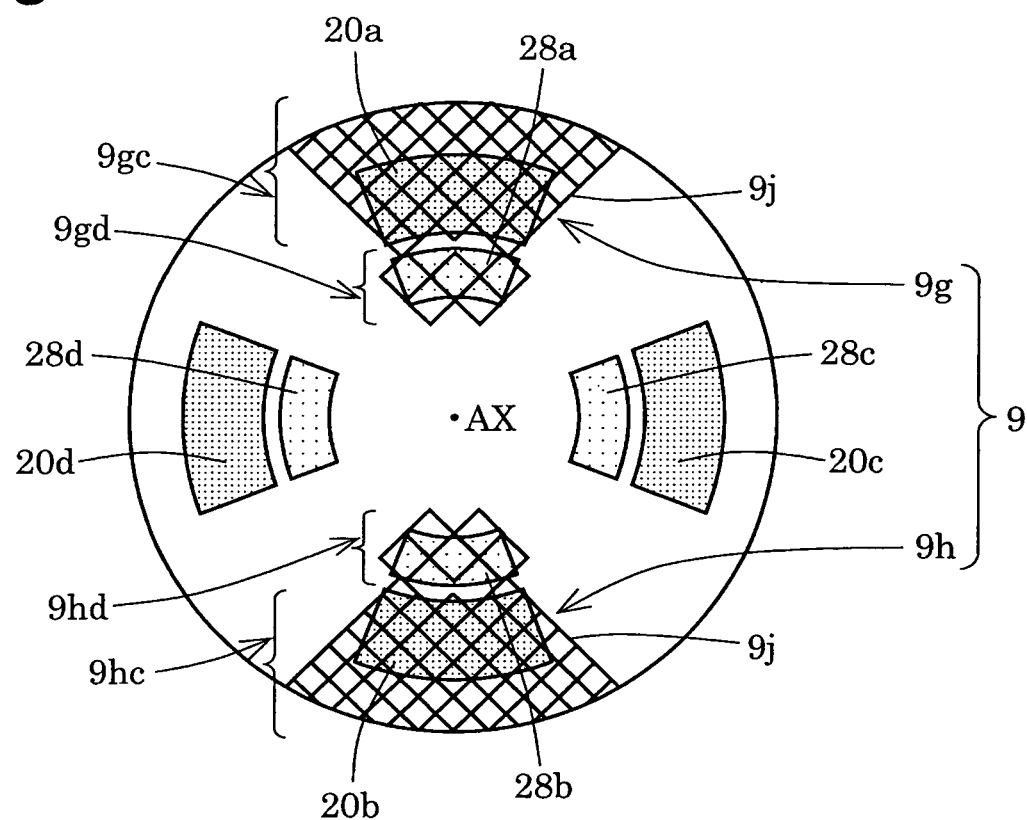
FIG. 34 is a drawing showing a configuration of a light shield portion according to a fourth modification example of the embodiment.

As another example, as shown in FIG. 34, it is also possible to adopt a configuration wherein mesh coarsenesses of the light shield member groups are different depending upon positions, for the first light shield member group 9g and the second light shield member group 9h of the light shield 9; this configuration allows the required attenuation action to be also exerted on the pair of surface illuminants 20a and 20b and the required attenuation action to be exerted on the pair of surface illuminants 28a and 28b. Specifically, in the configuration of FIG. 34, a mesh of light shield member groups 9gd, 9hd arranged opposite to the pair of surface illuminants 28a and 28b is set to be coarser than a mesh of light shield member groups 9gc, 9hc arranged opposite to the pair of surface illuminants 20a and 20b. In other words, the mesh of the light shield member groups 9gd, 9hd arranged near the optical axis AX is set to be coarser than the mesh of the light shield member groups 9gc, 9hc arranged away from the optical axis AX.

In the above description, the action and effect of the present invention were described using the example of the modified illumination to form the quadrupolar pupil intensity distribution on the illumination pupil, i.e., the quadrupolar illumination. However, it is obvious that, without having to be limited to the quadrupolar illumination, the present invention is also similarly applicable with the same action and effect, for example, to the annular illumination to form the pupil intensity distribution of the annular shape and to multi-polar illumination to form the pupil intensity distribution of a multi-polar shape other than the quadrupolar shape.

In the above description, the light shield 9 is arranged immediately behind the rear focal plane of the micro fly's eye lens 8 or the illumination pupil near it. However, without having to be limited to this, the light shield 9 may also be arranged immediately in front of the rear focal plane of the micro fly's eye lens 8 or the illumination pupil near it. Furthermore, the light shield 9 can also be arranged immediately in front of or behind another illumination pupil located behind the micro fly's eye lens 8, e.g., immediately in front of or behind the illumination pupil between the front lens unit 12a and the rear lens unit 12b of the imaging optical system 12. When the light shield 9 is arranged at the position of the illumination pupil, the light shield 9 can be regarded as being arranged immediately in front of or behind the illumination pupil because the light shield 9 has some width along the optical-axis direction.

Figure 35:
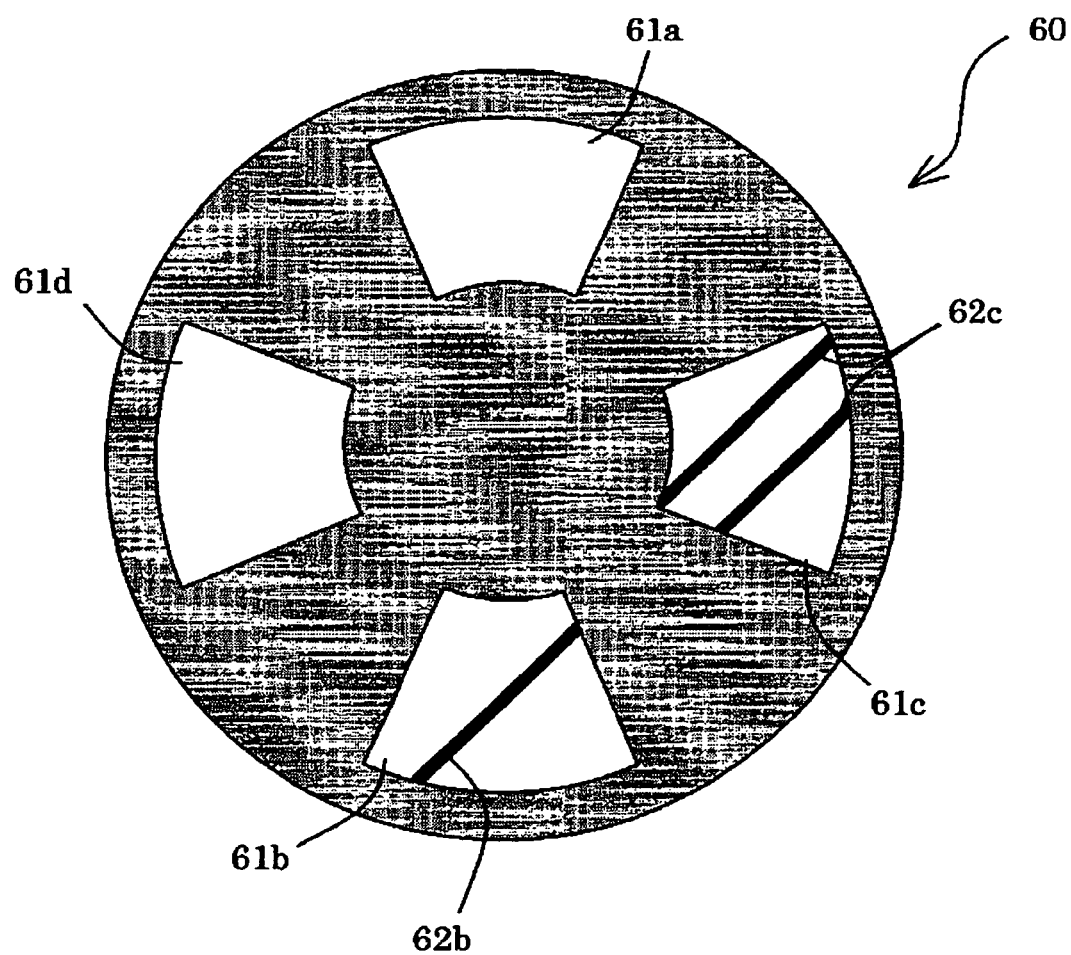
FIG. 35 is a drawing showing a configuration of an example of a compensation filter.

As the compensation filter 6 in the above description, reference can be made, for example, to the disclosures of Japanese Patent Applications Laid-open No. 2005-322855 and Laid-open No. 2007-27240. Furthermore, an aperture stop plate 60 shown in FIG. 35 may be used instead of the compensation filter with the dense pattern of light shield dots for providing the transmittance distribution of different transmittances depending upon positions of incidence of light. In FIG. 35, the aperture stop plate 60 has four apertures 61a-61d formed at positions of the quadrupolar pupil intensity distribution formed at the position of the aperture stop plate 60. The apertures 61b and 61c are provided with respective light shields 62b and 62c. This configuration attenuates the light intensity of beams passing through the apertures 61b and 61c, whereby, among the pupil intensity distributions related to the respective points in the still exposure region ER on the wafer W, pupil intensity distributions formed by the beams passing through the apertures 61b and 61c are equally adjusted independent of positions of respective points. This aperture stop plate 60 can be made by perforating a light-shielding metal plate.

Figure 36:
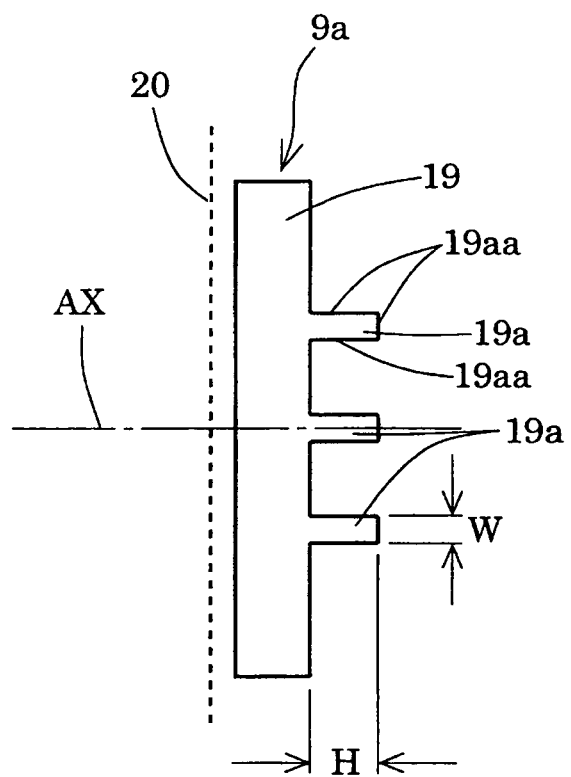
FIG. 36 is a drawing to illustrate a sectional configuration of an attenuation unit according to a modification example.

Instead of the fin member 9, it is also possible to use an optical attenuator having a first attenuation member 9a arranged opposite to one surface illuminant 20a and a second attenuation member 9b arranged opposite to the other surface illuminant 20b out of the surface illuminants 20a and 20b spaced in the X-direction on both sides of the optical axis AX. It is assumed hereinafter, for simplicity of description, that the first attenuation member 9a and the second attenuation member 9b have the same configuration and are arranged in symmetry with respect to an axis extending in the Z-direction while passing the optical axis AX. Referring to FIG. 36 showing a cross section, each attenuation member 9a, 9b is provided with an optically transparent substrate 19 located at the position immediately behind the illumination pupil. The surface of the substrate 19 on the light source side (the left surface in FIG. 36) is formed in a planar shape perpendicular to the optical axis AX and the mask-side surface (the right surface in FIG. 36) has three linear protuberances 19a extending in the X-direction and formed at intervals in the Z-direction.

As an example, each protuberance 19a has the same rectangular cross section (the size in the direction of the optical axis AX or in the Y-direction is H and the size in the Z-direction is W), and an outside surface 19aa of each protuberance 19a is subjected to rough grinding or blackening. The blackening herein means, for example, a process of forming a thin film of a light shielding material such as chromium (Cr) on a surface. As an example, the center protuberance 19a is formed along an axis extending in the X-direction while passing the optical axis AX, and the other protuberances 19a are formed at mutually identical intervals from the center protuberance 19a. In other words, in each attenuation member 9a, 9b, the three linear protuberances 19a are formed in symmetry with respect to the axis extending in the X-direction while passing the optical axis AX. The attenuation unit 9 is fabricated, for example, by etching a plane-parallel plate of silica glass, or by polishing it.

Therefore, light traveling from the quadrupolar pupil intensity distribution 20 through the interior of each protuberance 19a to impinge upon an outside surface 19aa and light traveling through the exterior of each protuberance 19a to impinge upon the outside surface 19aa, is subjected to scattering action by the outside surface 19aa subjected to rough grinding, to be guided to the outside of the illumination optical path, or subjected to light shield action by the outside surface 19aa subjected to blackening, to be blocked in travel along the illumination optical path. Namely, each protuberance 19a functions as a light shield member having the rectangular cross section with the Y-directional size of H and the Z-directional size of W and extending linearly along the X-direction.

Figure 37:
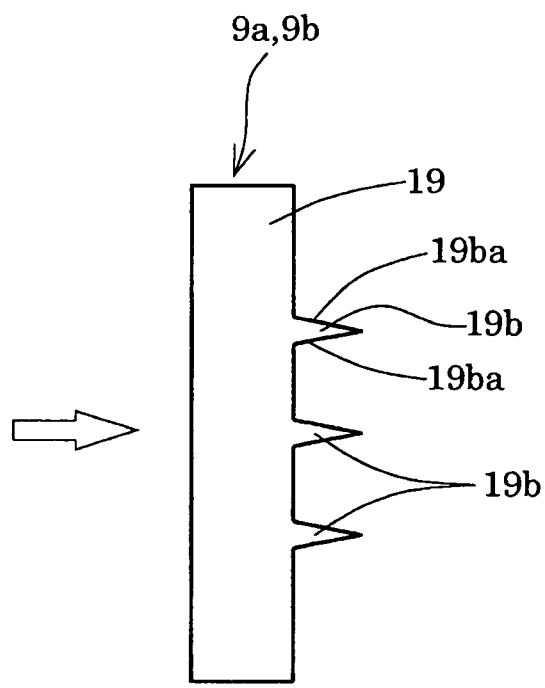
FIG. 37 is a drawing showing a configuration of an attenuation unit with protuberances of a triangular cross section.

In the above modification example, the three protuberances 19a of the rectangular cross section are formed on one surface of the substrate 19. However, without having to be limited to this, for example as shown in FIG. 37, it is also possible to adopt a configuration wherein the attenuation members 9a, 9b are configured by forming a predetermined number of protuberances 19b with a triangular cross section on the surface of the substrate 19 on the light exit side (or on the surface on the light entrance side or on the both surfaces) and subjecting the outside surface 19ba of each protuberance 19b to rough grinding or blackening.

Figure 38:
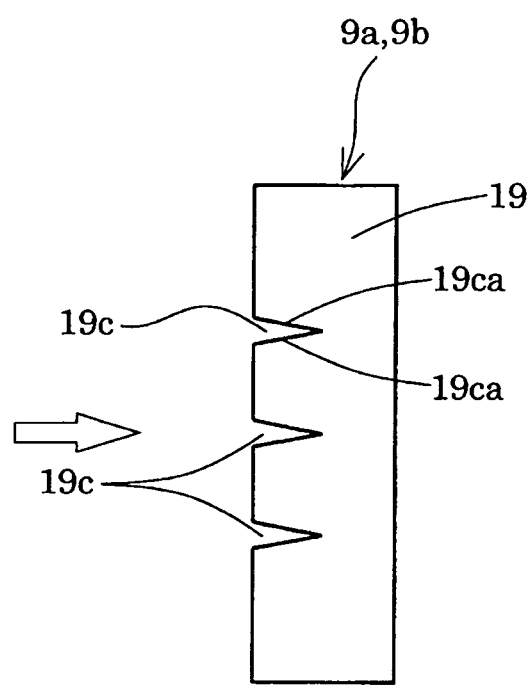
FIG. 38 is a drawing showing a configuration of an attenuation unit with grooves of a triangular cross section.

The above modification example uses the protuberances 19a formed on one surface of the substrate 19, as a linear attenuation portion. However, without having to be limited to this, it is also possible to adopt a configuration, for example as shown in FIG. 38, wherein the attenuation members 9a, 9b are configured by forming a predetermined number of grooves 19c of a triangular cross section in the surface of the substrate 19 on the light entrance side (or in the surface on the light exit side or on the both surfaces) and subjecting the outside surface 19ca of each groove 19c to rough grinding or blackening. However, in a case where the grooves 19c as the linear attenuation portion are formed only in the surface of the substrate 19 on the light entrance side, it is also contemplated that the outside surface 19ca thereof is not subjected to rough grinding or blackening.

Figure 39:
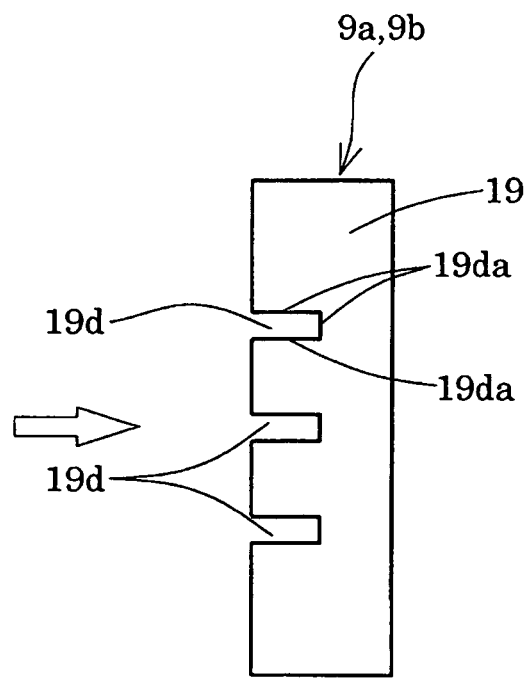
FIG. 39 is a drawing showing a configuration of an attenuation unit with grooves of a rectangular cross section.

For example, as shown in FIG. 39, it is also possible to adopt a configuration wherein the attenuation members 9a, 9b are configured by forming a predetermined number of grooves 19d of a rectangular cross section on the surface of the substrate 19 on the light entrance side (or on the surface on the light exit side or on the both surfaces) and subjecting the outside surface 19da of each groove 19d to rough grinding or blackening.

As described above, a variety of modification examples can be contemplated as to specific configurations of the attenuation unit 9. Specifically, a variety of modification examples can be contemplated as to the contour and number of attenuation members, the form of the linear attenuation portion (protuberances, grooves, mixtures thereof, etc.), the sectional shape (rectangular shape, triangular shape, etc.) and parameters (sizes of protuberances or grooves, etc.) of the linear attenuation portion, the number of the linear attenuation portion, the orientation of the longitudinal direction of the linear attenuation portion, selection of the surface of the substrate where the linear attenuation portion is formed, and so on.

Second Embodiment

Figure 40:
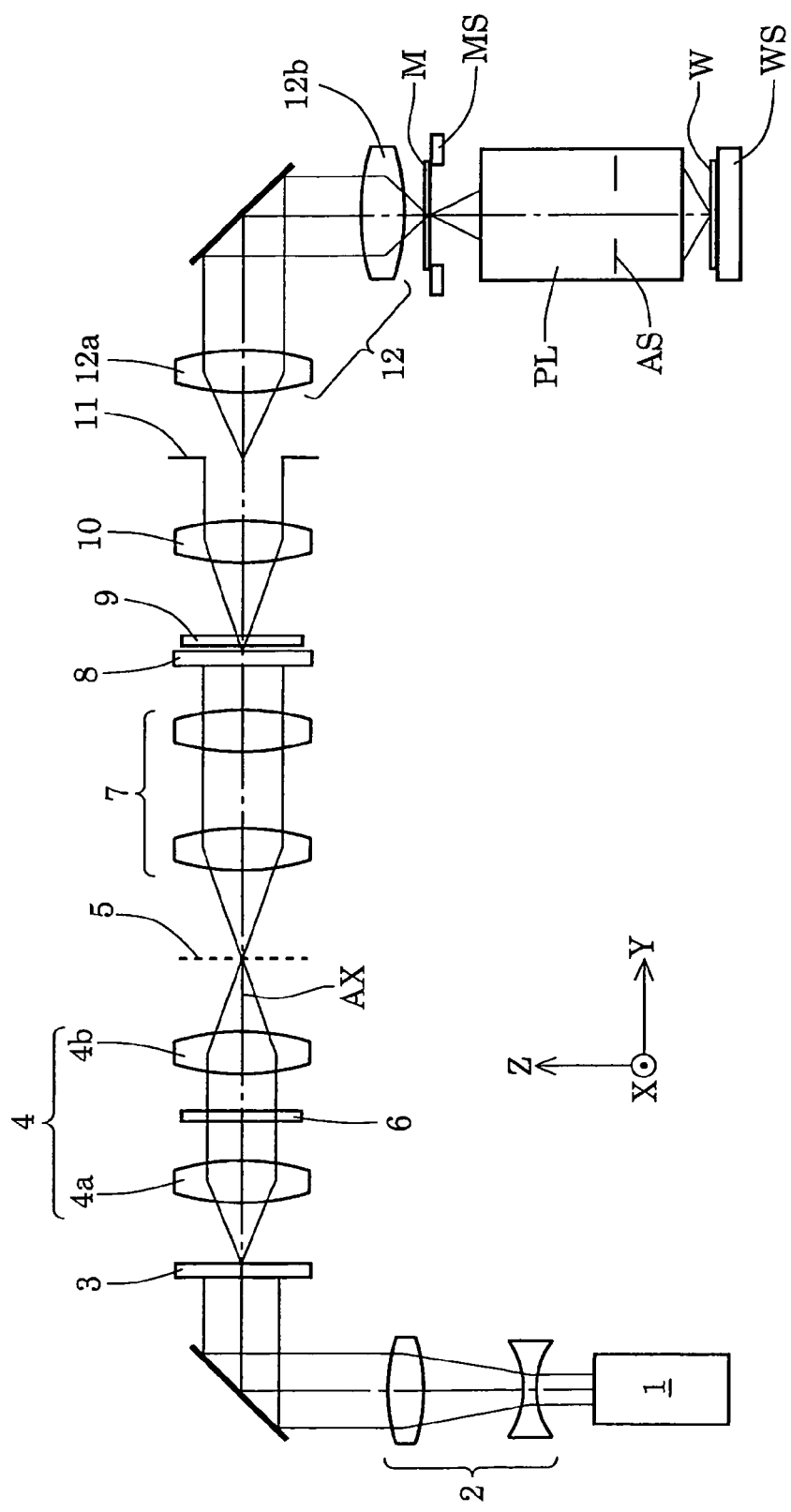
FIG. 40 is a drawing schematically showing a configuration of an exposure apparatus according to another embodiment of the present invention.

The second embodiment of the present invention will be described on the basis of the accompanying drawings. FIG. 40 is a drawing schematically showing a configuration of an exposure apparatus according to the second embodiment. The second embodiment uses a compensation filter 9 instead of the fin member. In FIG. 40, the Z-axis is set along a direction of a normal to an exposure surface (transfer surface) of a wafer W being a photosensitive substrate, the Y-axis along a direction parallel to the plane of FIG. 40 in the exposure surface of the wafer W, and the X-axis along a direction perpendicular to the plane of FIG. 40 in the exposure surface of the wafer W.

Figure 41:
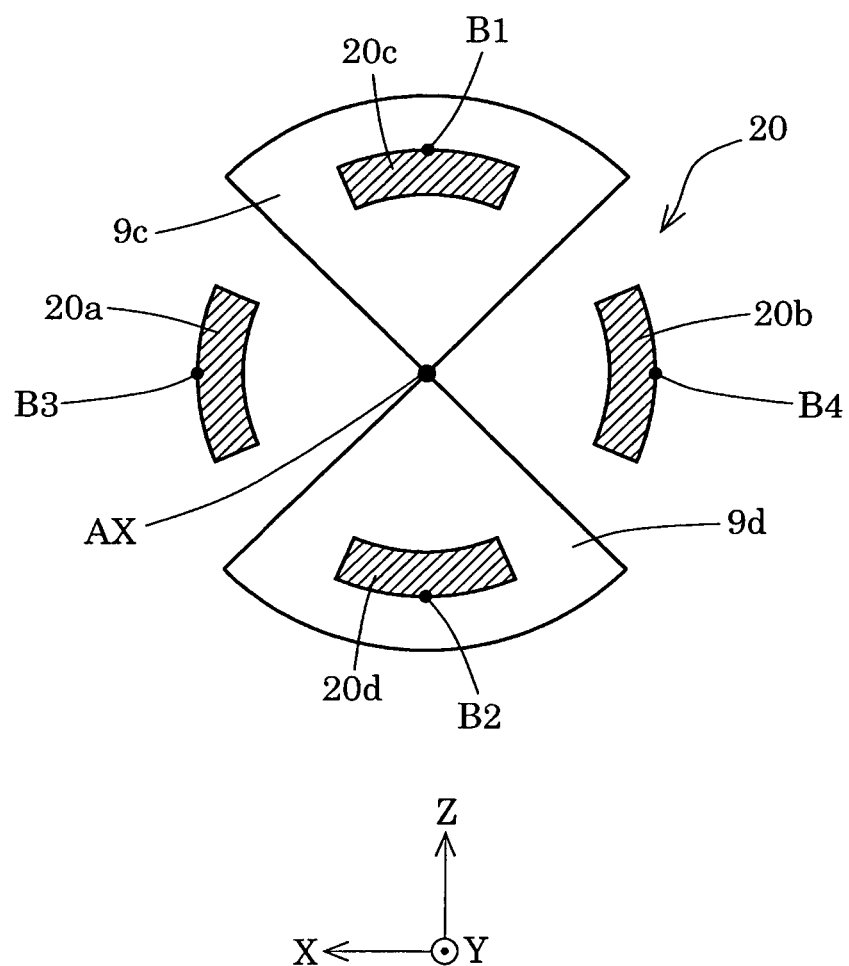
FIG. 41 is a drawing showing a secondary light source of a quadrupolar shape formed on an illumination pupil.

It is assumed in the description hereinafter, for easier understanding of the action and effect of the present embodiment, that a pupil intensity distribution (secondary light source) 20 of a quadrupolar shape consisting of four substantial surface illuminants of an arcuate shape (which will be referred to simply as "surface illuminants") 20a, 20b, 20c, and 20d as shown in FIG. 41 is formed on the rear focal plane of the micro fly's eye lens 8 or on the illumination pupil near it. It is also assumed that the compensation filter 9 is arranged behind (or on the mask side of) the plane where the pupil intensity distribution 20 of the quadrupolar shape is formed. When the "illumination pupil" is simply used in the description hereinafter, it means the rear focal plane of the micro fly's eye lens 8 or the illumination pupil near it.

With reference to FIG. 41, the pupil intensity distribution 20 of the quadrupolar shape formed on the illumination pupil has a pair of surface illuminants 20a and 20b-spaced in the X-direction on both sides of the optical axis AX, and a pair of substantial surface illuminants 20c, 20d of an arcuate shape spaced in the Z-direction on both sides of the optical axis AX. The X-direction on the illumination pupil is the short-side direction of the rectangular micro lenses of the micro fly's eye lens 8 and corresponds to the scanning direction of the wafer W. The Z-direction on the illumination pupil is the long-side direction of the rectangular micro lenses of the micro fly's eye lens 8 and corresponds to an orthogonal-to-scan direction (the Y-direction on the wafer W) perpendicular to the scanning direction of the wafer W.

As shown in FIG. 3, a still exposure region ER of a rectangular shape having the long sides along the Y-direction and the short sides along the X-direction is formed on the wafer W and a rectangular illumination region (not shown) is formed on the mask M so as to correspond to this still exposure region ER.

Figure 42:
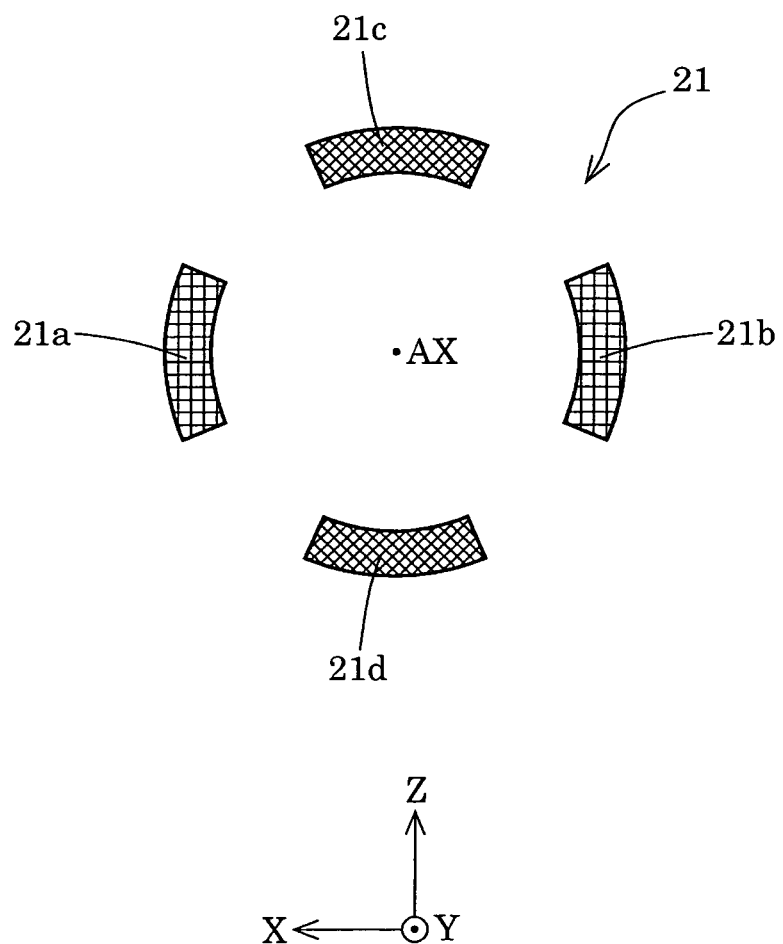
FIG. 42 is a drawing to illustrate a property of a pupil intensity distribution of a quadrupolar shape formed by light incident to a center point P1 in a still exposure region.
Figure 43:
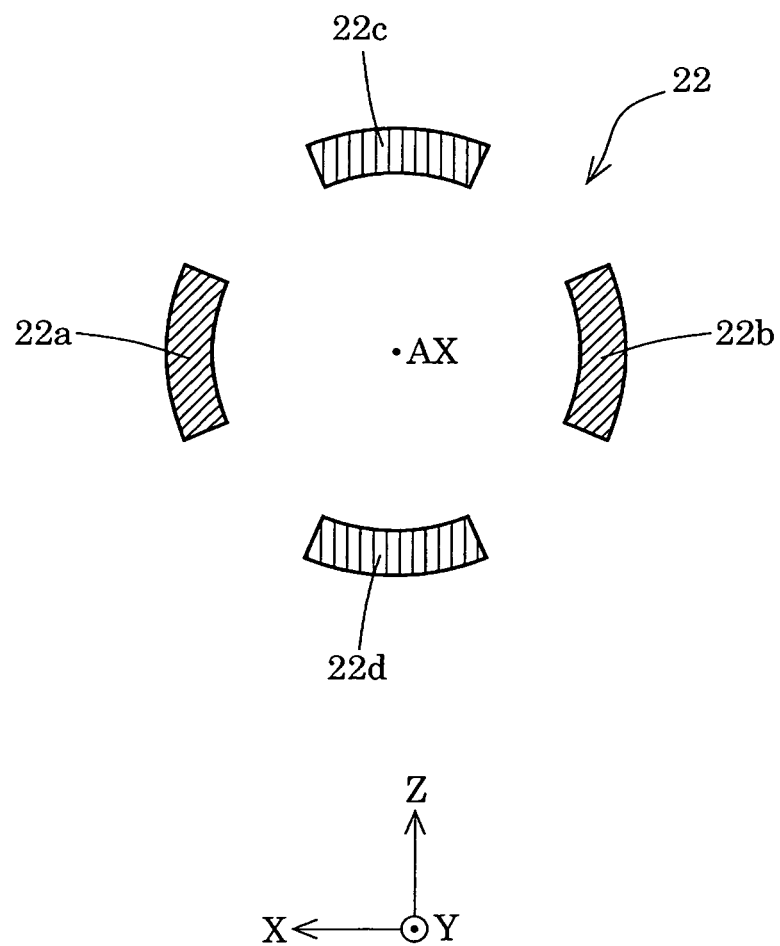
FIG. 43 is a drawing to illustrate a property of a pupil intensity distribution of a quadrupolar shape formed by light incident to peripheral points P2, P3 in the still exposure region.

Specifically, in the case of a quadrupolar pupil intensity distribution 21 formed by light incident to the center point P1 in the still exposure region ER, as shown in FIG. 42, the light intensity of surface illuminants 21c and 21d spaced in the Z-direction tends to become larger than the light intensity of surface illuminants 21a and 21b spaced in the X-direction. On the other hand, in the case of a quadrupolar pupil intensity distribution 22 formed by light incident to the peripheral points P2, P3 spaced in the Y-direction apart from the center point P1 in the still exposure region ER, as shown in FIG. 43, the light intensity of surface illuminants 22c and 22d spaced in the Z-direction tends to become smaller than the light intensity of surface illuminants 22a and 22b spaced in the X-direction.

Figure 44A:
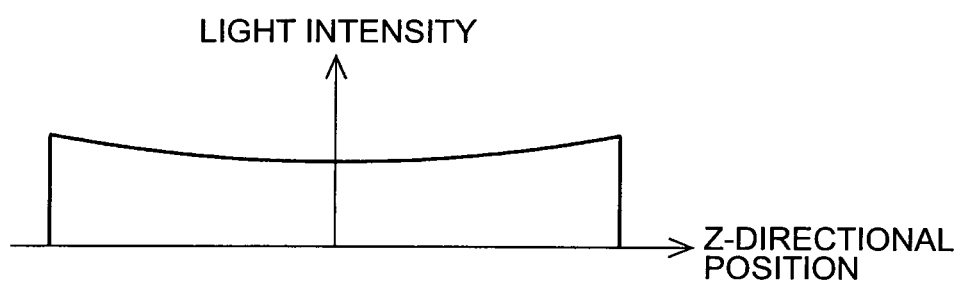
FIG. 44A is a drawing schematically showing a light intensity profile along the Z-direction of the pupil intensity distribution related to the center point P1.
Figure 44B:
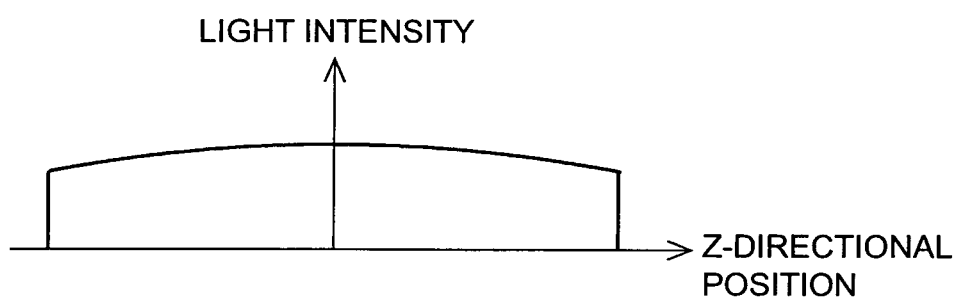
FIG. 44B is a drawing schematically showing a light intensity profile along the Z-direction of the pupil intensity distribution related to the peripheral points P2, P3.

In general, regardless of the contour of the pupil intensity distribution formed on the illumination pupil, a light intensity profile along the Z-direction of the pupil intensity distribution related to the center point P1 in the still exposure region ER on the wafer W (the pupil intensity distribution formed on the illumination pupil by the light incident to the center point P1) has a profile of a concave curve shape in which the intensity is minimum in the center and increases toward the periphery, as shown in FIG. 44A. On the other hand, a light intensity profile along the Z-direction of the pupil intensity distribution related to the peripheral points P2, P3 in the still exposure region ER on the wafer W has a profile of a convex curve shape in which the intensity is maximum in the center and decreases toward the periphery, as shown in FIG. 44B.

The light intensity profile along the Z-direction of the pupil intensity distribution is not very dependent on positions of incident points along the X-direction (scanning direction) in the still exposure region ER, but tends to vary depending upon positions of incident points along the Y-direction (orthogonal-to-scan direction) in the still exposure region ER. When each of the pupil intensity distributions related to the respective points in the still exposure region ER on the wafer W (pupil intensity distributions formed on the illumination pupil by light incident to the respective points) is not substantially uniform as in this case, the line width of the pattern varies depending upon positions on the wafer W, so as to fail in faithfully transferring the micro pattern of the mask M in a desired line width across the entire exposure region on the wafer W.

In the present embodiment, as described above, the density filter 6 with the transmittance distribution of different transmittances depending upon positions of incidence of light is arranged at or near the pupil position of the afocal lens 4. The pupil position of the afocal lens 4 is optically conjugate with the entrance surface of the micro fly's eye lens 8 by virtue of the rear lens unit 4b of the afocal lens 4 and the zoom lens 7. Therefore, the light intensity distribution formed on the entrance surface of the micro fly's eye lens 8 is adjusted (or corrected) by the action of the density filter 6 and, in turn, the pupil intensity distribution formed on the rear focal plane of the micro fly's eye lens 8 or on the illumination pupil near it is also adjusted.

However, the density filter 6 equally adjusts the pupil intensity distributions related to the respective points in the still exposure region ER on the wafer W, independent of positions of the respective points. As a consequence, it is possible, for example, to adjust the quadrupolar pupil intensity distribution 21 related to the center point P1, to a substantially uniform one and, in turn, to make the light intensities of the respective surface illuminants 21a-21d approximately equal to each other by the action of the density filter 6, but in that case, the difference becomes larger on the contrary between the light intensities of the surface illuminants 22a, 22b and the surface illuminants 22c, 22d of the quadrupolar pupil intensity distribution 22 related to the peripheral points P2, P3.

Namely, in order to substantially uniformly adjust each of the pupil intensity distributions related to the respective points in the still exposure region ER on the wafer W by the action of the density filter 6, the pupil intensity distributions related to the respective points may be adjusted to distributions of mutually identical properties by another means different from the density filter 6. Specifically, for example, in the pupil intensity distribution 21 related to the center point P1 and the pupil intensity distribution 22 related to the peripheral points P2, P3, the magnitude relation of light intensities between the surface illuminants 21a, 21b and the surface illuminants 21c, 21d and the magnitude relation of light intensities between the surface illuminants 22a, 22b and the surface illuminants 22c, 22d may be made coincident at a nearly equal ratio.

In the present embodiment, in order to make the property of the pupil intensity distribution related to the center point P1 approximately coincident with the property of the pupil intensity distribution related to the peripheral points P2, P3, the compensation filter 9 is provided for realizing such adjustment that the light intensity of the surface illuminants 21a, 21b becomes smaller than the light intensity of the surface illuminants 21c, 21d in the pupil intensity distribution 21 related to the center point P1. The compensation filter 9, as shown in FIG. 40, has a form of an optically transparent substrate with a predetermined thickness along the optical axis AX. Specifically, the compensation filter 9 has a form of a plane-parallel plate made of an optical material, for example, like silica or fluorite.

Referring to FIG. 45, light shield dots 9aa of a circular shape, for example, of chromium, chromium oxide, or the like are formed in a predetermined distribution on the surface 9a on the light entrance side (light source side) of the compensation filter 9. On the other hand, light shield dots 9bb of a ring shape, for example, of chromium, chromium oxide, or the like are formed as distributed in one-to-one correspondence to the circular light shield dots 9aa on the surface 9b on the light exit side (mask side) of the compensation filter 9.

It is assumed hereinafter, for easier understanding of description, that a line connecting a center of a circular light shield dot 9aa and a center of a ring light shield dot 9bb is parallel to the optical axis AX. It is also assumed that the inside diameter of the ring light shield dot 9bb is equal to the outside diameter of the circular light shield dot 9aa and that the outside diameter of the ring light shield dot 9bb is double the outside diameter of the circular light shield dot 9aa. Namely, the circular light shield dot 9aa and the ring light shield dot 9bb have their respective shapes complementary to each other when viewed in the direction of the optical axis AX, and do not overlap with each other.

Figure 46A:
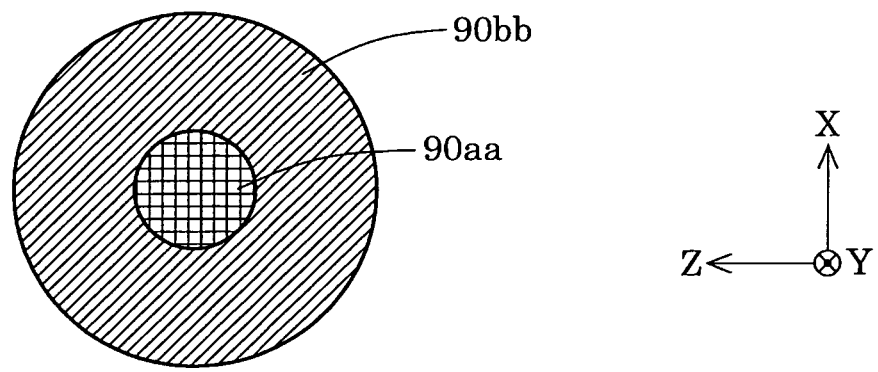
FIG. 46A is a drawing to illustrate an attenuation action of the unit attenuation region of the compensation filter according to the embodiment.

In this case, when light parallel to the optical axis AX is incident to a unit attenuation region consisting of a combination of the circular light shield dot 9aa and the ring light shield dot 9bb, there is no overlap between a region 90aa attenuated by the circular light shield dot 9aa (note: the term "attenuate" herein is a general concept including "light shield") and a region 90bb attenuated by the ring light shield dot 9bb, as shown in FIG. 46A, on a plane parallel to the exit surface 9b immediately behind the compensation filter 9. Namely, immediately behind the compensation filter 9, the circular attenuation region 90*aa* and the ring attenuation region 90*bb* form a circular attenuation region with the same outside diameter as that of the ring attenuation region 90*bb*.

Figure 46B:
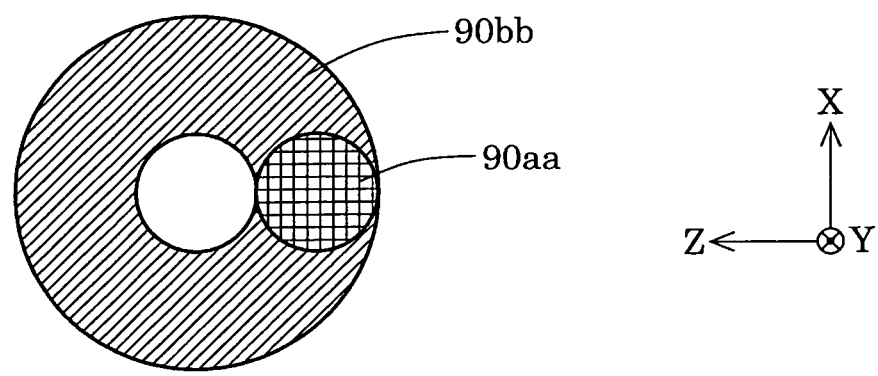
FIG. 46B is a drawing to illustrate the attenuation action of the unit attenuation region of the compensation filter according to the embodiment.
Figure 46C:
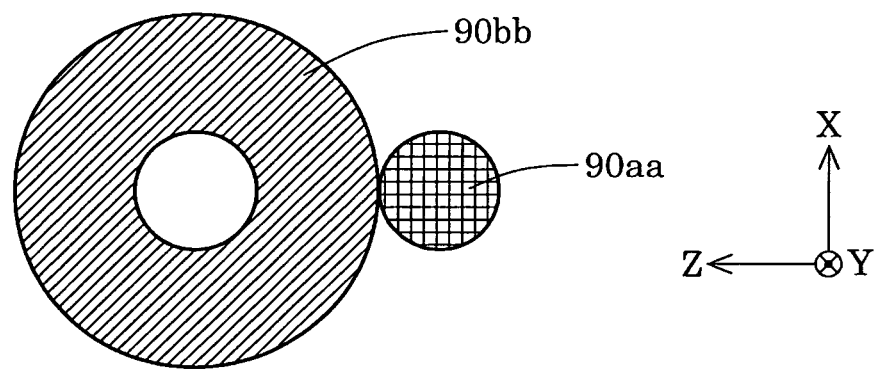
FIG. 46C is a drawing to illustrate the attenuation action of the unit attenuation region of the compensation filter according to the embodiment.

As the angle to the optical axis AX of light incident to the unit attenuation region consisting of the circular light shield dot 9*aa* and the ring light shield dot 9*bb* monotonically increases from 0°, for example, along the YZ plane, the circular attenuation region 90*aa* immediately behind the compensation filter 9 moves in the Z-direction to monotonically increase an overlap region with the ring attenuation region 90*bb* and, after a while, the circular attenuation region 90*aa* is located inside the ring attenuation region 90*bb* as shown in FIG. 46B. As the angle of incident light to the optical axis AX further monotonically increases along the XY plane, the overlap region between the circular attenuation region 90*aa* and the ring attenuation region 90*bb* monotonically decreases and, after a while, the circular attenuation region 90*aa* is located outside the ring attenuation region 90*bb* as shown in FIG. 46C.

Figure 47:
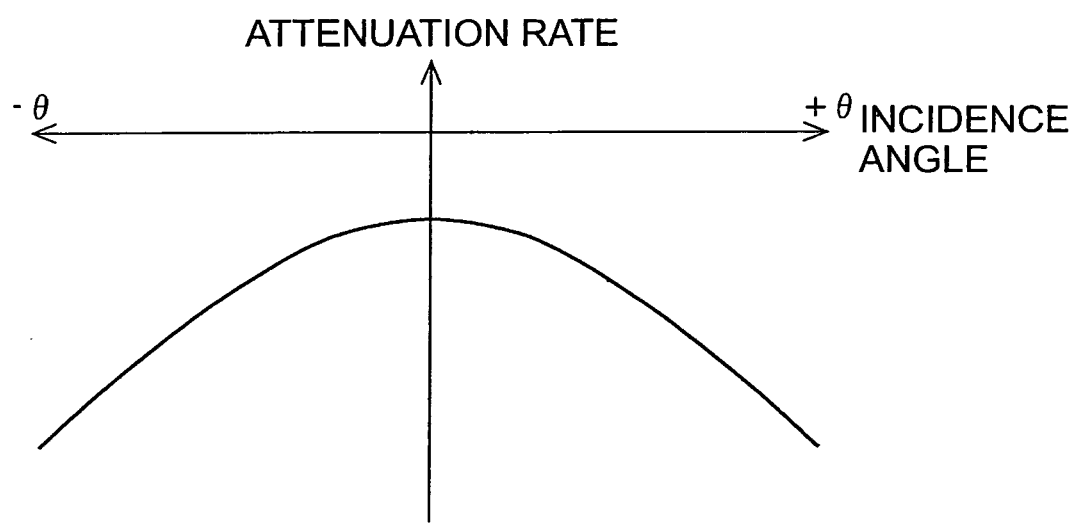
FIG. 47 is a drawing showing an attenuation characteristic of the compensation filter in the embodiment.

It is assumed in the present embodiment that the maximum incidence angle along the YZ plane of light from the quadrupolar pupil intensity distribution 20 to the compensation filter 9 is not more than the angle of incidence of light at which the circular attenuation region 90*aa* is located inside the ring attenuation region 90*bb* as shown in FIG. 46B. In this case, the unit attenuation region consisting of the circular light shield dot 9*aa* and the ring light shield dot 9*bb* comes to exert the attenuation action to decrease the attenuation rate with increase in the angle of incidence of light. As a result, the compensation filter 9 consisting of a large number of unit attenuation regions consisting of the light shield dots 9*aa* and 9*bb* formed in the predetermined distribution, has an attenuation characteristic of decreasing the attenuation rate with increase in the incidence angle θ of light to the compensation filter 9, as shown in FIG. 47.

The compensation filter 9, as shown in FIG. 41, has a pair of filter regions 9*c* and 9*d* arranged corresponding to the pair of surface illuminants 20*c*, 20*d* spaced in the Z-direction on both sides of the optical axis AX. Therefore, of the quadrupolar pupil intensity distribution 20, light from the surface illuminant 20*c* passes through the filter region 9*c* and light from the surface illuminant 20*d* passes through the filter region 9*d*; however, light from the surface illuminants 20*a*, 20*b* is not subjected to the action of the compensation filter 9.

Figure 48:
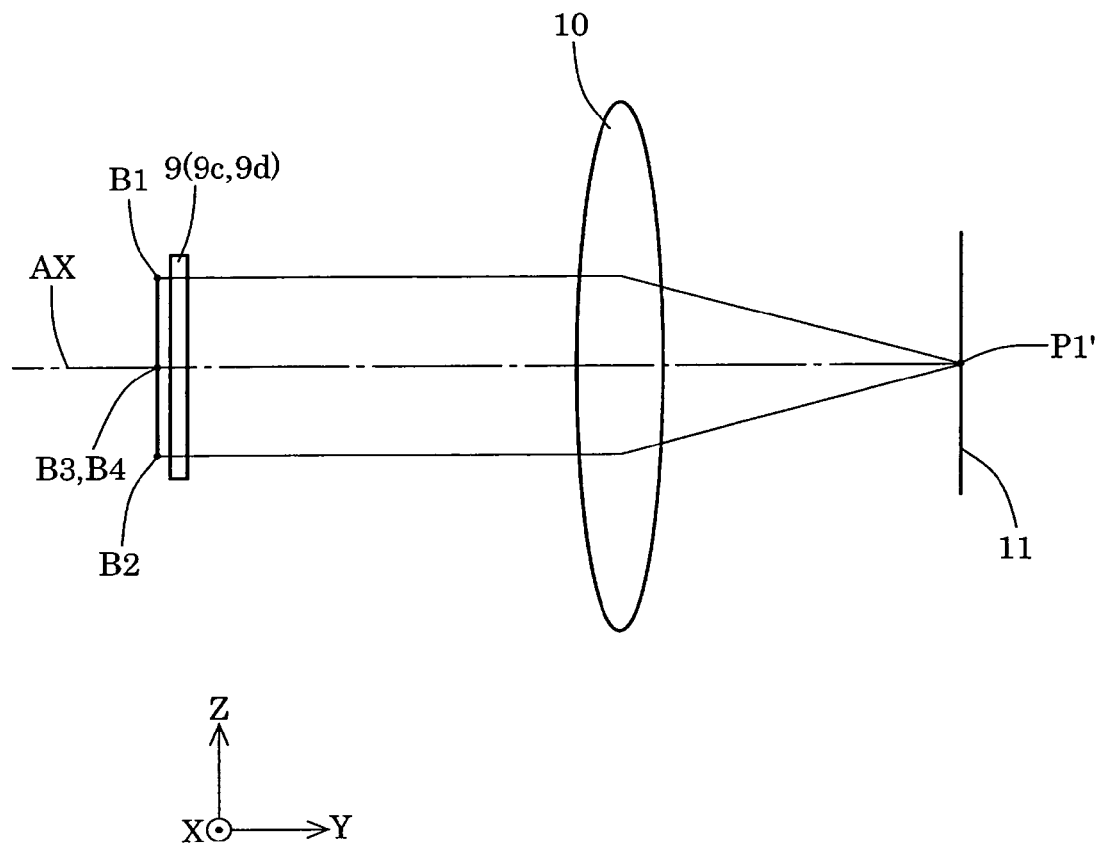
FIG. 48 is a first drawing to illustrate an action of the compensation filter in the embodiment.
Figure 49:
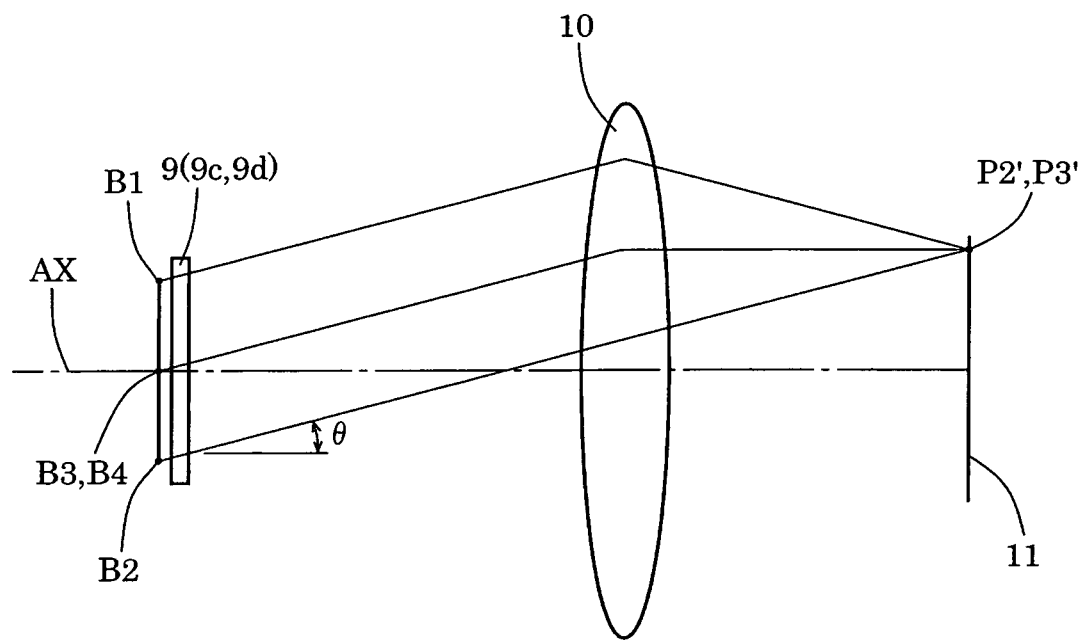
FIG. 49 is a second drawing to illustrate an action of the compensation filter in the embodiment.

In this case, as shown in FIG. 48, the light reaching the center point P1 in the still exposure region ER on the wafer W, i.e., light reaching the center point P1' of the aperture of the mask blind 11 is incident at the incidence angle of 0 to the compensation filter 9. In other words, the light from the surface illuminants 21*c* and 21*d* of the pupil intensity distribution 21 related to the center point P1 is incident at the incidence angle of 0 to the pair of filter regions 9*c* and 9*d*. On the other hand, as shown in FIG. 49, the light reaching the peripheral points P2, P3 in the still exposure region ER on the wafer W, i.e., the light reaching the peripheral points P2', P3' of the aperture of the mask blind 11 is incident at the incidence angles ±θ to the compensation filter 9. In other words, the light from the surface illuminants 22*c* and 22*d* of the pupil intensity distribution 22 related to the peripheral points P2, P3 is incident each at the incidence angles ±θ to the pair of filter regions 9*c* and 9*d*.

In FIGS. 48 and 49, reference symbol B1 denotes an outermost edge point along the Z-direction of the surface illuminant 20*c* (21*c*, 22*c*) (cf. FIG. 41) and reference symbol B2 an outermost edge point along the Z-direction of the surface illuminant 20*d* (21*d*, 22*d*) (cf. FIG. 41). Furthermore, for easier understanding of the description associated with FIGS. 48 and 49, an outermost edge point along the X-direction of the surface illuminant 20*a* (21*a*, 22*a*) is denoted by reference symbol B3 and an outermost edge point along the X-direction of the surface illuminant 20*b* (21*b*, 22*b*) by reference symbol B4. However, as described above, the light from the surface illuminant 20*a* (21*a*, 22*a*) and the surface illuminant 20*b* (21*b*, 22*b*) is not subjected to the action of the compensation filter 9.

Figure 50:
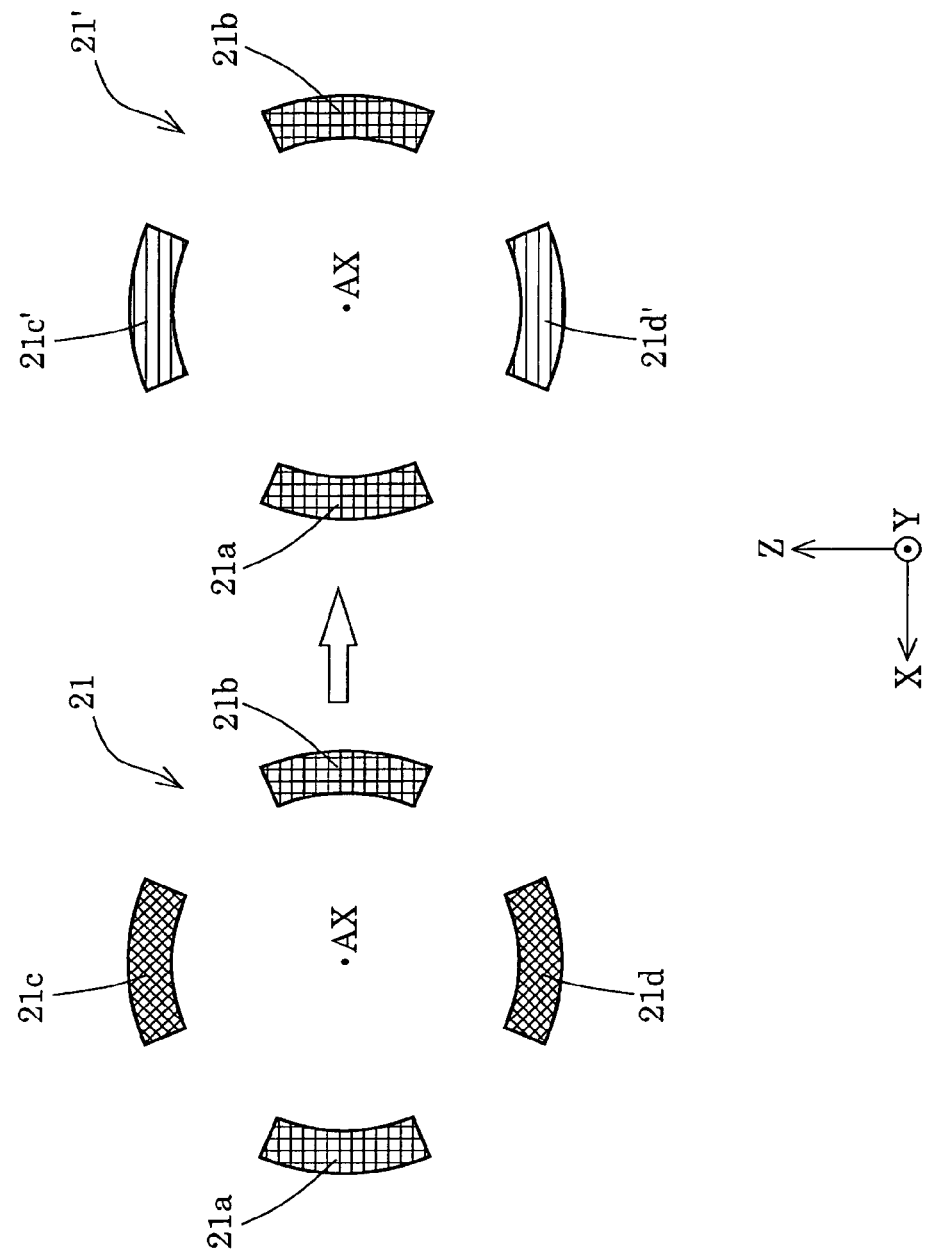
FIG. 50 is a drawing schematically showing how the pupil intensity distribution related to the center point P1 is adjusted by the compensation filter of the embodiment.

In this manner, the light from the surface illuminants 21*c* and 21*d* in the pupil intensity distribution 21 related to the center point P1 is subjected to the attenuation action of the filter regions 9*c* and 9*d* of the compensation filter 9, and the light intensity thereof is relatively significantly decreased. Since the light from the surface illuminants 21*a* and 21*b* is not subjected to the action of the compensation filter 9, there is no change in the light intensity thereof. As a result, the pupil intensity distribution 21 related to the center point P1 is subjected to the action of the compensation filter 9, as shown in FIG. 50, to be adjusted to a pupil intensity distribution 21' of a property different from that of the original distribution 21. Namely, the pupil intensity distribution 21' adjusted by the compensation filter 9 comes to have the property that the light intensity of the surface illuminants 21*a*, 21*b* spaced in the X-direction is larger than the light intensity of surface illuminants 21*c*', 21*d*' spaced in the Z-direction.

Figure 51:
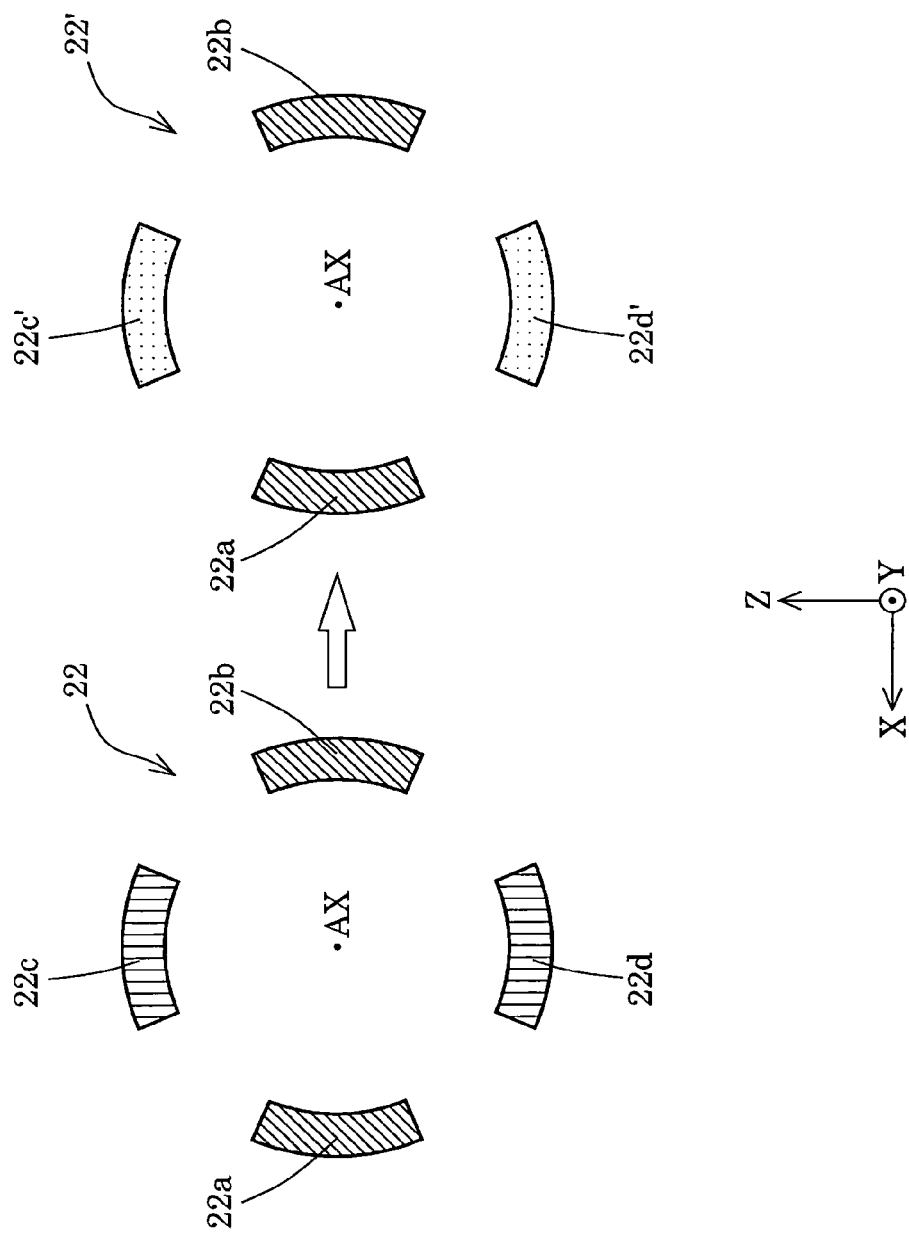
FIG. 51 is a drawing schematically showing how the pupil intensity distribution related to the peripheral points P2, P3 is adjusted by the compensation filter of the embodiment.

On the other hand, the light from the surface illuminants 22*c* and 22*d* in the pupil intensity distribution 22 related to the peripheral points P2, P3 is subjected to the action of the filter regions of the compensation filter 9 and the light intensity thereof is relatively insignificantly decreased. Since the light from the surface illuminants 22*a* and 22*b* is not subjected to the action of the compensation filter 9, there is no change in the light intensity thereof. As a result, the pupil intensity distribution 22 related to the peripheral points P2, P3 is adjusted to a pupil intensity distribution 22' of a property similar to that of the original distribution 22, as shown in FIG. 51, by the action of the compensation filter 9. Namely, the pupil intensity distribution 22' adjusted by the compensation filter 9 maintains the property that the light intensity of the surface illuminants 22*a*, 22*b* spaced in the X-direction is larger than the light intensity of surface illuminants 22*c*', 22*d*' spaced in the Z-direction.

In this manner, the pupil intensity distribution 21 related to the center point P1 is adjusted to the distribution 21' of the property substantially identical to that of the pupil intensity distribution 22' related to the peripheral points P2, P3 by the action of the compensation filter 9. Similarly, the pupil intensity distributions related to respective points arranged along the Y-direction between the center point P1 and the peripheral points P2, P3 and, therefore, the pupil intensity distributions related to the respective points in the still exposure region ER on the wafer W are also adjusted to distributions of substantially mutually identical properties. In other words, the pupil intensity distributions related to the respective points in the still exposure region ER on the wafer W are adjusted to distributions of substantially mutually identical properties by the action of the compensation filter 9.

In still another expression, the pair of filter regions 9*c* and 9*d* of the compensation filter 9 have the required attenuation characteristic necessary for adjusting the pupil intensity distributions related to the respective points, to distributions of substantially mutually identical properties, i.e., the required attenuation characteristic of decreasing the attenuation rate with increase in the angle of incidence of light. The required attenuation characteristic of the pair of filter regions 9*c* and 9*d* is realized, for example, by properly setting the thickness of the substrate forming the compensation filter 9 or the distribution of unit attenuation regions consisting of the circular light shield dots 9aa and ring light shield dots 9bb in the filter regions 9c and 9d.

In the compensation filter 9 of the present embodiment, as described above, the large number of circular light shield dots 9aa are formed in the predetermined distribution on the entrance surface of the optically transparent substrate having the form of the plane-parallel plate and the large number of ring light shield dots 9bb are formed in one-to-one correspondence to the large number of circular light shield dots 9aa on the exit surface of the substrate. In other words, the first attenuation pattern consisting of the large number of circular light shield dots 9aa is formed on the entrance surface of the compensation filter 9 and the second attenuation pattern consisting of the large number of ring light shield dots 9bb is formed on the exit surface. The circular light shield dot 9aa and the ring light shield dot 9bb have their respective shapes complementary to each other when viewed in the direction of the optical axis AX. Therefore, the unit attenuation region consisting of the circular light shield dot 9aa and the ring light shield dot 9bb exerts the attenuation action to decrease the attenuation rate with increase in the angle of incidence of light, by virtue of the so-called parallax effect.

As a result, the compensation filter 9 consisting of the large number of unit attenuation regions consisting of the light shield dots 9aa and 9bb formed in the predetermined distribution has the attenuation characteristic of decreasing the attenuation rate with increase in the incidence angle of light. The compensation filter 9 is arranged at the position near the illumination pupil, i.e., at the position where position information of light on the mask M (or wafer W) being the surface to be illuminated is converted into angle information of light. Therefore, it is feasible to independently adjust each of the pupil intensity distributions related to the respective points on the surface to be illuminated and, therefore, to adjust the pupil intensity distributions related to the respective points, to distributions of substantially mutually identical properties, by the attenuation action of the compensation filter 9 of the present embodiment. Particularly, since the compensation filter 9 of the present embodiment adopts the structure in which the first attenuation pattern is provided on the entrance surface of a substrate and in which the second attenuation pattern is provided on the exit surface of the same substrate, it is easy to achieve registration (alignment) between the first attenuation pattern and the second attenuation pattern.

In the illumination optical system of the present embodiment, the pupil intensity distributions related to the respective points each are substantially uniformly adjusted through collaboration between the compensation filter 9 having the pair of filter regions 9c and 9d with the required attenuation characteristic of decreasing the attenuation rate with increase in the angle of incidence of light and independently adjusting each of the pupil intensity distributions related to the respective points in the still exposure region ER on the wafer W, and the density filter 6 having the required transmittance characteristic varying depending upon the position of incidence of light and equally adjusting the pupil intensity distributions related to the respective points. Therefore, the exposure apparatus (2-WS) of the present embodiment is able to perform excellent exposure under an appropriate illumination condition according to the micro pattern of the mask M, using the illumination optical system (2-12) to substantially uniformly adjust each of the pupil intensity distributions for the respective points in the still exposure region ER on the wafer W, and therefore to faithfully transfer the micro pattern of the mask M in a desired line width across the entire exposure region on the wafer W.

It is considered in the present embodiment that the light quantity distribution on the wafer (surface to be illuminated) W is affected, for example, by the adjusting action of the compensation filter 9. In this case, as described in the first embodiment above, an exposure dose distribution can be modified by action of a light quantity distribution adjuster having a known configuration, if necessary, so as to change the illuminance distribution in the still exposure region ER or change the shape of the still exposure region (illumination region) ER.

In the above embodiment, the circular light shield dots 9aa as first unit attenuation regions formed as distributed on the entrance surface of the compensation filter 9 and the ring light shield dots 9bb as second unit attenuation regions formed as distributed on the exit surface have their respective shapes complementary to each other when viewed in the direction of the optical axis AX. However, without having to be limited to this, a variety of forms can be contemplated as to the shape of the first unit attenuation regions formed as distributed on the entrance surface of the compensation filter 9, the shape of the second unit attenuation regions formed as distributed on the exit surface, the positional relationship between the first unit attenuation regions and the second unit attenuation regions, and so on.

Figure 52:
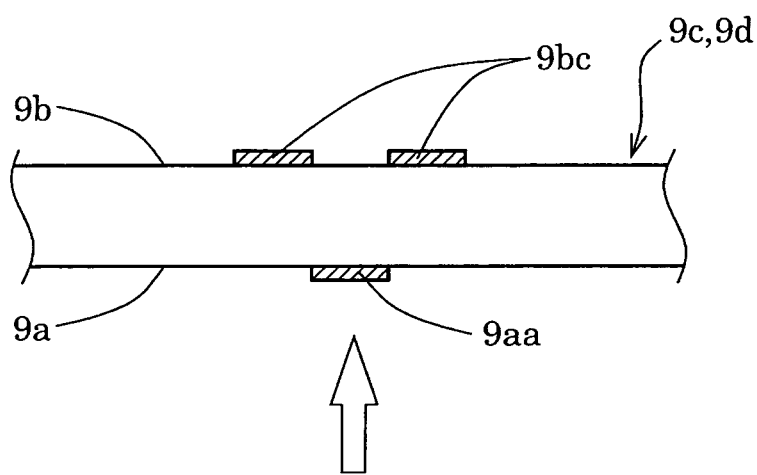
FIG. 52 is a drawing showing a state in which a light shield dot of a circular shape is formed on an entrance surface and a pair of light shield dots of a circular shape are formed on an exit surface, as a modification example of the combination for the unit attenuation region of the compensation filter.

As an example, as shown in FIG. 52, the filter regions 9c and 9d of the compensation filter 9 can also be composed of combinations of a circular light shield dot 9aa formed on the entrance surface 9a and a pair of circular light shield dots 9bc formed as spaced on the exit surface 9b. It is assumed hereinafter, for easier understanding of description, that the light shield dots 9aa and 9bc have the same size and are arranged as linearly aligned along the X-direction. It is also assumed that the center of the light shield dot 9aa agrees with the middle point of a line connecting the centers of the corresponding pair of light shield dots 9bc when viewed in the direction of the optical axis AX. Namely, the circular light shield dot 9aa does not overlap with the pair of circular light shield dots 9bc when viewed in the direction of the optical axis AX.

Figure 53A:
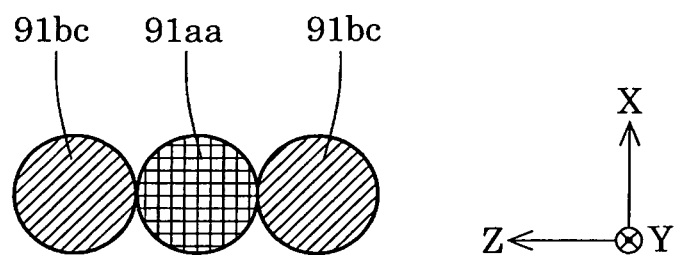
FIG. 53A is a drawing to illustrate the attenuation action of the unit attenuation region of the compensation filter according to the modification example of FIG. 52.

In this case, when light parallel to the optical axis AX is incident to a unit attenuation region consisting of a combination of a circular light shield dot 9aa and a pair of circular light shield dots 9bc, there is no overlap between a region 91aa attenuated by the circular light shield dot 9aa and regions 91bc attenuated by the pair of circular light shield dots 9bc, as shown in FIG. 53A, on a plane parallel to the exit surface 9b, immediately behind the compensation filter 9. Namely, immediately behind the compensation filter 9, the circular attenuation region 91aa and the pair of circular attenuation regions 91bc form an attenuation region having the area equal to three times that of the circular attenuation region 91aa.

Figure 53B:
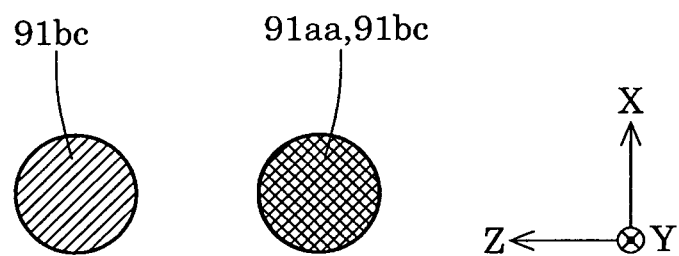
FIG. 53B is a drawing to illustrate the attenuation action of the unit attenuation region of the compensation filter according to the modification example of FIG. 52.

As the angle to the optical axis AX of the light incident to the unit attenuation region consisting of the circular light shield dot 9aa and the pair of circular light shield dots 9bc monotonically increases from 0°, for example, along the YZ plane, the attenuation region 91aa moves in the Z-direction immediately behind the compensation filter 9 to monotonically increase an overlap region with one attenuation region 91bc and, after a while, the attenuation region 91aa comes to completely overlap with the one attenuation region 91bc as shown in FIG. 53B. In this state, the circular attenuation region 91aa and the pair of circular attenuation regions 91bc form an attenuation region having the area equal to twice that of the circular attenuation region 91aa.

In this manner, the unit attenuation region consisting of the circular light shield dot 9aa and the pair of circular light shield dots 9bc exerts the attenuation action to decrease the attenuation rate with increase in the incidence angle of light. As a result, the filter regions 9c and 9d of the compensation filter 9 where the large number of unit attenuation regions consisting of the light shield dots 9aa and 9bc are formed according to the predetermined distribution, also have the attenuation characteristic of decreasing the attenuation rate with increase in the incidence angle of light in the modification example of FIG. 52, and the modification example of FIG. 52 also achieves the same effect as the embodiment of FIG. 45. The loss of light quantity is smaller with the filter regions 9c and 9d in the modification example of FIG. 52 than with the filter regions 9c and 9d in the embodiment of FIG. 45.

The above embodiment is configured to substantially uniformly adjust each of the pupil intensity distributions related to the respective points, through collaboration between the compensation filter 9 and the density filter 6. However, another modification example without use of the density filter 6 can also be contemplated as follows: a new filter region having an attenuation characteristic different from that of the filter regions 9c, 9d is added to the compensation filter 9, thereby substantially uniformly adjusting each of the pupil intensity distributions related to the respective points. The compensation filter 9 of this modification example, as shown in FIG. 54, has a pair of filter regions 9e and 9f arranged corresponding to the pair of surface illuminants 20a, 20b spaced in the X-direction, in addition to the pair of filter regions 9c and 9d arranged corresponding to the pair of surface illuminants 20c, 20d spaced in the Z-direction.

Therefore, of the quadrupolar pupil intensity distribution 20, light from the surface illuminant 20c passes through the filter region 9c, light from the surface illuminant 20d passes through the filter region 9d, light from the surface illuminant 20a passes through the filter region 9e, and light from the surface illuminant 20b passes through the filter region 9f. In the filter regions 9e and 9f, as shown in FIG. 55, circular light shield dots 9ab are formed on the entrance surface 9a and circular light shield dots 9bd are formed so as to correspond to the circular light shield dots 9ab on the exit surface 9b.

Figure 56A:
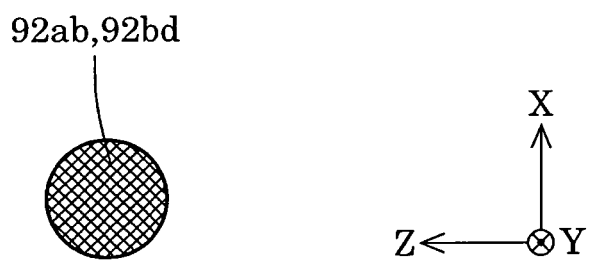
FIG. 56A is a drawing to illustrate the attenuation action of the unit attenuation region in the filter regions of FIG. 55.

It is assumed hereinafter, for easier understanding of description, that the light shield dots 9ab and 9bd have the same size and the center of the light shield dot 9ab agrees with the center of the light shield dot 9bd when viewed in the direction of the optical axis AX. Namely, the circular light shield dot 9ab overlaps with the circular light shield dot 9bd when viewed in the direction of the optical axis AX. In this case, when light parallel to the optical axis AX is incident to a unit attenuation region consisting of a combination of the circular light shield dots 9ab and 9bd, there is an overlap between a region 92ab attenuated by the circular light shield dot 9ab and a region 92bd attenuated by the circular light shield dot 9bd, as shown in FIG. 56A, on the plane parallel to the exit surface 9b, immediately behind the compensation filter 9. Namely, immediately behind the compensation filter 9, the circular attenuation regions 92ab and 92bd form an attenuation region having the area equal to that of the circular attenuation region 92ab.

Figure 56B:
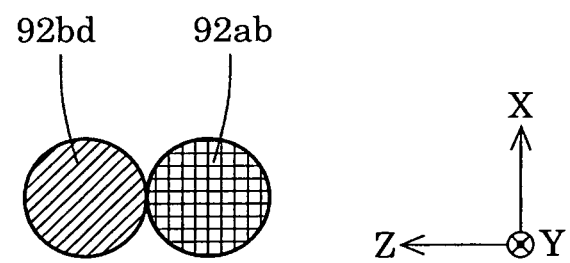
FIG. 56B is a drawing to illustrate the attenuation action of the unit attenuation region in the filter regions of FIG. 55.

As the angle to the optical axis AX of the light incident to the unit attenuation region consisting of the circular light shield dots 9ab and 9bd monotonically increases from 0°, for example, along the YZ plane, the attenuation region 92ab moves in the Z-direction immediately behind the compensation filter 9 to monotonically decrease the overlap region with the attenuation region 92bd and, after a while, the attenuation region 92ab comes to be located completely off the attenuation region 92bd as shown in FIG. 56B. In this state, the circular attenuation regions 92ab and 92bd form an attenuation region having the area equal to twice that of the circular attenuation region 92ab.

Figure 57:
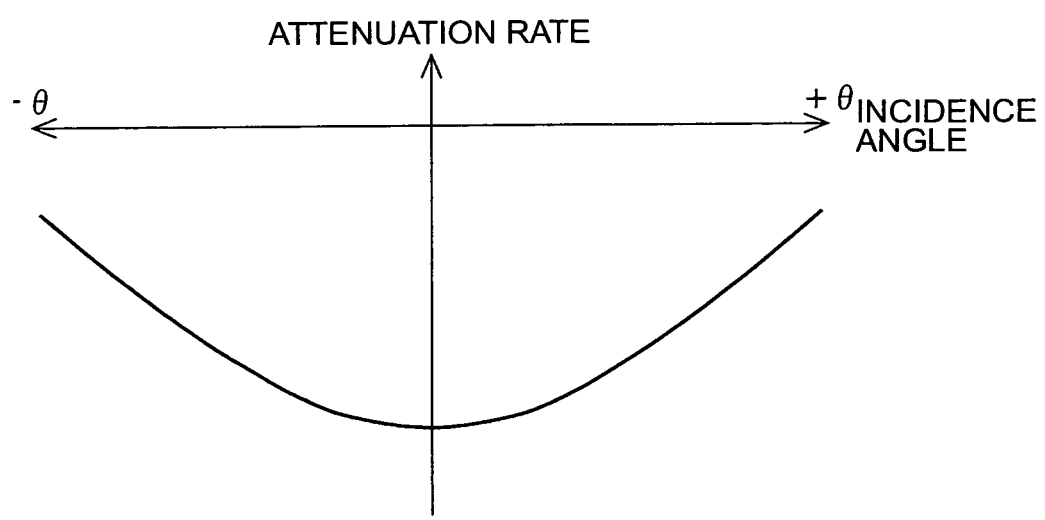
FIG. 57 is a drawing showing an attenuation characteristic of the filter regions of FIG. 55.

In this manner, the unit attenuation region consisting of the circular light shield dots 9ab and 9bd exerts the attenuation action to increase the attenuation rate with increase in the incidence angle of light. As a result, the filter regions 9e and 9f of the compensation filter 9 where the large number of unit attenuation regions consisting of the light shield dots 9ab and 9bd are formed according to a predetermined distribution, have the attenuation characteristic of increasing the attenuation rate with increase in the incidence angle θ of light, as shown in FIG. 57, opposite to that of the filter regions 9c and 9d.

Figure 58:
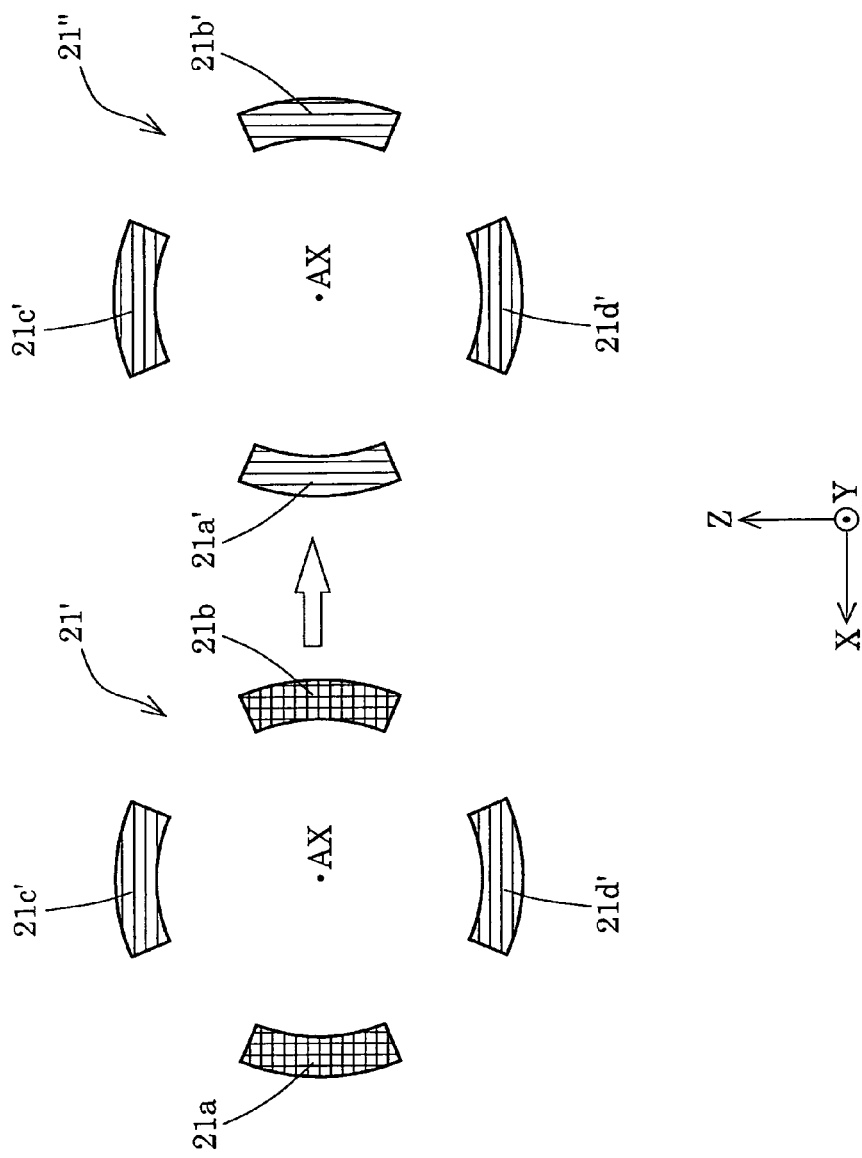
FIG. 58 is a drawing schematically showing how the pupil intensity distribution related to the center point P1, adjusted by the filter regions in the embodiment of FIG. 45, is substantially uniformly adjusted by the filter regions of FIG. 55.

In this way, the light from the surface illuminants 21a and 21b in the pupil intensity distribution 21 related to the center point P1 is subjected to the attenuation action of the filter regions 9e and 9f of the compensation filter 9 and the light intensity thereof is lowered by a relatively small degree. As a result, as shown in FIG. 58, the pupil intensity distribution 21' related to the center point P1, adjusted by the filter regions 9c and 9d, (cf., the right distribution 21' in FIG. 50) is subjected to the action of the filter regions 9e and 9f to be adjusted to a pupil intensity distribution 21" of a substantially uniform property. Namely, in the pupil intensity distribution 21" adjusted by the compensation filter 9, the light intensity of the surface illuminants 21a', 21b' spaced in the X-direction is approximately equal to the light intensity of the surface illuminants 21c', 21d' spaced in the Z-direction.

Figure 59:
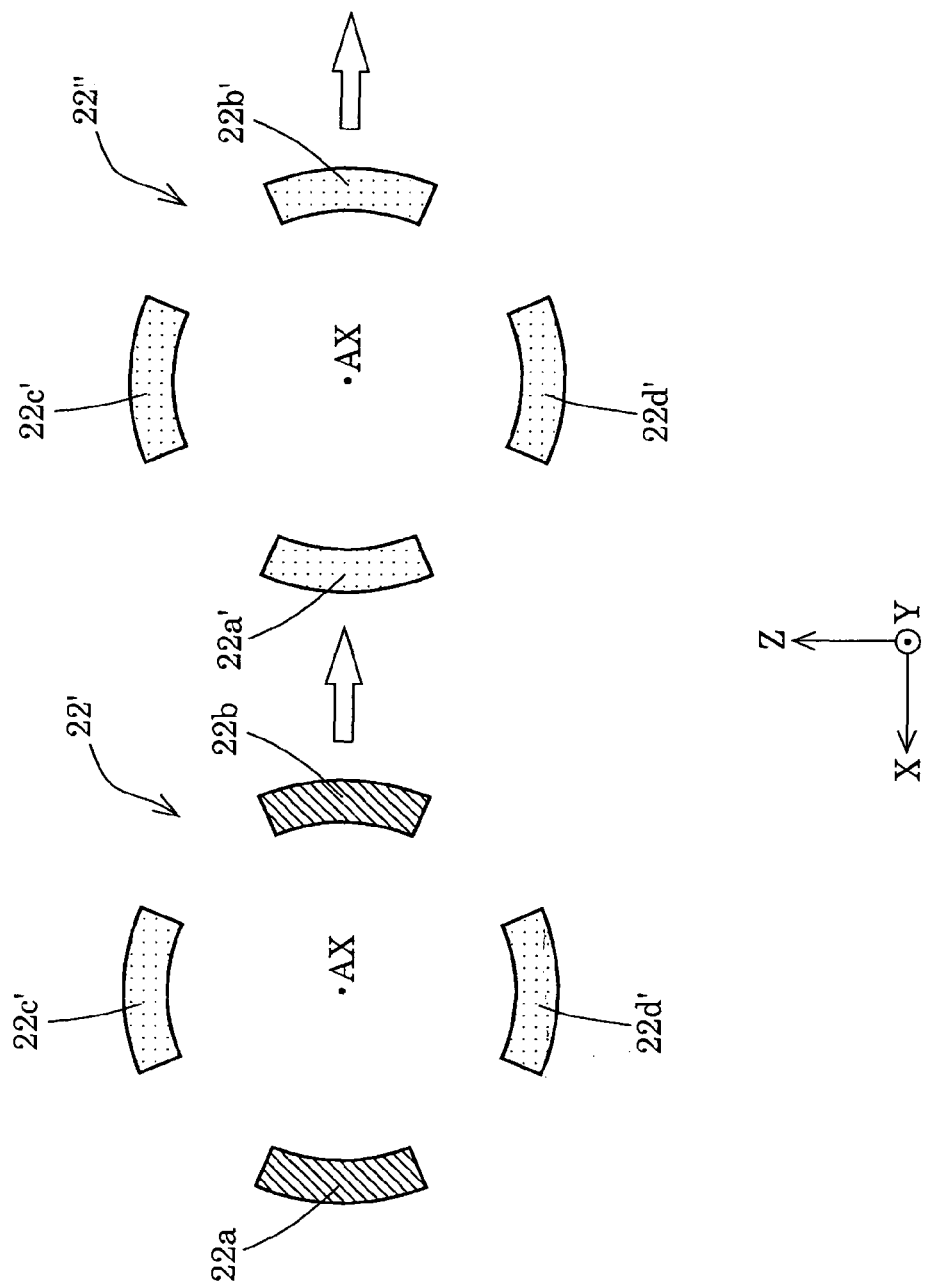
FIG. 59 is a drawing schematically showing how the pupil intensity distribution related to the peripheral points P2, P3, adjusted by the filter regions in the embodiment of FIG. 45, is substantially uniformly adjusted by the filter regions of FIG. 55.

On the other hand, the light from the surface illuminants 22a and 22b in the pupil intensity distribution 22 related to the peripheral points P2, P3 is subjected to the action of the filter regions 9e and 9f of the compensation filter 9 and the light intensity thereof is lowered by a relatively large degree. As a result, as shown in FIG. 59, the pupil intensity distribution 22' related to the peripheral points P2, P3, adjusted by the filter regions 9c and 9d, (cf., the right distribution 22' in FIG. 51) is subjected to the action of the filter regions 9e and 9f to be adjusted to a pupil intensity distribution 22" of a substantially uniform property. Namely, in the pupil intensity distribution 22" adjusted by the compensation filter 9, the light intensity of the surface illuminants 22a', 22b' spaced in the X-direction is approximately equal to the light intensity of the surface illuminants 22c', 22d' spaced in the Z-direction.

In this manner, in the modification example of FIG. 54, the pupil intensity distribution 21 related to the center point P1 and the pupil intensity distribution 22 related to the peripheral points P2, P3 both are adjusted to the pupil intensity distributions 21" and 22" of the substantially uniform properties by the action of the compensation filter 9 with the filter regions 9c, 9d and 9e, 9f. Similarly, the pupil intensity distributions related to the respective points aligned along the Y-direction between the center point P1 and the peripheral points P2, P3 and, therefore, the pupil intensity distributions related to the respective points in the still exposure region ER on the wafer W are also adjusted to distributions of substantially uniform properties. In other words, the pupil intensity distributions related to the respective points in the still exposure region ER on the wafer W are adjusted to distributions of substantially uniform properties by the attenuation action of the compensation filter 9 only, without use of the density filter 6.

The loss of light quantity is smaller with the filter regions 9e and 9f in the modification example of FIG. 54 than with the filter regions 9c and 9d in the modification example of FIG. 52. Depending upon circumstances, it is also possible to use a compensation filter provided with only the filter regions 9e and 9f according to the modification example of FIG. 54, thereby independently adjusting each of the pupil intensity distributions related to the respective points on the surface to be illuminated and, therefore, adjusting the pupil intensity distributions related to the respective points, to distributions of substantially mutually identical properties.

In the above description, the plane-parallel plate is used as an optically transparent substrate forming the main body of the compensation filter 9. However, without having to be limited to the plane-parallel plate, the compensation filter of the present invention can also be constructed, for example, using a substrate in which at least one surface has curvature.

In the above description, the action and effect of the present invention were described using the example of the modified illumination to form the quadrupolar pupil intensity distribution on the illumination pupil, i.e., the quadrupolar illumination. However, it is obvious that, without having to be limited to the quadrupolar illumination, the present invention is also similarly applicable with the same action and effect, for example, to the annular illumination to form the pupil intensity distribution of the annular shape and to multi-polar illumination to form the pupil intensity distribution of a multi-polar shape other than the quadrupolar shape.

In the above description, the compensation filter 9 is arranged behind (or on the mask side of) the forming plane of the pupil intensity distribution 20 formed on the rear focal plane of the micro fly's eye lens 8 or on the illumination pupil near it. However, without having to be limited to this, the compensation filter 9 may also be arranged at the position of the forming plane of the pupil intensity distribution 20, or in front of it (or on the light source side). Furthermore, the compensation filter 9 can also be arranged at or near a position of another illumination pupil behind the micro fly's eye lens 8, e.g., at or near the position of the illumination pupil between the front lens unit 12a and the rear lens unit 12b of the imaging optical system 12.

In general, a transmission filter with a transmittance characteristic varying depending upon an angle of incidence of light can be arranged at a position of incidence of light to pass through only a partial region of the illumination pupil or light having passed through only a partial region of the illumination pupil, in an illumination pupil space between an optical element with a power adjacent in front of the illumination pupil located behind the optical integrator and an optical element with a power adjacent behind the illumination pupil. Namely, a plane-parallel plate or a planar mirror without power may exist in this "illumination pupil space."

The above described the application of the present invention to the exposure apparatus of the step-and-scan method to perform scanning exposure of the pattern on the mask M into a shot area on the wafer W. However, without having to be limited to this, the present invention can also be applied to the exposure apparatus of the step-and-repeat method to repeat an operation of performing one-shot exposure of the pattern on the mask M into each exposure region on the wafer W. Particularly, the compensation filter 9 with the filter regions 9c and 9d in the embodiment of FIG. 45 and the compensation filter 9 with the filter regions 9c, 9d and 9e, 9f in the modification example of FIG. 54 are also applicable to the exposure apparatus of the one-shot exposure type.

In the above description, the embodiment of FIG. 45, the modification example of FIG. 52, and the modification example of FIG. 55 show the configurations wherein the first unit attenuation regions formed as distributed on the entrance surface 9a of the compensation filter 9 and the second unit attenuation regions formed as distributed on the exit surface 9b are formed as the attenuation regions to block the incident light, as composed of the light shield dots (9aa, 9bb; 9aa, 9bc; 9ab, 9bd), for example, of chromium, chromium oxide, or the like. However, without having to be limited to this, it is also possible to adopt any form other than the form of the light shield regions, for the first unit attenuation regions and the second unit attenuation regions.

For example, at least one of the first unit attenuation region and the second unit attenuation region can be made as a scattering region to scatter incident light, or as a diffractive region to diffract incident light. In general, a scattering region is made by subjecting a required region of an optically transparent substrate to a roughening process, and a diffractive region is made by subjecting a required region to a diffractive surface forming process.

Figure 60:
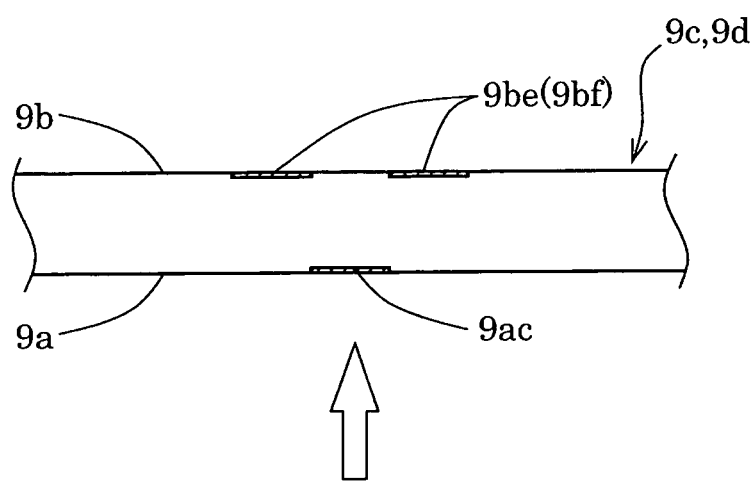
FIG. 60 is a drawing showing an example using a scattering region or diffractive region as a unit attenuation region in a configuration corresponding to the embodiment of FIG. 45 and the modification example of FIG. 52.

Specifically, a configuration corresponding to the embodiment of FIG. 45 can be constructed as follows while achieving the same effect as the embodiment of FIG. 45: as shown in FIG. 60, circular scattering regions (or diffractive regions) 9ac are formed as the first unit attenuation regions as distributed on the entrance surface 9a of the compensation filter 9, and ring scattering regions (or diffractive regions) 9be are formed as the second unit attenuation regions as distributed on the exit surface 9b.

A configuration corresponding to the modification example of FIG. 52 can be constructed as follows while achieving the same effect as the modification example of FIG. 52: as shown in FIG. 60, circular scattering regions (or diffractive regions) 9ac are formed as the first unit attenuation regions as distributed on the entrance surface 9a of the compensation filter 9, and pairs of circular scattering regions (or diffractive regions) 9bf are formed as the second unit attenuation regions as distributed on the exit surface 9b.

A configuration corresponding to the modification example of FIG. 55 can be constructed as follows while achieving the same effect as the modification example of FIG. 55: as shown in FIG. 61, circular scattering regions (or diffractive regions) 9ad are formed as the first unit attenuation regions as distributed on the entrance surface 9a of the compensation filter 9, and circular scattering regions (or diffractive regions) 9bg are formed as the second unit attenuation regions as distributed on the exit surface 9b.

Figure 62:
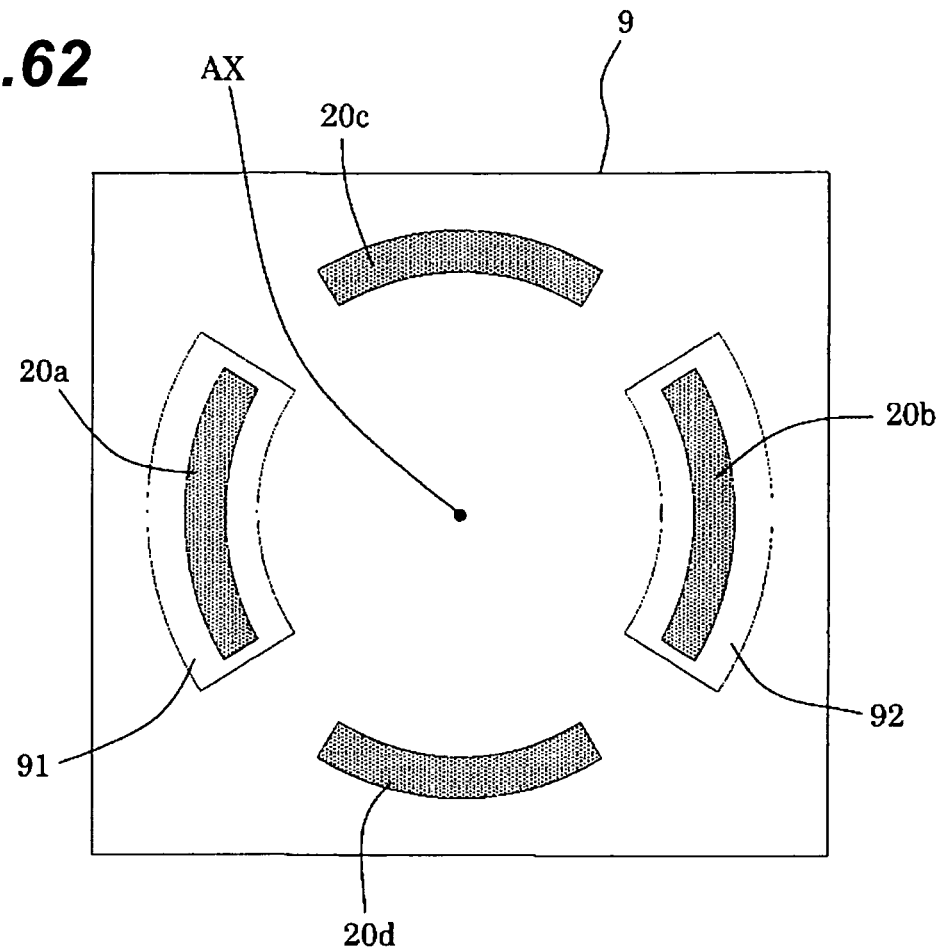
FIG. 62 is a drawing showing an example of a configuration of a compensation filter according to the embodiment.

The compensation filter 9 may have a pair of compensation regions 91 and 92 arranged corresponding to the pair of surface illuminants 20a, 20b spaced in the X-direction on both sides of the optical axis AX, as shown in FIG. 62. It is assumed below, for easier description, that the pair of compensation regions 91 and 92 have the same configuration and are arranged in symmetry with respect to an axis extending in the Z-direction while passing the optical axis AX.

Figure 64:
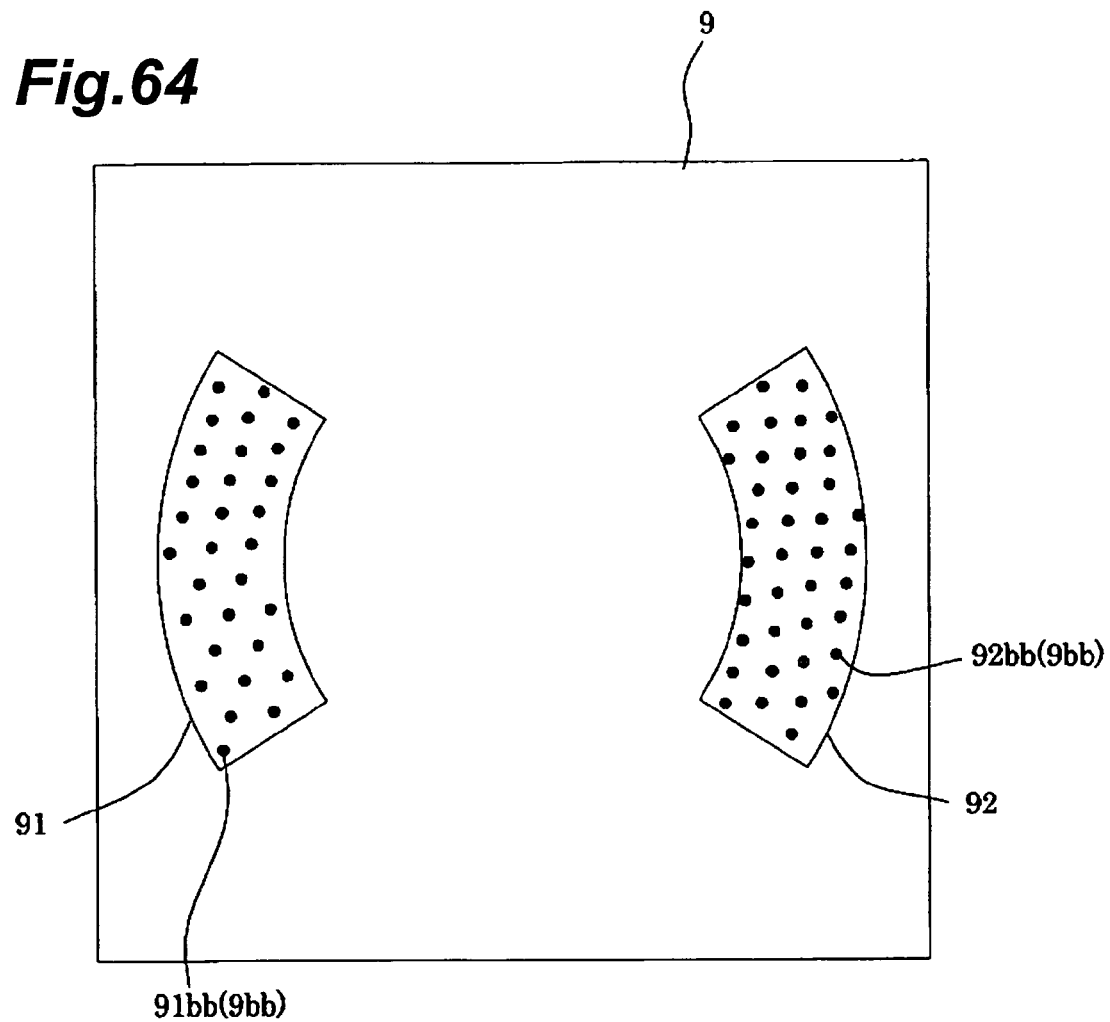
FIG. 64 is a drawing showing an example of a distribution of unit attenuation regions in a compensation filter according to the embodiment.

The compensation filter 9, as shown in FIG. 63, has a form of an optically transparent substrate having a predetermined thickness along the optical axis AX. Specifically, the compensation filter 9 has a form of a plane-parallel plate made of an optical material, for example, like silica or fluorite. In each of the compensation regions 91, 92 on the surface 9a of the compensation filter 9 on the light entrance side (light source side), for example, light shield dots 9aa of a circular shape made of chromium, chromium oxide, or the like are formed according to a predetermined distribution. On the other hand, in each of the compensation regions 91, 92 on the surface 9b of the compensation filter 9 on the light exit side (mask side), for example, circular light shield dots 9bb of chromium, chromium oxide, or the like are formed as distributed in one-to-one correspondence to the circular light shield dots 9aa. FIG. 64 shows an example of the distribution of light shield dots 91 bb (9bb), 92bb (9bb) formed in each compensation region 91, 92 in the compensation filter 9.

It is assumed below, for easier understanding of description, that the compensation filter 9 is arranged so that the entrance surface 9*a* and exit surface 9*b* thereof are perpendicular to the optical axis AX. It is also assumed that a line connecting the center of the circular light shield dot 9*aa* and the center of the circular light shield dot 9*bb* is parallel to the optical axis AX. It is further assumed that the outside diameter of the circular light shield dot 9*bb* is larger than the outside diameter of the circular light shield dot 9*aa*. Namely, the region of the circular light shield dot 9*bb* is assumed to have such a size as to enclose the region of the circular light shield dot 9*aa*.

Figure 65A:
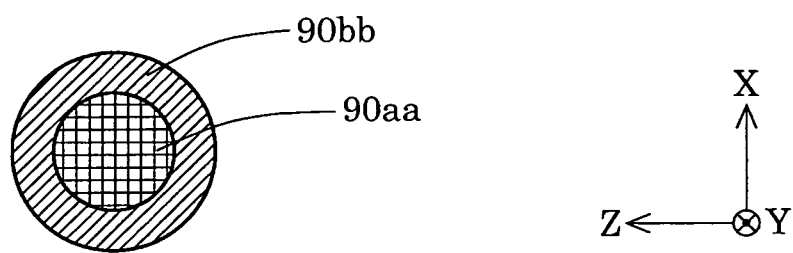
FIG. 65A is a drawing to illustrate the attenuation action of the unit attenuation region of the compensation filter according to the embodiment.

In this case, when light parallel to the optical axis AX is incident to a unit attenuation region consisting of a combination of one circular light shield dot 9*aa* and one circular light shield dot 9*bb*, there is an overlap between a region 90*aa* shielded by the circular light shield dot 9*aa* (note: the term "shield" herein is a general concept including "optical attenuation") and a region 90*bb* shielded by the circular light shield dot 9*bb*, as shown in FIG. 65A, on a plane parallel to the exit surface 9*b*, immediately behind each compensation region 91, 92 (or immediately behind the compensation filter 9). Namely, immediately behind the compensation filter 9, the circular shielded region 90*aa* and the circular shielded region 90*bb* form a shielded region of a circular shape having the same outside diameter as that of the circular shielded region 90*bb*.

Figure 65B:
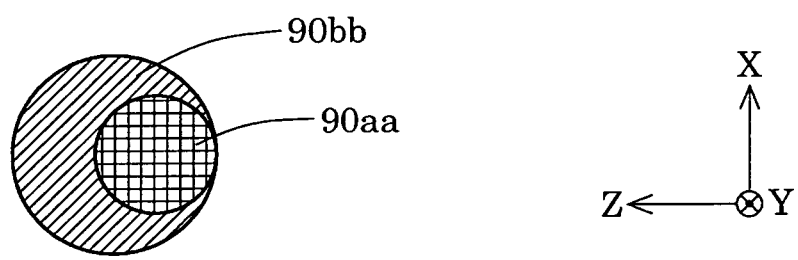
FIG. 65B is a drawing to illustrate the attenuation action of the unit attenuation region of the compensation filter according to the embodiment.

As the angle to the optical axis AX of the light incident to the unit attenuation region consisting of the circular light shield dot 9*aa* and the circular light shield dot 9*bb* monotonically increases from 0°, for example, along the YZ plane, the circular shielded region 90*aa* moves in the Z-direction and, after a while, the circumference of the circular shielded region 90*aa* comes into contact with the circumference of the circular shielded region 90*bb* as shown in FIG. 65B. As the angle of incident light to the optical axis AX further monotonically increases along the YZ plane, the overlap region between the circular shielded region 90*aa* and the circular shielded region 90*bb* monotonically decreases and, after a while, the circular shielded region 90*aa* comes to be located completely outside the circular shielded region 90*bb* as shown in FIG. 65C.

Figure 65C:
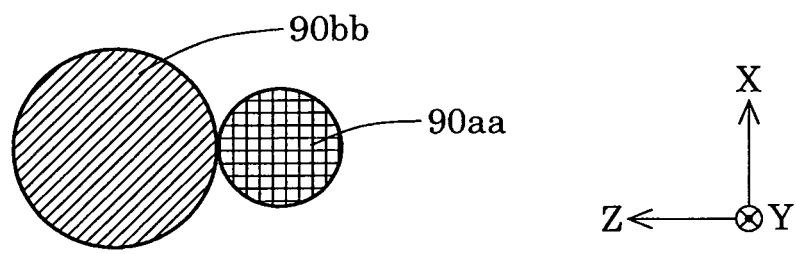
FIG. 65C is a drawing to illustrate the attenuation action of the unit attenuation region of the compensation filter according to the embodiment.

In the present embodiment, the optical system is assumed to be configured so that the maximum incidence angle along the YZ plane of the light from the quadrupolar pupil intensity distribution 20 to the compensation filter 9 is not more than an incidence angle θm of light immediately before a point where the circular shielded region 90*aa* is located completely outside the circular shielded region 90*bb* as shown in FIG. 65C. In this case, the unit attenuation region consisting of the circular light shield dot 9*aa* and the circular light shield dot 9*bb* exerts the attenuation action to keep the attenuation rate constant before the magnitude (absolute value) of the incidence angle θ of light reaches a predetermined value θc (magnitude of the incidence angle of light at a point where the circumference of the circular shielded region 90*aa* is in contact with the circumference of the circular shielded region 90*bb* as shown in FIG. 65B), and thereafter to monotonically increase the attenuation rate as the magnitude of the incidence angle of light increases over the predetermined value θc.

Figure 66:
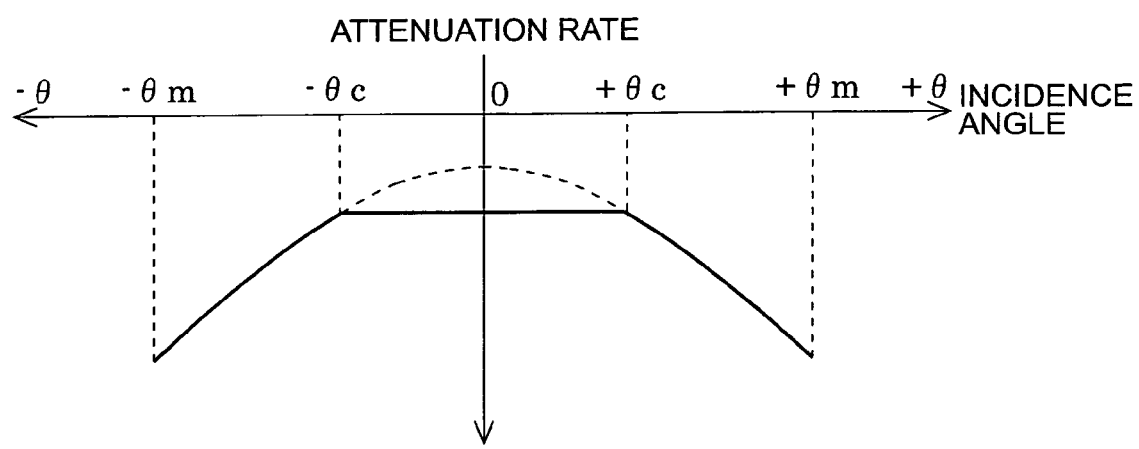
FIG. 66 is a drawing showing an attenuation characteristic of the compensation filter of the embodiment.

In another expression, the circular light shield dot (first attenuation region) 9*aa* and the circular light shield dot (second attenuation region) 9*bb* impart to the light passing through the entrance surface 9*a* and the exit surface of the compensation filter 9, the attenuation characteristic of, with change in the incidence angle θ of light to the entrance surface 9*a* (e.g., a change from a negative value to a positive value), monotonically decreasing the attenuation rate, then keeping the attenuation rate almost constant, and thereafter monotonically increasing the attenuation rate. Namely, the compensation filter 9 in which the plurality of unit attenuation regions consisting of the light shield dots 9*aa* and 9*bb* are formed according to a predetermined distribution, has the attenuation characteristic of keeping the attenuation rate constant when the magnitude of the incidence angle θ of light to the compensation filter 9 is not more than θc and increasing the attenuation rate as the magnitude of the incidence angle θ of light increases over θc, as shown in FIG. 66.

As described above with reference to FIG. 62, the compensation filter 9 has the pair of compensation regions 91 and 92 arranged corresponding to the pair of surface illuminants 20*a*, 20*b* spaced in the X-direction on both sides of the optical axis AX. Namely, the compensation region 91 is arranged so as to act on the light from the surface illuminant 20*a*, while the compensation region 92 is arranged so as to act on the light from the surface illuminant 20*b*. Consequently, of the quadrupolar pupil intensity distribution 20, the light from the surface illuminant 20*a* passes through the compensation region 91 and the light from the surface illuminant 20*b* passes through the compensation region 92; however, the light from the surface illuminants 20*c*, 20*d* is not subjected to the action of the compensation filter 9.

Figure 67:
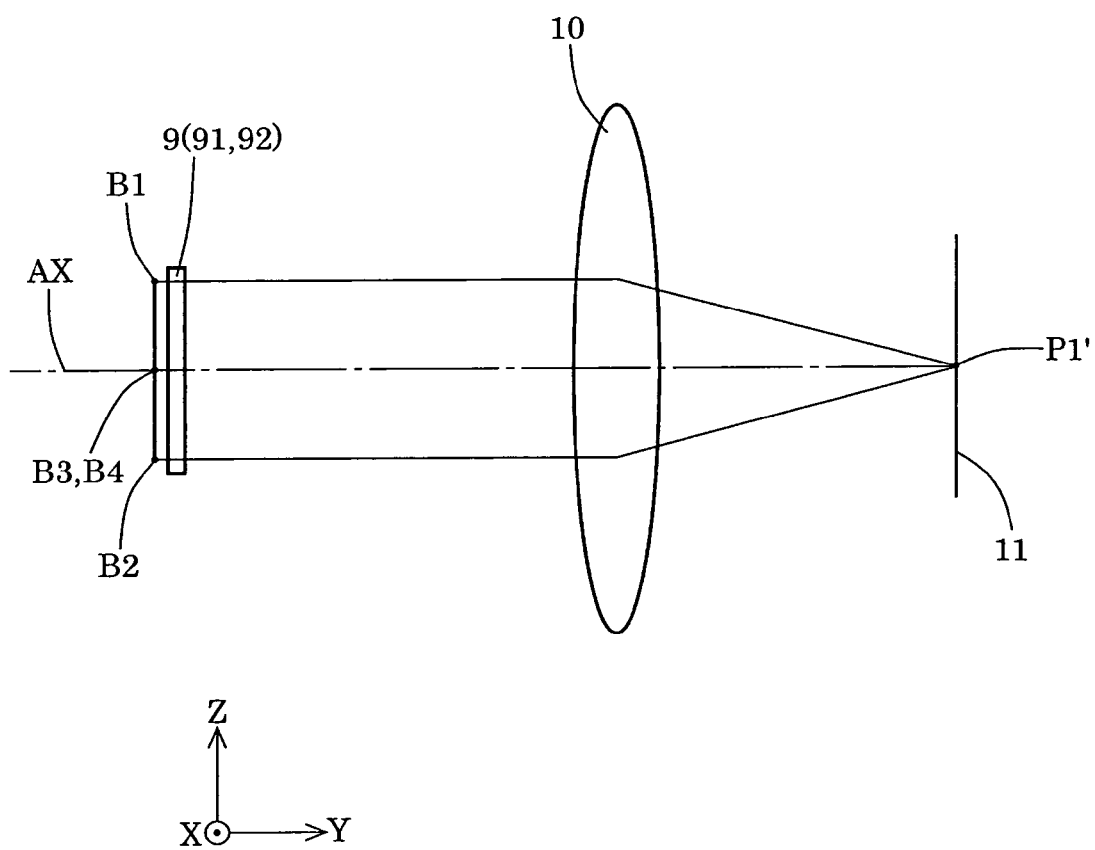
FIG. 67 is a first drawing to illustrate an action of the compensation filter in the embodiment.
Figure 68:
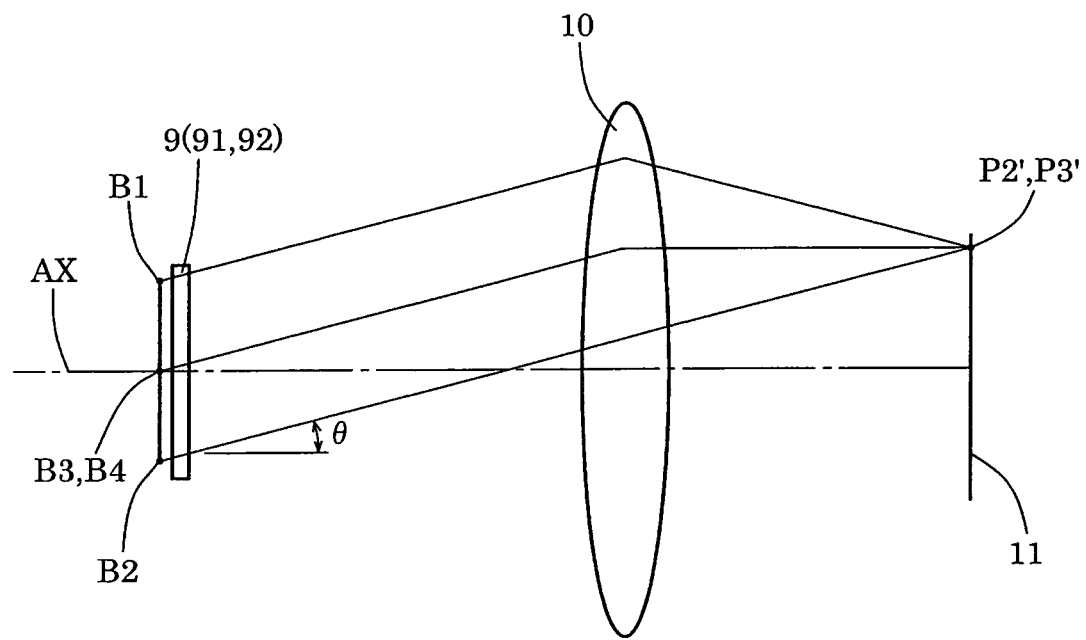
FIG. 68 is a second drawing to illustrate an action of the compensation filter in the embodiment.

In this case, as shown in FIG. 67, the light reaching the center point P1 in the still exposure region ER on the wafer W, i.e., the light reaching the center point P1' of the aperture of the mask blind 11 is incident at the incidence angle of 0 to the compensation filter 9. In other words, the light from the surface illuminants 21*a* and 21*b* of the pupil intensity distribution 21 related to the center point P1 is incident at the incidence angle of 0 to the pair of compensation regions 91 and 92. On the other hand, as shown in FIG. 68, the light reaching the peripheral points P2, P3 in the still exposure region ER on the wafer W, i.e., the light reaching the peripheral points P2', P3' of the aperture of the mask blind 11 is incident at the relatively large incidence angles ±θ to the compensation filter 9. In other words, the light from the surface illuminants 22*a* and 22*b* of the pupil intensity distribution 22 related to the peripheral points P2, P3 is incident each at the incidence angles ±θ to the pair of compensation regions 91 and 92.

Figure 69:
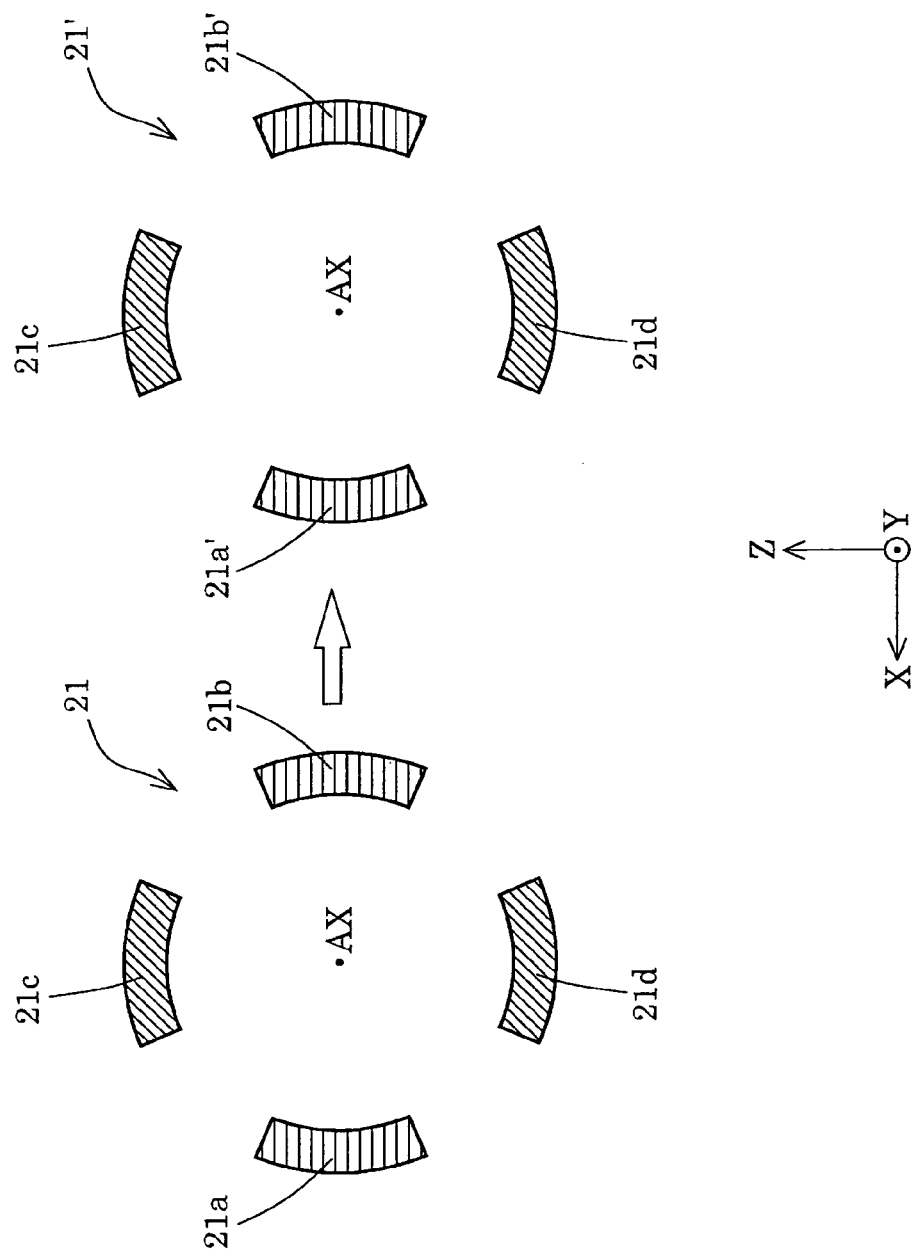
FIG. 69 is a drawing schematically showing how the pupil intensity distribution related to the center point P1 is adjusted by the compensation filter.

Of the pupil intensity distribution 21 related to the center point P1, the light from the surface illuminants 21*a* and 21*b* is subjected to the attenuation action of the compensation filter 9, but the light intensity thereof is lowered by a relatively small degree. The light from the surface illuminants 21*c* and 21*d* is not subjected to the attenuation action of the compensation filter 9 and thus there is no change in the light intensity thereof. As a consequence, the pupil intensity distribution 21 related to the center point P1 is subjected to the attenuation action of the compensation filter 9 but is simply adjusted to a pupil intensity distribution 21' of a property substantially identical to that of the original distribution 21, as shown in FIG. 69. Namely, the pupil intensity distribution 21' adjusted by the compensation filter 9 maintains the property that the light intensity of the surface illuminants 21*c*, 21*d* spaced in the Z-direction is larger than the light intensity of the surface illuminants 21*a'*, 21*b'* spaced in the X-direction.

Figure 70:
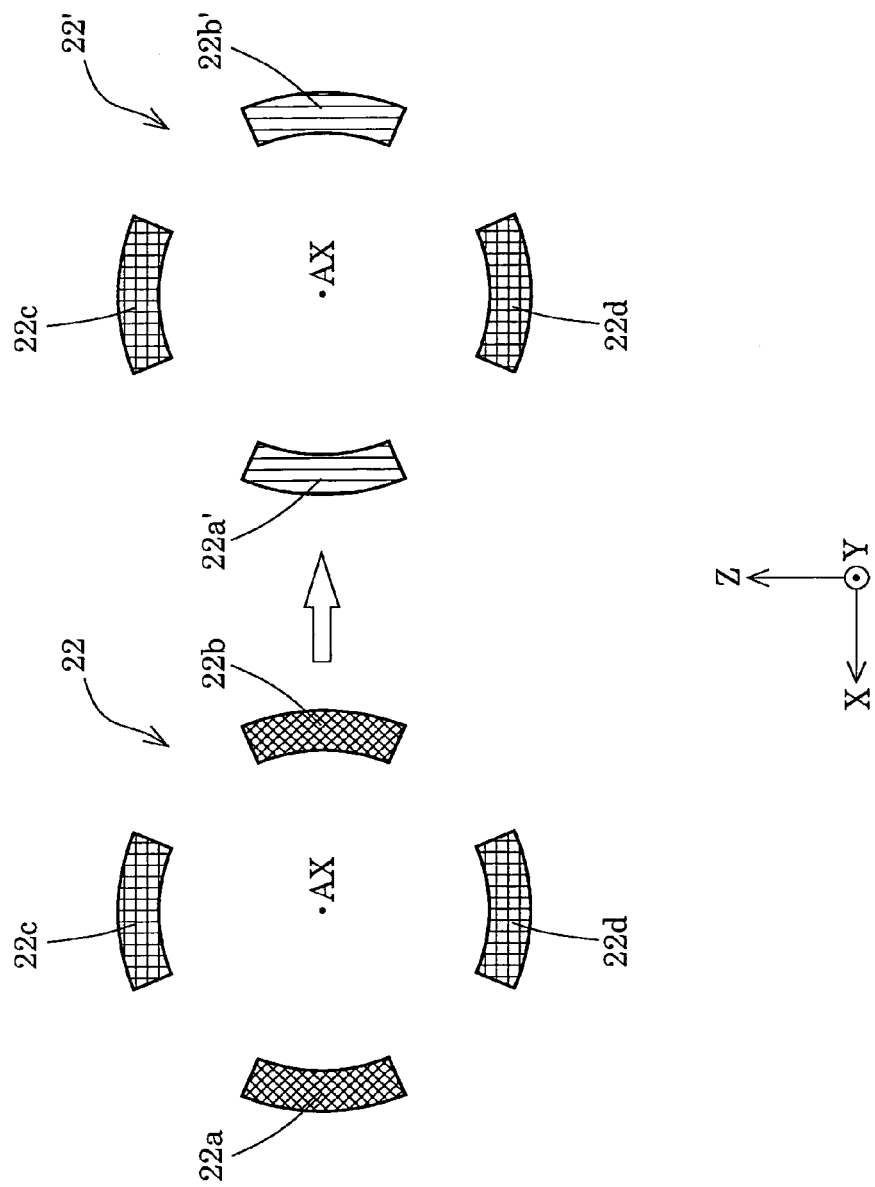
FIG. 70 is a drawing schematically showing how the pupil intensity distribution related to the peripheral points P2, P3 is adjusted by the compensation filter.

On the other hand, of the pupil intensity distribution 22 related to the peripheral points P2, P3, the light from the surface illuminants 22*a* and 22*b* is subjected to the attenuation action of the compensation filter 9 and the light intensity thereof is lowered by a relatively large degree. Since the light from the surface illuminants 22*c* and 22*d* is not subjected to the attenuation action of the compensation filter 9, there is no change in the light intensity thereof. As a consequence, the pupil intensity distribution 22 related to the peripheral points P2, P3 is adjusted to a pupil intensity distribution 22' of a property different from that of the original distribution 22, as shown in FIG. 70, by the attenuation action of the compensation filter 9. Namely, the pupil intensity distribution 22' adjusted by the compensation filter 9 comes to have the property that the light intensity of the surface illuminants 22c, 22d spaced in the Z-direction is larger than the light intensity of the surface illuminants 22a', 22b' spaced in the X-direction.

In this manner, the pupil intensity distribution 22 related to the peripheral points P2, P3 is adjusted to the distribution 22' of the property substantially identical to that of the pupil intensity distribution 21' related to the center point P1, by the attenuation action of the compensation filter 9. Similarly, the pupil intensity distributions related to the respective points aligned along the Y-direction between the center point P1 and the peripheral points P2, P3 and, therefore, the pupil intensity distributions related to the respective points in the still exposure region ER on the wafer W are also adjusted to distributions of properties substantially identical to that of the pupil intensity distribution 21' related to the center point P1. In other words, the pupil intensity distributions related to the respective points in the still exposure region ER on the wafer W are adjusted to distributions of substantially mutually identical properties by the attenuation action of the compensation filter 9. In still another expression, the compensation filter 9 has the required attenuation characteristic necessary for adjusting the pupil intensity distributions related to the respective points, to distributions of substantially mutually identical properties.

In the compensation filter 9 of the present embodiment, as described above, the plurality of circular light shield dots 9aa are formed according to the predetermined distribution on the entrance surface of the optically transparent substrate having the form of the plane-parallel plate, and the plurality of circular light shield dots 9bb are formed in one-to-one correspondence to the plurality of circular light shield dots 9aa on the exit surface of the substrate. The region of the circular light shield dot 9bb has such a size as to enclose the region of the circular light shield dot 9aa. Therefore, the unit attenuation region consisting of the circular light shield dot 9aa and the circular light shield dot 9bb exerts the attenuation action to, with change in the incidence angle of light, monotonically decrease the attenuation rate, then keep the attenuation rate almost constant, and thereafter monotonically increase the attenuation rate, by virtue of the so-called parallax effect.

As a result, the compensation filter 9 in which the plurality of unit attenuation regions consisting of the light shield dots 9aa and 9bb are formed, has the attenuation characteristic of monotonically decreasing the attenuation rate, then keeping the attenuation rate almost constant, and thereafter monotonically increasing the attenuation rate, with change in the incidence angle of light. The compensation filter 9 is arranged at a position near the illumination pupil, i.e., at a position where positional information of light on the mask M (or wafer W) being the surface to be illuminated is converted into angular information of light. Therefore, by the attenuation action of the compensation filter 9 of the present embodiment, it is feasible to independently adjust each of the pupil intensity distributions related to the respective points on the surface to be illuminated and, therefore, to adjust the pupil intensity distributions related to the respective points, to distributions of substantially mutually identical properties.

The illumination optical system (2-12) of the present embodiment is able to substantially uniformly adjust each of the pupil intensity distributions related to the respective points, through collaboration between the compensation filter 9 having the pair of compensation regions 91 and 92 with the required attenuation characteristic and independently adjusting each of the pupil intensity distributions related to the respective points in the still exposure region ER on the wafer W, and the density filter 6 with the required transmittance characteristic varying depending upon the incidence position of light, to equally adjust the pupil intensity distributions related to the respective points.

Therefore, the exposure apparatus (2-WS) of the present embodiment is able to perform excellent exposure under an appropriate illumination condition according to the micro pattern of the mask M, using the illumination optical system (2-12) to substantially uniformly adjust each of the pupil intensity distributions for the respective points in the still exposure region ER on the wafer W, and therefore to faithfully transfer the micro pattern of the mask M in a desired line width across the entire exposure region on the wafer W.

It is considered in the present embodiment that the light quantity distribution on the wafer (surface to be illuminated) W is affected, for example, by the attenuation action (adjusting action) of the compensation filter 9. In this case, as described in the first embodiment above, the illuminance distribution in the still exposure region ER or the shape of the still exposure region (illumination region) ER can be modified by action of a light quantity distribution adjuster having a known configuration if necessary.

In the aforementioned embodiment, according to the specific form shown in FIG. 63, the circular light shield dots 9aa are formed as distributed as the first attenuation regions on the entrance surface of the compensation filter 9 having the form of the plane-parallel plate arranged perpendicularly to the optical axis AX, and the circular light shield dots 9bb are formed as distributed as the second attenuation regions on the exit surface of the compensation filter 9. However, without having to be limited to this, a variety of forms can be contemplated as to specific configurations of the compensation filter 9. For example, various forms can be made as to the form and posture of the substrate forming the compensation filter 9, the number, shape, and form of the first attenuation regions and the second attenuation regions, the magnitude relation and positional relation between the first attenuation regions and the second attenuation regions, and so on. For example, the combination of light shield dots 9aa and 9bb in each unit attenuation region may be one to one, or one to two or more. Concerning the light shield dot pair 9aa, 9bb (unit attenuation region), it is sufficient that at least one set thereof exists in each compensation region 91, 92.

In general, a required attenuation action can be exerted by a combination of at least one first attenuation region of a predetermined shape (appropriate shape including a circular shape) and at least one second attenuation region of a predetermined shape corresponding thereto. The same attenuation action can also be exerted in a case where the first attenuation region formed on the entrance surface has such a size as to enclose the second attenuation region formed on the exit surface. It is also possible to form the pair of compensation regions 91 and 92 on separate optically transparent substrates, or to use, for example, a substrate at least one surface of which has curvature, as the optically transparent substrate forming the main body of the compensation filter 9.

Figure 71:
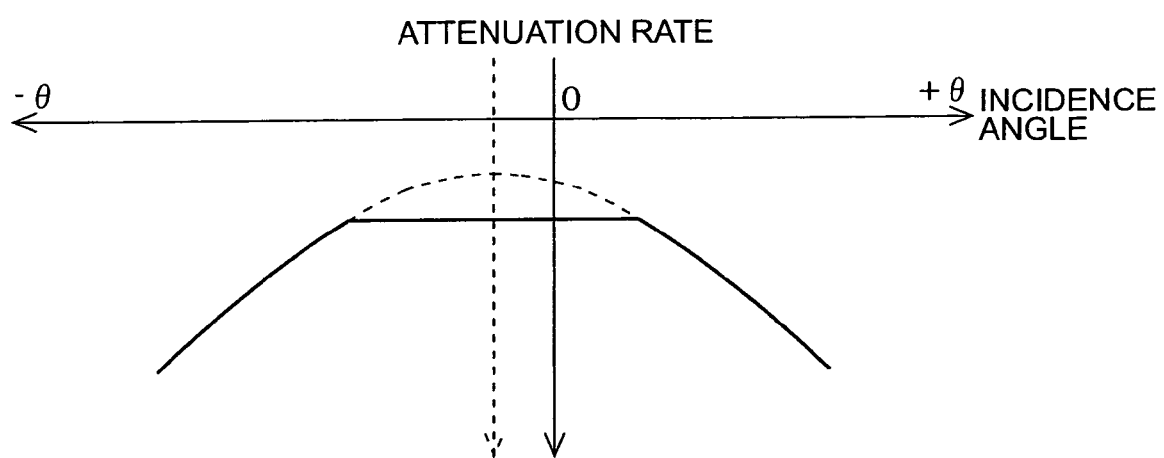
FIG. 71 is a drawing showing an example of an attenuation characteristic asymmetric with respect to an incidence angle of 0.

In the above embodiment, the attenuation characteristic symmetrical with respect to the incidence angle of 0 as shown in FIG. 66 is realized by the combination of circular light shield dot 9aa and circular light shield dot 9bb. However, for example, the configuration shown in FIG. 63 may be modified so that the center of the circular light shield dot 9bb is located as decentered in the Z-direction from the center of the circular light shield dot 9*aa*, and this modification can realize an attenuation characteristic asymmetric with respect to the incidence angle of 0 as shown in FIG. 71, i.e., an attenuation characteristic the axis of symmetry of which deviates from the incidence angle of 0 by a predetermined angle. This means that degrees of freedom are increased for change in the attenuation characteristic of the compensation filter 9, by adopting a mixture of unit attenuation regions consisting of combinations of circular light shield dots 9*aa* and 9*bb* the centers of which are decentered from each other. In this connection, it is also possible to change the attenuation characteristic of the compensation filter 9 to an asymmetric one with respect to the incidence angle of 0, for example, by changing the posture through rotation of each compensation region 91, 92 (and, therefore, the compensation filter 9) around the X-axis in the configuration shown in FIG. 62.

It is also possible to increase degrees of freedom for change in the attenuation characteristic of the compensation filter 9, for example, by mixing combinations of light shield dots 9*aa* and 9*bc* as shown in FIG. 72. In FIG. 72, for example, a line connecting the center of the circular light shield dot 9*aa* and the center of the circular light shield dot 9*bc* is parallel to the optical axis AX and the outside diameter of the circular light shield dot 9*aa* is equal to the outside diameter of the circular light shield dot 9*bc*. Namely, the circular light shield dot 9*aa* and the circular light shield dot 9*bc* overlap with each other when viewed from the direction of the optical axis AX.

Figure 73A:
FIG. 73A is a drawing to illustrate the attenuation action of the unit attenuation region of FIG. 72.

In this case, when light parallel to the optical axis AX is incident to a unit attenuation region consisting of a combination of a circular light shield dot 9*aa* and a circular light shield dot 9*bc*, there is an overlap between a region 93*aa* shielded by the circular light shield dot 9*aa* (note: the term "shield" herein is a general concept including "optical attenuation") and a region 93*bc* shielded by the circular light shield dot 9*bc*, as shown in FIG. 73A, on a plane parallel to the exit surface 9*b*, immediately behind the compensation filter 9. Namely, immediately behind the compensation filter 9, the circular shielded regions 93*aa* and 93*bc* form a shielded region having the area equal to that of the circular shielded region 93*aa*.

Figure 73B:
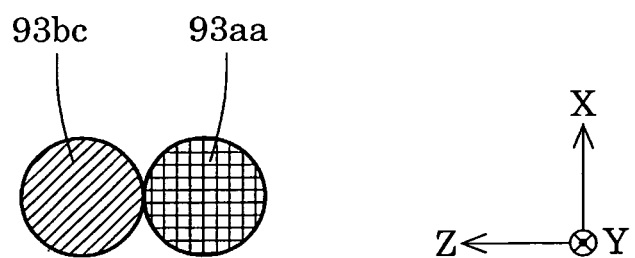
FIG. 73B is a drawing to illustrate the attenuation action of the unit attenuation region of FIG. 72.
Figure 74:
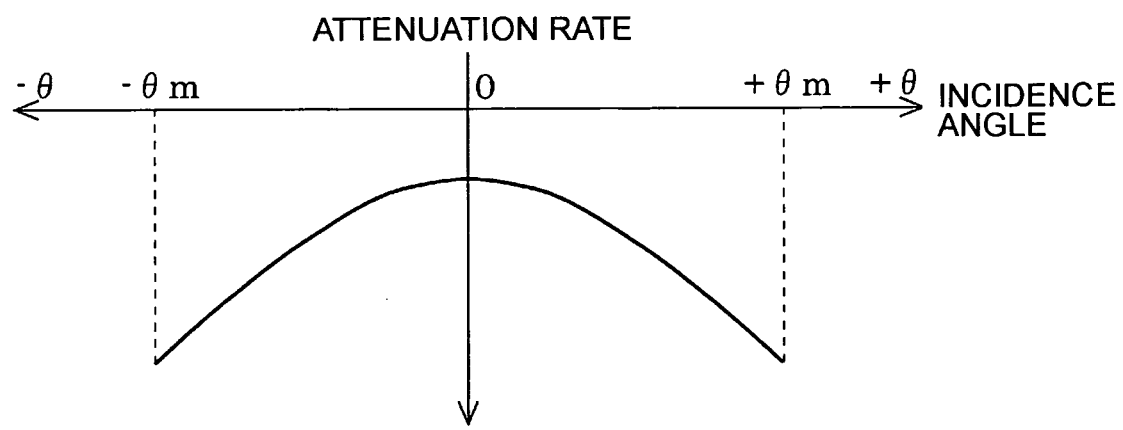
FIG. 74 is a drawing showing an attenuation characteristic of the unit attenuation region of FIG. 72.

As the angle to the optical axis AX of the light incident to the unit attenuation region consisting of the circular light shield dots 9*aa* and 9*bc* monotonically increases from 0° along the YZ plane, the shielded region 93*aa* moves in the Z-direction to monotonically decrease the overlap region with the shielded region 93*bc* and, after a while, the shielded region 93*aa* comes to be located completely off the shielded region 93*bc* as shown in FIG. 73B. In this state, the circular shielded regions 93*aa* and 93*bc* form a shielded region having the area equal to twice that of the shielded region 93*aa*. In this manner, the unit shield region consisting of the circular light shield dots 9*aa* and 9*bc* exerts the attenuation action to increase the attenuation rate with increase in the incidence angle of light, as shown in FIG. 74.

In the above description, the first attenuation regions formed on the entrance surface 9*a* of the compensation filter 9 and the second attenuation regions formed on the exit surface 9*b* are formed as the light shield regions to block incident light, for example, as composed of the light shield dots 9*aa* and 9*bb* of chromium, chromium oxide, or the like. However, without having to be limited to this, it is also possible to adopt any form other than the form of the light shield regions for the attenuation regions. For example, at least one of the first attenuation region and the second attenuation region can be formed as a scattering region to scatter incident light, or as a diffractive region to diffract incident light. In general, a scattering region is made by subjecting a required region of an optically transparent substrate to a roughening process, and a diffractive region is made by subjecting a predetermined region to a diffractive surface forming process.

In the above description, the compensation filter 9 is arranged behind (or on the mask side of) the forming plane of the pupil intensity distribution 20 formed on the rear focal plane of the micro fly's eye lens 8 or on the illumination pupil near it. However, without having to be limited to this, the compensation filter 9 may also be arranged at the position of the forming plane of the pupil intensity distribution 20, or in front of it (or on the light source side). Furthermore, the compensation filter 9 can also be arranged at or near a position of another illumination pupil behind the micro fly's eye lens 8, e.g., at or near the position of the illumination pupil between the front lens unit 12*a* and the rear lens unit 12*b* of the imaging optical system 12.

Generally, the compensation filter of the present invention to change the pupil intensity distribution formed on the illumination pupil is provided with the first attenuation region formed on the first surface located in the illumination pupil space between an optical element with a power adjacent in front of the illumination pupil and an optical element with a power adjacent behind the illumination pupil, and the second attenuation region formed corresponding to the first attenuation region on the second surface located behind the first surface in the illumination pupil space. The first attenuation region and the second attenuation region are so configured as to impart the attenuation characteristic of, with change in the incidence angle of light to the first surface, monotonically decreasing the attenuation rate, then keeping the attenuation rate almost constant, and thereafter monotonically increasing the attenuation rate, to the light passing through the first surface and the second surface. A plane-parallel plate or a planar mirror without power may exist in the "illumination pupil space."

Figure 75:
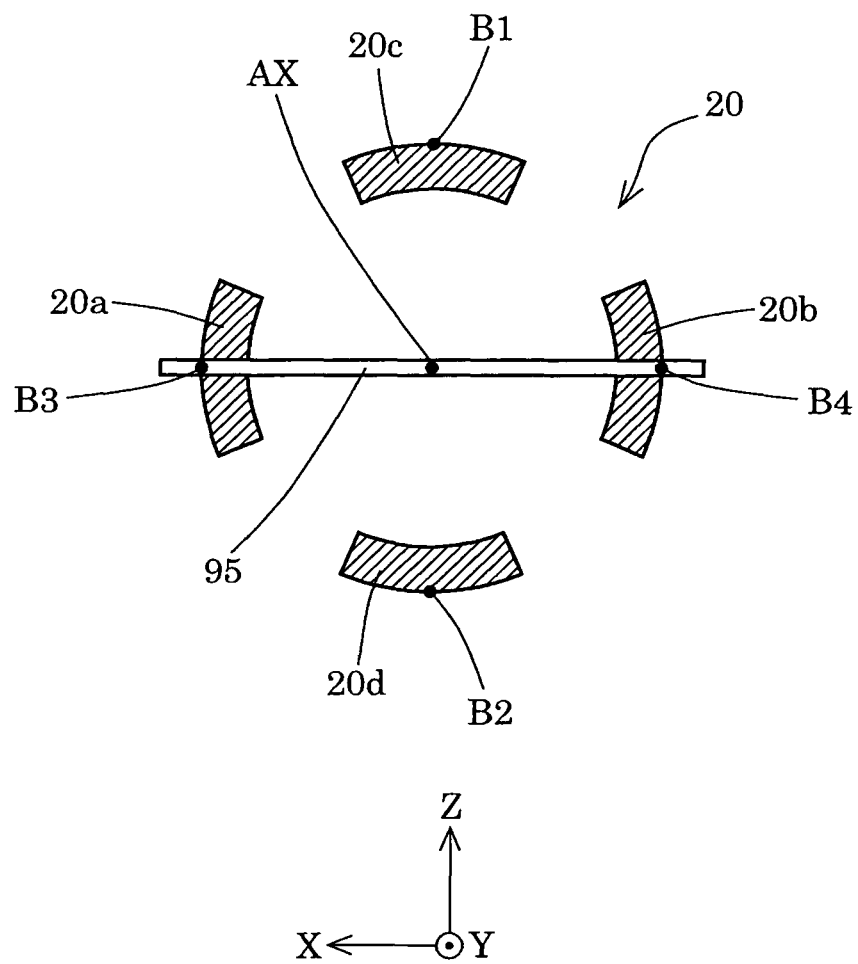
FIG. 75 is a drawing showing a layout of a compensation filter according to a modification example having a form of a light shield member.
Figure 76:
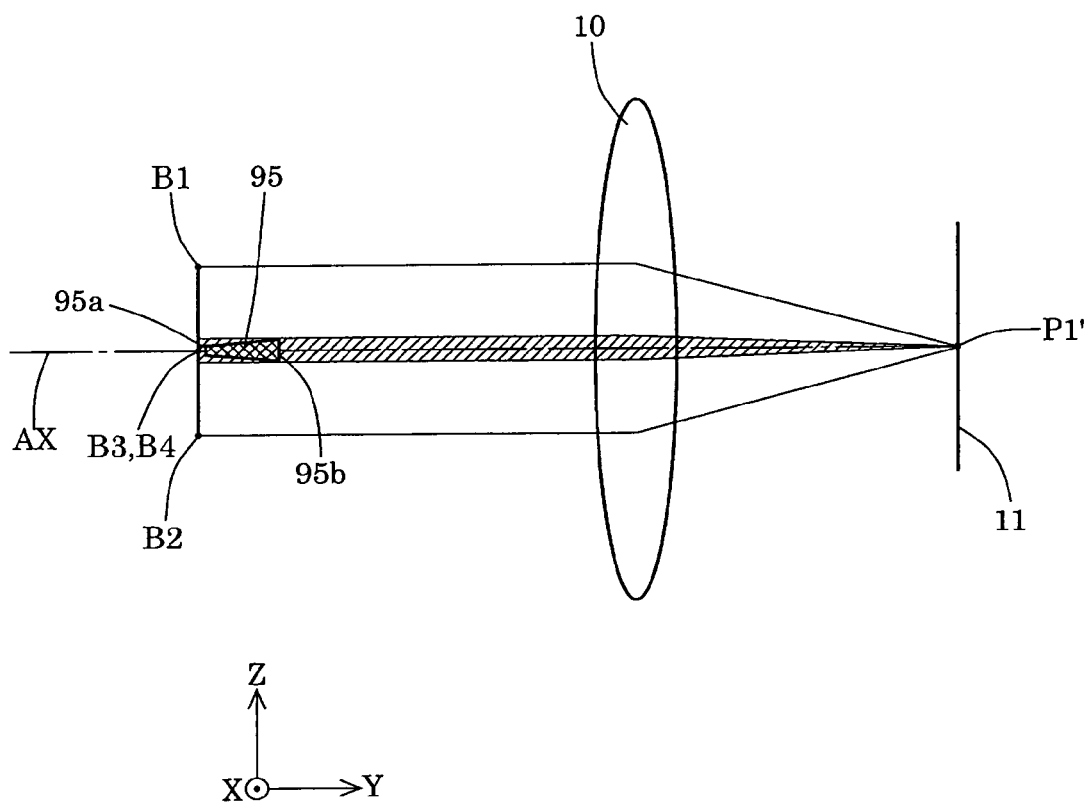
FIG. 76 is a first drawing to illustrate an action of the compensation filter according to the modification example of FIG. 75.

Namely, the compensation filter of the present invention is not limited simply to the form of the optically transparent substrate, but may also be, for example, a form of a light shield member having a predetermined cross section. The below will describe a modification example in which the compensation filter has the form of the light shield member, with reference to FIGS. 75-77. The compensation filter of this modification example, as shown in FIG. 75, is provided with a light shield member 95 extending along the X-direction so as to correspond to the pair of surface illuminants 20*a*, 20*b* spaced in the X-direction on both sides of the optical axis AX. The light shield member 95, as shown in FIG. 76, has, for example, a trapezoidal cross section and is arranged so as to extend in parallel with the plane of the illumination pupil (XZ plane). It is assumed hereinafter, for easier description, that the light shield member 95 is arranged so that a side face 95*a* on the front side (light source side) and a side face 95*b* on the rear side (mask side) are parallel to the XZ plane.

Therefore, of the quadrupolar pupil intensity distribution 20, the light from the surface illuminants 20*a* and 20*b* is subjected to the action of the light shield member 95, but the light from the surface illuminants 20*c* and 20*d* is not subjected to the action of the light shield member 95. In this case, as shown in FIG. 76, the light reaching the center point P1 in the still exposure region ER on the wafer W, i.e., the light reaching the center point P1' of the aperture of the mask blind 11 is incident at the incidence angle of 0 to the side face 95*a* of the light shield member 95 and, therefore, the quantity of light blocked by the light shield member 95 is relatively small. In other words, the attenuation rate by the light shield member 95 is relatively small for the light from the surface illuminants 21a and 21b of the pupil intensity distribution 21 related to the center point P1.

Figure 77:
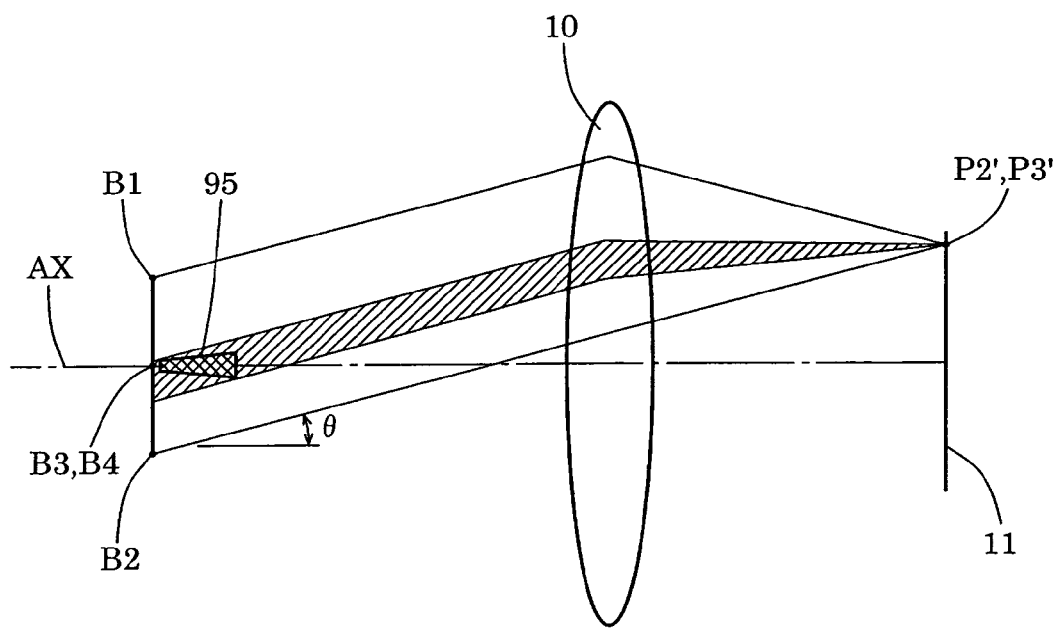
FIG. 77 is a second drawing to illustrate an action of the compensation filter according to the modification example of FIG. 75.

On the other hand, as shown in FIG. 77, the light reaching the peripheral points P2, P3 in the still exposure region ER on the wafer W, i.e., the light reaching the peripheral points P2′, P3′ of the aperture of the mask blind 11 is incident at relatively large incidence angles ±θ to the side face 95a of the light shield member 95 and, therefore, the quantity of light blocked by the light shield member 95 is relatively large. In other words, the attenuation rate by the light shield member 95 becomes a relatively large value which increases according to the magnitude of the absolute value of the incidence angles ±θ, for the light from the surface illuminants 22a and 22b of the pupil intensity distribution 22 related to the peripheral points P2, P3.

In the case of the modification example of FIG. 75, the front side face 95a of the light shield member 95 fulfills the function corresponding to the circular light shield dot 9aa as the first attenuation region in the foregoing embodiment, while the rear side face 95b of the light shield member 95 fulfills the function corresponding to the circular light shield dot 9bb as the second attenuation region in the foregoing embodiment. As a result, the compensation filter consisting of the light shield member 95 has the attenuation characteristic of varying the attenuation rate according to the mode as shown in FIG. 66, as in the case of the aforementioned embodiment. A variety of forms can be contemplated as to the number, sectional shape, contour, arrangement, etc. of the light shield member forming the compensation filter. For example, the sectional shape of the light shield member 95 is not limited only to the trapezoid but may also be a T-shape. At least one side face out of the side faces 95a, 95b of the trapezoid and the side faces intersecting with these side faces 95a, 95b may be a nonplanar surface (curved surface).

Figure 78:
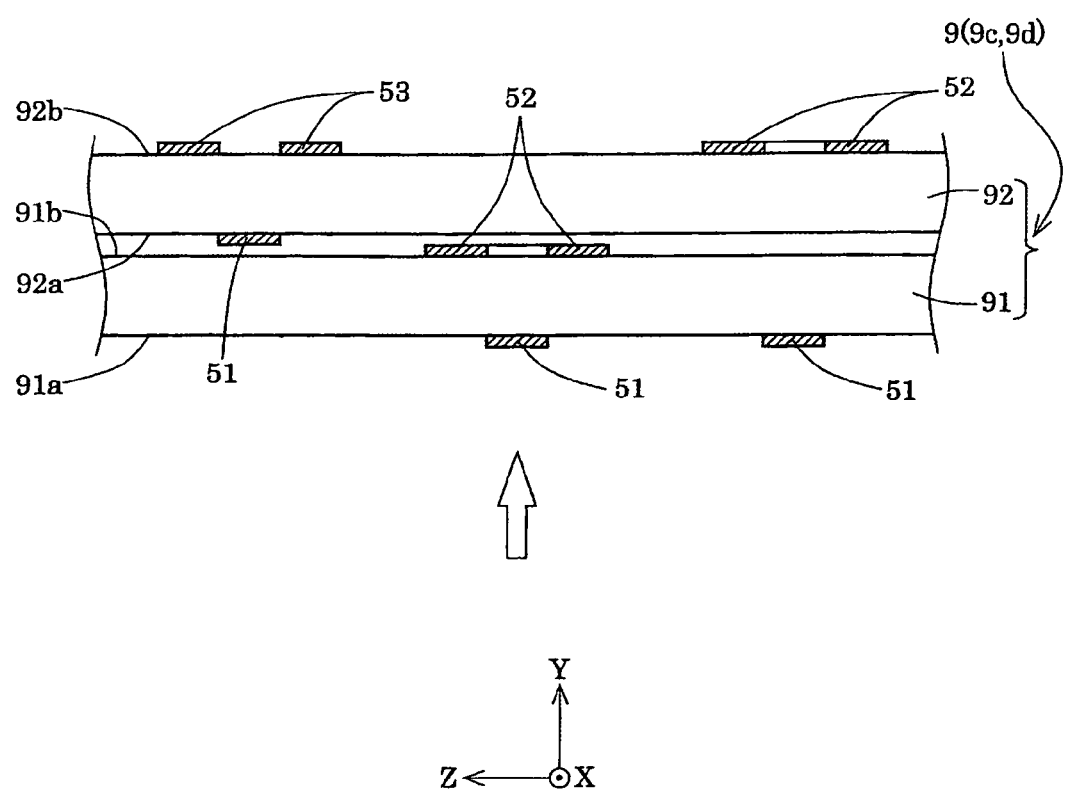
FIG. 78 is a drawing showing a configuration of two types of unit attenuation regions formed in a compensation filter according to the embodiment.
Figure 79:
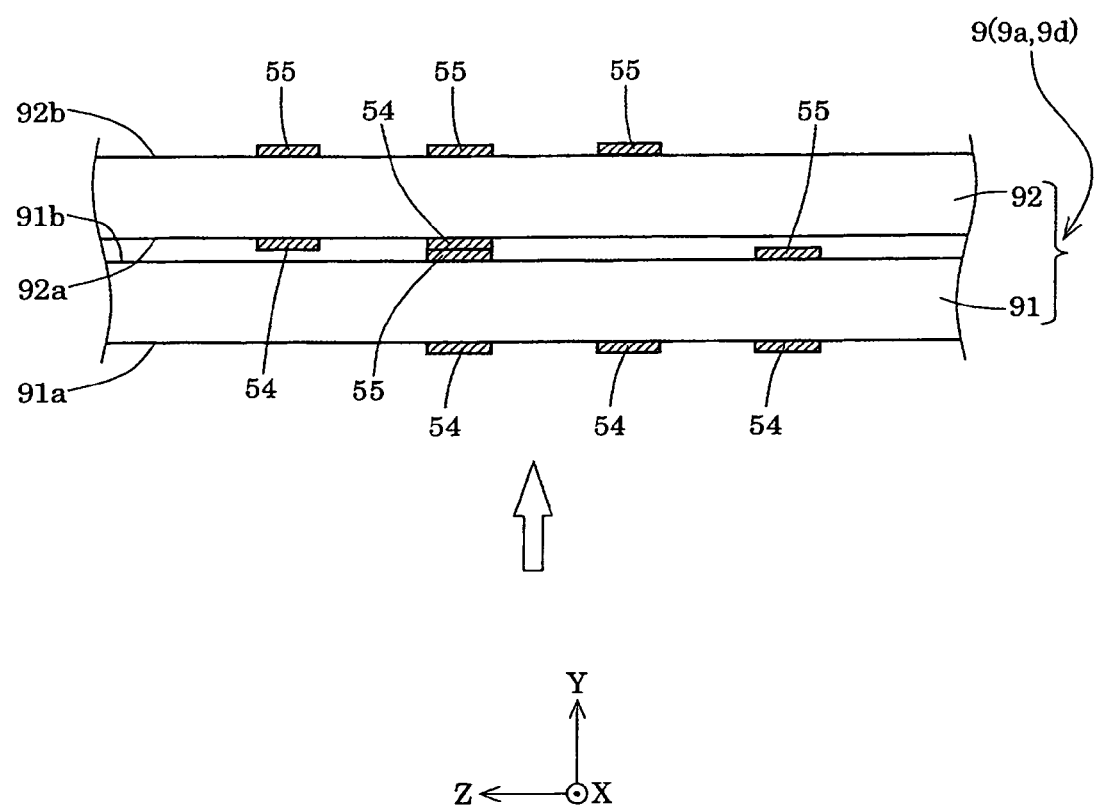
FIG. 79 is a drawing showing a state in which unit attenuation regions of different kinds are formed on a pair of filter regions.

The compensation filter 9 may be a plurality of filters (substrates) 91, 92 arranged in the direction of the optical axis as shown in FIGS. 78 and 79. Furthermore, the compensation filter is not limited only to the two-stage configuration consisting of a pair of substrates, but may also be a three-stage configuration consisting of three substrates to form the compensation filter; various forms can be contemplated as to the number of substrates. In FIGS. 78 and 79, plane-parallel plates are used as optically transparent substrates 91, 92 forming the compensation filter 9. However, the compensation filter of the present invention is not limited only to the plane-parallel plates, but it may also be constructed, for example, using substrates at least one surface of which has curvature.

In FIGS. 78 and 79, the optically transparent substrates 91 and 92 forming the compensation filter 9 are arranged so as to be adjacent to each other. However, a variety of forms can be contemplated as to the arrangement of the plurality of substrates forming the compensation filter. In FIGS. 78 and 79, a plurality of unit attenuation regions (combinations of the first unit attenuation regions and the second unit attenuation regions) are formed as distributed in the compensation filter 9, but the same action and effect can also be achieved by a unit attenuation region according to circumstances.

Incidentally, as shown in FIG. 80, there is, for example, a case where a quadrupolar pupil intensity distribution 24a-24d with a relatively large outside diameter (or a relatively large illumination NA) is formed for transferring a pattern with a relatively small pitch and where a quadrupolar pupil intensity distribution 25a-25d with a relatively small outside diameter (or relatively small illumination NA) is formed for transferring a pattern with a relatively large pitch. In this case, the compensation filter may be configured as follows: it includes many unit attenuation regions each consisting of a pair of light shield dots 54 and 55 spaced with a relatively large space in the direction of the optical axis AX and many pairs of unit attenuation regions overlapping with each other in the direction of the optical axis AX in each region of filter regions 9a and 9b arranged opposite to the pair of surface illuminants 24a and 24b; it includes many unit attenuation regions each consisting of a pair of light shield dots 54 and 55 spaced with a relatively small space in the direction of the optical axis AX in each region of filter regions 9a and 9b arranged opposite to the pair of surface illuminants 25a and 25b.

Third Embodiment

Figure 81:
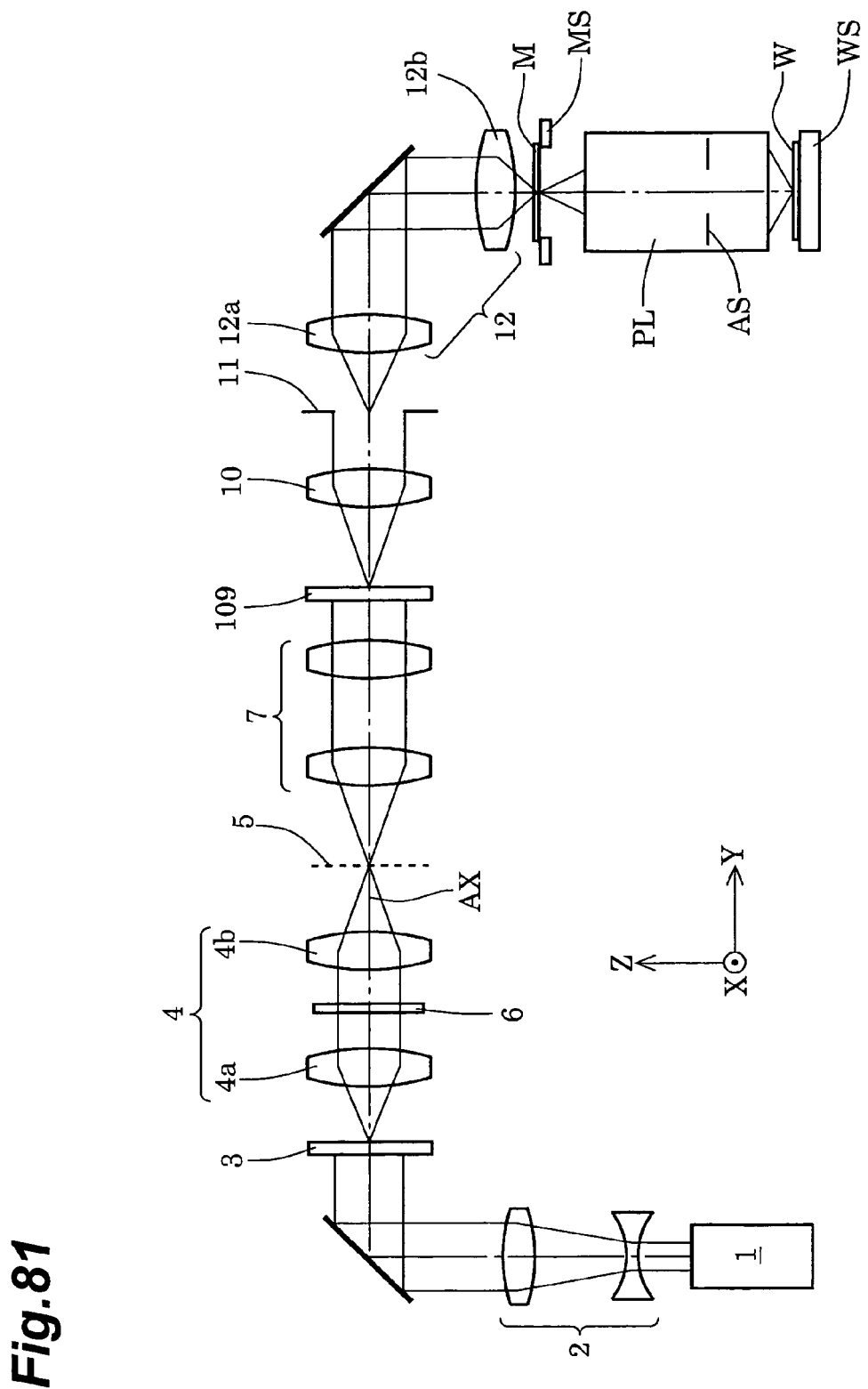
FIG. 81 is a drawing schematically showing a configuration of an exposure apparatus according to another embodiment of the present invention.

The third embodiment of the present invention will be described on the basis of the accompanying drawings. FIG. 81 is a drawing schematically showing a configuration of an exposure apparatus according to the third embodiment of the present invention. In FIG. 81, the Z-axis is set along a direction of a normal to an exposure surface (transfer surface) of a wafer W being a photosensitive substrate, the Y-axis along a direction parallel to the plane of FIG. 81 in the exposure surface of the wafer W, and the X-axis along a direction perpendicular to the plane of FIG. 81 in the exposure surface of the wafer W. The exposure apparatus of the third embodiment is different from the exposure apparatus of the first embodiment in that the fin member 9 is not used and in that a cylindrical micro fly's eye lens 109 is used instead of the micro fly's eye lens 8.

Figure 82:
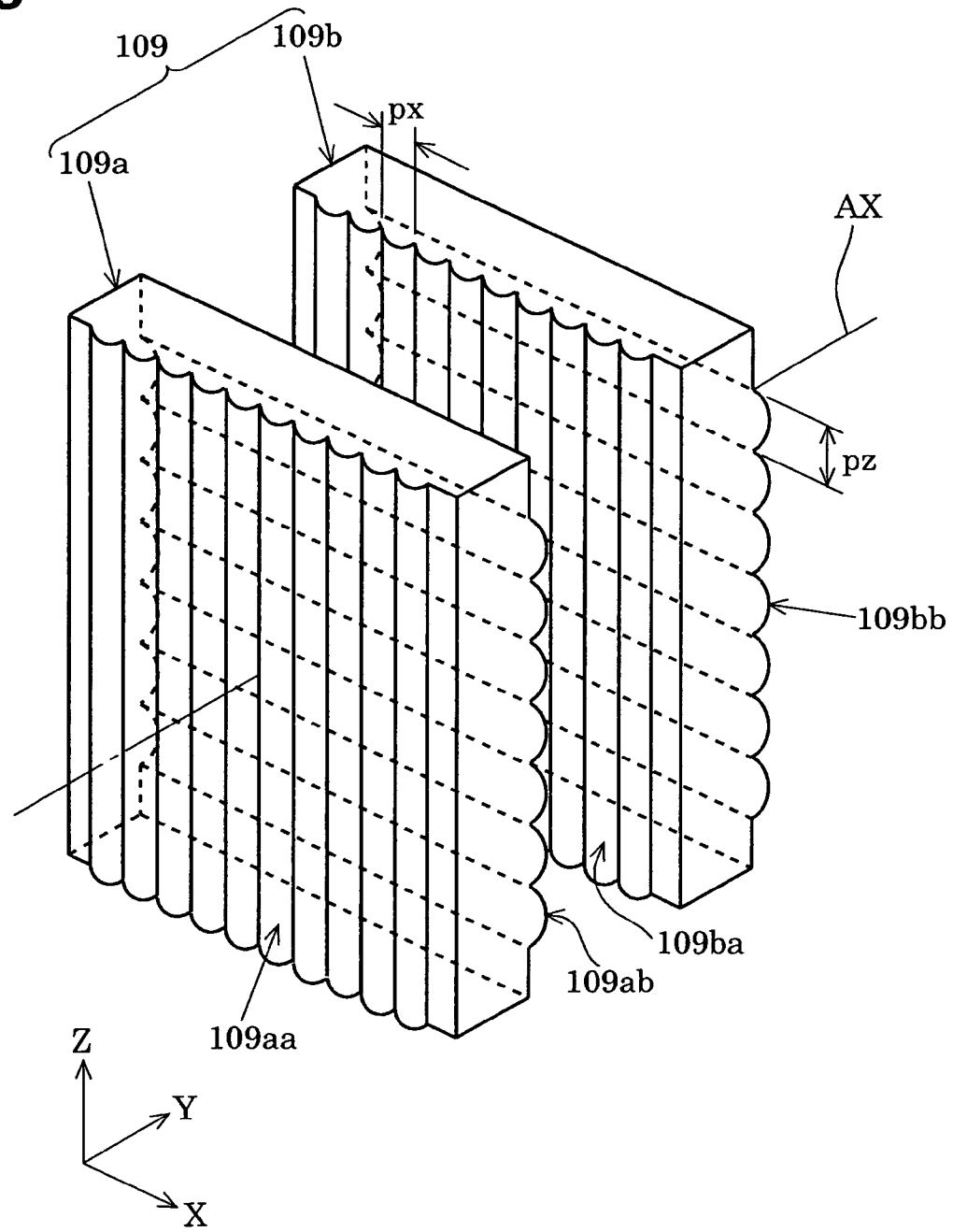
FIG. 82 is a perspective view schematically showing a configuration of a cylindrical micro fly's eye lens shown in FIG. 81.

In the exposure apparatus of the third embodiment, the light having passed through the afocal lens 4 travels through the zoom lens 7 to enter the cylindrical micro fly's eye lens 109 as an optical integrator. The cylindrical micro fly's eye lens 109, as shown in FIG. 82, is composed of a first fly's eye member (first optical member) 109a arranged on the light source side and a second fly's eye member (second optical member) 109b arranged on the mask side.

A plurality of refracting faces (cylindrical lens groups) 109aa and 109ba of a cylindrical surface shape arrayed in the X-direction are formed each at a pitch px in the surface on the light source side (entrance side) of the first fly's eye member 109a and in the surface on the light source side of the second fly's eye member 109b. A plurality of refracting faces (cylindrical lens groups) 109ab and 109bb of a cylindrical surface shape arrayed in the Z-direction are formed each at a pitch pz (pz>px) in the surface on the mask side (exit side) of the first fly's eye member 109a and in the surface on the mask side of the second fly's eye member 109b.

When attention is focused on the refraction action in the X-direction of the cylindrical micro fly's eye lens 109 (i.e., the refraction action in the XY plane), a parallel beam incident along the optical axis AX is subjected to wavefront division at the pitch px along the X-direction by the group of refracting faces 109aa formed on the light source side of the first fly's eye member 109a and the divided beams are subjected to the converging action of the refracting faces. Thereafter, the beams are subjected to the converging action by the corresponding refracting faces in the group of refracting faces 109ba formed on the light source side of the second fly's eye member 109b, to be converged on the rear focal plane of the cylindrical micro fly's eye lens 109.

When attention is focused on the refraction action in the Z-direction of the cylindrical micro fly's eye lens 109 (i.e., the refraction action in the YZ plane), a parallel beam incident along the optical axis AX is subjected to wavefront division at the pitch pz along the Z-direction by the group of refracting faces 109ab formed on the mask side of the first fly's eye member 109a, and the divided beams are subjected to the converging action of the refracting faces. Thereafter, the beams are subjected to the converging action by the corresponding refracting faces in the group of refracting faces 109bb formed on the mask side of the second fly's eye member 109b, to be converged on the rear focal plane of the cylindrical micro fly's eye lens 109.

As described above, the cylindrical micro fly's eye lens 109 is composed of the first fly's eye member 109a and the second fly's eye member 109b in which the cylindrical lens groups are arranged on their both side faces, and fulfills an optical function similar to that of a micro fly's eye lens in which a large number of rectangular micro refracting faces (unit wavefront division faces) having the size of px in the X-direction and the size of pz in the Z-direction are integrally formed vertically and horizontally and densely. In the case of the cylindrical micro fly's eye lens 109, it is feasible to keep small change in distortion due to variation in surface shapes of the micro refracting faces and, for example, to keep down influence on the illuminance distribution from manufacturing errors of the large number of micro refracting faces integrally formed by etching.

The position of the predetermined plane 5 is arranged at or near the front focal point of the zoom lens 7 and the entrance surface of the cylindrical micro fly's eye lens 109 (i.e., the entrance surface of the first fly's eye member 109a) is located at or near the rear focal point of the zoom lens 7. In other words, the zoom lens 7 arranges the predetermined plane 5 and the entrance surface of the cylindrical micro fly's eye lens 109 substantially in the Fourier transform relation and, therefore, keeps the pupil plane of the afocal lens 4 substantially optically conjugate with the entrance surface of the cylindrical micro fly's eye lens 109.

Therefore, for example, an annular illumination field centered on the optical axis AX is formed on the entrance surface of the cylindrical micro fly's eye lens 109 as on the pupil plane of the afocal lens 4. The overall shape of this annular illumination field similarly varies depending upon the focal length of the zoom lens 7. Each unit wavefront division face of the cylindrical micro fly's eye lens 109, as described above, has a rectangular shape with the long sides along the Z-direction and the short sides along the X-direction and rectangular shape similar to a shape of an illumination region to be formed on the mask M (and, therefore, similar to a shape of an exposure region to be formed on the wafer W).

A beam incident to the cylindrical micro fly's eye lens 109 is two-dimensionally divided to form a secondary light source with a light intensity distribution approximately identical to the illumination field formed on the entrance surface of the cylindrical micro fly's eye lens 109, i.e., a secondary light source (pupil intensity distribution) consisting of a substantial surface illuminant of an annular shape centered on the optical axis AX, on the rear focal plane of the fly's eye lens 109 or at a position near it (or at the position of the illumination pupil).

An illumination aperture stop (not shown) having an annular aperture region (light transmitting portion) corresponding to the annular secondary light source is arranged, if necessary, at or near the rear focal plane of the cylindrical micro fly's eye lens 109. The illumination aperture stop is configured so as to be freely inserted into or retracted from the illumination optical path and so as to be switchable with a plurality of aperture stops having respective apertures of different sizes and shapes. A switching method of the aperture stops can be, for example, a known turret method, slide method, or the like. The illumination aperture stop is arranged at a position approximately optically conjugate with the entrance pupil plane of the projection optical system PL described later, and defines a range for the secondary light source to contribute to illumination.

The light having passed through the cylindrical micro fly's eye lens 109 travels through the condenser optical system 10 to superposedly illuminate the mask blind 11. In this manner, an illumination field of a rectangular shape according to the shape and focal length of the unit wavefront division faces of the cylindrical micro fly's eye lens 109 is formed on the mask blind 11 as an illumination field stop. Light having passed through the rectangular aperture of the mask blind 11 (light transmitting portion) travels through the imaging optical system 12 consisting of the front lens unit 12a and the rear lens unit 12b, to superposedly illuminate the mask M on which the predetermined pattern is formed. Namely, the imaging optical system 12 forms an image of the rectangular aperture of the mask blind 11 on the mask M.

The pattern to be transferred is formed on the mask M held on the mask stage MS and is illuminated in a pattern region of a rectangular shape (slit shape) having the long sides along the Y-direction and the short sides along the X-direction in the entire pattern region. Light transmitted by the pattern region of the mask M travels through the projection optical system PL to form an image of the mask pattern on the wafer (photosensitive substrate) W held on the wafer stage WS. Namely, the pattern image is also formed in a still exposure region (effective exposure region) of a rectangular shape having the long sides along the Y-direction and the short sides along the X-direction on the wafer W, so as to optically correspond to the rectangular illumination region on the mask M.

In this configuration, the mask stage MS and the wafer stage WS and, therefore, the mask M and wafer W are synchronously moved (scanned) along the X-direction (scanning direction) in the plane (XY plane) perpendicular to the optical axis AX of the projection optical system PL in accordance with the so-called step-and-scan method, whereby scanning exposure of the mask pattern is effected in a shot area (exposure region) having a width equal to a Y-directional size of the still exposure region and a length according to a scan distance (movement distance) of the wafer W, on the wafer W.

In the present embodiment, as described above, the mask M arranged on the surface to be illuminated, of the illumination optical system (2-12) is illuminated by Köhler illumination, using as a light source the secondary light source formed by the cylindrical micro fly's eye lens 109. For this reason, the position where the secondary light source is formed is optically conjugate with the position of the aperture stop AS of the projection optical system PL and the forming position of the secondary light source can be called an illumination pupil plane of the illumination optical system (2-12). Typically, the surface to be illuminated (the surface where the mask M is arranged, or the surface where the wafer W is arranged in the case where the illumination optical system is considered to include the projection optical system PL) becomes an optical Fourier transform surface of the illumination pupil plane.

A pupil intensity distribution is a light intensity distribution (luminance distribution) on the illumination pupil plane of the illumination optical system (2-12) or on a plane optically conjugate with the illumination pupil plane. If the number of wavefront divisions by the cylindrical micro fly's eye lens 109 is relatively large, there is a high correlation between a global light intensity distribution formed on the entrance surface of the cylindrical micro fly's eye lens 109 and a global light intensity distribution (pupil intensity distribution) of the entire secondary light source. For this reason, light intensity distributions on the entrance surface of the cylindrical micro fly's eye lens 109 and on a plane optically conjugate with the entrance surface can also be called pupil intensity distributions. In the configuration of FIG. 81, the diffractive optical element 3, afocal lens 4, zoom lens 7, and cylindrical micro fly's eye lens 109 constitute a distribution forming optical system to form the pupil intensity distribution on the illumination pupil located behind the cylindrical micro fly's eye lens 109.

The diffractive optical element 3 for annular illumination may be replaced with another diffractive optical element (not shown) for multi-polar illumination (dipolar illumination, quadrupolar illumination, octupolar illumination, or the like) set in the illumination optical path, so as to implement the multi-polar illumination. The diffractive optical element for multi-polar illumination has such a function that when a parallel beam with a rectangular cross section is incident thereto, it forms a light intensity distribution of a multi-polar shape (dipolar shape, quadrupolar shape, octupolar shape, or the like) in its far field. Therefore, the beam having passed through the diffractive optical element for multi-polar illumination forms, for example, an illumination field of a multi-polar shape consisting of a plurality of illumination zones of a predetermined shape (arcuate shape, circular shape, or the like) centered on the optical axis AX, on the entrance surface of the cylindrical micro fly's eye lens 109. As a consequence, a secondary light source of a multi-polar shape identical to the illumination field formed on the entrance surface is also formed on or near the rear focal plane of the cylindrical micro fly's eye lens 109.

When a diffractive optical element for circular illumination (not shown) is set, instead of the diffractive optical element 3 for annular illumination, in the illumination optical path, ordinary circular illumination can be implemented. The diffractive optical element for circular illumination has such a function that when a parallel beam with a rectangular cross section is incident thereto, it forms a light intensity distribution of a circular shape in its far field. Therefore, a beam having passed through the diffractive optical element for circular illumination forms, for example, an illumination field of a circular shape centered on the optical axis AX, on the entrance surface of the cylindrical micro fly's eye lens 109. As a consequence, a secondary light source of a circular shape identical to the illumination field formed on the entrance surface is also formed on or near the rear focal plane of the cylindrical micro fly's eye lens 109. Furthermore, modified illuminations of various forms can also be implemented by setting a diffractive optical element with an appropriate property (not shown) in the illumination optical path, instead of the diffractive optical element 3 for annular illumination. A switching method of diffractive optical element 3 can be, for example, a well-known turret method, slide method, or the like.

Figure 83:
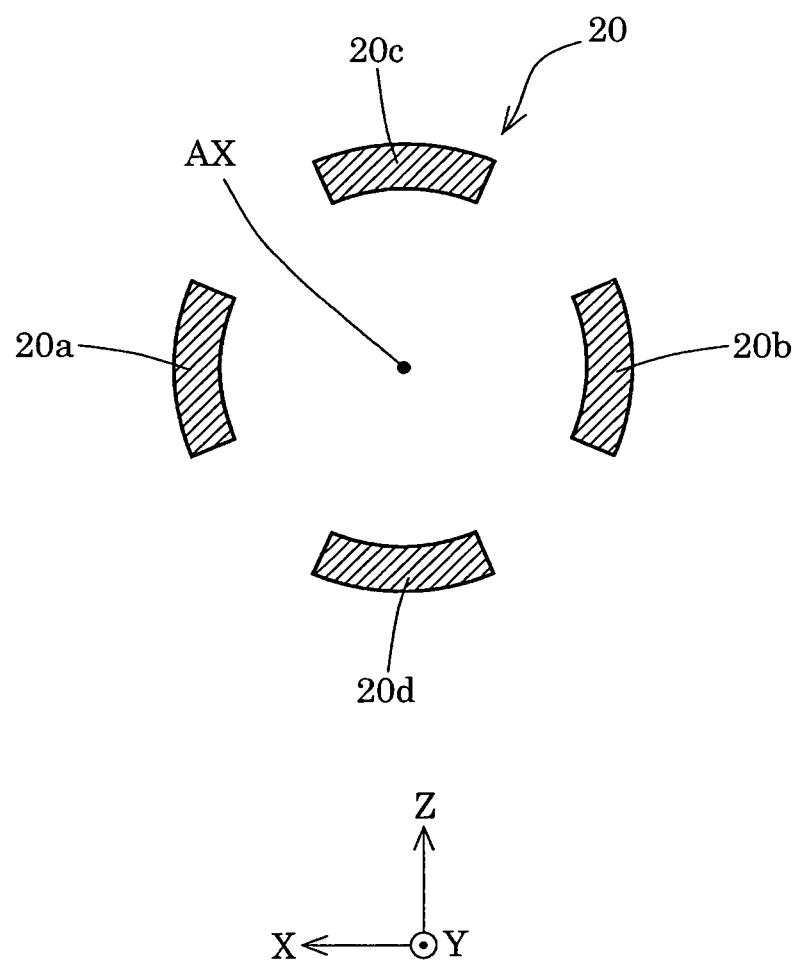
FIG. 83 is a drawing showing a secondary light source of a quadrupolar shape formed on an illumination pupil.

It is assumed in the description hereinafter, for easier understanding of the action and effect of the present embodiment, that a pupil intensity distribution (secondary light source) 20 of a quadrupolar shape consisting of four substantial surface illuminants of an arcuate shape (hereinafter referred to simply as "surface illuminants") 20*a*, 20*b*, 20*c*, and 20*d* as shown in FIG. 83 is formed on the rear focal plane of the cylindrical micro fly's eye lens 109 or on the illumination pupil near it. When the "illumination pupil" is simply used in the description hereinafter, it means the rear focal plane of the cylindrical micro fly's eye lens 109 or the illumination pupil near it.

With reference to FIG. 83, the pupil intensity distribution 20 of the quadrupolar shape formed on the illumination pupil has the surface illuminants 20*a* and 20*b* spaced in the X-direction on both sides of the optical axis AX, and the pair of substantial surface illuminants 20*c* and 20*d* of the arcuate shape spaced in the Z-direction on both sides of the optical axis AX. The X-direction on the illumination pupil is the short-side direction of the rectangular unit wavefront division faces of the cylindrical micro fly's eye lens 109 and corresponds to the scanning direction of the wafer W. The Z-direction on the illumination pupil is the long-side direction of the rectangular unit wavefront division faces of the cylindrical micro fly's eye lens 109 and corresponds to the orthogonal-to-scan direction (the Y-direction on the wafer W) perpendicular to the scanning direction of the wafer W.

As shown in FIG. 83, the still exposure region ER of the rectangular shape having the long sides along the Y-direction and the short sides along the X-direction is formed on the wafer W and the rectangular illumination region (not shown) is formed on the mask M so as to correspond to this still exposure region ER.

Figure 84:
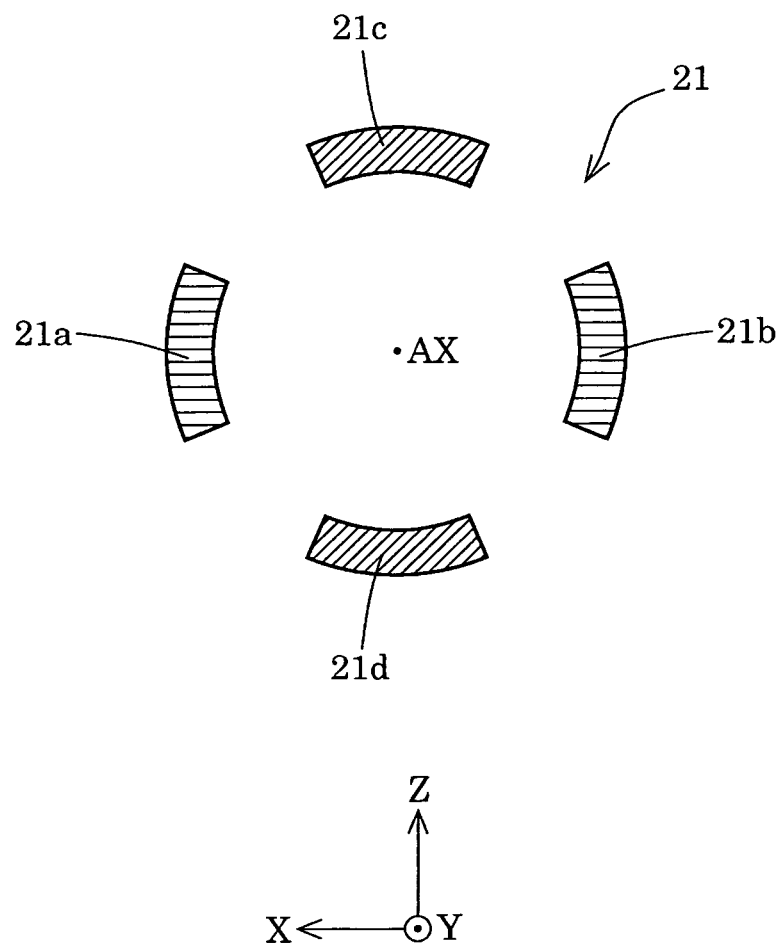
FIG. 84 is a drawing to illustrate a property of a pupil intensity distribution of a quadrupolar shape formed by light incident to a center point P1 in a still exposure region.
Figure 85:
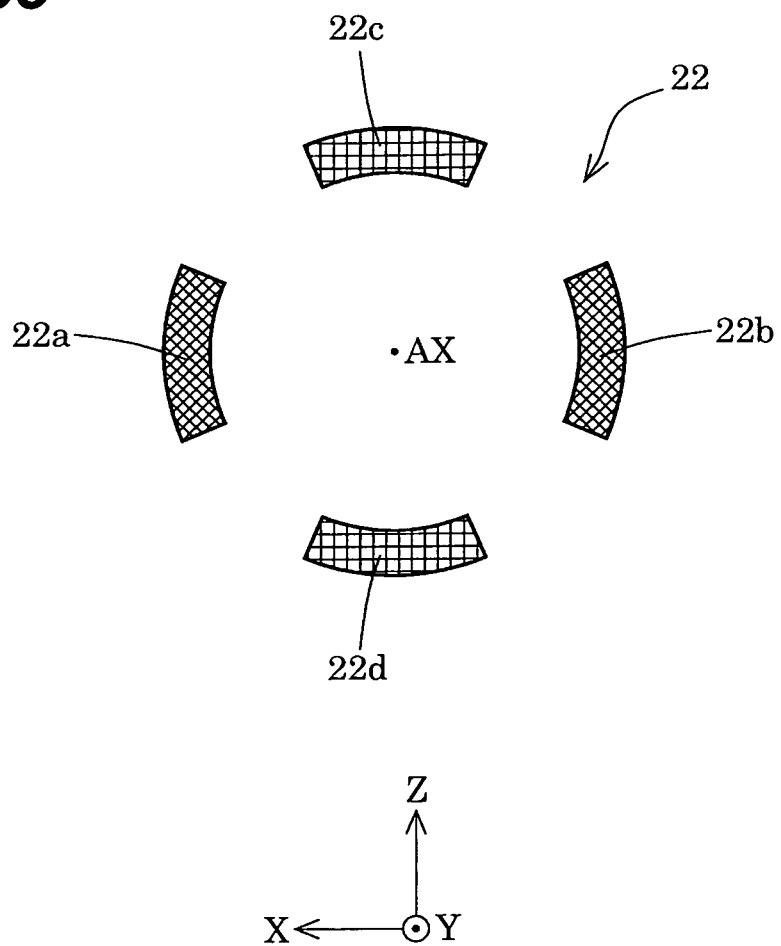
FIG. 85 is a drawing to illustrate a property of a pupil intensity distribution of a quadrupolar shape formed by light incident to peripheral points P2, P3 in the still exposure region.

Specifically, in the case of a quadrupolar pupil intensity distribution 21 formed by light incident to the center point P1 in the still exposure region ER, as shown in FIG. 84, the light intensity of the surface illuminants 21*c* and 21*d* spaced in the Z-direction tends to become larger than the light intensity of the surface illuminants 21*a* and 21*b* spaced in the X-direction. On the other hand, in the case of a quadrupolar pupil intensity distribution 22 formed by light incident to the peripheral points P2, P3 spaced in the Y-direction apart from the center point P1 in the still exposure region ER, as shown in FIG. 85, the light intensity of the surface illuminants 22*c* and 22*d* spaced in the Z-direction tends to become smaller than the light intensity of the surface illuminants 22*a* and 22*b* spaced in the X-direction.

Figure 86A:
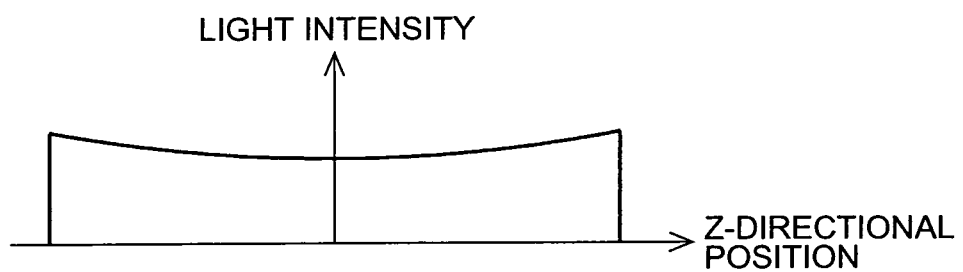
FIG. 86A is a drawing schematically showing a light intensity profile along the Z-direction of the pupil intensity distribution related to the center point P1.
Figure 86B:
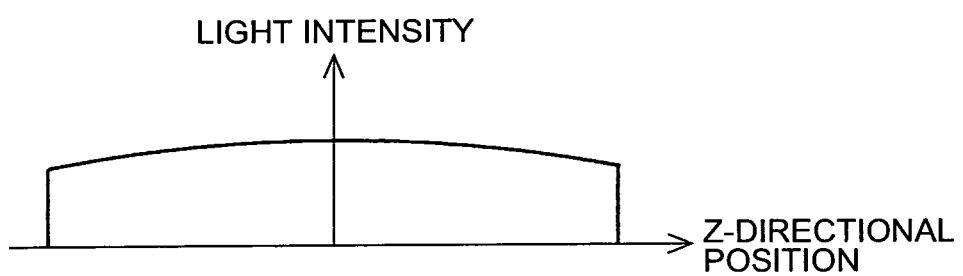
FIG. 86B is a drawing schematically showing a light intensity profile along the Z-direction of the pupil intensity distribution related to the peripheral points P2, P3.

In general, regardless of the contour of the pupil intensity distribution formed on the illumination pupil, a light intensity profile along the Z-direction of the pupil intensity distribution related to the center point P1 in the still exposure region ER on the wafer W (the pupil intensity distribution formed on the illumination pupil by the light incident to the center point P1) has a profile of a concave curve shape in which the intensity is minimum in the center and increases toward the periphery, as shown in FIG. 86A. On the other hand, a light intensity profile along the Z-direction of the pupil intensity distribution related to the peripheral points P2, P3 in the still exposure region ER on the wafer W has a profile of a convex curve shape in which the intensity is maximum in the center and decreases toward the periphery, as shown in FIG. 86B.

The light intensity profile along the Z-direction of the pupil intensity distribution is not very dependent on positions of incident points along the X-direction (scanning direction) in the still exposure region ER, but tends to vary depending upon positions of incident points along the Y-direction (orthogonal-to-scan direction) in the still exposure region ER. When each of the pupil intensity distributions related to the respective points in the still exposure region ER on the wafer W (pupil intensity distributions formed on the illumination pupil by light incident to the respective points) is not substantially uniform as in this case, the line width of the pattern varies depending upon positions on the wafer W, so as to fail in faithfully transferring the micro pattern of the mask M in a desired line width across the entire exposure region on the wafer W.

In the present embodiment, as described above, the density filter 6 with the transmittance distribution of different transmittances depending upon positions of incidence of light is arranged at or near the pupil position of the afocal lens 4. The pupil position of the afocal lens 4 is optically conjugate with the entrance surface of the cylindrical micro fly's eye lens 109 by virtue of the rear lens unit 4*b* of the afocal lens 4 and the zoom lens 7. Therefore, the light intensity distribution formed on the entrance surface of the cylindrical micro fly's eye lens 109 is adjusted (or corrected) by the action of the density filter 6 and, in turn, the pupil intensity distribution formed on the rear focal plane of the cylindrical micro fly's eye lens 109 or on the illumination pupil near it is also adjusted.

However, the density filter 6 equally adjusts the pupil intensity distributions related to the respective points in the still exposure region ER on the wafer W, independent of positions of the respective points. As a consequence, it is possible, for example, to substantially uniformly adjust the quadrupolar pupil intensity distribution 21 related to the center point P1 and, in turn, to make the light intensities of the respective surface illuminants 21a-21d approximately equal to each other by the action of the density filter 6, but in that case, the difference becomes larger on the contrary between the light intensities of the surface illuminants 22a, 22b and the surface illuminants 22c, 22d of the quadrupolar pupil intensity distribution 22 related to the peripheral points P2, P3.

Namely, in order to substantially uniformly adjust each of the pupil intensity distributions related to the respective points in the still exposure region ER on the wafer W by the action of the density filter 6, the pupil intensity distributions related to the respective points may be adjusted to distributions of mutually identical properties by another means different from the density filter 6. Specifically, for example, in the pupil intensity distribution 21 related to the center point P1 and the pupil intensity distribution 22 related to the peripheral points P2, P3, the magnitude relation of light intensities between the surface illuminants 21a, 21b and the surface illuminants 21c, 21d and the magnitude relation of light intensities between the surface illuminants 22a, 22b and the surface illuminants 22c, 22d may be made coincident at a nearly equal ratio.

In the present embodiment, in order to make the property of the pupil intensity distribution related to the center point P1 approximately coincident with the property of the pupil intensity distribution related to the peripheral points P2, P3, specifically, in order to realize such adjustment that the light intensity of the surface illuminants 22a, 22b becomes smaller than that of the surface illuminants 22c, 22d in the pupil intensity distribution 22 related to the peripheral points P2, P3, the cylindrical micro fly's eye lens 109 is provided with an attenuation portion having a required attenuation characteristic. FIG. 87 is a drawing showing the configuration and action of the attenuation portion provided in the cylindrical micro fly's eye lens.

Figure 88:
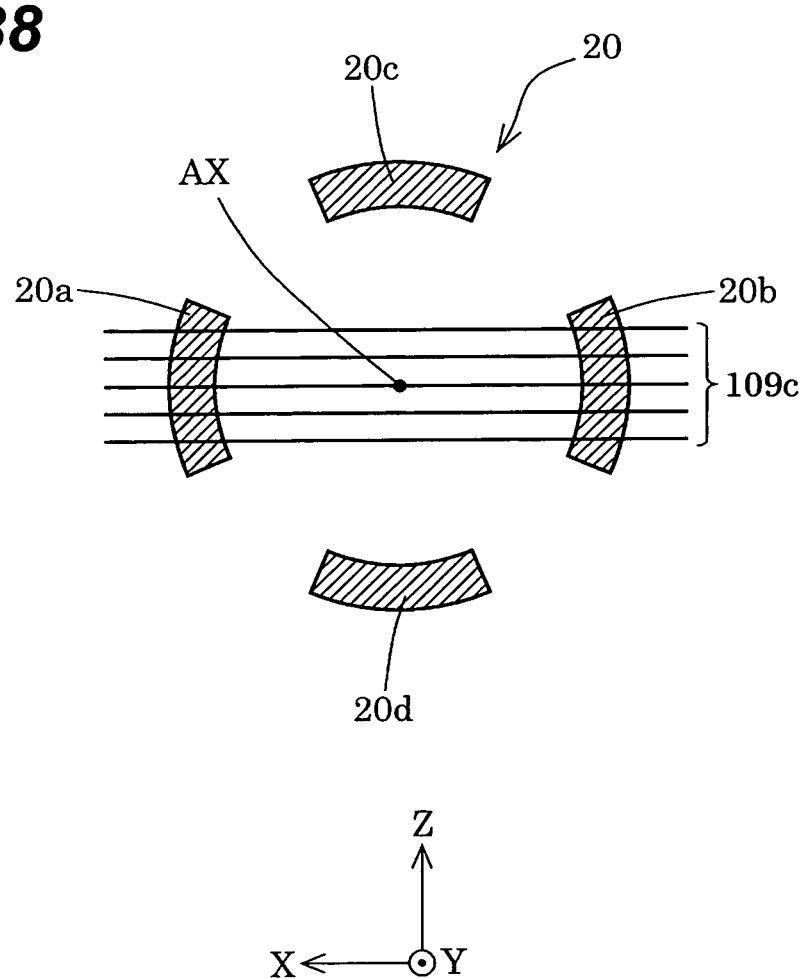
FIG. 88 is a drawing showing a state in which V-shaped cut faces are formed as an attenuation portion in regions corresponding to a pair of surface illuminants spaced in the X-direction in a pupil intensity distribution of a quadrupolar shape.

Referring to FIG. 87, V-shaped cut faces 109c linearly extending along the X-direction are provided between two refracting faces 109bb adjacent in the Z-direction on the exit side of the rear (mask-side) second fly's eye member 109b, out of the pair of fly's eye members 109a and 109b forming the cylindrical micro fly's eye lens 109. A necessary number of V-shaped cut faces 109c (five cut faces in the example of FIG. 88), as schematically showing in FIG. 88, are formed along the X-direction in a region corresponding to the pair of surface illuminants 20a and 20b spaced in the X-direction in the quadrupolar pupil intensity distribution 20.

As a consequence, of the quadrupolar pupil intensity distribution 20, the light forming the surface illuminants 20a and 20b spaced in the X-direction is subjected to the action of the V-shaped cut faces 109c during passage through the cylindrical micro fly's eye lens 109, whereas the light forming the surface illuminants 20c and 20d spaced in the Z-direction is not subjected to the action of the V-shaped cut faces 109c. The below will describe the action of the V-shaped cut faces 109c as an attenuation portion, referring to FIG. 87, while attention is focused on ray groups forming one small illuminant 20aa (or 20ba) out of the large number of small illuminants forming the surface illuminant 20a (or 20b) through one refracting face 109bb.

A ray group L1 reaching the center point P1 in the still exposure region ER on the wafer W passes through a central region along the Z-direction of the refracting face 109bb. Therefore, the ray group L1 is not subjected to the action of the V-shaped cut faces 109c but is subjected to the refraction action of the refracting face 109bb to form a small illuminant with the original size (light quantity) on the illumination pupil. Namely, the ray group L1 forms one small illuminant of the original light quantity out of the large number of small illuminants forming the surface illuminant 21a (or 21b) in the pupil intensity distribution 21 related to the center point P1.

On the other hand, a ray group L2 reaching the peripheral point P2 in the still exposure region ER passes through a region apart from the center region along the Z-direction of the refracting face 109bb, i.e., through one cut face 109ca out of the V-shaped cut faces 109c, and the refracting face 109bb. In other words, some rays of the ray group L2 are incident to the cut face 109ca and the rest rays of the ray group L2 are incident to the refracting face 109bb. Light impinging upon and reflected by the cut face 109ca, and light impinging upon and refracted by the cut face 109ca is guided, for example, to the outside of the illumination optical path, without any contribution to forming of the pupil intensity distribution.

As a consequence, the ray group L2 is subjected in part to the attenuation action of the V-shaped cut face 109c, and the rest is subjected to the refraction action of the refracting face 109bb, to form a small illuminant smaller than the original size on the illumination pupil. Namely, the ray group L2 forms one small illuminant out of the large number of small illuminants forming the surface illuminant 22a (or 22b) in the pupil intensity distribution 22 related to the peripheral point P2, as a small illuminant with a light quantity smaller than the original.

As for a ray group L3 reaching the peripheral point P3 in the still exposure region ER, some rays are incident to the cut face 109ca and the rest rays are incident to the refracting face 109bb. As a result, the ray group L3, just as the ray group L2, is also subjected in part to the attenuation action of the V-shaped cut face 109c and the rest is subjected to the refraction action of refracting face 109bb, to form a small illuminant smaller than the original on the illumination pupil. Namely, the ray group L3 forms one small illuminant out of the large number of small illuminants forming the surface illuminant 22a (or 22b) in the pupil intensity distribution 22 related to the peripheral point P3, as a small illuminant with a light quantity smaller than the original.

Figure 89A:
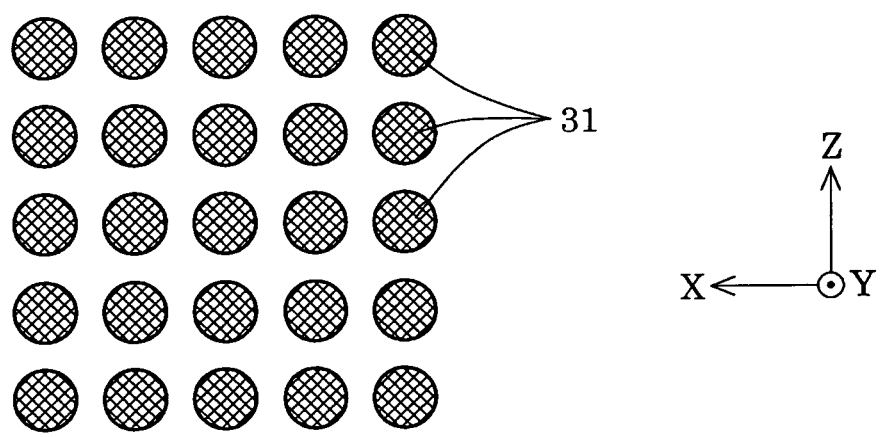
FIG. 89A is a drawing schematically showing a state in which a ray group arriving at the center point P1 forms small illuminants of an original size.

In this manner, the ray group L1 reaching the center point P1 in the still exposure region ER forms small illuminants 31 with the original size (i.e., the original light quantity) in a matrix pattern, as schematically shown in FIG. 89A, in the surface illuminants 21a, 21b of the quadrupolar pupil intensity distribution 21. In contrast to it, the ray groups L2, L3 reaching the peripheral points P2, P3 in the still exposure region ER form small illuminants 32a with the original size (original light quantity) and small illuminants 32b with the size smaller than the original (light quantity smaller than the original) in a matrix pattern, as schematically shown in FIG. 89B, in the surface illuminants 22a, 22b of the quadrupolar pupil intensity distribution 22.

Figure 89B:
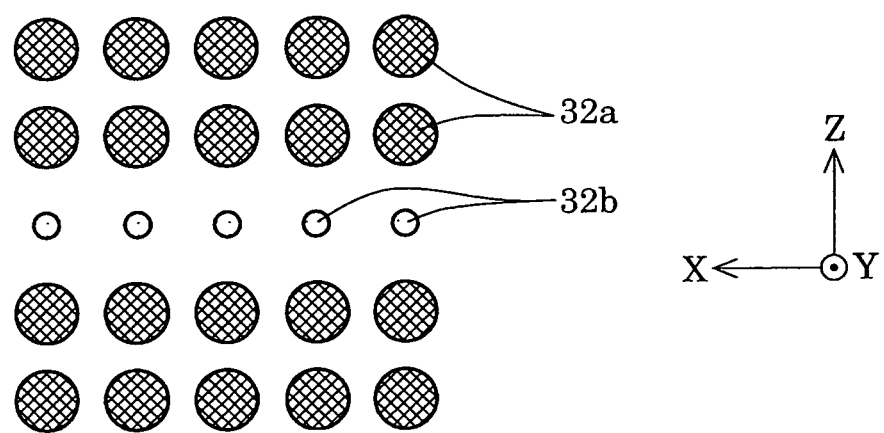
FIG. 89B is a drawing schematically showing a state in which ray groups arriving at the peripheral points P2, P3 form small illuminants of an original size and small illuminants smaller than the original size.

Actually, different from the schematic drawing shown in FIG. 89B, the small illuminants 32b are formed as aligned along the X-direction at n positions along the Z-direction, corresponding to the positions and number n along the Z-direction of the V-shaped cut faces 109c. In the surface illuminants 22a, 22b of the pupil intensity distribution 22 related to the peripheral points P2, P3, therefore, the overall light intensity is lowered according to a level at which the ray groups L2, L3 are subjected to the attenuation action of the V-shaped cut faces 109c, a ratio of the small illuminants 32b with the light quantity smaller than the original to the total number of small illuminants, and so on.

The ratio of small illuminants 32b is dependent upon the number n of V-shaped cut faces 109c acting on the surface illuminants 22a, 22b. The level of the attenuation action of the V-shaped cut faces 109c on the ray groups L2, L3, i.e., the attenuation rate is dependent upon the shape of the cross section along the XY plane of the V-shaped cut faces 109c. In general, as a point where a ray group reaches the still exposure region ER, becomes more distant from the center point P1 along the Y-direction, the ray group passes through a region more distant from the center region along the Z-direction of the refracting face 109bb and the ratio of light incident to the cut face 109ca becomes larger than the ratio of light incident to the refracting face 109bb.

In other words, the level at which the ray group reaching a point in the still exposure region ER is subjected to the attenuation action of the V-shaped cut faces 109c, increases with increasing distance along the Y-direction (orthogonal-to-scan direction) from the center point P1 of the still exposure region ER to the point which the ray group reaches. Namely, the V-shaped cut faces 109c as the attenuation portion have an attenuation characteristic of increasing the attenuation rate with increasing distance along the Y-direction of the position of the ray group reaching the still exposure region ER as the surface to be illuminated, from the center of the still exposure region ER.

Figure 90:
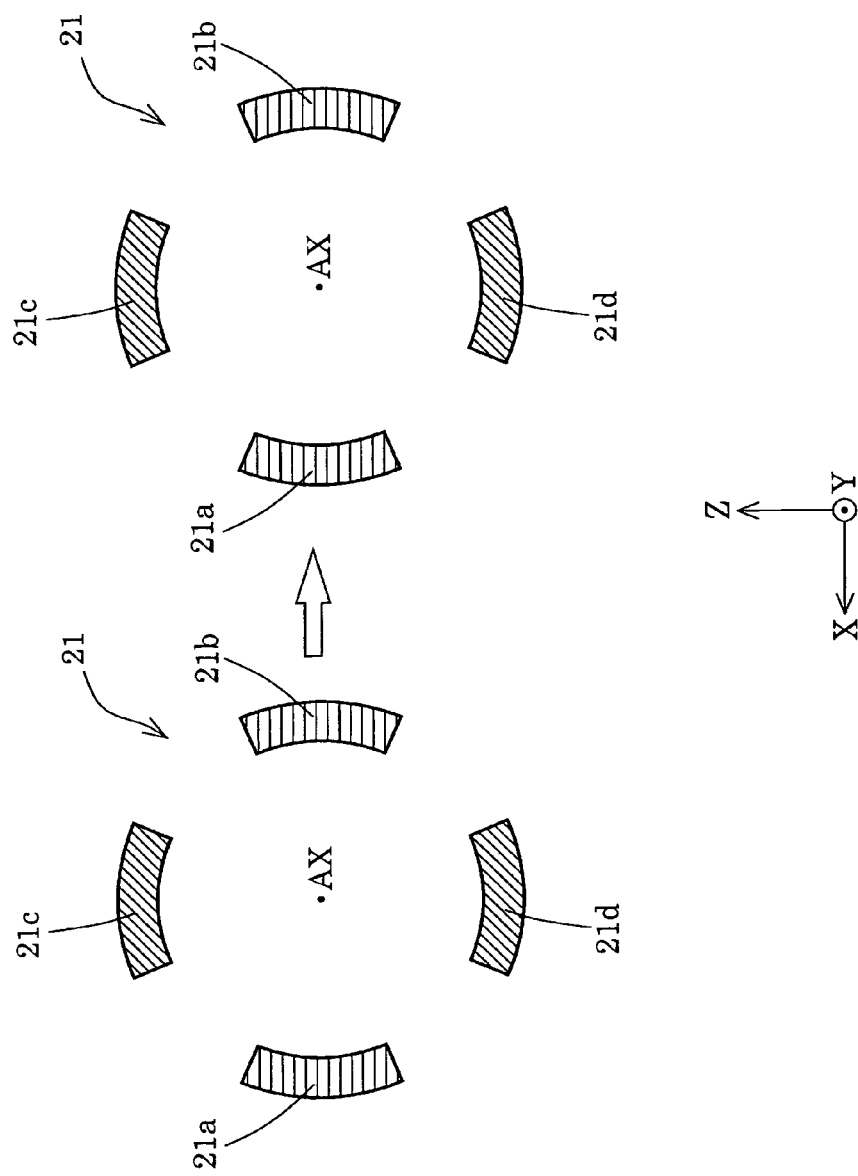
FIG. 90 is a first drawing to illustrate an action of the attenuation portion in the embodiment.

In this manner, the light forming the surface illuminants 21a and 21b in the pupil intensity distribution 21 related to the center point P1 is not subjected to the attenuation action of the V-shaped cut faces 109c, and therefore the light intensity of the surface illuminants 21a and 21b is maintained at the original magnitude. Since the light forming the surface illuminants 21c and 21d is not subjected to the attenuation action of the V-shaped cut faces 109c, either, the light intensity of the surface illuminants 21c and 21d is maintained at the original magnitude. As a result, the pupil intensity distribution 21 related to the center point P1, as shown in FIG. 90, is maintained as the original distribution, without being subjected to the attenuation action of the V-shaped cut faces 109c. Namely, this configuration maintains the property that the light intensity of the surface illuminants 21c, 21d spaced in the Z-direction is larger than the light intensity of the surface illuminants 21a, 21b spaced in the X-direction, as it is.

Figure 91:
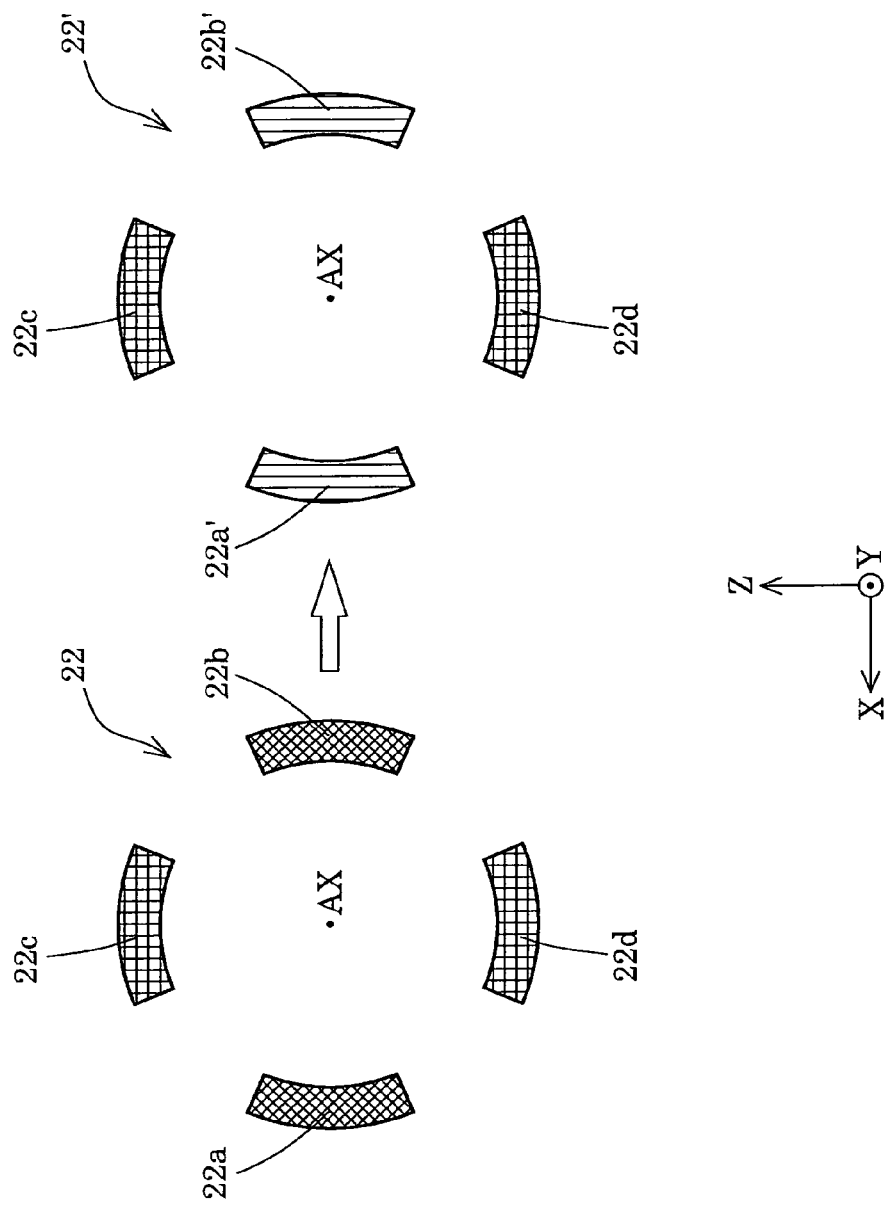
FIG. 91 is a second drawing to illustrate an action of the attenuation portion in the embodiment.

On the other hand, since part of the light from the surface illuminants 22a and 22b in the pupil intensity distribution 22 related to the peripheral points P2, P3 is subjected to the attenuation action of the V-shaped cut faces 109c, the overall light intensity of the surface illuminants 22a and 22b is lowered. Since the light from the surface illuminants 22c and 22d is not subjected to the attenuation action of the V-shaped cut faces 109c, the light intensity of the surface illuminants 22c and 22d is maintained at the original magnitude. As a result, the pupil intensity distribution 22 related to the peripheral points P2, P3 is adjusted to a pupil intensity distribution 22' of a property different from that of the original distribution 22, as shown in FIG. 91, by the attenuation action of the V-shaped cut faces 109c. Namely, the pupil intensity distribution 22' thus adjusted comes to have the property that the light intensity of the surface illuminants 22c, 22d spaced in the Z-direction is larger than the light intensity of the surface illuminants 22a', 22b' spaced in the X-direction.

In this manner, the pupil intensity distribution 22 related to the peripheral points P2, P3 is adjusted to the distribution 22' of the property nearly identical to that of the pupil intensity distribution 21 related to the center point P1, by the action of the V-shaped cut faces 109c. Similarly, the pupil intensity distributions related to the respective points aligned along the Y-direction between the center point P1 and the peripheral points P2, P3 and, therefore, the pupil intensity distributions related to the respective points in the still exposure region ER on the wafer W are also adjusted to distributions of properties substantially identical to that of the pupil intensity distribution 21 related to the center point P1. In other words, the pupil intensity distributions related to the respective points in the still exposure region ER on the wafer W are adjusted to distributions of substantially mutually identical properties by the action of the V-shaped cut faces 109c.

In still another expression, the V-shaped cut faces 109c as the attenuation portion provided in the cylindrical micro fly's eye lens 109 have the required attenuation characteristic necessary for adjusting the pupil intensity distributions related to the respective points, to distributions of substantially mutually identical properties, i.e., the required attenuation characteristic of increasing the attenuation rate with increasing distance along the Y-direction of the position of light reaching the still exposure region ER as the surface to be illuminated, from the center point P1. The required attenuation characteristic of the attenuation portion is realized by appropriately setting the number of V-shaped cut faces 109c, the sectional shape of the V-shaped cut faces 109c, and so on, as described above.

As described above, the cylindrical micro fly's eye lens 109 as an optical integrator of the wavefront division type according to the present embodiment has the V-shaped cut faces 109c provided between the refracting faces 109bb adjacent in the Z-direction. The V-shaped cut faces 109c as the attenuation portion have the required attenuation characteristic of increasing the attenuation rate with increasing distance along the Y-direction of the position of light reaching the still exposure region ER as the surface to be illuminated, from the center point P1. Therefore, by the action of the attenuation portion obtained by properly setting the forming positions, the number, the sectional shape, etc. of the V-shaped cut faces 109c, it becomes feasible to independently adjust each of the pupil intensity distributions related to the respective points on the surface to be illuminated and, therefore, to adjust the pupil intensity distributions related to the respective points, to distributions of substantially mutually identical properties.

In the illumination optical system (2-12) of the present embodiment, the pupil intensity distributions related to the respective points each are substantially uniformly adjusted through collaboration between the attenuation portion of the cylindrical micro fly's eye lens 109 to independently adjust each of the pupil intensity distributions related to the respective points in the still exposure region ER on the wafer W, and the density filter 6 with the required transmission characteristic varying depending upon the position of incidence of light, to equally adjust the pupil intensity distributions related to the respective points. Therefore, the exposure apparatus (2-WS) of the present embodiment is able to perform excellent exposure under an appropriate illumination condition according to the micro pattern of the mask M, using the illumination optical system (2-12) to substantially uniformly adjust each of the pupil intensity distributions for the respective points in the still exposure region ER on the wafer W, and therefore to faithfully transfer the micro pattern of the mask M in a desired line width across the entire exposure region on the wafer W.

It is considered in the present embodiment that the light quantity distribution on the wafer (surface to be illuminated) W is affected, for example, by the adjusting action of the attenuation portion of the cylindrical micro fly's eye lens 109. In this case, as described above, the exposure dose distribution can be modified by action of a light quantity distribution adjuster having a known configuration, if necessary, so as to change the illuminance distribution in the still exposure region ER or change the shape of the still exposure region (illumination region) ER.

Figure 92:
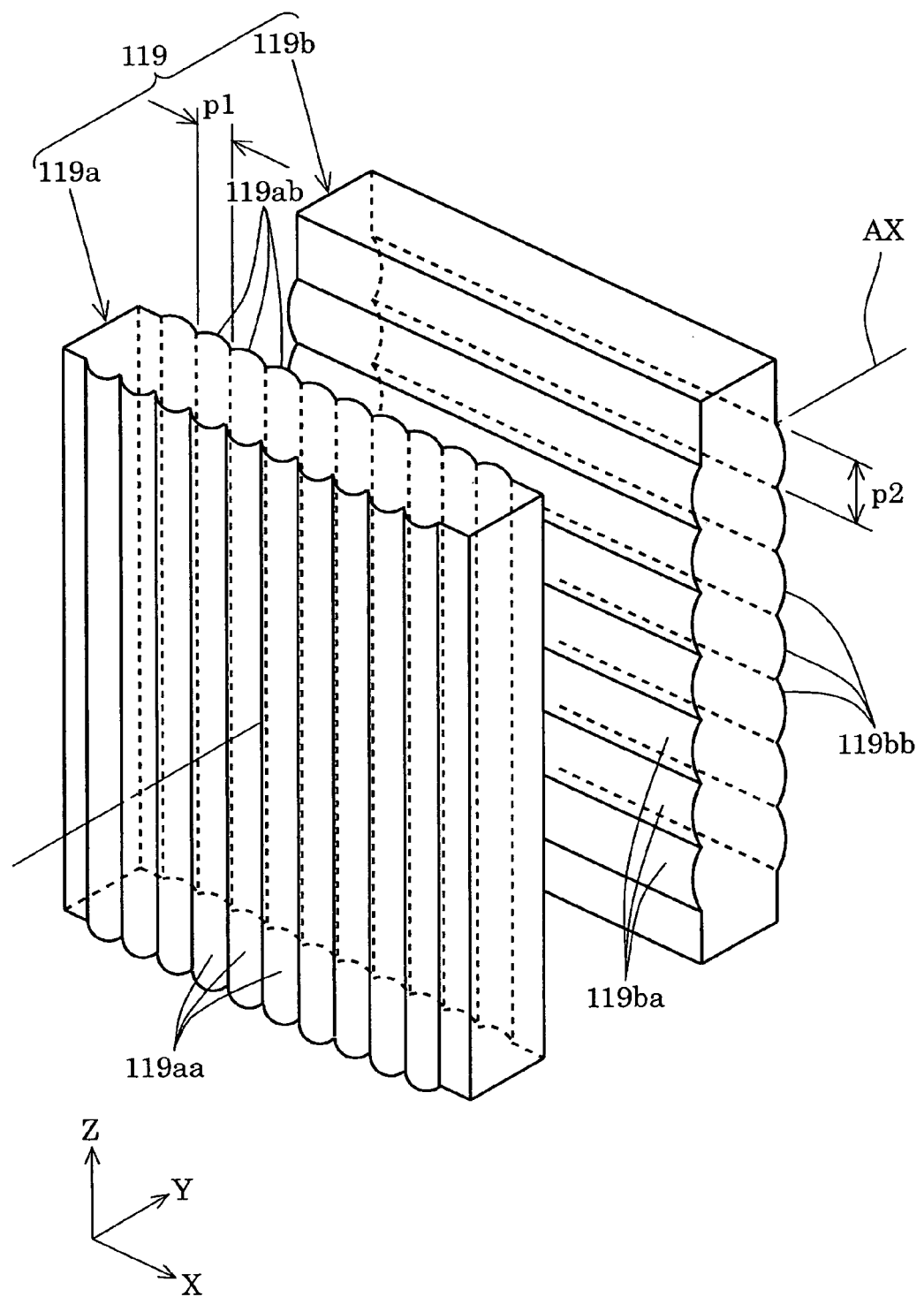
FIG. 92 is a perspective view schematically showing a configuration of a cylindrical micro fly's eye lens having another form different from FIG. 82.

In the above description, the cylindrical micro fly's eye lens 109 having the form as shown in FIG. 82 is used as an optical integrator of the wavefront division type. However, without having to be limited to this, it is also possible to use, for example, a cylindrical micro fly's eye lens 119 having another form as shown in FIG. 92. The cylindrical micro fly's eye lens 119, as shown in FIG. 92, is composed of a first fly's eye member 119a arranged on the light source side and a second fly's eye member 119b arranged on the mask side.

A plurality of refracting faces (cylindrical lens groups) 119aa and 119ab of a cylindrical surface shape arrayed in the X-direction are formed each at a pitch p1 in the surface on the light source side and in the surface of the mask side of the first fly's eye member 119a. A plurality of refracting faces (cylindrical lens groups) 119ba and 119bb of a cylindrical surface shape arrayed in the Z-direction are formed each at a pitch p2 (p2>p1) in the surface on the light source side and in the surface on the mask side of the second fly's eye member 119b.

When attention is focused on the refraction action in the X-direction (i.e., the refraction action in the XY plane) of the cylindrical micro fly's eye lens 119, a parallel beam incident along the optical axis AX is subjected to wavefront division at the pitch p1 along the X-direction by the group of refracting faces 119aa formed on the light source side of the first fly's eye member 119a and the divided beams are subjected to the converging action of the refracting faces. Thereafter, the beams are subjected to the converging action of the corresponding refracting faces in the group of refracting faces 119ab formed on the mask side of the first fly's eye member 119a, to be converged on the rear focal plane of the cylindrical micro fly's eye lens 119.

When attention is focused on the refraction action in the Z-direction (i.e., the refraction action in the YZ plane) of the cylindrical micro fly's eye lens 119, a parallel beam incident along the optical axis AX is subjected to wavefront division at the pitch p2 along the Z-direction by the group of refracting faces 119ba formed on the light source side of the second fly's eye member 119b and the divided beams are subjected to the converging action of the refracting faces. Thereafter, the beams are subjected to the converging action of the corresponding refracting faces in the group of refracting faces 119bb formed on the mask side of the second fly's eye member 119b, to be converged on the rear focal plane of the cylindrical micro fly's eye lens 119.

As described above, the cylindrical micro fly's eye lens 119 is composed of the first fly's eye member 119a and the second fly's eye member 119b in which the cylindrical lens groups are arranged on their both side faces, and has a large number of rectangular micro refracting faces (unit wavefront division faces) having the size of p1 in the X-direction and the size of p2 in the Z-direction. Namely, the cylindrical micro fly's eye lens 119 has the unit wavefront division faces of the rectangular shape having the long sides along the Z-direction and the short sides along the X-direction.

With the use of the cylindrical micro fly's eye lens 119, the same effect as in the above embodiment can also be exerted, for example, by providing the attenuation portion consisting of the V-shaped cut faces, as with the cylindrical micro fly's eye lens 9 shown in FIG. 82. Specifically, as shown in FIG. 93, V-shaped cut faces 119c linearly extending along the X-direction are provided between two refracting faces 119bb adjacent in the Z-direction, on the exit side of the rear (mask-side) second fly's eye member 119b out of the pair of fly's eye members 119a and 119b. Each V-shaped cut face 119c is composed of a pair of cut faces 119ca.

More generally, the present invention is not limited only to the cylindrical micro fly's eye lenses, but can also be applied to any optical integrator of the wavefront division type having a plurality of first refracting faces with a predetermined refracting power in a first direction in a plane perpendicular to the optical axis of the illumination optical system, and a plurality of second refracting faces with a predetermined refracting power in the first direction provided behind the first refracting faces so as to correspond to the first refracting faces. In this case, an attenuation portion having an attenuation characteristic of increasing the attenuation rate with increasing distance of the position of light reaching the surface to be illuminated, along the first direction from the center thereof is provided between at least two adjacent second refracting faces.

In the above description, the cylindrical micro fly's eye lens 109 or 119 as an optical integrator is provided with the attenuation portion consisting of the V-shaped cut faces 109c, 119c. However, without having to be limited to this, the attenuation portion can also be constructed, for example, using reflecting films, optical attenuation films, optical scattering films, or the like provided so as to correspond to the V-shaped cut faces 109c, 119c.

In the above description, the action and effect of the present invention were described using the example of the modified illumination to form the quadrupolar pupil intensity distribution on the illumination pupil, i.e., the quadrupolar illumination. However, it is obvious that, without having to be limited to the quadrupolar illumination, the present invention is also similarly applicable with the same action and effect, for example, to the annular illumination to form the pupil intensity distribution of the annular shape and to multi-polar illumination to form the pupil intensity distribution of a multi-polar shape other than the quadrupolar shape.

Figure 94:
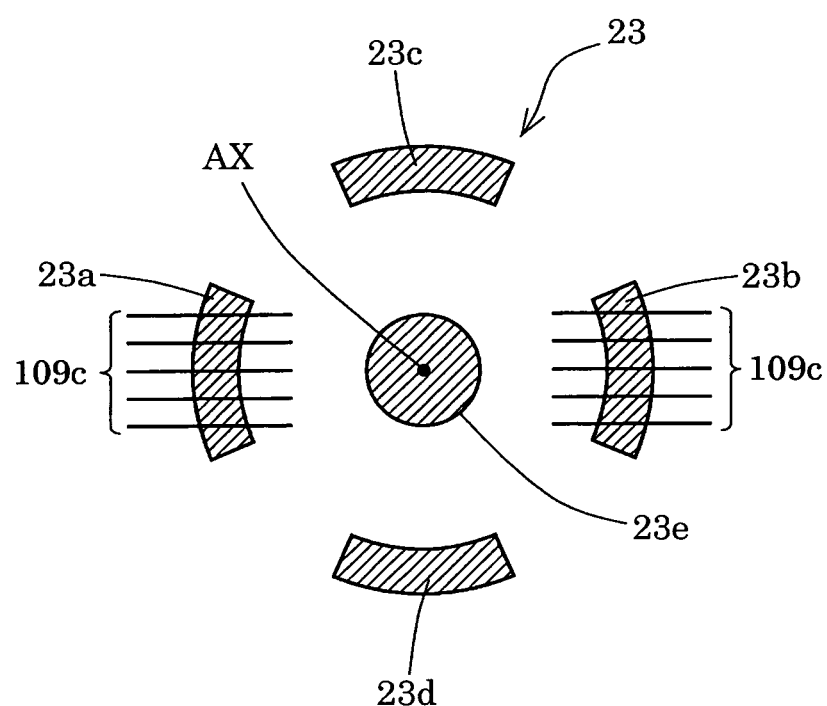
FIG. 94 is a drawing showing a state in which V-shaped cut faces are formed as an attenuation portion in only regions corresponding to a pair of surface illuminants spaced in the X-direction in a pupil intensity distribution of a pentapolar shape.

Furthermore, as shown in FIG. 94, it is also possible to adopt a modified illumination in such a manner that a pentapolar pupil intensity distribution is formed on the illumination pupil and that the attenuation action is imparted to only a pair of surface illuminants 23a and 23b spaced in the X-direction in the pentapolar pupil intensity distribution 23 while the attenuation action is not imparted to a surface illuminant 23e located on the optical axis AX on both sides of the pair of surface illuminants 23a and 23b. In this case, the V-shaped cut faces 109c may be provided only in regions corresponding to the pair of surface illuminants 23a and 23b, instead of being provided in the entire range along the X-direction of the region between two refracting faces 109bb on the exit side of the second fly's eye member 109b of the cylindrical micro fly's eye lens 109.

Figure 95:
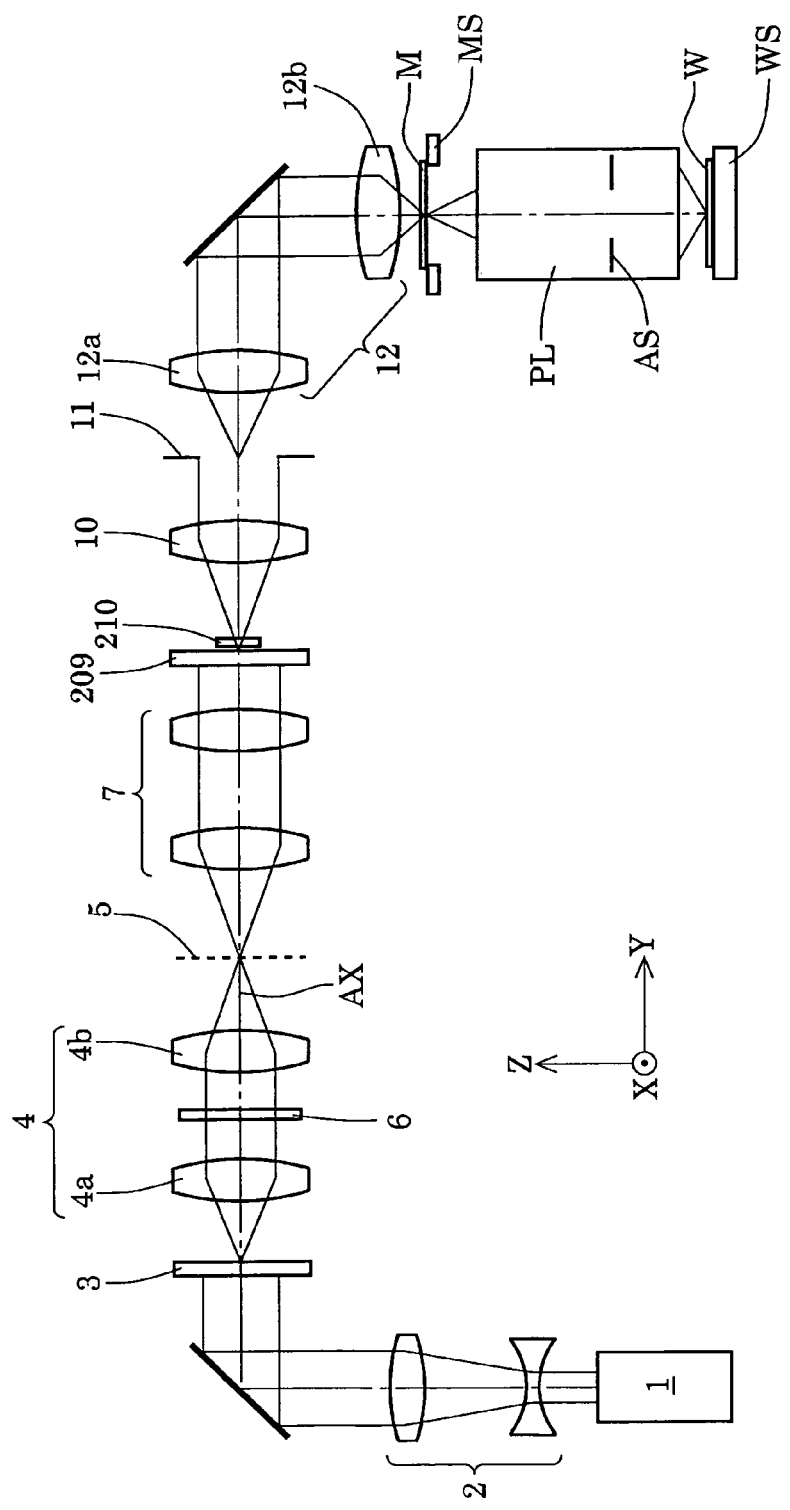
FIG. 95 is a drawing schematically showing a configuration of an exposure apparatus according to an embodiment of the present invention.

FIG. 95 schematically shows a configuration of an exposure apparatus according to a modification example of the third embodiment. The exposure apparatus shown in FIG. 95 is different from the exposure apparatus of the third embodiment in that it is provided with a cylindrical micro fly's eye lens 209 and an optical attenuation unit 210, instead of the cylindrical micro fly's eye lens 109.

Figure 96:
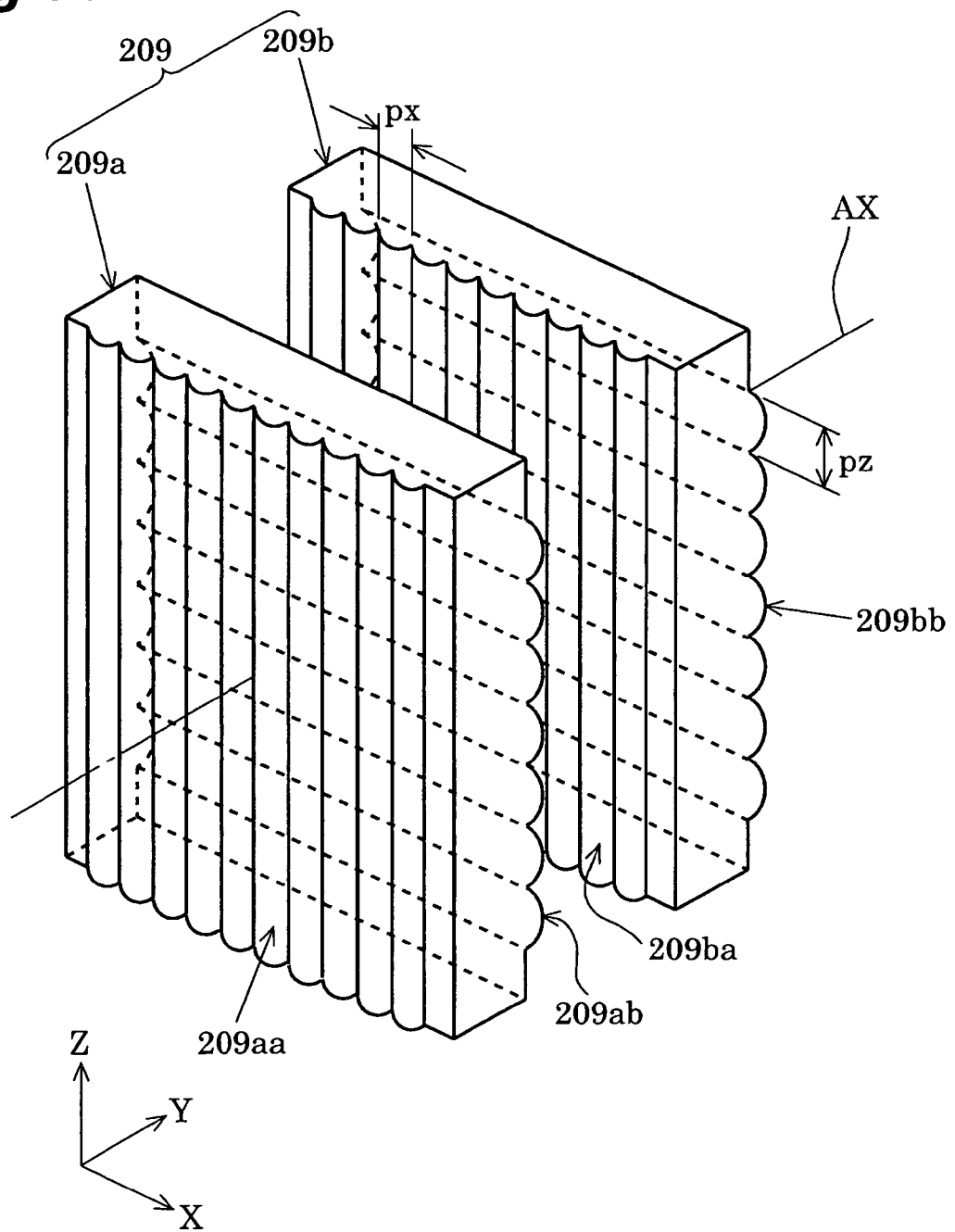
FIG. 96 is a perspective view schematically showing a configuration of a cylindrical micro fly's eye lens shown in FIG. 95.

As shown in FIG. 95, the light having passed through the afocal lens 4 travels through the zoom lens 7 and is incident to the cylindrical micro fly's eye lens 209 as an optical integrator. The cylindrical micro fly's eye lens 209, as shown in FIG. 96, is composed of a first fly's eye member (first optical member) 209a arranged on the light source side and a second fly's eye member (second optical member) 209b arranged on the mask side. A plurality of refracting faces (cylindrical lens groups) 209aa and 209ba of a cylindrical surface shape arrayed in the X-direction are formed each at a pitch px in the surface on the light source side (entrance side) of the first fly's eye member 209a and in the surface on the light source side of the second fly's eye member 209b. A plurality of refracting faces (cylindrical lens groups) 209ab and 209bb of a cylindrical surface shape arrayed in the Z-direction are formed each at a pitch pz (pz>px) in the surface on the mask side (exit side) of the first fly's eye member 209a and in the surface on the mask side of the second fly's eye member 209b. The cylindrical micro fly's eye lens 209 shown in FIG. 96 is disclosed, for example, in U.S. Pat. No. 6,913,373. The teachings of this U.S. Pat. No. 6,913,373 is incorporated herein by reference.

When attention is focused on the refraction action in the X-direction of the cylindrical micro fly's eye lens 209 (i.e., the refraction action in the XY plane), a parallel beam incident along the optical axis AX is subjected to wavefront division at the pitch px along the X-direction by the group of refracting faces 209aa formed on the light source side of the first fly's eye member 209a and the divided beams are subjected to the converging action of the refracting faces. Thereafter, the beams are subjected to the converging action by the corresponding refracting faces in the group of refracting faces 209ba formed on the light source side of the second fly's eye member 209b, to be converged on the rear focal plane of the cylindrical micro fly's eye lens 209. When attention is focused on the refraction action in the Z-direction of the cylindrical micro fly's eye lens 209 (i.e., the refraction action in the YZ plane), a parallel beam incident along the optical axis AX is subjected to wavefront division at the pitch pz along the Z-direction by the group of refracting faces 209ab formed on the mask side of the first fly's eye member 209a, and the divided beams are subjected to the converging action of the refracting faces. Thereafter, the beams are subjected to the converging action by the corresponding refracting faces in the group of refracting faces 209bb formed on the mask side of the second fly's eye member 209b, to be converged on the rear focal plane of the cylindrical micro fly's eye lens 209.

As described above, the cylindrical micro fly's eye lens 209 is composed of the first fly's eye member 209a and the second fly's eye member 209b in which the cylindrical lens groups are arranged on their both side faces, and fulfills an optical function similar to that of a micro fly's eye lens in which a large number of rectangular micro refracting faces (unit wavefront division faces) having the size of px in the X-direction and the size of pz in the Z-direction are integrally formed vertically and horizontally and densely. In the case of the cylindrical micro fly's eye lens 209, it is feasible to keep small change in distortion due to variation in surface shapes of the micro refracting faces and, for example, to keep down influence on the illuminance distribution from manufacturing errors of the large number of micro refracting faces integrally formed by etching.

The position of the predetermined plane 5 is arranged at or near the front focal point of the zoom lens 7 and the entrance surface of the cylindrical micro fly's eye lens 209 (i.e., the entrance surface of the first fly's eye member 209a) is located at or near the rear focal point of the zoom lens 7. In other words, the zoom lens 7 arranges the predetermined plane 5 and the entrance surface of the cylindrical micro fly's eye lens 209 substantially in the Fourier transform relation and, therefore, keeps the pupil plane of the afocal lens 4 substantially optically conjugate with the entrance surface of the cylindrical micro fly's eye lens 209. Therefore, for example, an annular illumination field centered on the optical axis AX is formed on the entrance surface of the cylindrical micro fly's eye lens 209 as on the pupil plane of the afocal lens 4. The overall shape of this annular illumination field similarly varies depending upon the focal length of the zoom lens 7. Each unit wavefront division face of the cylindrical micro fly's eye lens 209, as described above, has a rectangular shape with the long sides along the Z-direction and the short sides along the X-direction and rectangular shape similar to a shape of an illumination region to be formed on the mask M (and, therefore, similar to a shape of an exposure region to be formed on the wafer W).

A beam incident to the cylindrical micro fly's eye lens 209 is two-dimensionally divided to form a secondary light source with a light intensity distribution approximately identical to the illumination field formed on the entrance surface of the cylindrical micro fly's eye lens 209, i.e., a secondary light source (pupil intensity distribution) consisting of a substantial surface illuminant of an annular shape centered on the optical axis AX, on the rear focal plane of the fly's eye lens 209 or at a position near it (or at the position of the illumination pupil). The attenuation unit 210 is arranged immediately behind the cylindrical micro fly's eye lens 209. The configuration and action of the attenuation unit 210 will be described later. An illumination aperture stop (not shown) having an annular aperture region (light transmitting portion) corresponding to the annular secondary light source is arranged, if necessary, on or near the rear focal plane of the cylindrical micro fly's eye lens 209. The illumination aperture stop is configured so as to be freely inserted into or retracted from the illumination optical path and so as to be switchable with a plurality of aperture stops having respective apertures of different sizes and shapes. A switching method of the aperture stops can be, for example, a well-known turret method, slide method, or the like. The illumination aperture stop is arranged at a position substantially optically conjugate with the entrance pupil plane of the below-described projection optical system PL and defines a range for the secondary light source to contribute to illumination.

Figure 97:
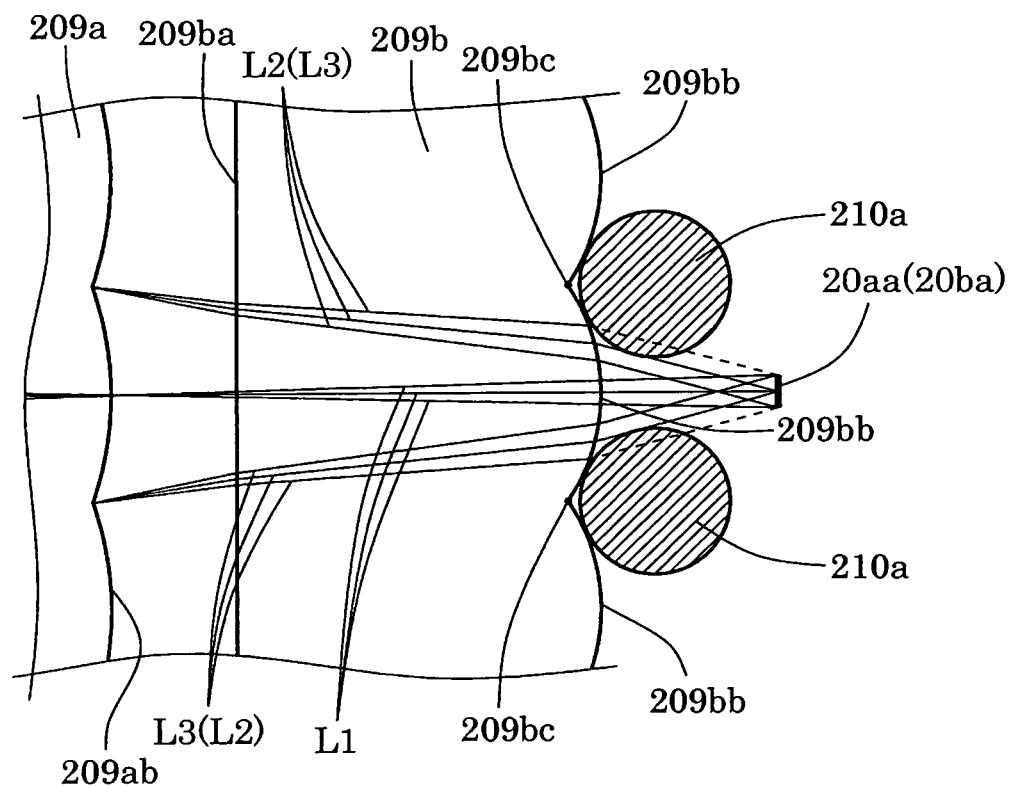
FIG. 97 is a drawing to illustrate a major configuration and action of an attenuation unit in the embodiment.
Figure 98:
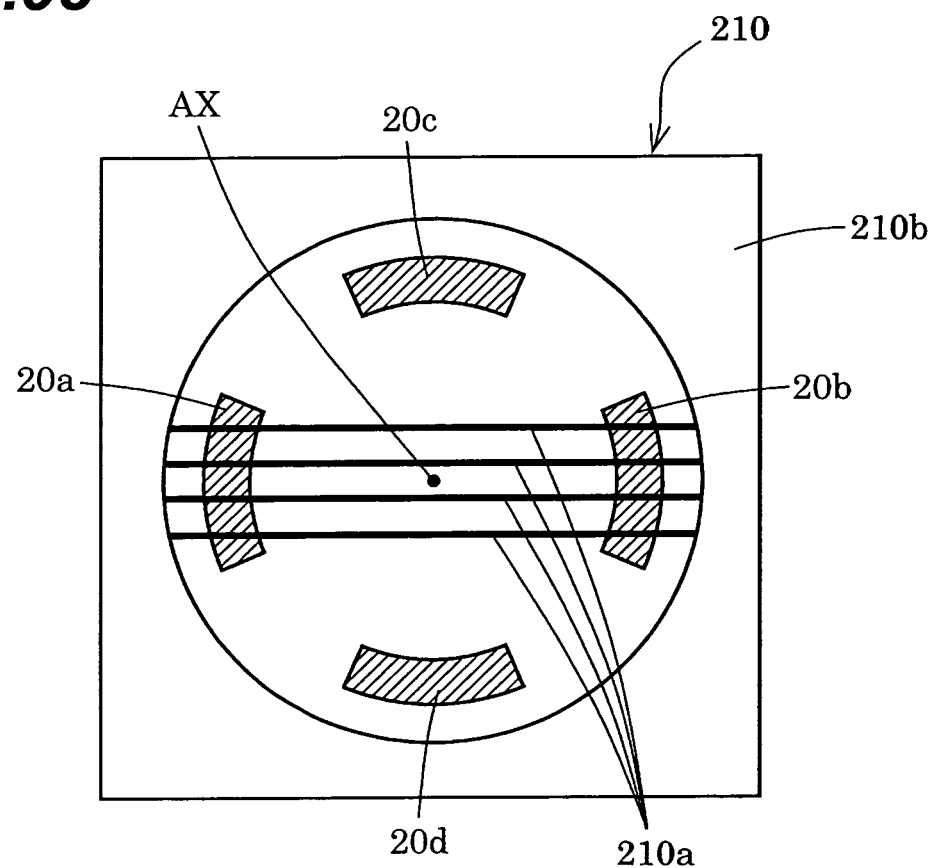
FIG. 98 is a drawing schematically showing an overall configuration of the attenuation unit in the embodiment.

In the present embodiment, in order to make the property of the pupil intensity distribution related to the center point P1, approximately coincident with the property of the pupil intensity distribution related to the peripheral points P2, P3, the attenuation unit 210 is provided, specifically, as an adjusting means to effect such adjustment that the light intensity of the surface illuminants 22a, 22b is smaller than the light intensity of the surface illuminants 22c, 22d in the pupil intensity distribution 22 related to the peripheral points P2, P3. FIG. 97 is a drawing to illustrate the major configuration and action of the attenuation unit according to the present embodiment. FIG. 98 is a drawing schematically showing the overall configuration of the attenuation unit according to the present embodiment. Referring to FIG. 97, light shield members 210a linearly extending along the X-direction in parallel with boundary lines 209bc, are arranged immediately behind the boundary lines 209bc between two refracting faces 209bb adjacent in the Z-direction on the exit side of the rear (maskside) second fly's eye member 209b out of the pair of fly's eye members 209a and 209b constituting the cylindrical micro fly's eye lens 209. The light shield members 210a have, for example, a cross section of a circular shape and are made of an appropriate metal. As schematically shown in FIG. 98, a required number of light shield members 210*a* (four light shield members in the example of FIG. 98) are arranged at intervals in the Z-direction so as to act on the pair of surface illuminants 20*a* and 20*b* spaced in the X-direction in the quadrupolar pupil intensity distribution 20.

Specifically, the attenuation unit 210 of the present embodiment, as shown in FIG. 98, is composed of a plurality of light shield members 210*a* linearly extending along the X-direction and arranged at intervals in the Z-direction, and a holding member 210*b* supporting the both ends of each light shield member 210*a* in order to hold these light shield members 210*a* at predetermined positions. If each light shield member 210*a* does not have required bending rigidity, each light shield member 210*a* can be maintained in the linear shape by supporting its both ends in a state in which a required tension is exerted on each light shield member 210*a*. FIG. 97 shows a state in which a pair of light shield members 210*a* are arranged so as to correspond to two boundary lines 209*bc* adjacent in the Z-direction, for easier understanding of the action and effect of the light shield members 210*a* (and, therefore, the action and effect of the attenuation unit 210). With reference to FIG. 97, of the quadrupolar pupil intensity distribution 20, the light forming the surface illuminants 20*a* and 20*b* spaced in the X-direction is subjected to the action of the light shield members 210*a* immediately after passage through the cylindrical micro fly's eye lens 209, but the light forming the surface illuminants 20*c* and 20*d* spaced in the Z-direction is not subjected to the action of the light shield members 210*a*. The below will describe the action of the light shield members 210*a* as the attenuation portion with reference to FIG. 97, with focus on ray groups to form one small illuminant 20*aa* (or 20*ba*) out of a large number of small illuminants forming the surface illuminant 20*a* (or 20*b*) through one refracting face 209*bb*.

A ray group L1 reaching the center point P1 in the still exposure region ER on the wafer W passes through a center region along the Z-direction of the refracting face 209*bb*. Therefore, the ray group L1 is not subjected to the action of the light shield members 210*a* but is subjected to the refraction action of the refracting face 209*bb* to form a small illuminant with the original size (light quantity) on the illumination pupil. Namely, the ray group L1 forms one small illuminant with the original light quantity out of the large number of small illuminants forming the surface illuminant 21*a* (or 21*b*) of the pupil intensity distribution 21 related to the center point P1. On the other hand, a ray group L2 reaching the peripheral point P2 in the still exposure region ER passes through a region apart from the center region along the Z-direction of the refracting face 209*bb*. As a result, some rays of the ray group L2 having passed through the refracting face 209*bb* impinge upon the light shield member 210*a*, while the other rays reach the forming plane of the small illuminant (the plane of the illumination pupil) without impinging upon the light shield member 210*a*. Light impinging upon and reflected by the light shield member 210*a* is guided, for example, to the outside of the illumination optical path, without contributing to forming of the pupil intensity distribution. In this manner, of the ray group L2, some rays are subjected to the refraction action of the refracting face 209*bb* and the attenuation action of the light shield member 210*a*, while the other rays are subjected to only the refraction action of the refracting face 209*bb*, thereby forming the small illuminant smaller than the original size, on the illumination pupil. Namely, the ray group L2 forms one small illuminant out of the large number of small illuminants forming the surface illuminant 22*a* (or 22*b*) in the pupil intensity distribution 22 related to the peripheral point P2, as a small illuminant with a light quantity smaller than the original one.

By the action of the light shield members 210*a* (and, therefore, by the action of the attenuation portion of the attenuation unit 210), the pupil intensity distribution 22 related to the peripheral points P2, P3 is adjusted to a distribution 22' of a property substantially identical to that of the pupil intensity distribution 21 related to the center point P1. Similarly, the pupil intensity distributions related to the respective points aligned along the Y-direction between the center point P1 and the peripheral points P2, P3 and, therefore, the pupil intensity distributions related to the respective points in the still exposure region ER on the wafer W are also adjusted to distributions of properties substantially identical to that of the pupil intensity distribution 21 related to the center point P1. In other words, the pupil intensity distributions related to the respective points in the still exposure region ER on the wafer W are adjusted to distributions of substantially mutually identical properties by the action of the attenuation unit 210. In still another expression, the light shield members 210*a* as the attenuation portion arranged immediately behind the cylindrical micro fly's eye lens 209 has the required attenuation characteristic necessary for adjusting the pupil intensity distributions related to the respective points, to distributions of substantially mutually identical properties, i.e., the required attenuation characteristic of increasing the attenuation rate with increasing distance of the position of light reaching the still exposure region ER as the surface to be illuminated, along the Y-direction from the center point P1. The required attenuation characteristic of the attenuation portion is realized by properly setting the number of light shield members 210*a*, the sectional shape of the light shield members 210*a*, and so on, as described above.

As described above, the attenuation unit 210 of the present embodiment has the light shield members 210*a* arranged immediately behind the boundary lines 209*bc* between the refracting faces 209*bb* adjacent in the Z-direction on the exit side of the cylindrical micro fly's eye lens 209 as an optical integrator of the wavefront division type and linearly extending along the X-direction in parallel with the boundary lines 209*bc*. The light shield members 210*a* as the attenuation portion have the required attenuation characteristic of increasing the attenuation rate with increasing distance of the position of the light reaching the still exposure region ER being the surface to be illuminated, along the Y-direction from the center point P1. Therefore, by the action of the attenuation portion of the attenuation unit 210 obtained by properly setting the arrangement positions, the number, the sectional shape, etc. of the light shield members 210*a*, it becomes feasible to independently adjust each of the pupil intensity distributions related to the respective points on the surface to be illuminated and, therefore, to adjust the pupil intensity distributions related to the respective points, to distributions of substantially mutually identical properties. The illumination optical system (2-13) of the present embodiment is able to substantially uniformly adjust each of the pupil intensity distributions related to the respective points, through collaboration between the attenuation unit 210 as the adjusting means to independently adjust each of the pupil intensity distributions related to the respective points in the still exposure region ER on the wafer W, and the density filter 6 with the required transmittance characteristic varying depending upon the incidence position of light, to equally adjust the pupil intensity distributions related to the respective points. Therefore, the exposure apparatus (2-WS) of the present embodiment is able to perform excellent exposure under an appropriate illumination condition according to the micro pattern on the mask M, using the illumination optical system (2-13) to substantially equally adjust each of the pupil intensity distributions for the respective points in the still exposure region ER on the wafer W, and, therefore, to faithfully transfer the micro pattern on the mask M in a desired line width across the entire exposure region on the wafer W.

It is considered in the present embodiment that the light quantity distribution on the wafer (surface to be illuminated) W is affected, for example, by the adjusting action of the attenuation portion of the attenuation unit 210. In this case, as described above, the exposure dose distribution can be modified by the action of the light quantity distribution adjuster having the well-known configuration, if necessary, so as to change the illuminance distribution in the still exposure region ER or change the shape of the still exposure region (illumination region) ER.

Figure 99:
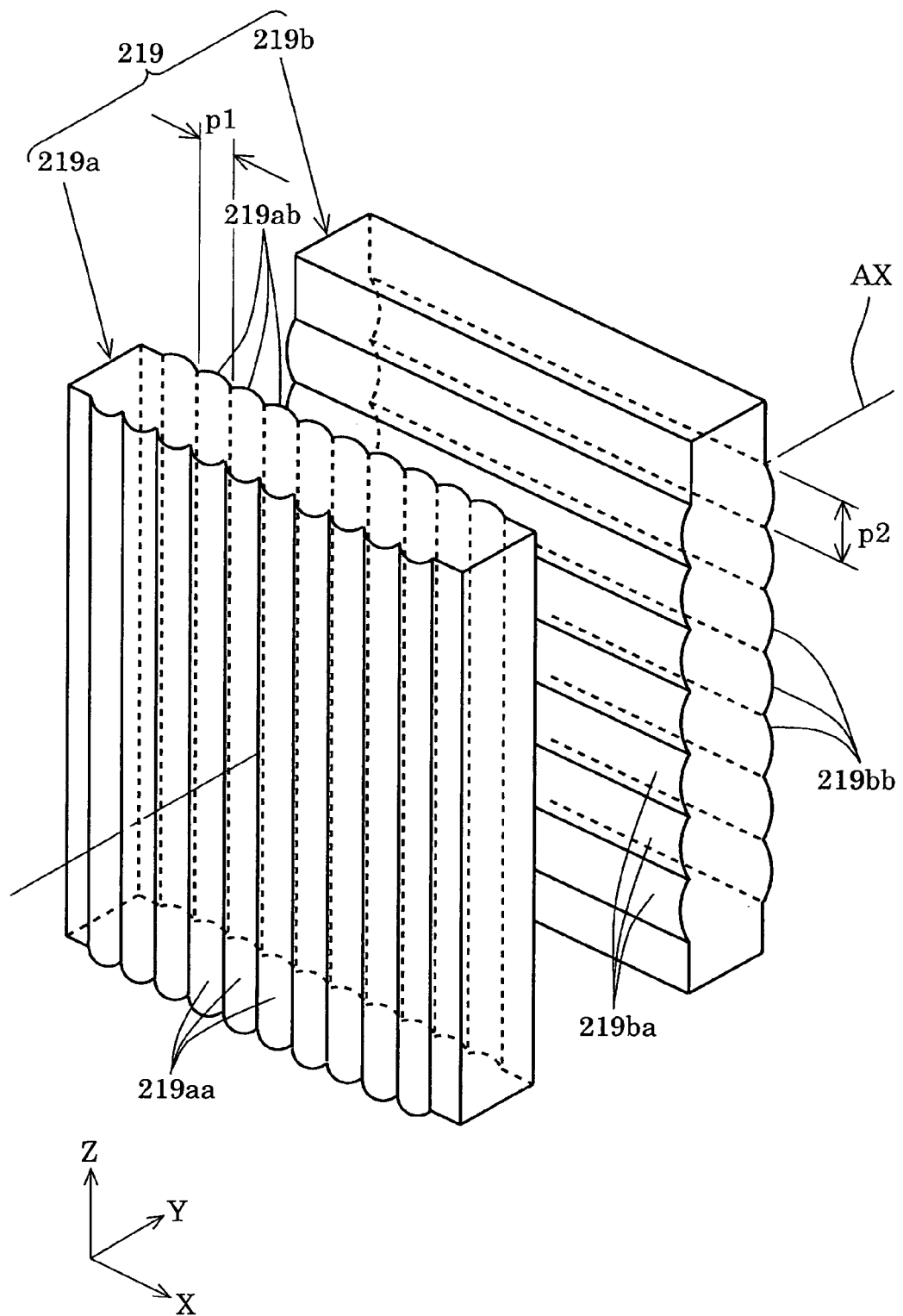
FIG. 99 is a perspective view schematically showing a configuration of a cylindrical micro fly's eye lens having another form different from FIG. 96.

In the above description, the cylindrical micro fly's eye lens 209 having the form as shown in FIG. 96 is used as an optical integrator of the wavefront division type. However, without having to be limited to this, it is also possible to use, for example, a cylindrical micro fly's eye lens 219 having another form as shown in FIG. 99. The cylindrical micro fly's eye lens 219, as shown in FIG. 99, is composed of a first fly's eye member 219a arranged on the light source side and a second fly's eye member 219b arranged on the mask side. A plurality of refracting faces (cylindrical lens groups) 219aa and 219ab of a cylindrical surface shape arrayed in the X-direction are formed each at a pitch p1 in the surface on the light source side and in the surface of the mask side of the first fly's eye member 219a. A plurality of refracting faces (cylindrical lens groups) 219ba and 219bb of a cylindrical surface shape arrayed in the Z-direction are formed each at a pitch p2 (p2>p1) in the surface on the light source side and in the surface on the mask side of the second fly's eye member 219b. The cylindrical micro fly's eye lens 219 shown in FIG. 99 is disclosed, for example, in U.S. Pat. Published Application No. 2008/0074631. The teachings of this U.S. Pat. Published Application No. 2008/0074631 are incorporated herein by reference.

When attention is focused on the refraction action in the X-direction (i.e., the refraction action in the XY plane) of the cylindrical micro fly's eye lens 219, a parallel beam incident along the optical axis AX is subjected to wavefront division at the pitch p1 along the X-direction by the group of refracting faces 219aa formed on the light source side of the first fly's eye member 219a and the divided beams are subjected to the converging action of the refracting faces. Thereafter, the beams are subjected to the converging action of the corresponding refracting faces in the group of refracting faces 219ab formed on the mask side of the first fly's eye member 219a, to be converged on the rear focal plane of the cylindrical micro fly's eye lens 219. When attention is focused on the refraction action in the Z-direction (i.e., the refraction action in the YZ plane) of the cylindrical micro fly's eye lens 219, a parallel beam incident along the optical axis AX is subjected to wavefront division at the pitch p2 along the Z-direction by the group of refracting faces 219ba formed on the light source side of the second fly's eye member 219b and the divided beams are subjected to the converging action of the refracting faces. Thereafter, the beams are subjected to the converging action of the corresponding refracting faces in the group of refracting faces 219bb formed on the mask side of the second fly's eye member 219b, to be converged on the rear focal plane of the cylindrical micro fly's eye lens 219.

Figure 100:
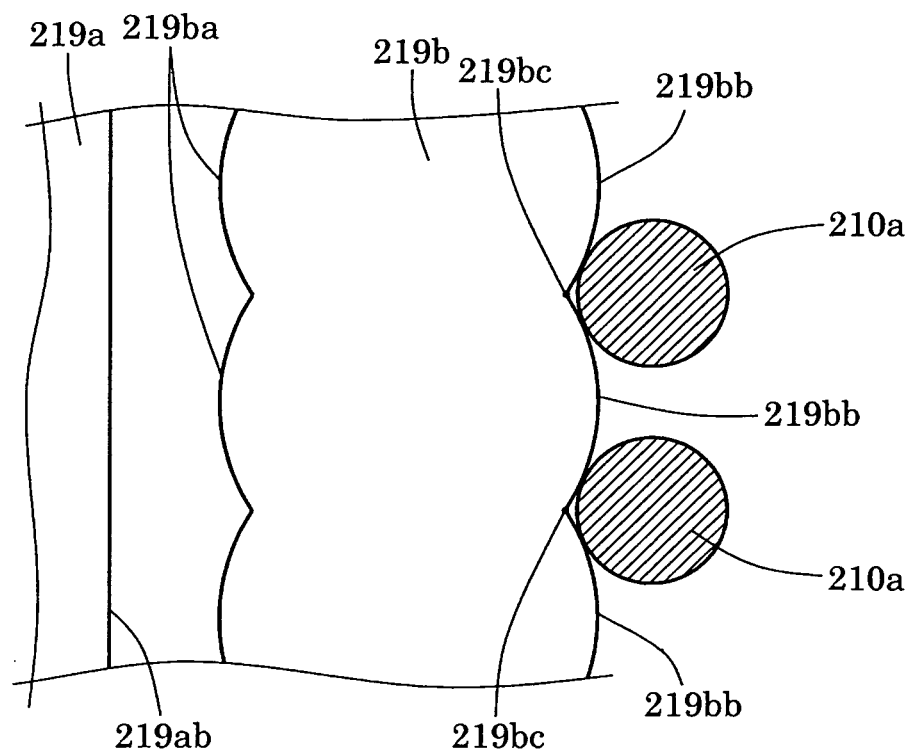
FIG. 100 is a drawing showing a state in which light shield members of an attenuation unit are arranged relative to the cylindrical micro fly's eye lens of FIG. 99.

As described above, the cylindrical micro fly's eye lens 219 is composed of the first fly's eye member 219a and the second fly's eye member 219b in which the cylindrical lens groups are arranged on their both side faces, and has the large number of rectangular micro refracting faces (unit wavefront division faces) having the size of p1 in the X-direction and the size of p2 in the Z-direction. Namely, the cylindrical micro fly's eye lens 219 has the unit wavefront division faces of the rectangular shape having the long sides along the Z-direction and the short sides along the X-direction. With the use of the cylindrical micro fly's eye lens 219, the same effect as in the above embodiment can also be exerted, for example, by additionally providing the attenuation unit 210 with the linear light shield members 210a having the cross section of circular shape, as with the cylindrical micro fly's eye lens 9 shown in FIG. 96. Specifically, as shown in FIG. 100, light shield members 210a linearly extending along the X-direction in parallel with boundary lines 219bc, are arranged immediately behind the boundary lines 219bc between two refracting faces 219bb adjacent in the Z-direction, on the exit side of the rear (mask-side) second fly's eye member 219b out of the pair of fly's eye members 219a and 219b. For example, as schematically shown in FIG. 98, a required number of light shield members 210a as the attenuation portion are arranged at intervals in the Z-direction so as to act on the pair of surface illuminants 20a and 20b spaced in the X-direction.

More generally, the present invention is not limited only to the cylindrical micro fly's eye lenses, but can also be applied to the attenuation unit used in combination with an optical integrator of the wavefront division type provided with a plurality of first refracting faces with a predetermined refracting power in a first direction in a plane perpendicular to the optical axis of the illumination optical system and a plurality of second refracting faces with a predetermined refracting power in the first direction provided behind the first refracting faces so as to correspond to the first refracting faces. In this case, the attenuation portion with the attenuation characteristic of increasing the attenuation rate with increasing distance of the position of light reaching the surface to be illuminated, along the first direction from the center thereof is arranged immediately behind a boundary line between at least two adjacent second refracting faces.

Figure 101:
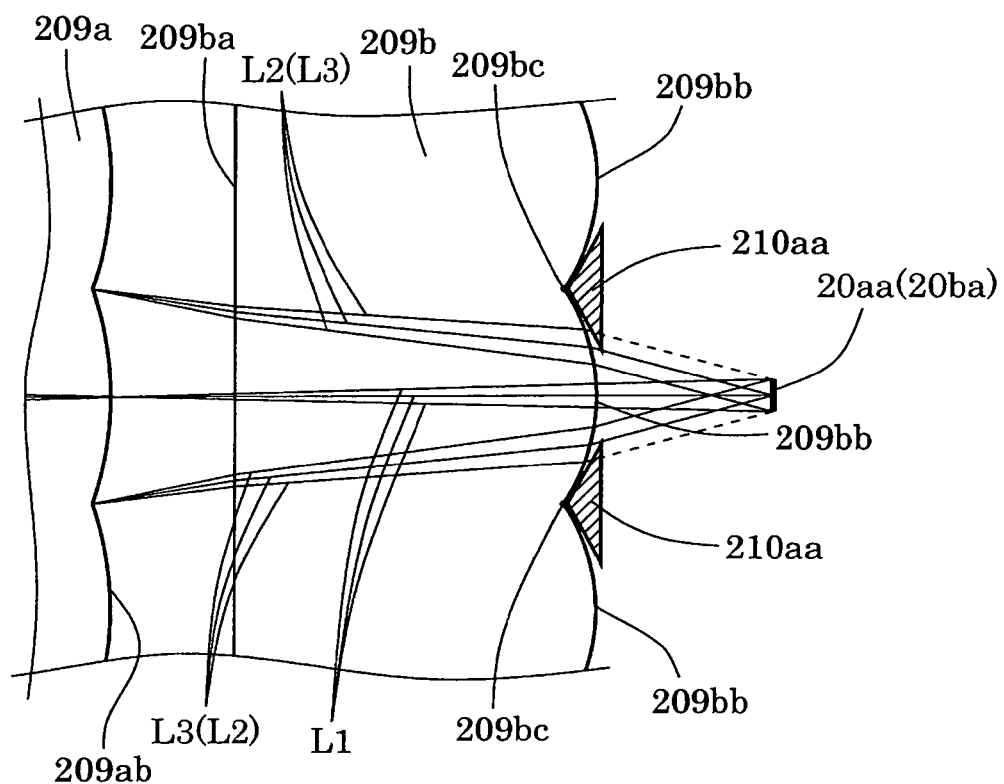
FIG. 101 is a drawing showing a configuration example using light shield members of a triangular cross section.
Figure 104:
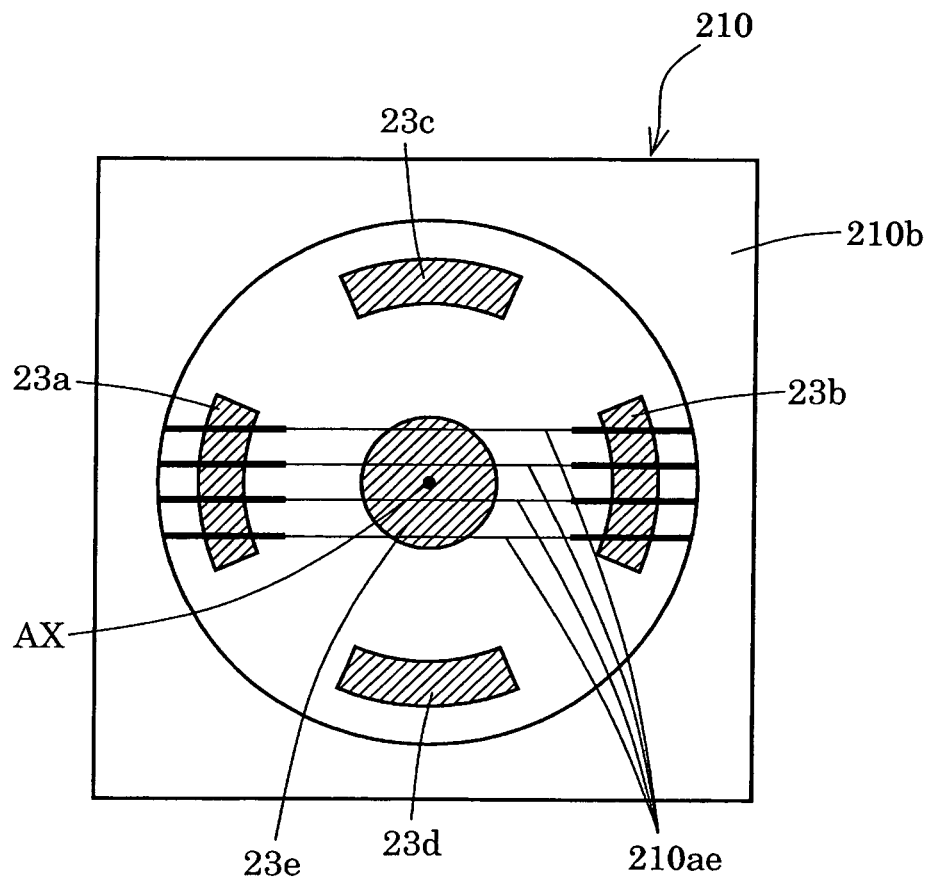

In the foregoing embodiment, the attenuation portion of the attenuation unit 210 is composed of the light shield members 210a having the cross section of the circular shape and extending from the position corresponding to the surface illuminant 20a to the position corresponding to the surface illuminant 20b. However, without having to be limited to this, various forms can be contemplated as to specific configurations of the attenuation portion and, therefore, as to specific configurations of the light shield members. For example, it is also possible to use light shield members 210aa with a cross section of a triangular shape as shown in FIG. 101, or to use light shield members 210ab with a cross section of a rectangular shape as shown in FIG. 102. Namely, various forms can be contemplated not only as to the arrangement positions and the number of the linear light shield members, but also as to the sectional shape thereof. Furthermore, as shown in FIG. 103, the attenuation unit 210 may be composed of a plurality of light shield members 210ac arranged corresponding to one surface illuminant 23a out of the pair of surface illuminants 23a, 23b spaced in the X-direction, a plurality of light shield members 210ad arranged corresponding to the other surface illuminant 23b, and a holding member 210b to support only one end of each light shield member 210ac, 210ad in order to hold these light shield members 210ac, 210ad at predetermined positions. In addition, as shown in FIG. 104, it is also possible to use light shield members 210ae with a relatively large cross section in their ends corresponding to the surface illuminants 23a and 23b and a relatively small cross section in their central region (in general, light shield members whose cross section varies along the longitudinal direction). The configuration examples of FIGS. 103 and 104 provide the following advantage: the attenuation action is exerted, for example, on only a pair of surface illuminants 23a and 23b spaced in the X-direction in a pentapolar pupil intensity distribution; the attenuation action is not exerted on a surface illuminant 23e located on the optical axis AX between the pair of surface illuminants 23a and 23b, or an unwanted attenuation action is reduced on the surface illuminant 23e.

Figure 105:
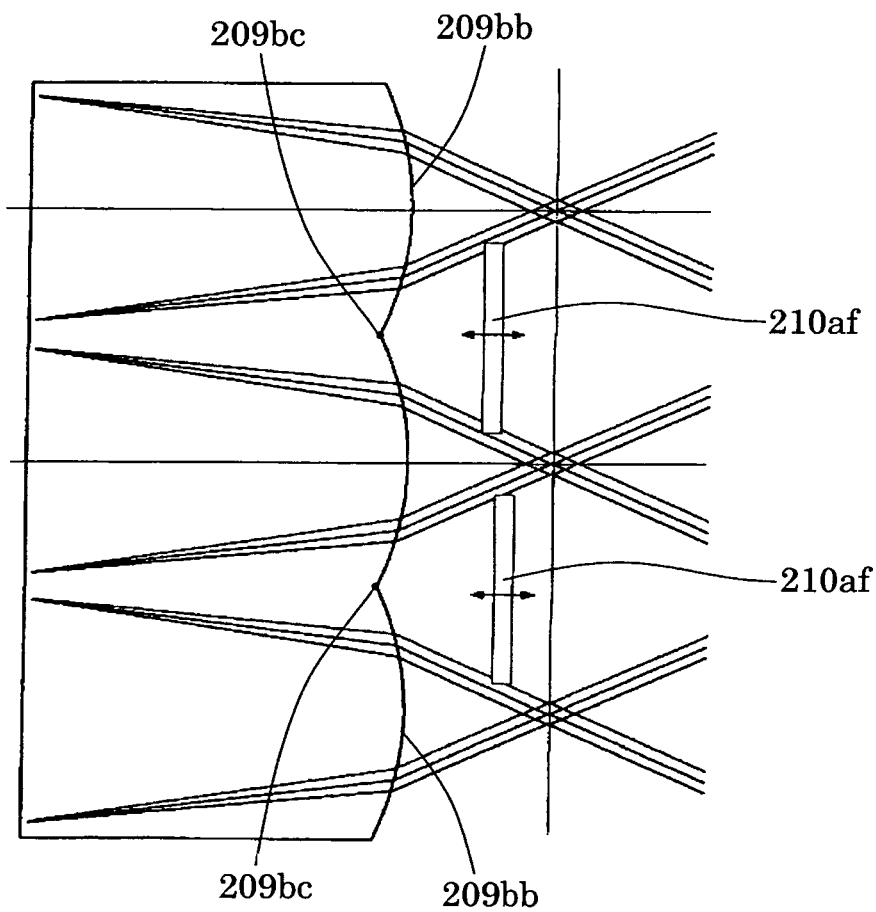
Figure 106:
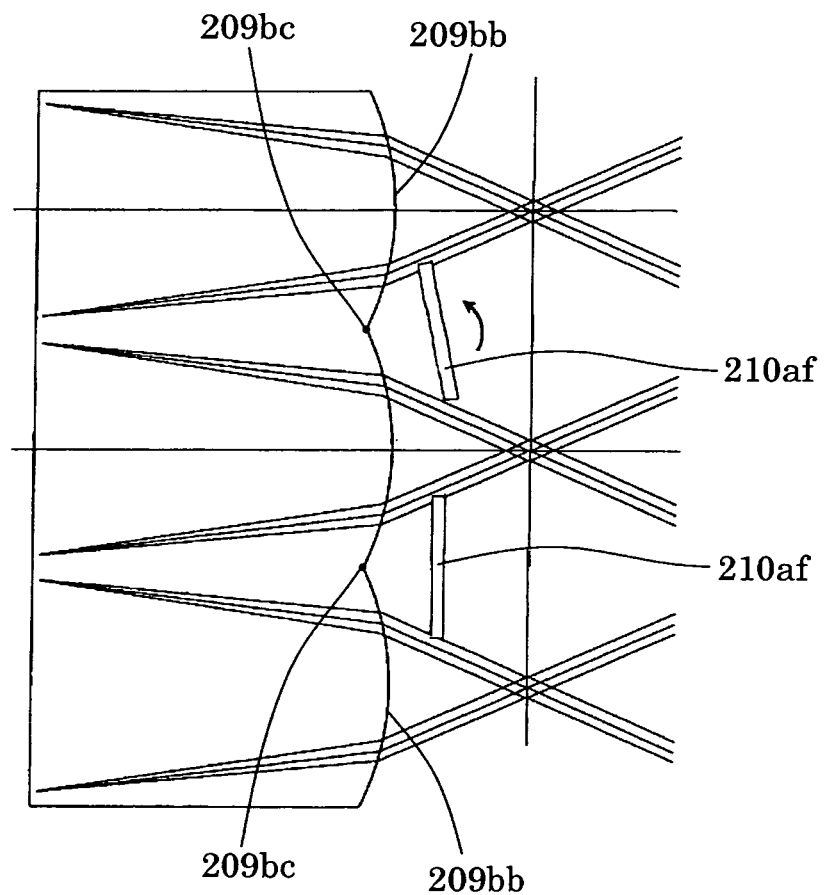

In the above embodiment, the linear light shield members 210a are fixedly positioned. However, without having to be limited to this, it is also possible to adopt a configuration wherein at least one of the position and posture of one or more linear light shield members is made variable. In a case where a plurality of linear light shield members are provided, the optical system can also be configured so that at least either of relative positions and relative postures between one linear light shield member and another linear light shield member are made variable. This configuration increases degrees of freedom for change in the attenuation characteristic (attenuation distribution) of the attenuation portion of the attenuation unit. For example, as shown in FIG. 105, a plurality of linear light shield members 210af can be configured so as to be integrally movable or individually movable in the direction along the optical axis AX, i.e., in the Y-direction. In this case, as a certain light shield member 210af becomes located more distant from the refracting face 9bb, the attenuation rate by the light shield member 210af decreases. Furthermore, as shown in FIG. 106, at least one linear light shield member 210af can also be configured so as to be rotatable around an axis extending in the X-direction (an axis perpendicular to the optical axis AX). In this case, as a certain light shield member 210af rotates, the attenuation rate decreases at the end located more distant from the refracting face 209bb in the light shield member 210af.

Figure 107:
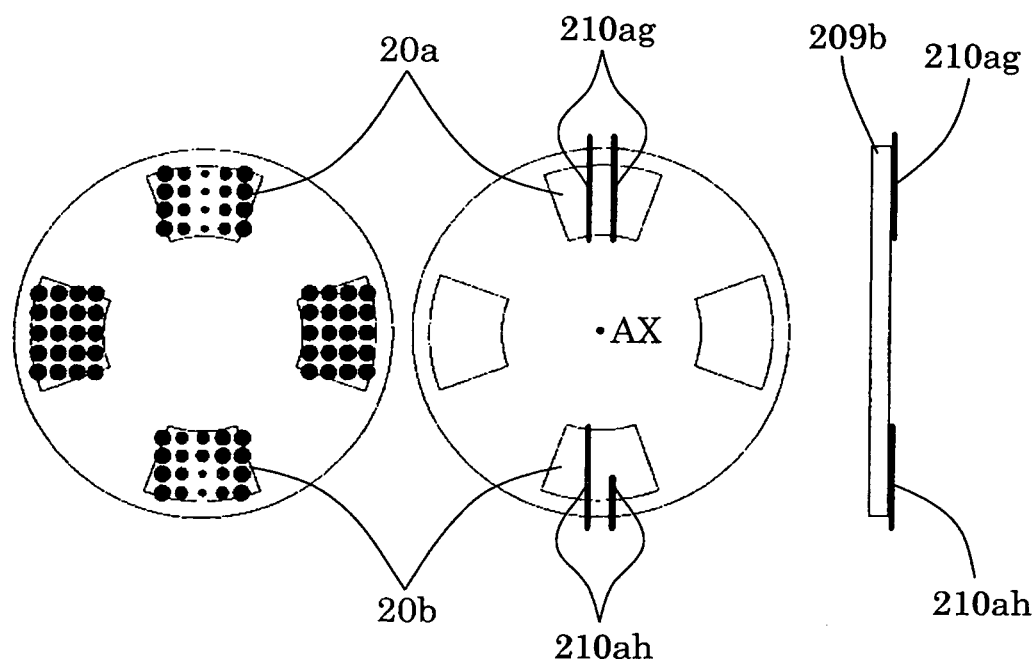
Figure 108:
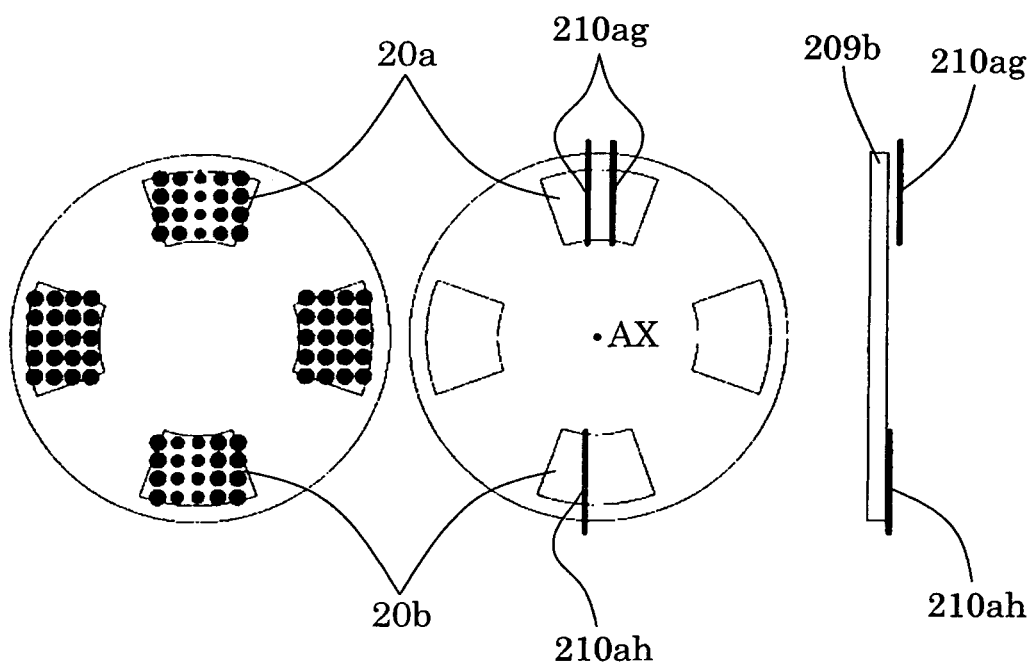
Figure 109:
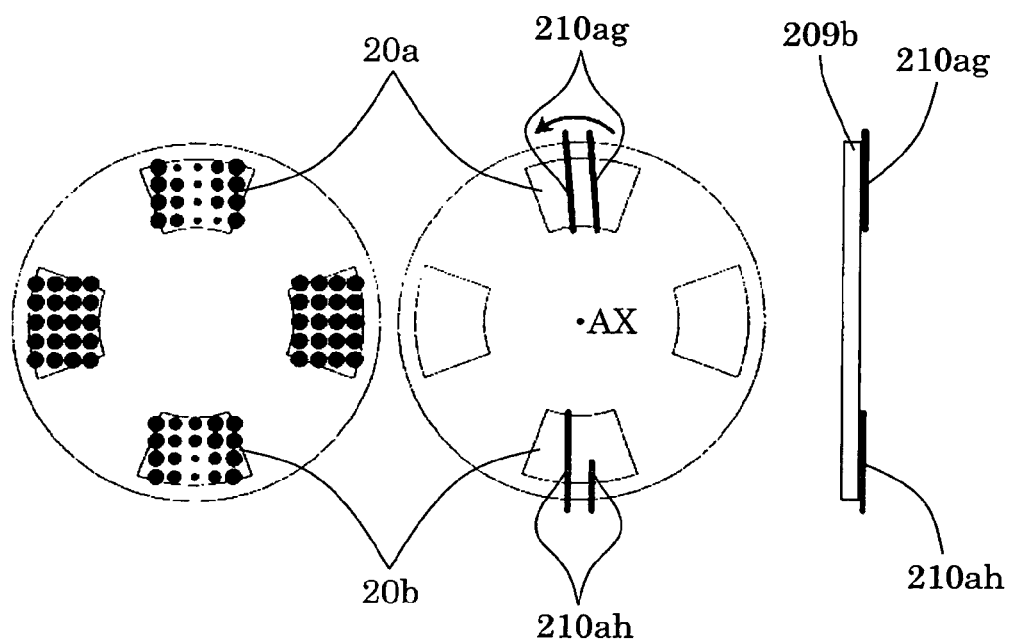

In a plurality of linear light shield members 210ag arranged for the surface illuminant 20a and a plurality of linear light shield members 210ah arranged for the surface illuminant 20b, as shown in FIG. 107, degrees of freedom can also be increased for change in the attenuation distribution when the positions of respective light shield members are made integrally variable or individually variable in the XZ plane (plane perpendicular to the optical axis AX). It is also noted that, as shown in FIG. 107, a length of a certain light shield member may be made different from that of the other light shield members. As shown in FIG. 108, the degrees of freedom for change in the attenuation distribution can also be increased, for example, by a configuration wherein the light shield member 210ag is configured so as to be movable in the Y-direction (the direction of the optical axis AX) from the state shown in FIG. 107. It is also possible to adopt a modification wherein the number of corresponding light shield members for the surface illuminant 20a is made different from that for the surface illuminant 20b, as shown in FIG. 108. Furthermore, as shown in FIG. 109, the degrees of freedom for change in the attenuation distribution can also be increased, for example, by a configuration wherein the light shield members 210ag are configured so as to be rotatable around an axis extending in the Y-direction (around the optical axis AX or around an axis parallel to the optical axis AX) from the state shown in FIG. 107.

Figure 110:
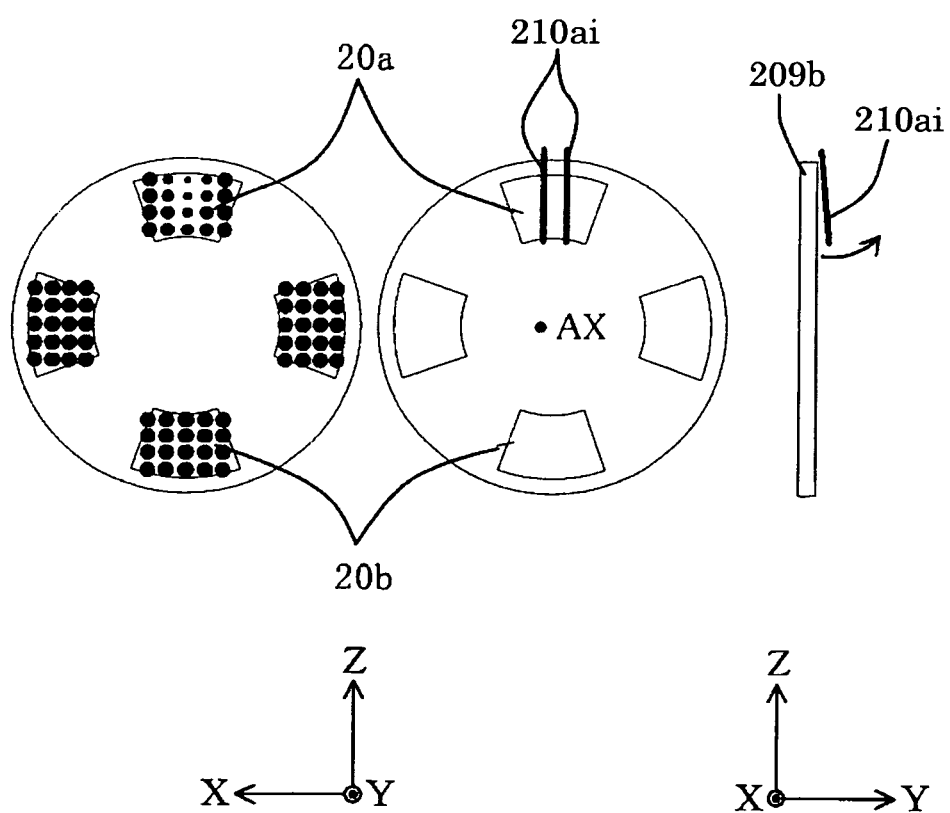

Furthermore, as shown in FIG. 110, the degrees of freedom for change in the attenuation distribution can also be increased, for example, by a configuration wherein light shield members 210ai extending in the Z-direction are configured so as to be rotatable around an axis extending in the X-direction (or around a direction perpendicular to the Z-direction and the direction of the optical axis AX). In the example of FIG. 110, the attenuation distribution in the region in the surface illuminant 20a is one varying with increasing distance from the optical axis. The configuration examples of FIGS. 105 to 110 described above can be combined with each other and their combinations can be optionally determined.

Figure 111A:
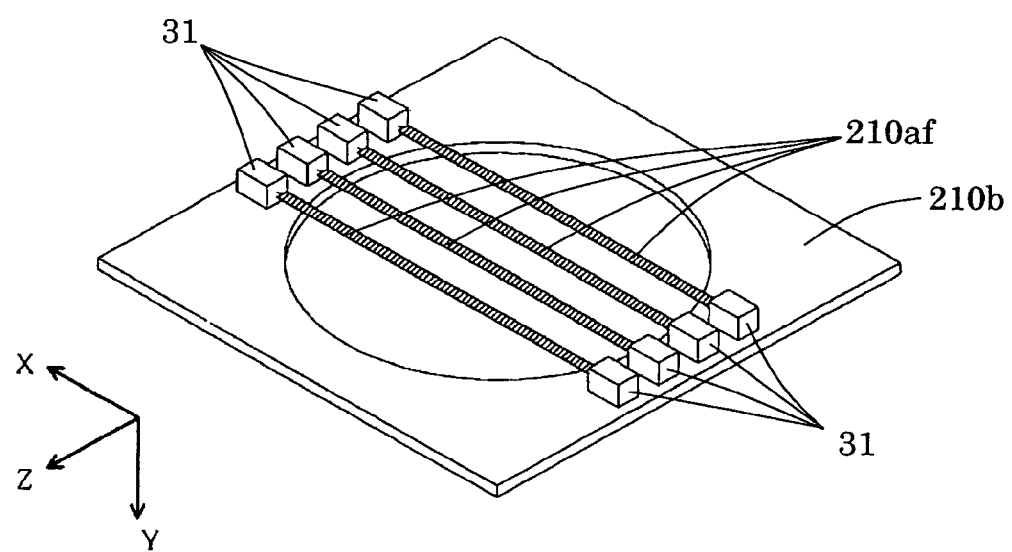
Figure 111B:
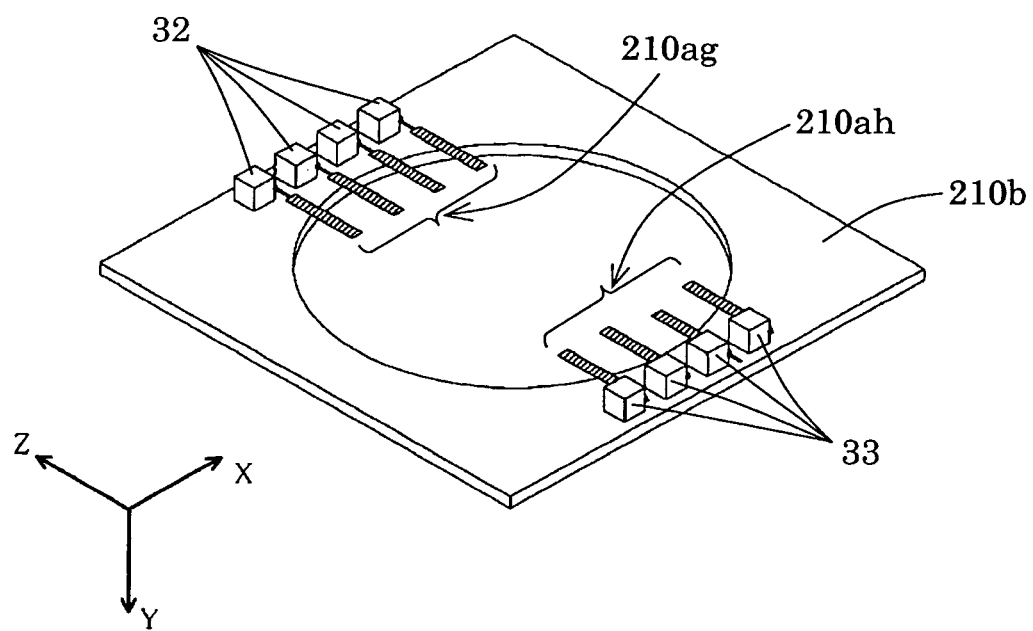

FIGS. 111A and 111B show examples of driving mechanisms for arranging the linear light shield members as movable. FIG. 111A corresponds to FIGS. 105 and 106 and shows the driving mechanism to move each light shield member 210af in the direction along the optical axis AX and to rotate each light shield member 210af around an axis perpendicular to the optical axis AX; FIG. 111B corresponds to FIG. 107 and shows the driving mechanism to change the position of each light shield member 210ah.

In FIG. 111A, each light shield member 210af extending in the X-direction is connected at its both ends to driving units 31 and these driving units 31 are provided on a holding member 210b. Then each driving unit 31 rotationally drives the light shield member 210af around the X-axis and moves the light shield member 210af along the Y-direction. If drive amounts along the Y-direction in the driving units 31 are equal at the two ends of the light shield member 210af, a change will be made in the position along the Y-direction of the light shield member 210af. If drive amounts along the Y-direction in the driving units 31 are different at the two ends of the light shield member 210af, the light shield member 210af can be rotated around the Z-axis.

In FIG. 111B, each of the light shield members 210ag on the side of the +Z-direction out of the light shield members extending in the X-direction is connected to a driving unit 32, and each of the light shield members 210ah on the side of the −Z-direction is connected to a driving unit 33. These driving units 32 and 33 are provided on a holding member 210b. Each driving unit 32 rotates the light shield member 210ag around the Z-axis and changes the position thereof along the Z-direction. Furthermore, each driving unit 33 rotates the light shield member 210ah around the Z-axis and changes the position thereof along the Z-direction.

Adjustment of the positions and postures of the light shield members 210 described above is carried out by controlling the driving units so that a pupil luminance distribution for each position becomes a desired distribution (intensity), based on the observation result of pupil luminance distributions (pupil intensity distributions) for a plurality of positions on a surface to be illuminated. For the observation of the pupil luminance distributions, it is possible to use a pupil luminance distribution measuring device, for example, as disclosed in Japanese Patent Applications Laid-open No. 2006-54328 and Laid-open No. 2003-22967 and U.S. Pat. Published Application No. 2003/0038225 corresponding thereto. The teachings of the U.S. Pat. Published Application No. 2003/0038225 are incorporated herein by reference.

By adjusting the pupil intensity distributions to a desired shape and also substantially uniformly adjusting each of the pupil intensity distributions related to the respective points on the wafer as a final surface to be illuminated, the micro pattern on the mask can be faithfully transferred onto the wafer. If there is variation in uniformity of the pupil intensity distributions for the respective points on the wafer, the line width of the pattern will vary depending upon positions on the wafer, so as to fail to faithfully transfer the micro pattern of the mask in a desired line width across the entire exposure region on the wafer.

The illumination optical system of the above embodiment is configured so that the light shield members are arranged at the position immediately in front of or immediately behind the illumination pupil located behind the optical integrator and so that the attenuation rate by the light shield members for light toward a point on the surface to be illuminated increases from the center to the periphery of the surface to be illuminated. Therefore, the pupil intensity distributions related to the respective points can be adjusted to distributions of substantially mutually identical properties by independently adjusting each of the pupil intensity distributions related to the respective points on the surface to be illuminated, by the attenuation action of the light shield members with the required attenuation characteristic varying depending upon the incidence position of light to the surface to be illuminated.

As a consequence, the illumination optical system of the above embodiment is able to substantially uniformly adjust each of the pupil intensity distributions for the respective points on the surface to be illuminated, for example, through collaboration between the compensation filter to equally adjust the pupil intensity distributions for the respective points on the surface to be illuminated, and the light shield members to independently adjust each of the pupil intensity distributions related to the respective points. In this manner, the exposure apparatus of the above embodiment is able to perform excellent exposure under an appropriate illumination condition, using the illumination optical system to substantially uniformly adjust each of the pupil intensity distributions for the respective points on the surface to be illuminated, and therefore to manufacture excellent devices.

The above-described embodiments relate to the illumination optical systems suitably applicable to the exposure apparatus for manufacturing, for example, devices such as semiconductor devices, imaging devices, liquid crystal display devices, and thin film magnetic heads by the lithography process.

The exposure apparatus of the foregoing embodiments is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus is preferably performed in a clean room in which the temperature, cleanliness, etc. are controlled.

Figure 22:
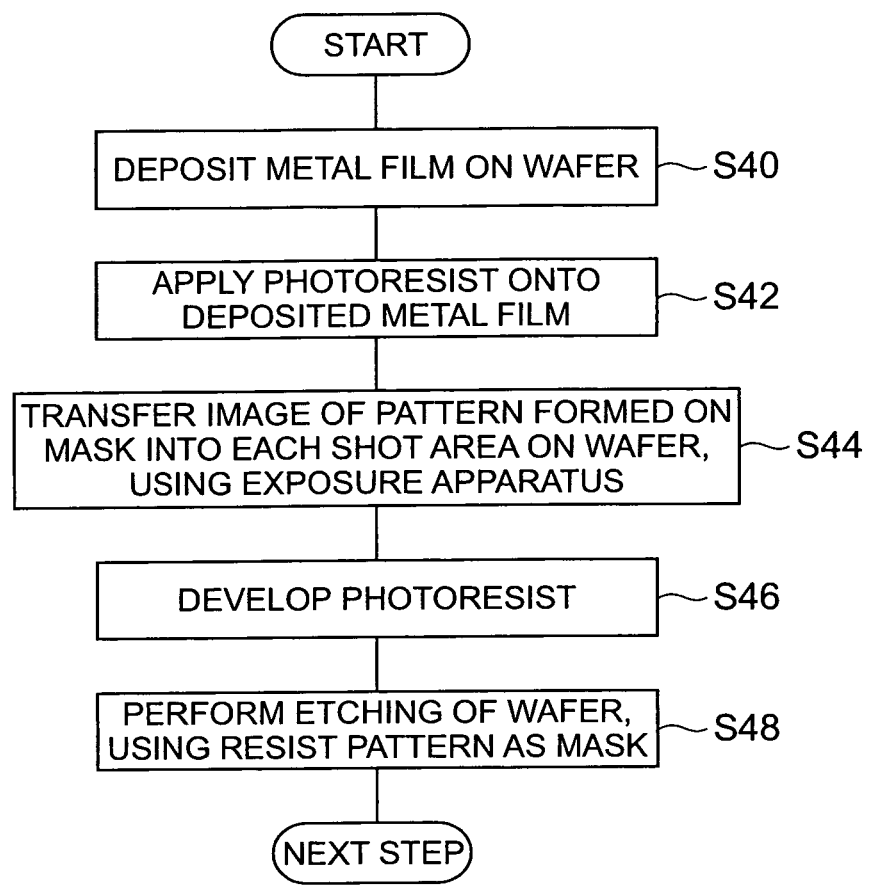
FIG. 22 is a flowchart showing manufacturing steps of semiconductor devices.

The following will describe a device manufacturing method using the exposure apparatus according to the above-described embodiments. FIG. 22 is a flowchart showing manufacturing steps of semiconductor devices. As shown in FIG. 22, the manufacturing steps of semiconductor devices include depositing a metal film on a wafer W to become a substrate of semiconductor devices (block S40) and applying a photoresist as a photosensitive material onto the deposited metal film (block S42). The subsequent steps include transferring a pattern formed on a mask (reticle) M, into each shot area on the wafer W, using the exposure apparatus of the aforementioned embodiments (block S44: exposure step), and developing the wafer W after completion of the transfer, i.e., developing the photoresist on which the pattern has been transferred (block S46: development step). Thereafter, using as a mask the resist pattern made on the surface of the wafer W in block S46, processing such as etching is carried out on the surface of the wafer W (block S48: processing step).

The resist pattern herein is a photoresist layer in which depressions and protuberances are formed in a shape corresponding to the pattern transferred by the exposure apparatus of the embodiments and which the depressions penetrate throughout. Block S48 is to process the surface of the wafer W through this resist pattern. The processing carried out in block S48 includes, for example, at least either etching of the surface of the wafer W or deposition of a metal film or the like. In block S44, the exposure apparatus of the embodiments performs the transfer of the pattern onto the wafer W coated with the photoresist, as a photosensitive substrate or plate P.

Figure 23:
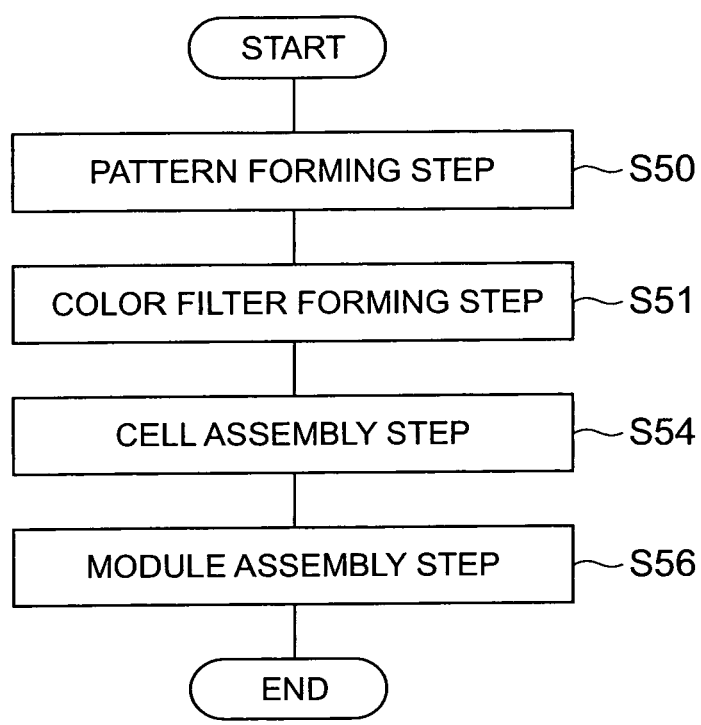
FIG. 23 is a flowchart showing manufacturing steps of a liquid crystal device such as a liquid crystal display device.

FIG. 23 is a flowchart showing manufacturing steps of a liquid crystal device such as a liquid crystal display device. As shown in FIG. 23, the manufacturing steps of the liquid crystal device include sequentially performing a pattern forming step (block S50), a color filter forming step (block S52), a cell assembly step (block S54), and a module assembly step (block S56).

The pattern forming step of block S50 is to form predetermined patterns such as a circuit pattern and an electrode pattern on a glass substrate coated with a photoresist, as a plate P, using the exposure apparatus of the embodiments. This pattern forming step includes an exposure step of transferring a pattern to a photoresist layer, using the exposure apparatus of the embodiments, a development step of performing development of the plate P on which the pattern has been transferred, i.e., development of the photoresist layer on the glass substrate, to make the photoresist layer in the shape corresponding to the pattern, and a processing step of processing the surface of the glass substrate through the developed photoresist layer.

The color filter forming step of block S52 is to form a color filter in which a large number of sets of three dots corresponding to R (Red), G (Green), and B (Blue) are arrayed in a matrix pattern, or in which a plurality of filter sets of three stripes of R, G, and B are arrayed in a horizontal scan direction.

The cell assembly step of block S54 is to assemble a liquid crystal panel (liquid crystal cell), using the glass substrate on which the predetermined pattern has been formed in block S50, and the color filter formed in block S52. Specifically, for example, a liquid crystal is poured into between the glass substrate and the color filter to form the liquid crystal panel. The module assembly step of block S56 is to attach various components such as electric circuits and backlights for display operation of this liquid crystal panel, to the liquid crystal panel assembled in block S54.

The present invention is not limited just to the application to the exposure apparatus for manufacture of semiconductor devices, but can also be widely applied, for example, to the exposure apparatus for the liquid crystal display devices formed with rectangular glass plates, or for display devices such as plasma displays, and the exposure apparatus for manufacture of various devices such as imaging devices (CCDs and others), micro machines, thin film magnetic heads, and DNA chips. Furthermore, the present invention is also applicable to the exposure step (exposure apparatus) for manufacturing masks (photomasks, reticles, etc.) on which mask patterns of various devices are formed, by the photolithography process.

The above-described embodiments used the ArF excimer laser light (wavelength: 193 nm) or the KrF excimer laser light (wavelength: 248 nm) as the exposure light, but, without having to be limited to this, the present invention can also be applied to any other appropriate laser light source, e.g., an $F_2$ laser light source which supplies laser light at the wavelength of 157 nm.

The aforementioned embodiments were the applications of the present invention to the exposure apparatus of the step-and-scan method to perform the scanning exposure of the pattern on the mask M into a shot area on the wafer W. However, without having to be limited to this, the present invention can also be applied to the exposure apparatus of the step-and-repeat method to repeat an operation of performing one-shot exposure of the pattern on the mask M into each exposure region on the wafer W.

The aforementioned embodiments were the applications of the present invention to the illumination optical system to illuminate the mask or the wafer in the exposure apparatus, but, without having to be limited to this, the present invention can also be applied to a generally-used illumination optical system which illuminates a surface to be illuminated except for the mask or the wafer.

The optical attenuator in the above-described first and second embodiments (e.g., the fin member (light shield member) 9, light shield 9, attenuation unit 9, compensation filter 9, and light shield member 95) may be provided so as to be replaceable with another optical attenuator with a different characteristic (both or either of possession of a different transmission characteristic and provision of transmission filter regions at different positions).

Figure 112:
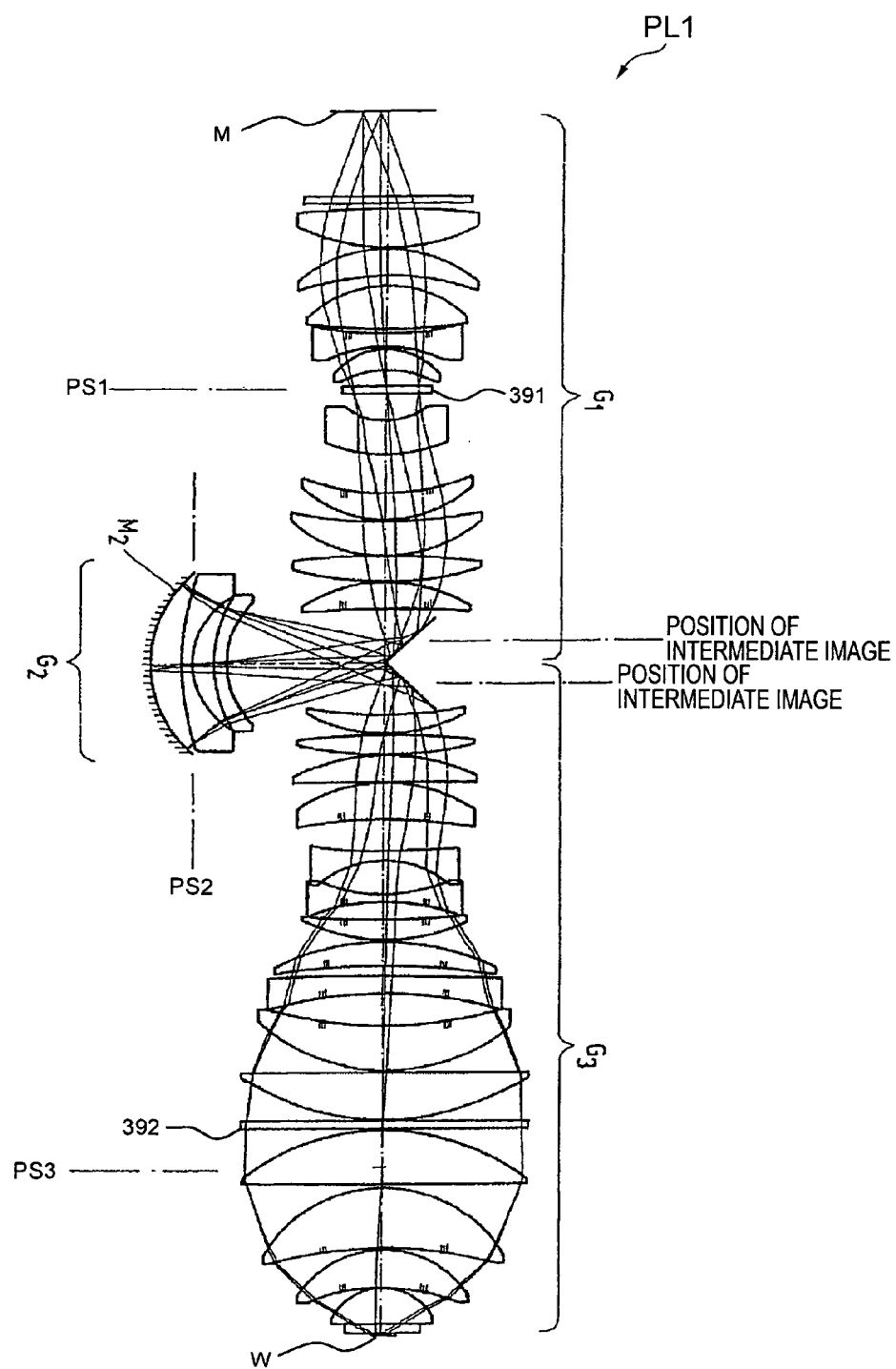
Figure 113:
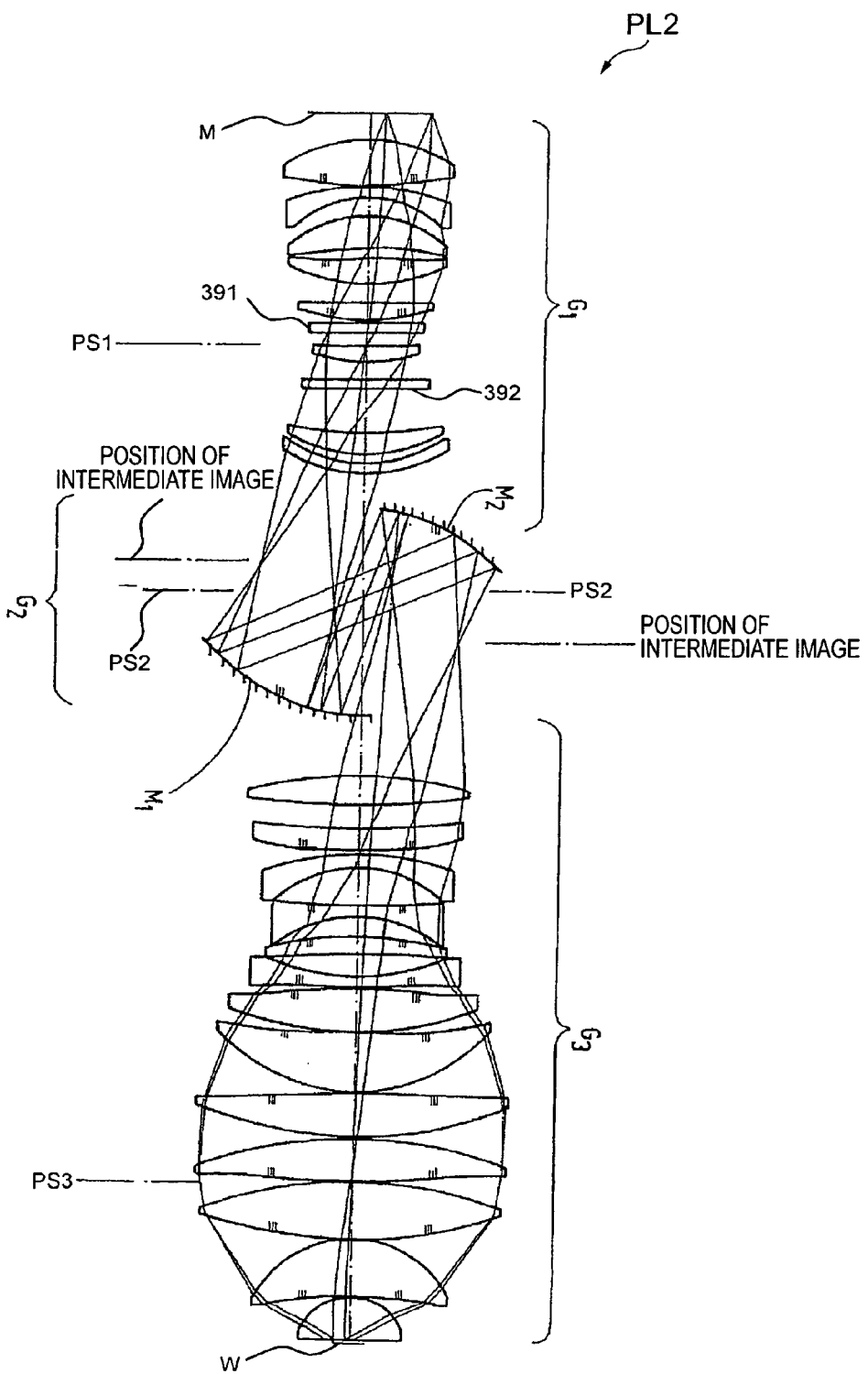

The optical attenuator in the above-described embodiments (e.g., the fin member (light shield member) 9, light shield 9, attenuation unit 9, compensation filter 9, and light shield member 95) does not always have to be arranged in the illumination pupil space inside the illumination optical system, but may be arranged at a position in the projection optical system conjugate with the illumination pupil space. Namely, the optical attenuator may be arranged not only in the illumination optical system, but also in the projection optical system being an exposure optical system. FIGS. 112 and 113 show examples of projection optical systems in which the optical attenuator is arranged.

The projection optical system PL1 shown in FIG. 112 is constructed with a refractive imaging system G1 to form an intermediate image of an object (e.g., a mask M), a catadioptric imaging system G2 to form an image of the intermediate image, and a refractive imaging system G3 to form an image of the intermediate image formed by the catadioptric imaging system G2, as a final image on a wafer surface W. This projection optical system PL1 has a plane where an aperture stop is arranged, and pupil planes PS1-PS3 being planes conjugate therewith. Plane-parallel plates 391, 392 are arranged near the pupil plane PS1 and near the pupil plane PS3 and at least one of these plane-parallel plates 391, 392 can be the optical attenuator.

The projection optical system PL2 shown in FIG. 113 is constructed with a refractive imaging system G1 to form an intermediate image of an object (e.g., a mask M), a catoptric imaging system G2 to form an image of the intermediate image, and a refractive imaging system G3 to form an image of the intermediate image formed by the catoptric imaging system G2, as a final image on a wafer surface W. This projection optical system PL2 has a plane where an aperture stop is arranged, and pupil planes PS1-PS3 being planes conjugate therewith. Plane-parallel plates 391, 392 are arranged near the pupil plane PS1 and the plane-parallel plate 391 can be the optical attenuator. The plane-parallel plate 392 may be set as the optical attenuator.

In the foregoing first and second embodiments, the micro fly's eye lens (fly's eye lens) of the wavefront division type with micro lens faces was used as an optical integrator, but an optical integrator of an internal reflection type (typically, a rod type integrator) may be used instead thereof. In this case, a condenser lens is arranged behind the zoom lens 7 so that its front focal point coincides with the rear focal point of the zoom lens 7, and the rod type integrator is arranged so that an entrance end thereof is positioned at or near the rear focal point of the condenser lens. At this time, an exit end of the rod type integrator is at the position of the mask blind 11. In the use of the rod type integrator, a position optically conjugate with the position of the aperture stop AS of the projection optical system, in the imaging optical system 12 downstream the rod integrator can be called an illumination pupil. Since a virtual image of the secondary light source on the illumination pupil plane is formed at the position of the entrance surface of the rod type integrator, this position and positions optically conjugate therewith can also be called illumination pupil planes. The fin member, attenuation unit, or compensation filter in the above embodiments can be arranged at or near the position optically conjugate with the position of the aperture stop AS of the projection optical system PL, in the imaging optical system 12 downstream the rod type integrator.

In the foregoing embodiments, it is also possible to apply a technique of filling the interior of the optical path between the projection optical system and the photosensitive substrate with a medium having the refractive index larger than 1.1 (typically, a liquid), which is so called a liquid immersion method. In this case, it is possible to adopt one of the following techniques as a technique of filling the interior of the optical path between the projection optical system and the photosensitive substrate with the liquid: the technique of locally filling the optical path with the liquid as disclosed in International Publication WO99/49504; the technique of moving a stage holding the substrate to be exposed, in a liquid bath as disclosed in Japanese Patent Application Laid-open No. 6-124873; the technique of forming a liquid bath of a predetermined depth on a stage and holding the substrate therein as disclosed in Japanese Patent Application Laid-open No. 10-303114, and so on. In the foregoing embodiments, it is also possible to apply the so-called polarization illumination method disclosed in U.S. Pat. Published Applications No. 2006/0170901 and No. 2007/0146676. The teachings of U.S. Pat. Published Applications No. 2006/0170901 and No. 2007/0146676 are incorporated herein by reference.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An illumination optical system which illuminates a surface to be illuminated with light from a light source, the illumination optical system comprising:
   a distribution forming optical system including a fly's eye integrator having a plurality of optical surfaces arranged along a plane crossing an optical axis of the illumination optical system and forming a predetermined pupil intensity distribution behind the fly's eye integrator; and a light shield member arranged on a predetermined surface in an optical path behind the fly's eye integrator, the light shield member having a dimension along an optical axis direction longer than a dimension along a direction perpendicular to the optical axis direction to attenuate a first light toward a first point on the surface to be illuminated and attenuate a second light toward a second point on the surface to be illuminated, wherein the first attenuation rate and the second attenuation rate are different, wherein the first light passes the predetermined surface with a first angle with respect to the optical axis, the second light passes the predetermined surface with a second angle, different from the first angle with respect to the optical axis, and the second point is different from the first point on the surface to be illuminated.

2. The illumination optical system according to claim 1, wherein the light shield member is arranged at a position immediately in front of or behind the illumination pupil, and wherein the light shield member is so configured that the attenuation rates of light toward the points on the surface increases from a center to a peripheral region of the surface to be illuminated.

3. The illumination optical system according to claim 2, wherein the light shield member has a plate-like form, a thickness direction of the light shield member is substantially parallel to a plane of the illumination pupil, and a width direction of the light shield member is substantially parallel to a direction of an optical axis of the illumination optical system.

4. The illumination optical system according to claim 3, wherein a size in the width direction of the light shield member varies along a length direction of the light shield member.

5. The illumination optical system according to claim 3, comprising a plurality of said light shield members, wherein a size in the width direction of a first light shield member out of the plurality of light shield members is different from a size in the width direction of a second light shield member.

6. The illumination optical system according to claim 2, wherein the light shield member has a form of a side face of a plane-parallel plate, a thickness direction of the light shield member is substantially parallel to a plane of the illumination pupil, and a width direction of the light shield member is substantially parallel to a direction of an optical axis of the illumination optical system.

7. The illumination optical system according to claim 6, wherein the optical integrator includes a unit wavefront division face of a rectangular shape elongated along a first direction, and wherein the thickness direction of the light shield member substantially agrees with the first direction.

8. The illumination optical system according to claim 7, wherein the light shield member is so positioned as to act on light from a pair of regions spaced in a direction perpendicular to the first direction on both sides of the optical axis of the illumination optical system on the illumination pupil.

9. The illumination optical system according to claim 2, wherein the optical integrator includes a unit wavefront division face of a rectangular shape elongated along a first direction, and wherein the light shield member is so configured that the attenuation rates increase from the center to the peripheral region along the first direction.

10. The illumination optical system according to claim 2, comprising a plurality of said light shield members.

11. The illumination optical system according to claim 1, wherein the light shield member is of a plate-like form arranged at a position immediately in front of or behind the illumination pupil, and wherein a thickness direction of the light shield member is substantially parallel to a plane of the illumination pupil and a width direction of the light shield member is substantially parallel to a direction of an optical axis of the illumination optical system.

12. The illumination optical system according to claim 1, wherein the light shield member includes at least two light shields arranged at a position immediately in front of or behind the illumination pupil and extending so as to intersect with each other along a plane substantially parallel to a plane of the illumination pupil, and wherein said at least two light shields are so configured that an attenuation rate of light toward a point on the surface to be illuminated, by the at least two light shields increases from a center to a peripheral region of the surface to be illuminated.

13. The illumination optical system according to claim 12, wherein each of said at least two light shields has a plate-like form.

14. The illumination optical system according to claim 13, wherein the fly's eye integrator includes a unit wavefront division face of a rectangular shape elongated along a first direction, and wherein said at least two light shields are so configured that the attenuation rate increases from the center to the peripheral region along the first direction.

15. The illumination optical system according to claim 14, wherein the fly's eye integrator includes a unit wavefront division face of a rectangular shape elongated along the first direction, and wherein said at least two light shields are so positioned as to act on light from a pair of regions spaced in a direction perpendicular to the first direction on both sides of an optical axis of the illumination optical system on the illumination pupil.

16. The illumination optical system according to claim 15, wherein said at least two light shields are arranged substantially in symmetry with respect to an axis extending in a direction perpendicular to the first direction while passing the optical axis.

17. The illumination optical system according to claim 15 or 16, wherein said at least two light shields have a mesh-like form along the plane substantially parallel to the plane of the illumination pupil.

18. The illumination optical system according to claim 17, wherein said at least two light shields includes a first light shield group of a mesh-like form arranged so as to act on light from one region out of said pair of regions, and a second light shield group of a mesh-like form arranged so as to act on light from the other region out of the pair of regions.

19. The illumination optical system according to claim 18, wherein the first light shield group and the second light shield group are configured substantially in symmetry with respect to an axis extending in the first direction while passing the optical axis.

20. The illumination optical system according to claim 18, wherein in the first light shield group and the second light shield group, sizes of light shield members in the direction of the optical axis differ depending upon positions.

21. The illumination optical system according to claim 20, wherein a size in the direction of the optical axis of a light shield arranged near the optical axis is smaller than a size in the direction of the optical axis of a light shield arranged apart from the optical axis.

22. The illumination optical system according to claim 18, wherein in the first light shield group and the second light shield group, meshes of the light shield groups differ depending upon positions.

23. The illumination optical system according to claim 22, wherein a mesh of a light shield group arranged near the optical axis is coarser than a mesh of a light shield group arranged apart from the optical axis.

24. The illumination optical system according to claim 1, further comprising a light quantity distribution adjuster which changes an illuminance distribution on the surface to be illuminated or a shape of an illumination region formed on the surface to be illuminated.

25. The illumination optical system according to claim 24, wherein the light quantity distribution adjuster changes an effect of the light shield member on a light quantity distribution on the surface to be illuminated.

26. The illumination optical system according to claim 1, which is used in combination with a projection optical system to form a plane optically conjugate with the surface to be illuminated, wherein the illumination pupil is at a position optically conjugate with an aperture stop of the projection optical system.

27. An exposure apparatus comprising the illumination optical system as set forth in claim 1 for illuminating a predetermined pattern, the exposure apparatus performing exposure of the predetermined pattern on a photosensitive substrate.

28. The exposure apparatus according to claim 27, comprising a projection optical system to form an image of the predetermined pattern on the photosensitive substrate, the exposure apparatus implementing relative movement of the predetermined pattern and the photosensitive substrate along a scanning direction relative to the projection optical system, thereby performing projection exposure of the predetermined pattern on the photosensitive substrate.

29. The exposure apparatus according to claim 28, wherein the first direction in the optical integrator corresponds to a direction perpendicular to the scanning direction.

30. A device manufacturing method comprising: effecting the exposure of the predetermined pattern on the photosensitive substrate, using the exposure apparatus as set forth in claim 27; developing the photosensitive substrate on which the predetermined pattern has been transferred, to form a mask layer in a shape corresponding to the predetermined pattern on a surface of the photosensitive substrate; and processing the surface of the photosensitive substrate through the mask layer.

31. The illumination optical system according to claim 1, wherein there is no array type optical member arranged along a surface crossing an optical path of the illumination optical system in parallel, between the fly's eye attenuator and the surface to be illuminated.

32. The illumination optical system according to claim 1, wherein the fly's eye integrator includes a cylindrical micro fly's eye lens.

33. An exposure optical system which illuminates a first illumination surface with light from a light source to project an image of the first illumination surface thus illuminated, onto a second illumination surface, the exposure optical system comprising:

a distribution forming optical system including a fly's eye integrator having a plurality of optical surfaces arranged along a plane crossing an optical axis of the illumination optical system and distributing light behind the fly's eye integrator;

a light shield member arranged on a predetermined surface in an optical path behind the fly's eye integrator and substantially uniformly adjusts a pupil intensity distribution related to lights reaching different positions on the first illumination surface; and an equally-adjusting part which equally adjusts the pupil intensity distributions related to lights reaching the first illumination surface, independent of incident portions of the lights reaching the first illumination surface.

34. The exposure optical system according to claim 33, wherein the light shield member is arranged at a position immediately in front of or behind the illumination pupil, or at a position conjugate with the illumination pupil, and wherein the light shield member is so configured to cause an attenuation rate of light propagating toward a point on the first illumination surface or second illumination surface by the light shield member to increase from a center to a peripheral region of the first illumination surface or second illumination surface.

35. The exposure optical system according to claim 33, wherein the light shield member includes at least two light shields arranged immediately in front of or behind the illumination pupil or at a position of a plane conjugate with the illumination pupil and extending so as to intersect with each other along a plane substantially parallel to a plane of the illumination pupil, and wherein said at least two light shields are so configured that the attenuation rate of light toward a point on the first illumination surface or second illumination surface by the at least two light shields increases from a center to a peripheral region of the first illumination surface or second illumination surface.

36. The exposure optical system according to claim 33, wherein there is no array type optical member arranged along a surface crossing an optical path of the illumination optical system in parallel, between the optical attenuator and the surface to be illuminated.

37. The exposure optical system according to claim 33, wherein the light shielding member attenuates a first light toward a first point in the illumination surface after the first light passed the predetermined surface with a first angle with respect to an optical axis of the exposure optical system and a second light toward a second point different from the first point in the illumination surface after the second light passed the predetermined surface with a second angle different from the first angle with respect to the optical axis with different attenuation rates to each other, respectively.

38. The exposure optical system according to claim 33, wherein the equally-adjusting parts is arranged in an optical path of the distribution forming optical system.

39. The exposure optical system according to claim 33, wherein the equally-adjusting parts is arranged in the light source side of the fly's eye integrator.

* * * * *

UNITED STATES PATENT AND TRADEMARK OFFICE
CERTIFICATE OF CORRECTION

| | |
|---|---|
| PATENT NO. | : 8,908,151 B2 |
| APPLICATION NO. | : 12/366429 |
| DATED | : December 9, 2014 |
| INVENTOR(S) | : Kouji Muramatsu et al. |

It is certified that error appears in the above-identified patent and that said Letters Patent is hereby corrected as shown below:

Title Page, Item [75] (Inventors), line 4, Delete "Honji, (JP);" and insert -- Honjo, (JP); --, therefor.

Signed and Sealed this
Fifth Day of May, 2015

Michelle K. Lee
*Director of the United States Patent and Trademark Office*